US011912724B2

(12) United States Patent
Kwon et al.

(10) Patent No.: US 11,912,724 B2
(45) Date of Patent: Feb. 27, 2024

(54) ORGANOMETALLIC COMPOUND, ORGANIC LIGHT-EMITTING DEVICE INCLUDING THE SAME, AND ELECTRONIC APPARATUS INCLUDING THE ORGANIC LIGHT-EMITTING DEVICE

(71) Applicant: Samsung Electronics Co., Ltd., Suwon-si (KR)

(72) Inventors: Ohyun Kwon, Seoul (KR); Sangdong Kim, Seongnam-si (KR); Hyungjun Kim, Suwon-si (KR); Virendra Kumar Rai, Hwaseong-si (KR); Bumwoo Park, Yongin-si (KR); Myungsun Sim, Suwon-si (KR); Jeoungin Yi, Seoul (KR); Yongsuk Cho, Hwaseong-si (KR); Byoungki Choi, Hwaseong-si (KR); Jongwon Choi, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/592,075

(22) Filed: Feb. 3, 2022

(65) Prior Publication Data

US 2022/0348599 A1 Nov. 3, 2022

(30) Foreign Application Priority Data

Feb. 5, 2021 (KR) ........................ 10-2021-0016842
Jan. 14, 2022 (KR) ........................ 10-2022-0006178

(51) Int. Cl.
*C07F 15/00* (2006.01)

(52) U.S. Cl.
CPC ................................ *C07F 15/0033* (2013.01)

(58) Field of Classification Search
CPC ..... C07F 15/0033; C07F 7/30; H10K 85/342; H10K 85/341
See application file for complete search history.

(56) References Cited

U.S. PATENT DOCUMENTS 9,923,154 B2 3/2018 Oshiyama et al.
2016/0268519 A1* 9/2016 Choi .................... C09K 11/025
2018/0138427 A1 5/2018 Ji et al.
2018/0179238 A1* 6/2018 Lee ........................ H10K 50/11
2020/0313098 A1* 10/2020 Kim .................... H01L 51/0071
2021/0050533 A1* 2/2021 Choi ...................... C09K 11/06
2022/0223803 A1* 7/2022 Park .................... H01L 51/0085
2022/0275013 A1* 9/2022 Ji ......................... H10K 85/624

FOREIGN PATENT DOCUMENTS

CN 107759638 A * 3/2018 .......... C07F 15/0033
CN 109988193 A 7/2019
JP 2016219490 A 12/2016
KR 1020190060589 A 6/2019
WO 2012111548 A1 8/2012
WO 2016056562 A1 4/2016

OTHER PUBLICATIONS

CAS Abstract and Indexed Compounds, W. Choi et al., US 2016/0268519 (2016) (Year: 2016).*

* cited by examiner

*Primary Examiner* — Alexander R Pagano
(74) *Attorney, Agent, or Firm* — CANTOR COLBURN LLP

(57) ABSTRACT

An organometallic compound represented by Formula 1:

$$M_1(Ln_1)_{n1}(Ln_2)_{n2} \quad \text{Formula 1}$$

wherein $M_1$ is a transition metal, $Ln_1$ is a ligand represented by Formula 1-1, $Ln_2$ is a bidentate ligand, n1 is 1, 2, or 3, and n2 is 0, 1, or 2, Formula 1-1

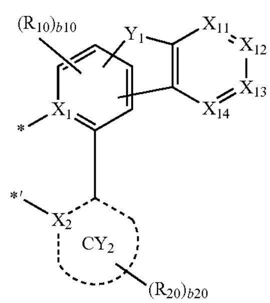

wherein $X_1$, $X_2$, $X_{11}$ to $X_{14}$, $Y_1$, $R_{10}$, $R_{20}$, ring $CY_2$, b10, and b20 are as defined herein, and wherein * and *' each indicate a binding site to $M_1$.

19 Claims, 1 Drawing Sheet

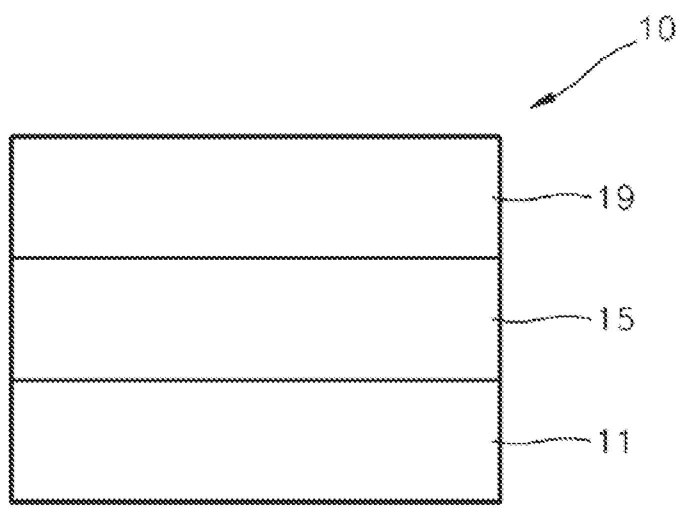
10
19
15
11

ORGANOMETALLIC COMPOUND, ORGANIC LIGHT-EMITTING DEVICE INCLUDING THE SAME, AND ELECTRONIC APPARATUS INCLUDING THE ORGANIC LIGHT-EMITTING DEVICE

CROSS-REFERENCE TO RELATED APPLICATION

This application claims priority to and the benefit of Korean Patent Applications Nos. 10-2021-0016842, filed on Feb. 5, 2021, and 10-2022-0006178, filed on Jan. 14, 2022 in the Korean Intellectual Property Office, and all the benefits accruing therefrom under 35 U.S.C. § 119, the content of which are incorporated by reference herein in their entireties.

BACKGROUND

1. Field

One or more embodiments relate to an organometallic compound, an organic light-emitting device including the same, and an electronic apparatus including the organic light-emitting device.

2. Description of the Related Art

Organic light-emitting devices (OLEDs) are self-emissive devices, which have improved characteristics in terms of viewing angles, response time, luminance, driving voltage, and response speed, and produce full-color images.

In an example, an organic light-emitting device includes an anode, a cathode, and an organic layer between the anode and the cathode, wherein the organic layer includes an emission layer. A hole transport region may be located between the anode and the emission layer, and an electron transport region may be located between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transition from an excited state to a ground state to thereby generate light, for example visible light.

SUMMARY

One or more embodiments relate to an organometallic compound, an organic light-emitting device including the same, and an electronic apparatus including the organic light-emitting device.

Additional aspects will be set forth in part in the description, which follows and, in part, will be apparent from the description, or may be learned by practice of the presented embodiments of the disclosure.

According to an aspect, one or more embodiments provide an organometallic compound represented by Formula 1.

$$M_1(Ln_1)_{n1}(Ln_2)_{n2} \quad \text{Formula 1}$$

In Formula 1, $M_1$ is a transition metal, $Ln_1$ is a ligand represented by Formula 1-1, $Ln_2$ is a bidentate ligand, n1 is 1, 2, or 3, and n2 is 0, 1, or 2, Formula 1-1

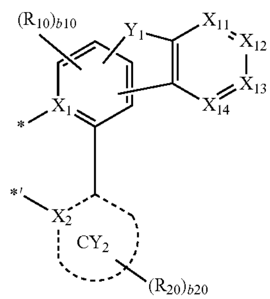

wherein, in Formula 1-1, $X_1$ is C or N, and $X_2$ may be C or N, $X_{11}$ is $C(R_1)$ or N, $X_{12}$ is $C(R_2)$ or N, $X_{13}$ is $C(R_3)$ or N, and $X_{14}$ is $C(R_4)$ or N, $Y_1$ is O, S, Se, $C(R_5)(R_6)$, or $N(R_5)$, $CY_2$ is a $C_5$-$C_{30}$ carbocyclic group or a $C_1$-$C_{30}$ heterocyclic group, $R_1$ to $R_6$, $R_{10}$, and $R_{20}$ are each independently a group represented by one of Formulae 2-1 or 2-2, hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —$N(Q_4)(Q_5)$, —$B(Q_6)(Q_7)$, —$P(Q_8)(Q_9)$, or —$P(=O)(Q_8)(Q_9)$, with the proviso that:

when $CY_2$ is a benzene group, (i) at least one of $R_1$ to $R_4$ is a group represented by Formula 2-1 or a group represented by Formula 2-2, or (ii) at least one of $R_{10}$ and $R_{20}$ is a group represented by Formula 2-2, 2-1

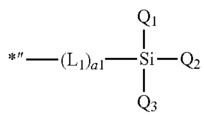

2-2

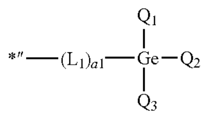

wherein, in Formulae 2-1 and 2-2, each $L_1$ is independently a single bond, a substituted or unsubstituted $C_5$-$C_{30}$ carbocyclic group, or a substituted or unsubstituted $C_1$-$C_{30}$ heterocyclic group, a1 is 0, 1, 2, 3, 4, or 5, and when $CY_2$ is not a benzene group, at least one of $R_1$ to $R_4$, $R_{10}$, and $R_{20}$ is a group represented by Formula 2-1 or a group represented by Formula 2-2, two or more of a plurality of $R_{10}$(s) are optionally linked to each other to form a substituted or unsubstituted $C_5$-$C_{30}$ carbocyclic group or a substituted or unsubstituted $C_1$-$C_{30}$ heterocyclic group, two or more of a plurality of $R_{20}$(s) are optionally linked to each other to form a substituted or unsubstituted $C_5$-$C_{30}$ carbocyclic group or a substituted or unsubstituted $C_1$-$C_{30}$ heterocyclic group, two or more adjacent groups of $R_5$, $R_6$, $R_{10}$, and $R_{20}$ are optionally linked to each other to form a substituted or unsubstituted $C_5$-$C_{30}$ carbocyclic group or a substituted or unsubstituted $C_1$-$C_{30}$ heterocyclic group, b10 is 1 or 2, b20 is 1, 2, 3, 4, 5, 6, 7, 8, 9, or 10,

* and *' each indicate a binding site to $M_1$,

*" indicates a binding site to a neighboring atom, and at least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_2$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_7$-$C_{60}$ alkyl aryl group, the substituted $C_7$-$C_{60}$ aryl alkyl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted $C_2$-$C_{60}$ heteroaryl alkyl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group is:

deuterium, —F, —Cl, —Br, —I, $—SF_5$, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with at least one of deuterium, —F, —Cl, —Br, —I, $—SF_5$, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, $—Si(Q_{11})(Q_{12})(Q_{13})$, $—Ge(Q_{11})(Q_{12})(Q_{13})$, $—N(Q_{14})(Q_{15})$, $—B(Q_{16})(Q_{17})$, $—P(Q_{18})(Q_{19})$, $—P(=O)(Q_{18})(Q_{19})$, or a combination thereof, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, each substituted with at least one of deuterium, —F, —Cl, —Br, —I, $—SF_5$, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alky aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, $—Si(Q_{21})(Q_{22})(Q_{23})$, $—Ge(Q_{21})(Q_{22})(Q_{23})$, $—N(Q_{24})(Q_{25})$, $—B(Q_{26})(Q_{27})$, $—P(Q_{18})(Q_{19})$, $—P(=O)(Q_{28})(Q_{29})$, or a combination thereof, or $—Si(Q_{31})(Q_{32})(Q_{33})$, $—Ge(Q_{31})(Q_{32})(Q_{33})$, $—N(Q_{34})(Q_{35})$, $—B(Q_{36})(Q_{37})$, $—P(Q_{18})(Q_{19})$, or $—P(=O)(Q_{38})(Q_{39})$, wherein $Q_1$ to $Q_9$, $Q_{11}$ to $Q_{19}$, $Q_{21}$ to $Q_{29}$, and $Q_{31}$ to $Q_{39}$ are each independently hydrogen, deuterium, —F, —Cl, —Br, —I, $—SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, or a substituted or unsubstituted monovalent non-aromatic condensed heteropolycyclic group.

Another aspect of the present disclosure provides an organic light-emitting device including a first electrode, a second electrode, and an organic layer located between the first electrode and the second electrode, wherein the organic layer includes an emission layer, and wherein the organic layer further includes at least one of the organometallic compounds.

The organometallic compound may be included in the emission layer of the organic layer, and the organometallic compound included in the emission layer may act as a dopant.

Another aspect of the present disclosure provides an electronic apparatus including the organic light-emitting device.

BRIEF DESCRIPTION OF THE DRAWING

The above and other aspects, features, and advantages of certain embodiments of the disclosure will be more apparent from the following description taken in conjunction with the accompanying drawing, in which FIGURE is a schematic cross-sectional view of an organic light-emitting device according to one or more embodiments.

DETAILED DESCRIPTION

Reference will now be made in detail to embodiments, examples of which are illustrated in the accompanying drawings, wherein like reference numerals refer to like elements throughout the specification. In this regard, the present embodiments may have different forms and should not be construed as being limited to the descriptions set forth herein. Accordingly, the embodiments are merely described below, by referring to the FIGURES, to explain aspects. As used herein, the term "and/or" includes any and all combinations of one or more of the associated listed items. Expressions such as "at least one of," when preceding a list of elements, modify the entire list of elements and do not modify the individual elements of the list.

The terminology used herein is for the purpose of describing one or more exemplary embodiments only and is not intended to be limiting. As used herein, the singular forms "a," "an," and "the" are intended to include the plural forms as well, unless the context clearly indicates otherwise. The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

It will be understood that when an element is referred to as being "on" another element, it can be directly in contact with the other element or intervening elements may be present therebetween. In contrast, when an element is referred to as being "directly on" another element, there are no intervening elements present.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

An organometallic compound according to one or more embodiments of the present disclosure is represented by Formula 1:

$$M_1(Ln_1)_{n1}(Ln_2)_{n2} \qquad \text{Formula 1}$$

wherein, in Formula 1, $M_1$ is a transition metal.

In one or more embodiments, $M_1$ in Formula 1 may be a Period 1 transition metal (a Period 4 metal element of the Periodic Table), a Period 2 transition metal (a Period 5 metal element of the Periodic Table), or a Period 3 transition metal (a Period 6 metal element of the Periodic Table). As used herein, "Period" refers to the Period of the transition metal as defined in the Periodic Table of the Elements.

In one or more embodiments, $M_1$ may be iridium (Ir), platinum (Pt), palladium (Pd), gold (Au), osmium (Os), titanium (Ti), zirconium (Zr), hafnium (Hf), europium (Eu), terbium (Tb), thulium (Tm), or rhodium (Rh).

In one or more embodiments, $M_1$ may be Ir, Os, Pt, Pd, or Au.

In one or more embodiments, $M_1$ may be Ir.

$Ln_1$ in Formula 1 is a ligand represented by Formula 1-1.

Formula 1-1

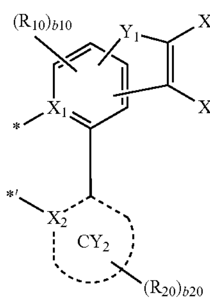

In Formula 1-1, $X_1$ is C or N, and $X_2$ is C or N.

In Formula 1-1, $X_{11}$ is $C(R_1)$ or N, $X_{12}$ is $C(R_2)$ or N, $X_{13}$ is $C(R_3)$ or N, and $X_{14}$ is $C(R_4)$ or N.

In one or more embodiments, one of $X_{11}$ to $X_{14}$ may not be N.

In one or more embodiments, at least one of $X_1$ to $X_{14}$ may not be N.

In one or more embodiments, each of $X_{11}$ to $X_{14}$ may not be N. In one or more embodiments, $X_{11}$ may be $C(R_1)$, $X_{12}$ may be $C(R_2)$, $X_{13}$ may be $C(R_3)$, and $X_{14}$ may be $C(R_4)$.

A bond between $M_1$ and $X_1$ may be a covalent bond or a coordinate bond.

A bond between $M_1$ and $X_2$ may be a covalent bond or a coordinate bond.

In one or more embodiments, $X_1$ may be N, $X_2$ may be C, a bond between $X_1$ and $M_1$ may be a coordinate bond, and a bond between $X_2$ and $M_1$ may be a covalent bond.

$Y_1$ in Formula 1-1 is O, S, Se, $C(R_5)(R_6)$, or $N(R_5)$.

$CY_2$ in Formula 1-1 is a $C_5$-$C_{30}$ carbocyclic group or a $C_1$-$C_{30}$ heterocyclic group.

In one or more embodiments, $CY_2$ may be i) a first ring, ii) a second ring, iii) a condensed cyclic group in which two or more first rings are condensed with each other, iv) a condensed cyclic group in which two or more second rings are condensed with each other, or v) a condensed cyclic group in which at least one first ring is condensed with at least one second ring, the first ring may be a cyclopentane group, a cyclopentadiene group, a furan group, a thiophene group, a pyrrole group, a silole group, an indene group, a benzofuran group, a benzothiophene group, an indole group, a benzosilole group, an oxazole group, an isoxazole group, an oxadiazole group, an isoxadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, or a triazasilole group, and the second ring may be an adamantane group, a norbornene group, a bicyclo[1.1.1]pentane group, a bicyclo[2.1.1]hexane group, a bicyclo[2.2.1]heptane group (norbornane group), a bicyclo[2.2.2]octane group, a cyclohexane group, a cyclohexene group, a benzene group, a pyridine group, a pyrimidine group, a pyrazine group, a pyridazine group, or a triazine group.

In one or more embodiments, $CY_2$ may be:

a benzene group, a naphthalene group, an anthracene group, a phenanthrene group, a triphenylene group, a pyrene group, a chrysene group, a 1,2,3,4-tetrahydronaphthalene group, a thiophene group, a furan group, a pyrrole group, a cyclopentadiene group, a silole group, a borole group, a phosphole group, a selenophene group, a germole group, a benzothiophene group, a benzofuran group, an indole group, an indene group, a benzosilole group, a benzoborole group, a benzophosphole group, a benzoselenophene group, a benzogermole group, a dibenzothiophene group, a dibenzofuran group, a carbazole group, a fluorene group, a dibenzosilole group, a dibenzoborole group, a dibenzophosphole group, a dibenzoselenophene group, a dibenzogermole group, a dibenzothiophene 5-oxide group, a 9H-fluoren-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, an adamantane group, a norbornane group, or a norbornene group; or a group represented by one of Formula 8-1 or 8-2:

Formula 8-1

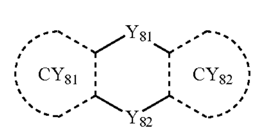

-continued

Formula 8-2

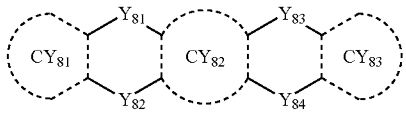

wherein, in Formulae 8-1 and 8-2, $Y_{81}$ to $Y_{84}$ may each independently be a single bond, O, S, $N(R_{81})$, $C(R_{81})(R_{82})$, $Si(R_{81})(R_{82})$, C(=O), S(=O), $S(=O)_2$, $B(R_{81})$, $P(R_{81})$, or $P(=O)(R_{81})$, $CY_{81}$ to $CY_{83}$ may each independently be a benzene group, a naphthalene group, a 1,2,3,4-tetrahydronaphthalene group, a phenanthrene group, a pyridine group, a pyrimidine group, a pyrazine group, a triazine group, a quinoline group, an isoquinoline group, a quinoxaline group, a quinazoline group, a phenanthroline group, a benzofuran group, a benzothiophene group, a fluorene group, a carbazole group, a dibenzofuran group, a dibenzothiophene group, a dibenzosilole group, an azafluorene group, an azacarbazole group, an azadibenzofuran group, an azadibenzothiophene group, or an azadibenzosilole group, and $R_{81}$ and $R_{82}$ are each independently as defined in connection with $R_{10}$ and $R_{20}$.

In one or more embodiments, $Y_{81}$ to $Y_{84}$ in Formulae 8-1 and 8-2 may each independently be a single bond, O, S, $N(R_{81})$, $C(R_{81})(R_{82})$, or $Si(R_{81})(R_{82})$.

In one or more embodiments, $Y_{81}$ and $Y_{82}$ may not be a single bond at the same time, and $Y_{83}$ and $Y_{84}$ may not be a single bond at the same time. That is, at least one of $Y_{81}$ and $Y_{82}$ may not be a single bond, and at least one of $Y_{83}$ and $Y_{84}$ may not be a single bond.

In one or more embodiments, $CY_{81}$ to $CY_{83}$ may each independently be a benzene group, a naphthalene group, a pyridine group, or a pyrimidine group.

In one or more embodiments, $CY_{81}$ to $CY_{83}$ may each independently be a benzene group or a naphthalene group.

In one or more embodiments, $CY_2$ may be:

a benzene group, a naphthalene group, a 1,2,3,4-tetrahydronaphthalene group, a phenanthrene group, a pyridine group, a pyrimidine group, a pyrazine group, a triazine group, a quinoline group, an isoquinoline group, a quinoxaline group, a quinazoline group, a phenanthroline group, a benzofuran group, a benzothiophene group, a fluorene group, a carbazole group, a dibenzofuran group, a dibenzothiophene group, a dibenzosilole group, an azafluorene group, an azacarbazole group, an azadibenzofuran group, an azadibenzothiophene group, or an azadibenzosilole group; or a group represented by one of Formula 8-1 or 8-2.

In one or more embodiments, $CY_2$ may be represented by one of Formulae CY2-1 to CY2-22:

CY2-1

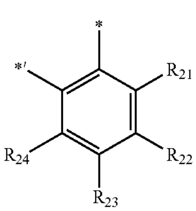

-continued

CY2-2

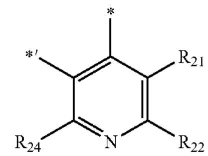

CY2-3

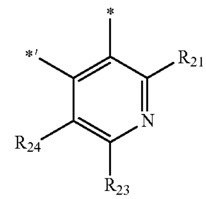

CY2-4

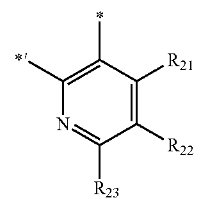

CY2-5

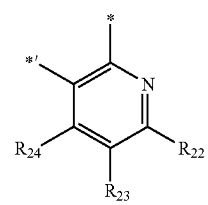

CY2-6

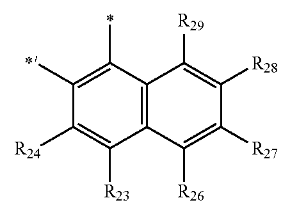

CY2-7

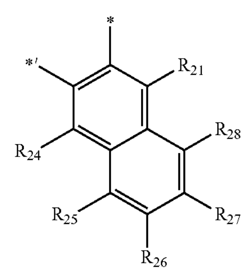

CY2-8

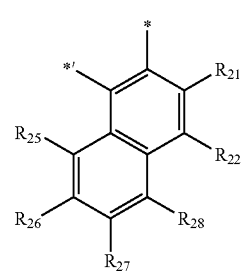

-continued
CY2-9
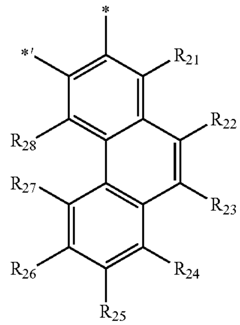
CY2-10
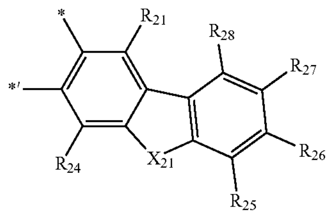
CY2-11
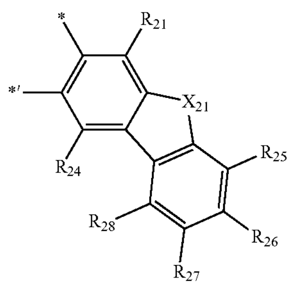
CY2-12
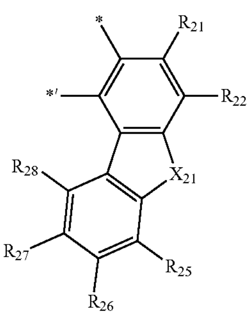
CY2-13
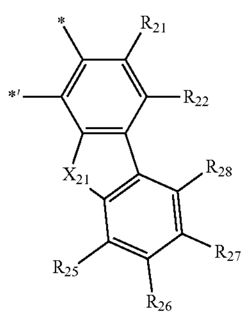
-continued
CY2-14
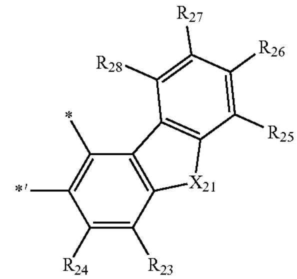
CY2-15
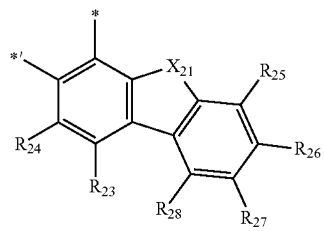
CY2-16
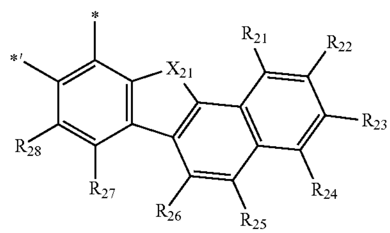
CY2-17
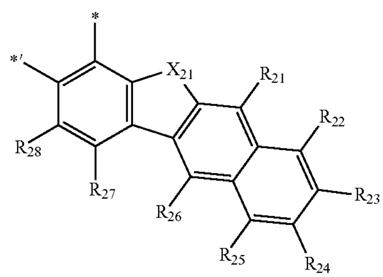
CY2-18
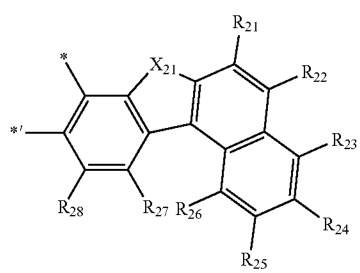
CY2-19
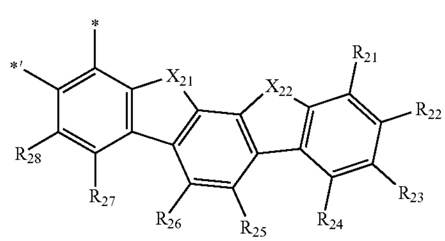

-continued

CY2-20

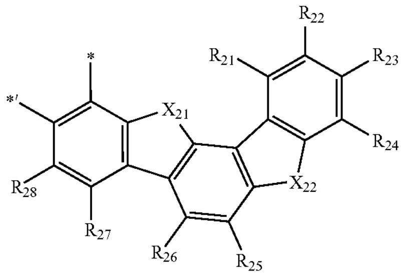

CY2-21

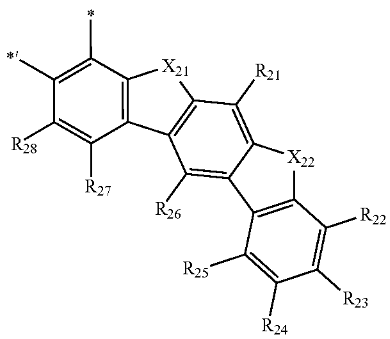

CY2-22

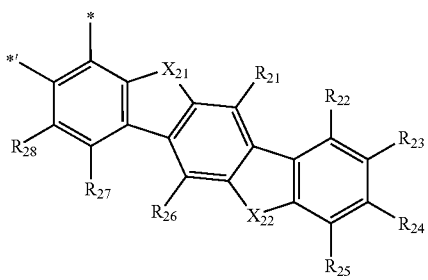

wherein, in Formulae CY2-1 to CY2-22, $X_{21}$ and $X_{22}$ may each independently be O, S, $N(R_{29a})$, $C(R_{29a})(R_{29b})$, or $Si(R_{29a})(R_{29b})$, $R_{21}$ to $R_{28}$, $R_{29a}$, and $R_{29b}$ are each independently as defined in connection with $R_{20}$, two or more adjacent groups of $R_{21}$ to $R_{23}$, $R_{29a}$, and $R_{29b}$ may optionally be linked to each other to form a substituted or unsubstituted $C_5$-$C_{30}$ carbocyclic group or a substituted or unsubstituted $C_1$-$C_{30}$ heterocyclic group, and

* indicates a binding site to a neighboring atom, and

*' indicates a binding site to $M_1$.

In one or more embodiments, two or more adjacent groups of $R_{21}$ to $R_{23}$, $R_{29a}$, and $R_{29b}$ may optionally be linked to each other to form a cyclopentane group, a cyclopentene group, a cyclopentadiene group, a furan group, a thiophene group, a pyrrole group, a silole group, an adamantane group, a norbornane group, a norbornene group, a cyclohexane group, a cyclohexene group, a benzene group, a naphthalene group, an indene group, an indole group, a benzofuran group, a benzothiophene group, a benzosilole group, a fluorene group, a carbazole group, a dibenzofuran group, a dibenzothiophene group, or a dibenzosilole group, each unsubstituted or substituted with at least one $R_{10a}$. $R_{10a}$ is as defined in connection with $R_1$.

$R_1$ to $R_6$, $R_{10}$, and $R_{20}$ in Formula 1-1 are each independently a group represented by one of Formulae 2-1 or 2-2, hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —$N(Q_4)(Q_5)$, —$B(Q_6)(Q_7)$, —$P(Q_8)(Q_9)$, or —$P(=O)(Q_8)(Q_9)$, with the proviso that:

at least one of $R_1$ to $R_4$ is a group represented by Formula 2-1 or a group represented by Formula 2-2, or at least one of $R_{10}$ and $R_{20}$ is a group represented by Formula 2-2:

Formula 2-1

2-1

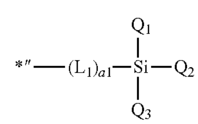

Formula 2-2

2-2

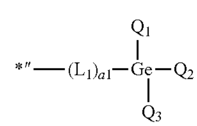

$L_1$ in Formulae 2-1 and 2-2 is a single bond, a substituted or unsubstituted $C_5$-$C_{30}$ carbocyclic group, or a substituted or unsubstituted $C_1$-$C_{30}$ heterocyclic group.

a1 in Formulae 2-1 and 2-2 is 0, 1, 2, 3, 4, or 5.

In one or more embodiments, $L_1$ may be:

a single bond, a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, or an azacarbazolylene group; or a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, or an azacarbazolylene group, each substituted with at least one of deuterium, —F, —Cl, —Br, —I, —$SF_5$, a hydroxyl group, a cyano group, a nitro group, an amidino group, a hydrazino group, a hydrazono group, a $C_1$-$C_{20}$ alkyl group, a $C_1$-$C_{20}$ alkoxy group, a $C_1$-$C_{20}$ alkylthio group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, or a combination thereof.

In Formula 1-1, the ring group $CY_2$ is a benzene group or is a group that is different than a benzene group (i.e., a group that is not a benzene group). As used herein, it is to be understood that a benzene group is synonymous with a "phenyl group" and may be abbreviated as "-Ph" for the sake of convenience.

In Formula 1-1, when $CY_2$ is a benzene group, at least one of $R_1$ to $R_4$ is a group represented by Formula 2-1 or a group represented by Formula 2-2, or at least one of $R_{10}$ and $R_{20}$ is a group represented by Formula 2-2.

In one or more embodiments, $CY_2$ in Formula 1-1 is a group represented by Formula CY2-1 (i.e., an unsubstituted or substituted benzene group), and at least one of $R_1$ to $R_4$ is a group represented by Formula 2-1 or a group represented by Formula 2-2, or at least one of $R_{10}$ and $R_{20}$ is a group represented by Formula 2-2. In some embodiments, when $CY_2$ in Formula 1-1 is a group represented by Formula CY2-1, if one or more of $R_1$ to $R_4$ is a group represented by Formula 2-1 or a group represented by Formula 2-2, then none of $R_{10}$ to $R_{20}$ may be a group represented by Formula 2-1 or a group represented by Formula 2-2. Similarly, in some embodiments, when $CY_2$ in Formula 1-1 is a group represented by Formula CY2-1, if one or more of $R_{10}$ to $R_{20}$ is a group represented by Formula 2-1 or a group represented by Formula 2-2, then none of $R_1$ to $R_4$ may be a group represented by Formula 2-1 or a group represented by Formula 2-2.

In Formula 1-1, when $CY_2$ in Formula 1-1 is not a benzene group, at least one of $R_1$ to $R_4$, $R_{10}$, and $R_{20}$ is a group represented by Formula 2-1 or a group represented by Formula 2-2.

In one or more embodiments, when $CY_2$ in Formula 1-1 is a group represented by one of Formulae CY2-2 to CY2-22, at least one of $R_1$ to $R_4$, $R_{10}$, and $R_{20}$ is a group represented by Formula 2-1 or a group represented by Formula 2-2.

In one or more embodiments, at least one of $R_1$ to $R_4$ may be a group represented by one of Formulae 2-1 or 2-2.

In one or more embodiments, at least one of $R_1$ to $R_4$, $R_{10}$, and $R_{20}$ may be a group represented by Formula 2-2.

In one or more embodiments, $R_1$ to $R_6$, $R_{10}$, and $R_{20}$ may each independently be:

a group represented by one of Formulae 2-1 or 2-2, hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$alkyl group, a $C_2$-$C_{20}$ alkenyl group, a $C_1$-$C_{20}$ alkoxy group, or a $C_1$-$C_{20}$ alkylthio group;

a $C_1$-$C_{20}$ alkyl group, a $C_2$-$C_{20}$ alkenyl group, a $C_1$-$C_{20}$ alkoxy group, or a $C_1$-$C_{20}$ alkylthio group, each substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group (a bicyclo [2.2.1]heptyl group), a norbornenyl group, a cyclopentenyl group, a cyclohexenyl group, a cycloheptenyl group, a bicyclo[1.1.1]pentyl group, a bicyclo[2.1.1] hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo [1.1.1]pentyl group, a ($C_1$-$C_{20}$ alkyl)bicyclo[2.1.1] hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a pyridinyl group, a pyrimidinyl group, or a combination thereof, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1] hexyl group, a bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterated $C_1$-$C_{20}$ alkyl group, a $C_1$-$C_{20}$alkoxy group, a $C_1$-$C_{20}$ alkylthio group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2] octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl) phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or a combination thereof, or —$N(Q_4)(Q_5)$ or —$B(Q_1)(Q_2)$, wherein $Q_1$ to $Q_5$ may each independently be:

deuterium, —F, —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, —$CD_2CDH_2$, —$CF_3$, —$CF_2H$, —$CFH_2$, —$CH_2CF_3$, —$CH_2CF_2H$, —$CH_2CFH_2$, —$CHFCH_3$, —$CHFCF_2H$, —$CHFCFH_2$, —$CHFCF_3$, —$CF_2CF_3$, —$CF_2CF_2H$, or —$CF_2CFH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with at least one of deuterium, —F, a $C_1$-$C_{10}$ alkyl group, a phenyl group, or a combination thereof.

In one or more embodiments, $R_1$ to $R_6$, $R_{10}$, and $R_{20}$ may each independently be:

a group represented by one of Formula 2-1 or 2-2, hydrogen, deuterium, —F, —Cl, —Br, —I, —$SF_5$, —$CD_3$, —$CD_2H$, —$CDH_2$, —$CF_3$, —$CF_2H$, —$CFH_2$, a $C_1$-$C_{60}$alkyl group, a $C_2$-$C_{60}$ alkenyl group, a $C_2$-$C_{60}$ alkynyl group, or a $C_1$-$C_{60}$ alkoxy group; or a group represented by one of Formulae 9-1 to 9-43, 9-201 to 9-237, 10-1 to 10-129, or 10-201 to 10-350:

9-1
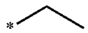
9-2
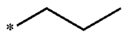
9-3
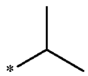
9-4
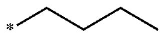
9-5
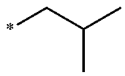
9-6
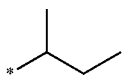
9-7
9-8
9-9
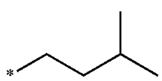
9-10
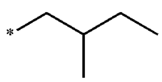
9-11
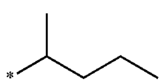
9-12
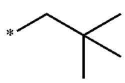
9-13
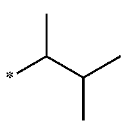
9-14
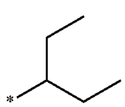
9-15
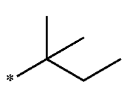
9-16
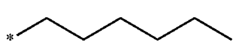
9-17
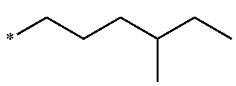
9-18
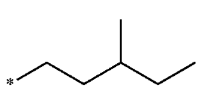
9-19
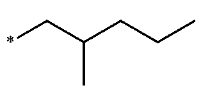
-continued
9-20
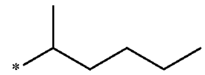
9-21
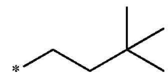
9-22
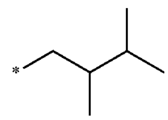
9-23
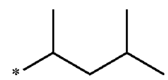
9-24
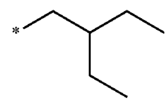
9-25
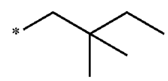
9-26
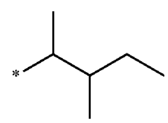
9-27
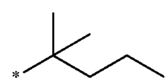
9-28
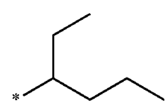
9-29
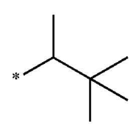
9-30
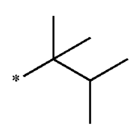
9-31
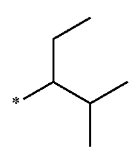
9-32
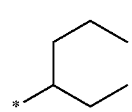
9-33
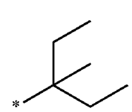

-continued
9-34
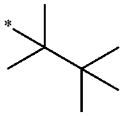
9-35
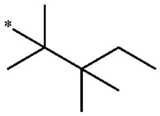
9-36
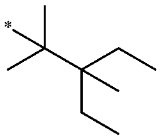
9-37
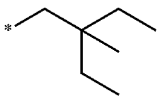
9-38
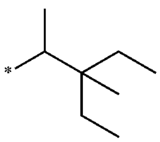
9-39
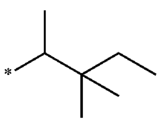
9-40
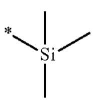
9-41
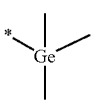
9-42
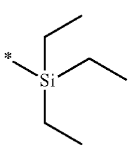
9-43
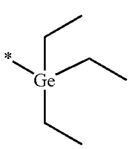
9-201
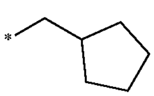
9-202
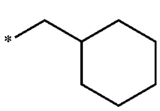
-continued
9-203
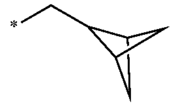
9-204
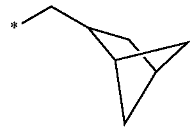
9-205
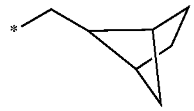
9-206
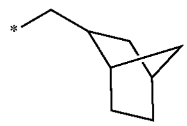
9-207
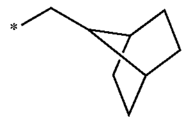
9-208
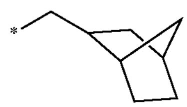
9-209
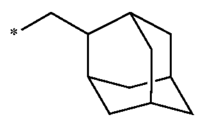
9-210
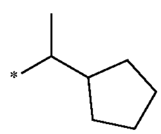
9-211
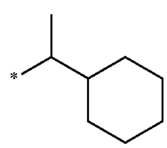
9-212
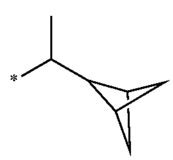
9-213
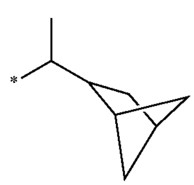

-continued
9-214
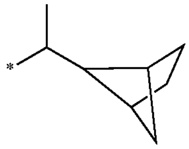
9-215
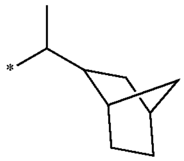
9-216
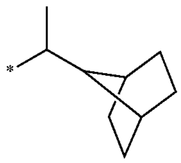
9-217
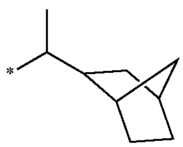
9-218
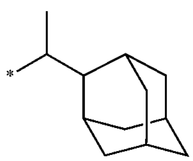
9-219
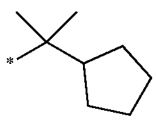
9-220
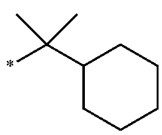
9-221
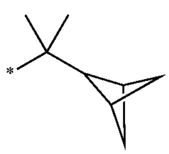
9-222
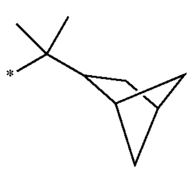
9-223
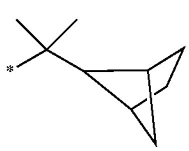
-continued
9-224
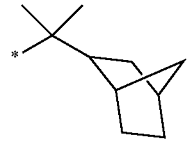
9-225
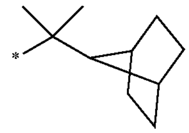
9-226
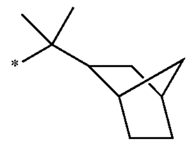
9-227
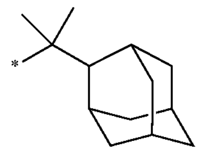
9-228
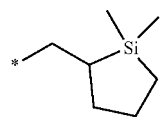
9-229
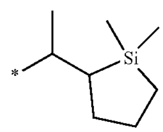
9-230
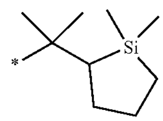
9-231
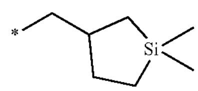
9-232
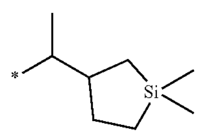
9-233
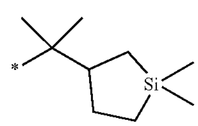
9-234
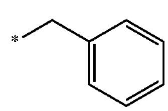
9-235
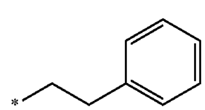

-continued
9-236
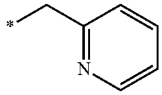
9-237
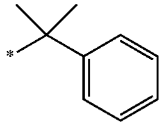
10-1
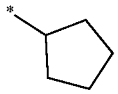
10-2
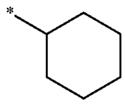
10-3
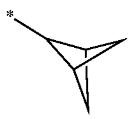
10-4
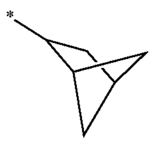
10-5
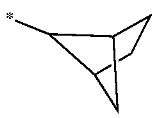
10-6
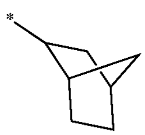
10-7
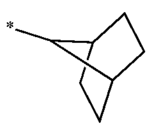
10-8
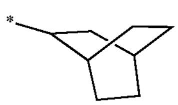
10-9
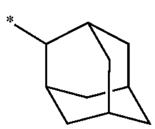
10-10
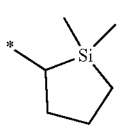
10-11
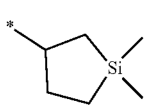
-continued
10-12
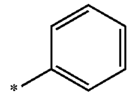
10-13
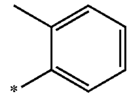
10-14
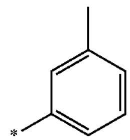
10-15
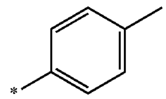
10-16
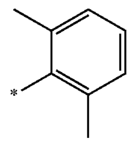
10-17
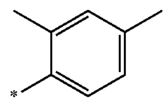
10-18
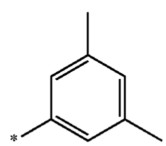
10-19
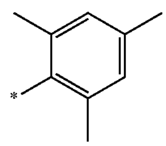
10-20
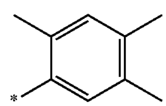
10-21
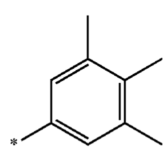
10-22
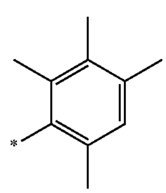

-continued
10-23
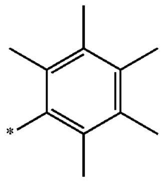
10-24
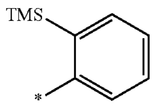
10-25
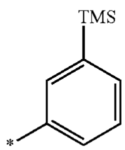
10-26
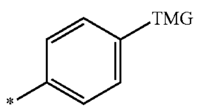
10-27
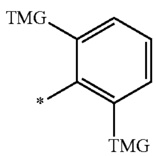
10-28
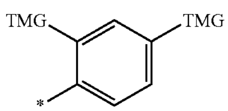
10-29
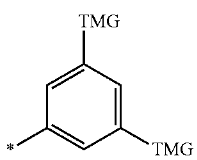
10-30
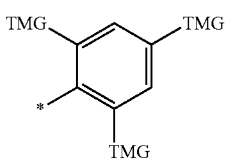
10-31
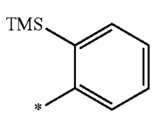
10-32
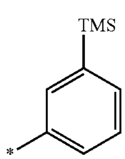
10-33
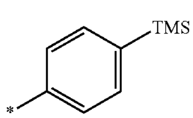
-continued
10-34
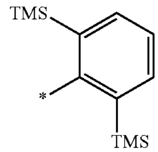
10-35
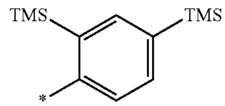
10-36
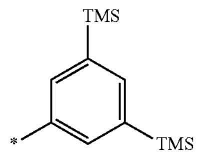
10-37
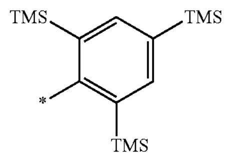
10-38
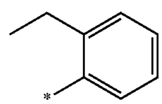
10-39
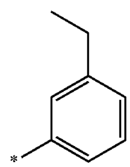
10-40
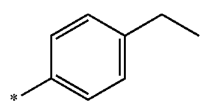
10-41
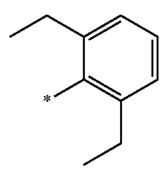
10-42
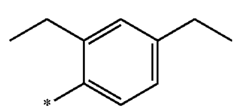
10-43
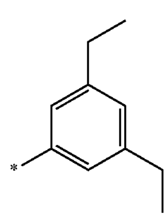

-continued
10-44
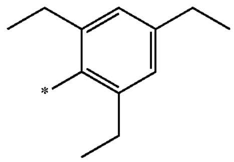
10-45
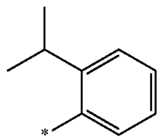
10-46
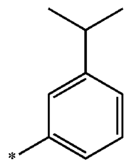
10-47
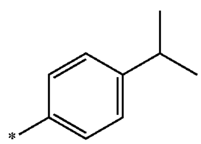
10-48
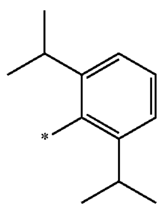
10-49
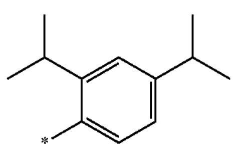
10-50
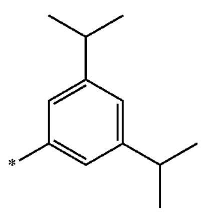
10-51
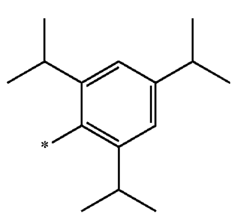
10-52
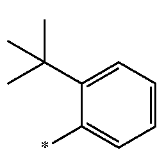
-continued
10-53
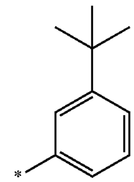
10-54
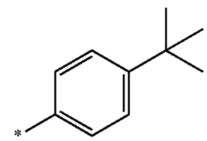
10-55
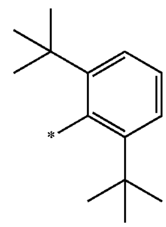
10-56
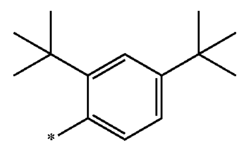
10-57
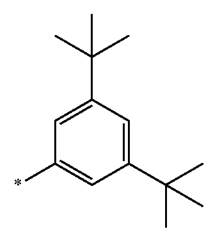
10-58
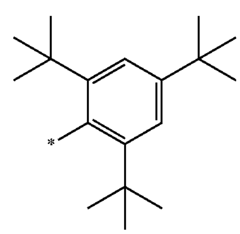
10-59
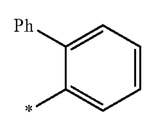
10-60
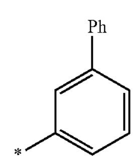
10-61
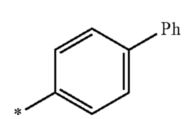

-continued
10-62
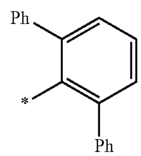
10-63
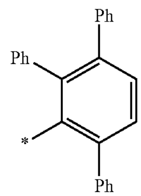
10-64
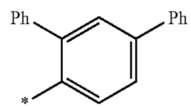
10-65
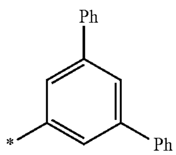
10-66
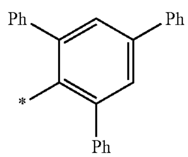
10-67
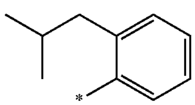
10-68
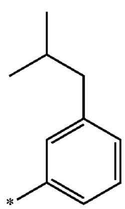
10-69
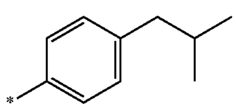
10-70
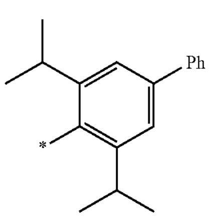
-continued
10-71
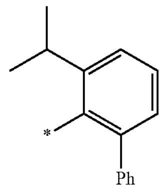
10-72
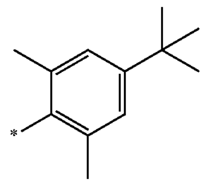
10-73
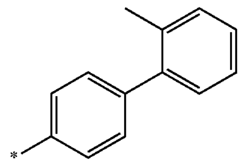
10-74
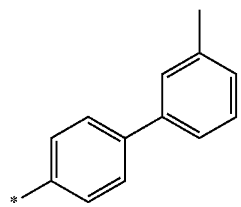
10-75
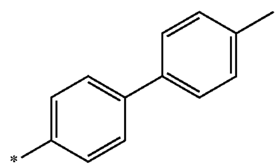
10-76
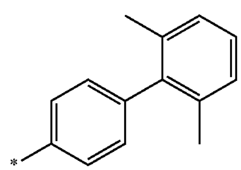
10-77
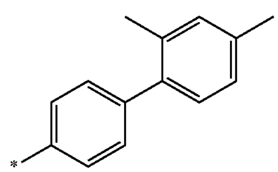
10-78
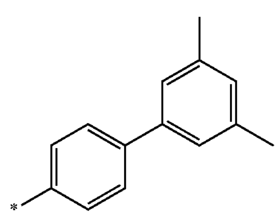

-continued
10-79
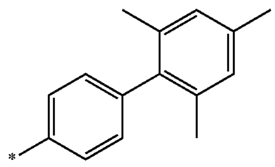
10-80
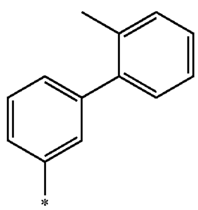
10-81
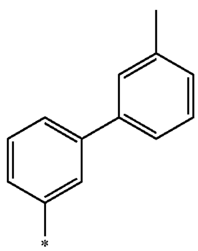
10-82
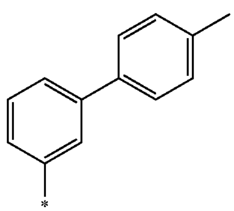
10-83
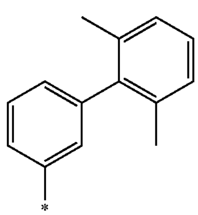
10-84
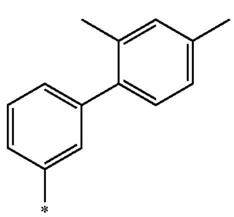
10-85
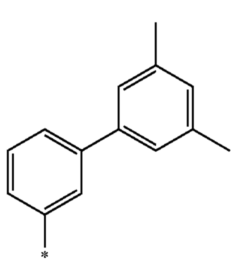
-continued
10-86
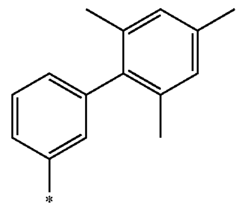
10-87
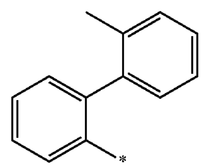
10-88
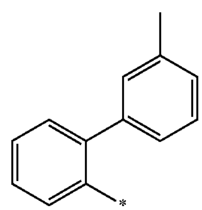
10-89
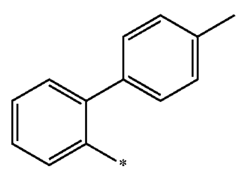
10-90
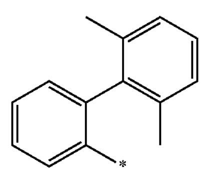
10-91
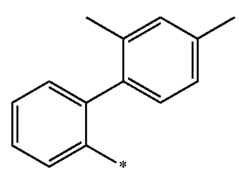
10-92
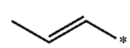
10-92
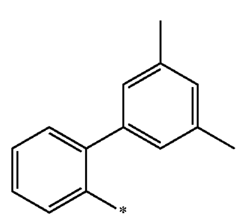
10-93
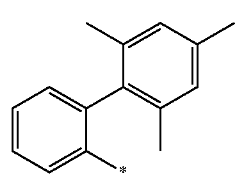

-continued
10-94
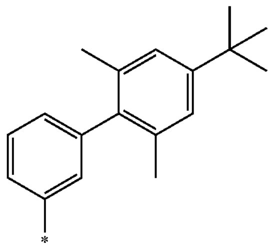
10-95
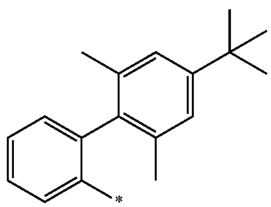
10-96
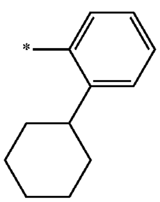
10-97
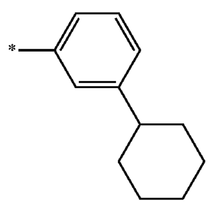
10-98
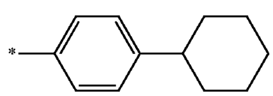
10-99
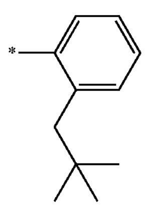
10-100
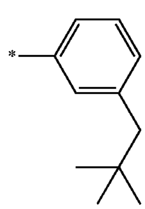
10-101
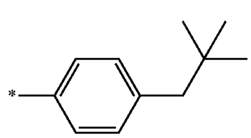
-continued
10-102
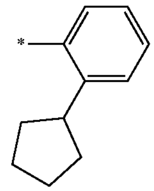
10-103
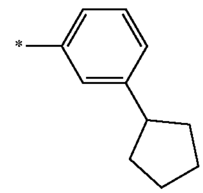
10-104
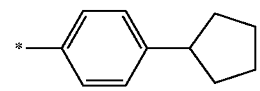
10-105
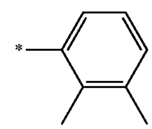
10-106
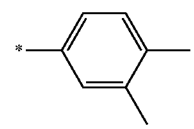
10-107
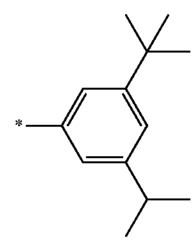
10-108
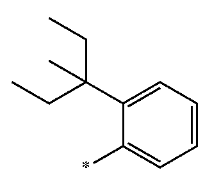
10-109
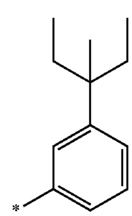
10-110
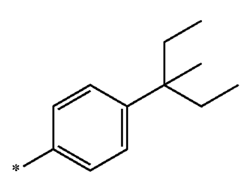

-continued
10-111
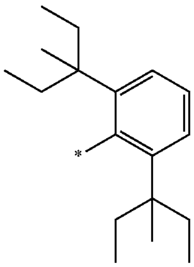
10-112
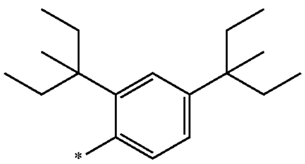
10-113
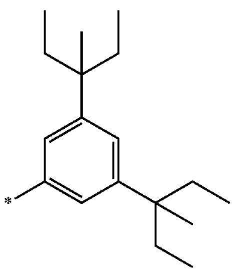
10-114
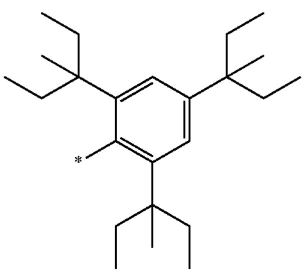
10-115
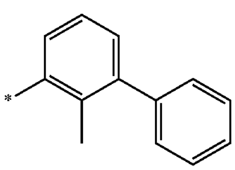
10-116
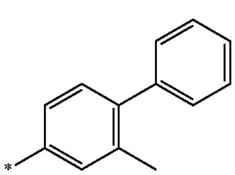
10-117
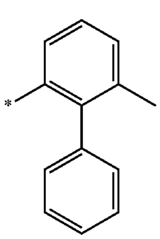
-continued
10-118
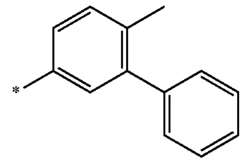
10-119
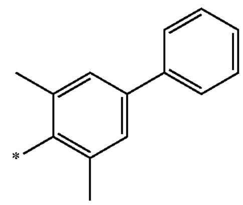
10-120
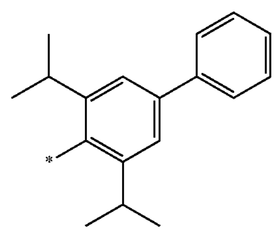
10-121
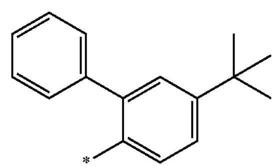
10-122
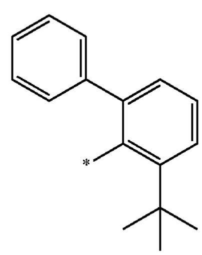
10-123
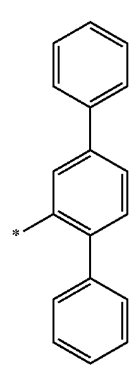

-continued
10-124
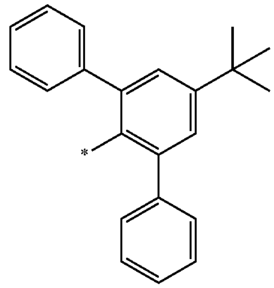
10-125
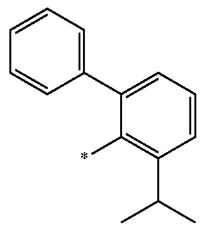
10-126
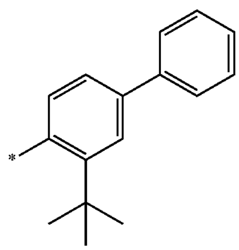
10-127
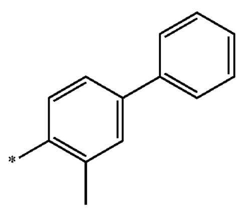
10-128
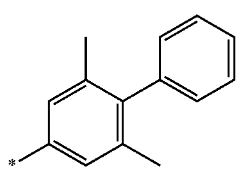
10-129
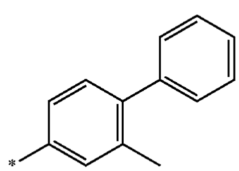
10-201
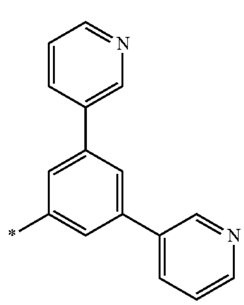
-continued
10-202
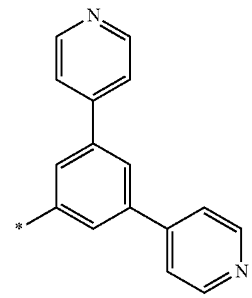
10-203
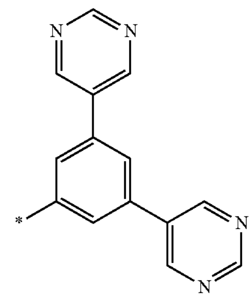
10-204
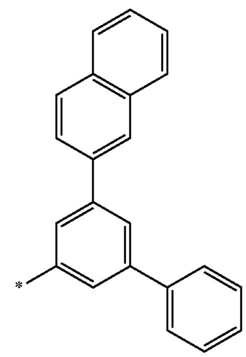
10-205
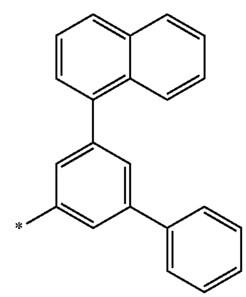
10-206
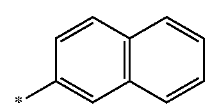
10-207
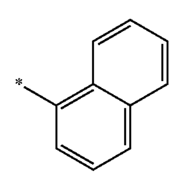

-continued
10-208
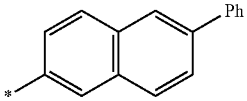
10-209
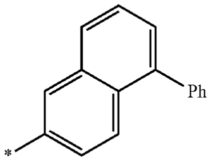
10-210
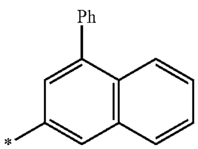
10-211
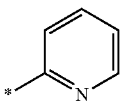
10-212
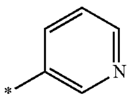
10-213
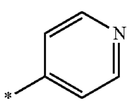
10-214
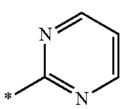
10-215
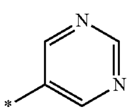
10-216
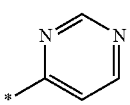
10-217
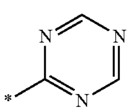
10-218
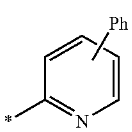
10-219
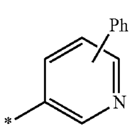
10-220
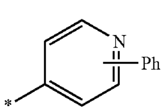
-continued
10-221
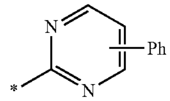
10-222
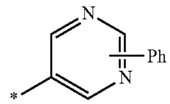
10-223
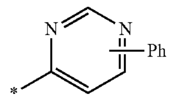
10-224
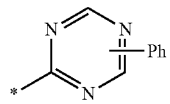
10-225
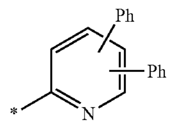
10-226
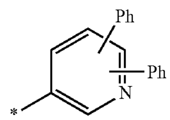
10-227
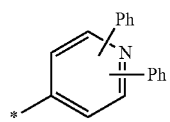
10-228
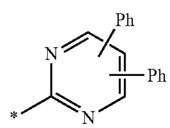
10-229
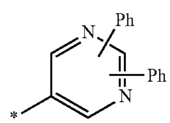
10-230
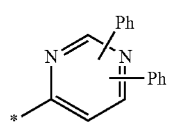
10-231
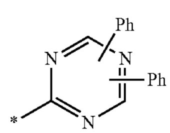
10-232
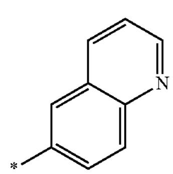

-continued
10-233
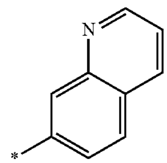
10-234
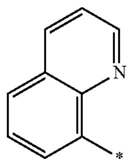
10-235
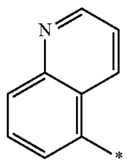
10-236
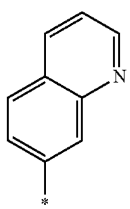
10-237
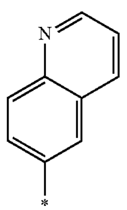
10-238
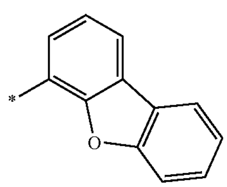
10-239
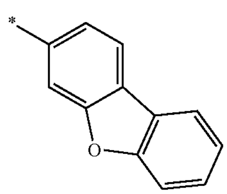
10-240
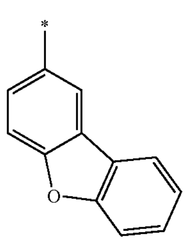
-continued
10-241
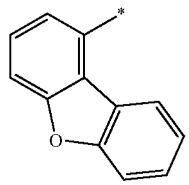
10-242
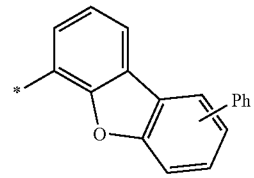
10-243
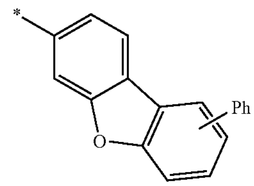
10-244
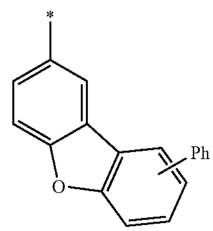
10-245
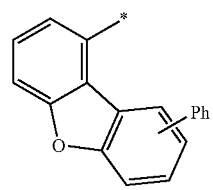
10-246
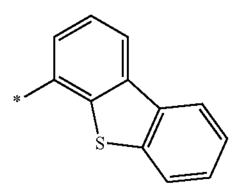
10-247
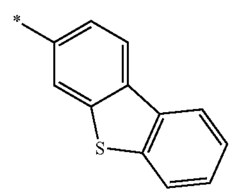
10-248
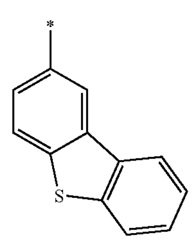

10-249
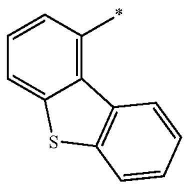
10-250
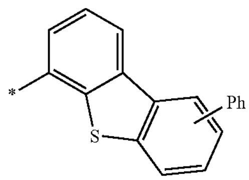
10-251
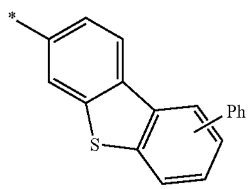
10-252
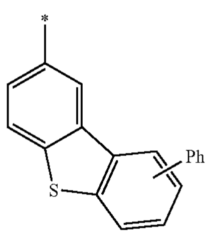
10-253
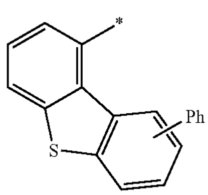
10-254
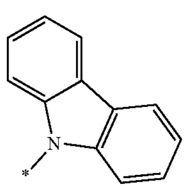
10-255
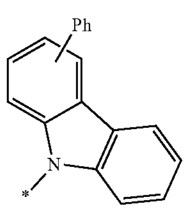
10-256
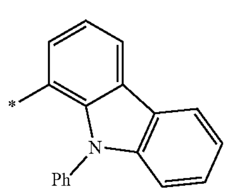
10-257
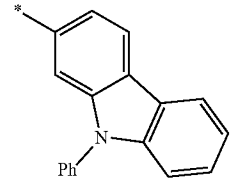
10-258
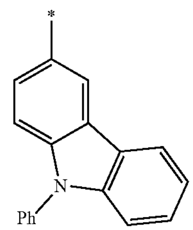
10-259
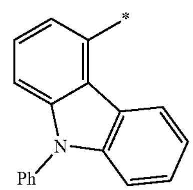
10-260
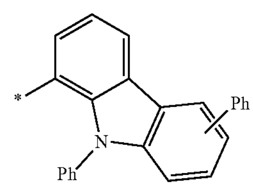
10-261
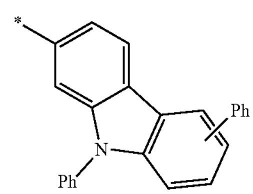
10-262
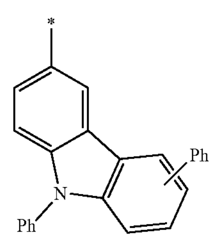
10-263
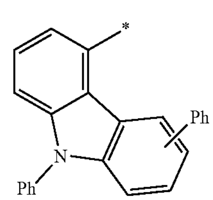

-continued
10-264
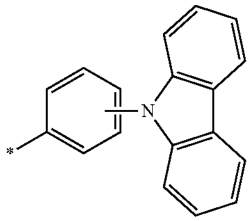
10-265
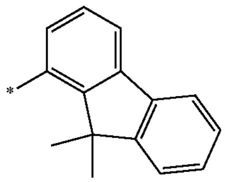
10-266
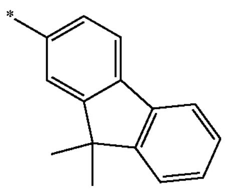
10-267
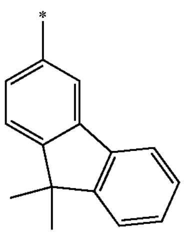
10-268
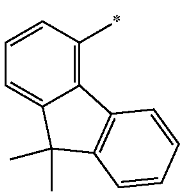
10-269
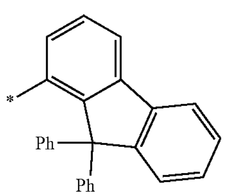
10-270
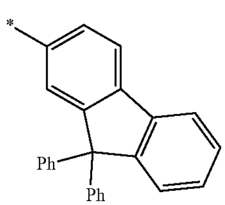
-continued
10-271
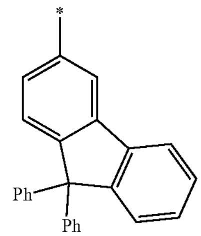
10-272
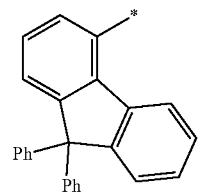
10-273
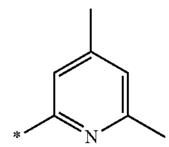
10-274
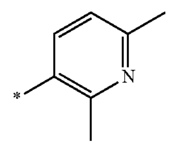
10-275
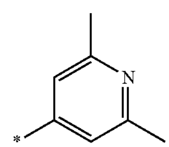
10-276
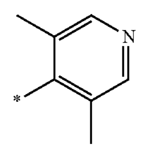
10-277
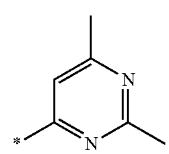
10-278
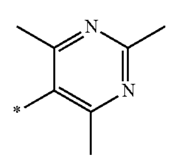
10-279
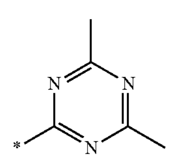

-continued
10-280
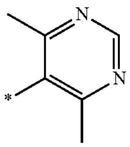
10-281
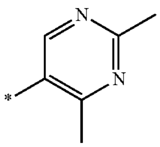
10-282
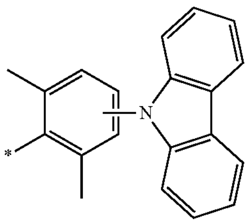
10-283
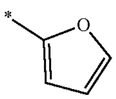
10-284
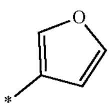
10-285
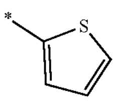
10-286
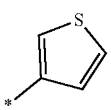
10-287
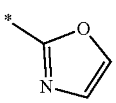
10-288
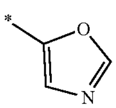
10-289
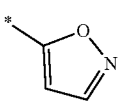
10-290
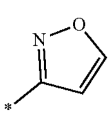
10-291
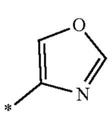
-continued
10-292
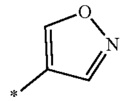
10-293
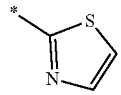
10-294
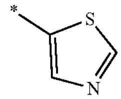
10-295
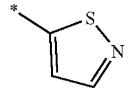
10-296
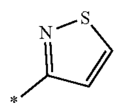
10-297
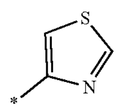
10-298
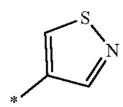
10-301
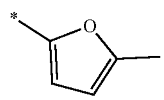
10-299
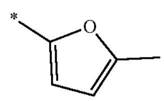
10-300
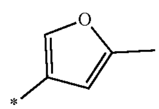
10-301
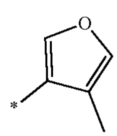
10-302
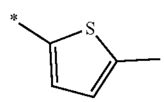
10-303
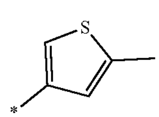
10-304
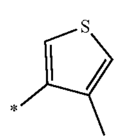

-continued
10-305
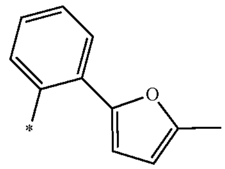
10-306
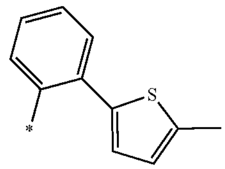
10-307
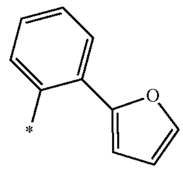
10-308
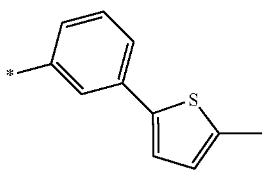
10-309
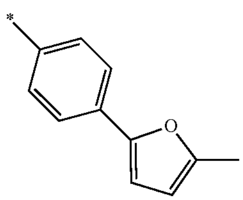
10-310
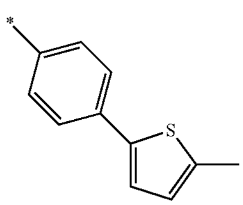
10-311
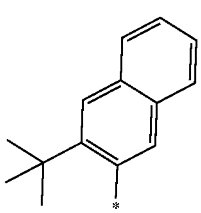
10-312
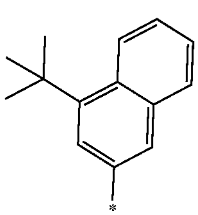
-continued
10-313
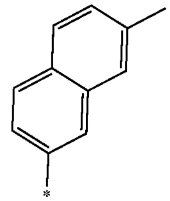
10-314
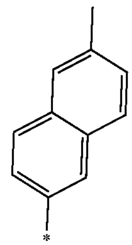
10-315
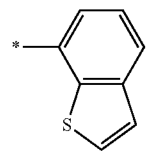
10-316
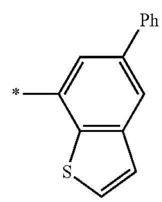
10-317
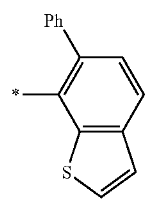
10-318
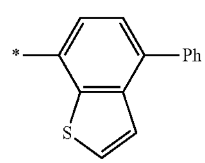
10-319
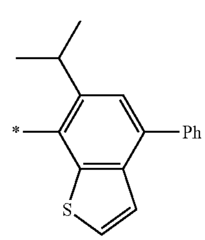

-continued
10-320
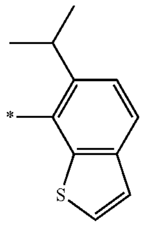
10-321
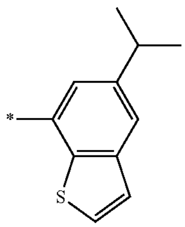
10-322
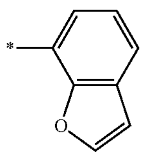
10-323
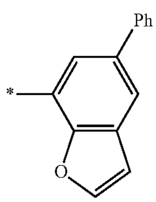
10-324
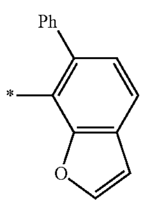
10-325
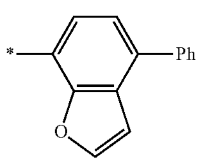
10-326
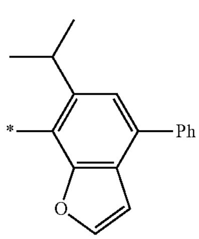
-continued
10-327
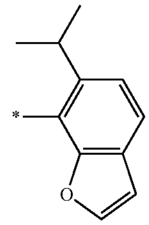
10-328
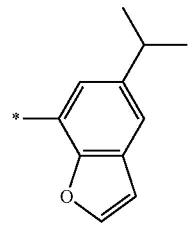
10-329
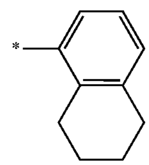
10-330
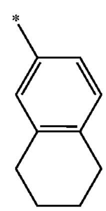
10-331
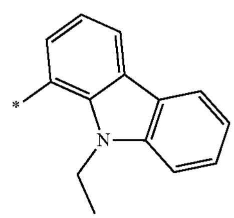
10-332
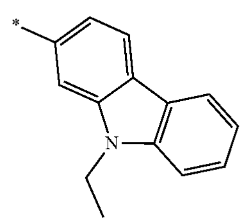
10-333
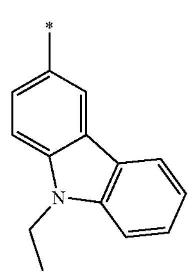

-continued 10-334

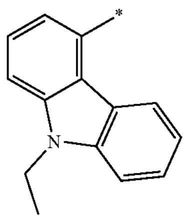

10-335

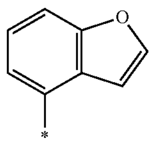

10-336

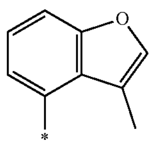

10-337

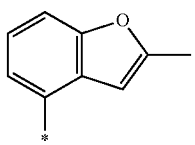

10-338

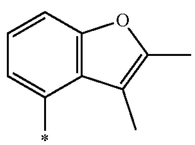

10-339

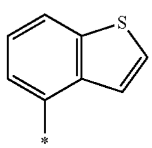

10-340

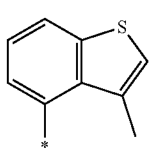

10-341

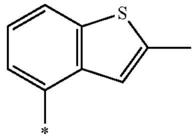

10-342

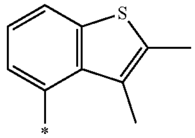

-continued 10-343

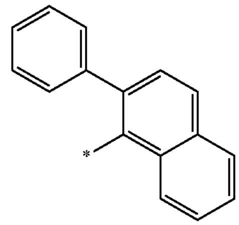

10-344

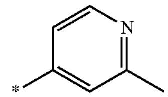

10-345

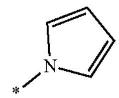

10-346

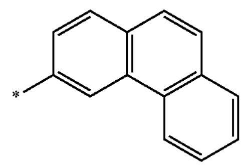

10-347

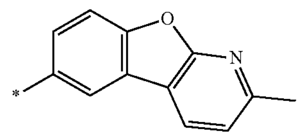

10-348

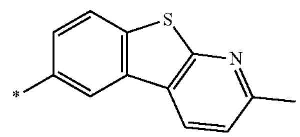

10-349

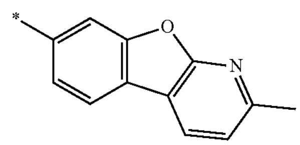

10-350

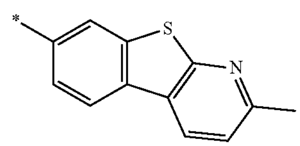

wherein, in Formulae 9-1 to 9-43, 9-201 to 9-237, 10-1 to 10-129, and 10-201 to 10-350, * indicates a binding site to a neighboring atom, Ph may be a phenyl group, TMS may be a trimethylsilyl group, and TMG may be a trimethylgermyl group.

In one or more embodiments, $R_1$ to $R_4$ may each independently be a group represented by one of Formula 2-1 or 2-2, hydrogen, deuterium, a methyl group, an ethyl group, an n-propyl group, an isopropyl group, an n-butyl group, an isobutyl group, a sec-butyl group, a tert-butyl group, an n-pentyl group, an isopentyl group, a 2-methylbutyl group, a sec-pentyl group, a tert-pentyl group, a neo-pentyl group, a 3-pentyl group, a 3-methyl-2-butyl group, a phenyl group, a biphenyl group, a $C_1$-$C_{20}$ alkylphenyl group, or a naphthyl group, and at least one of $R_1$ to $R_4$ may be a group represented by one of Formula 2-1 or 2-2.

In one or more embodiments, at least one of $R_1$ to $R_4$ may be:

—$Si(Q_1)(Q_2)(Q_3)$ or —$Ge(Q_1)(Q_2)(Q_3)$, or a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alkyl aryl group, a $C_1$-$C_{10}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, each substituted with at least one of —$Si(Q_1)(Q_2)(Q_3)$, —$Ge(Q_1)(Q_2)(Q_3)$, or a combination thereof.

In one or more embodiments, one of $R_1$ to $R_4$ may be a group represented by one of Formulae 2-1 or 2-2, and the others of $R_1$ to $R_4$ may each be hydrogen.

In one or more embodiments, one of $R_1$ to $R_4$, $R_{10}$, or $R_{20}$ may be a group represented by Formula 2-2.

In Formula 1-1, b10 is 1 or 2, and b20 is 1, 2, 3, 4, 5, 6, 7, 8, 9, or 10.

When b10 is 2, two of $R_{10}$(s) may be identical to or different from each other, and when b20 is 2 or more, two or more of $R_{20}$(s) may be identical to or different from each other.

In Formula 1-1, two of $R_{10}$(s); two or more of a plurality of $R_{20}$(s); or two or more adjacent groups of $R_5$, $R_6$, $R_{10}$, and $R_{20}$ may optionally be linked to each other to form a substituted or unsubstituted $C_5$-$C_{30}$ carbocyclic group or a substituted or unsubstituted $C_1$-$C_{30}$ heterocyclic group.

In one or more embodiments, two of $R_{10}$(s); two or more of a plurality of $R_{20}$(s); or two or more adjacent groups of $R_5$, $R_6$, $R_{10}$, and $R_{20}$ may optionally be linked to each other via a single bond, a double bond, or a first linking group to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$ (for example, a fluorene group, a carbazole group, a dibenzothiophene group, a dibenzofuran group, a dibenzosilole group, a xanthene group, an acridine group, or the like, each unsubstituted or substituted with at least one $R_{10a}$). $R_{10a}$ is as defined in connection with $R_1$.

In one or more embodiments, two of $R_{10}$(s); two or more of a plurality of $R_{20}$(s); or two or more adjacent groups of $R_5$, $R_6$, $R_{10}$, and $R_{20}$ may optionally be linked to each other to form a cyclopentane group, a cyclopentene group, a cyclopentadiene group, a furan group, a thiophene group, a pyrrole group, a silole group, an adamantane group, a norbornane group, a norbornene group, a cyclohexane group, a cyclohexene group, a benzene group, a naphthalene group, an indene group, an indole group, a benzofuran group, a benzothiophene group, a benzosilole group, a fluorene group, a carbazole group, a dibenzofuran group, a dibenzothiophene group, or dibenzosilole group, each unsubstituted or substituted with at least one $R_{10a}$. $R_{10a}$ is as defined in connection with $R_1$.

The first linking group may be *—N($R_8$)—*', *—B($R_8$)—*', *—P($R_8$)—*', *—C($R_8$)($R_9$)—*, *—Si($R_8$)($R_9$)—*', *—Ge($R_8$)($R_9$)—*', *—S—*', *—Se—*', *—O—*', *—C(=O)—*', *—S(=O)—*', *—S(=O)$_2$—*, C($R_8$)=*', *=C($R_8$)—*', *—C($R_8$)=C($R_9$)—*', *—C(=S)—*', or *—C≡C—*', wherein $R_8$ and $R_9$ are each as defined in connection with $R_{10}$, and * and *' each indicate a binding site to a neighboring atom.

In one or more embodiments, $Ln_1$ may be represented by one of Formulae 3-1 to 3-4:

3-1

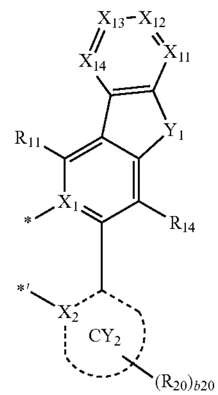

3-2

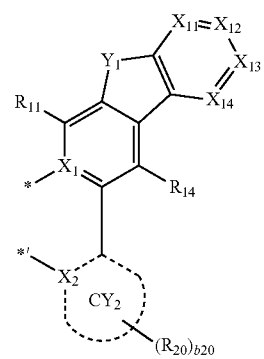

3-3

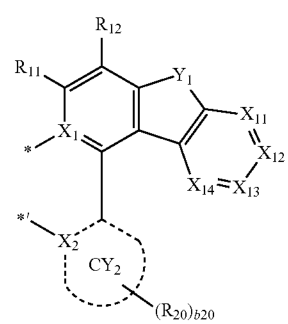

3-4

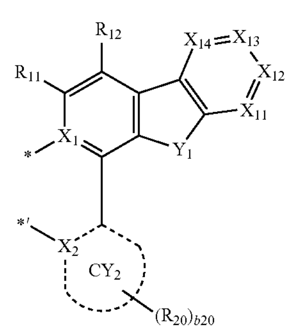

wherein, in Formulae 3-1 to 3-4, $X_1$, $X_2$, $Y_1$, $CY_2$, $X_{11}$ to $X_{14}$, $R_{20}$, and b20 are as defined in the present disclosure, $R_{11}$, $R_{12}$, and $R_{14}$ are each independently as defined in connection with $R_{10}$, and
* and *' each indicate a binding site to $M_1$.
n1 in Formula 1 is 1, 2, or 3.
$Ln_2$ in Formula 1 is a bidentate ligand.
In one or more embodiments, $Ln_2$ may be represented by one of Formulae 5, 6, or 8-1 to 8-11:
Formula 5
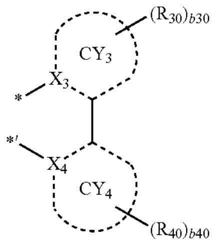
Formula 6
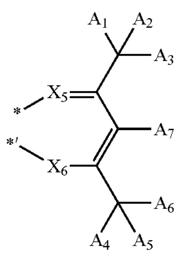
8-1
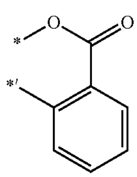
8-2
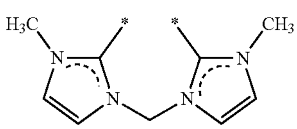
8-3
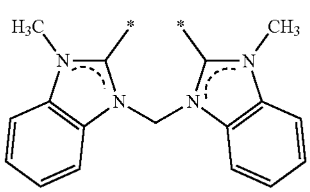
8-4
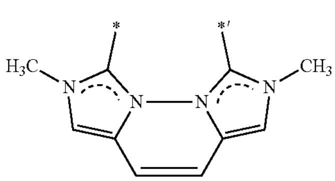
-continued
8-5
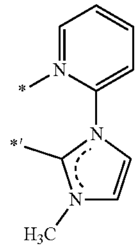
8-6
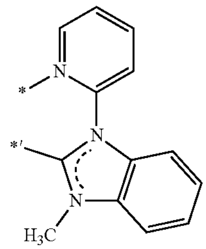
8-7
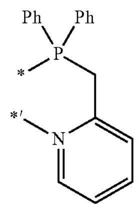
8-8
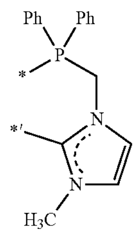
8-9
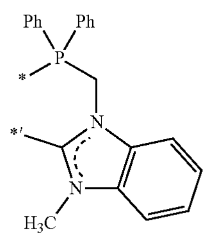
8-10
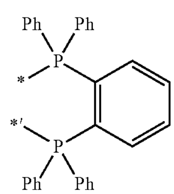
8-11
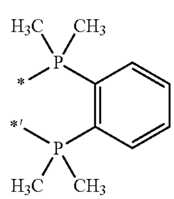

wherein, in Formulae 5, 6, and 8-1 to 8-11, $X_3$ may be C or N, and $X_4$ may be C or N, $X_5$ and $X_6$ may each independently be O or S, $CY_3$ and $CY_4$ may each independently be a $C_5$-$C_{30}$ carbocyclic group or a $C_1$-$C_{30}$ heterocyclic group, $R_{30}$, $R_{40}$, and $A_1$ to $A_7$ may each independently be hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, —$Ge(Q_1)(Q_2)(Q_3)$, or —$B(Q_1)(Q_2)$, b30 and b40 may each independently be 1, 2, 3, 4, 5, 6, 7, 8, 9, or 10, Ph may be a phenyl group, and

* and *' each indicate a binding site to $M_1$.

In one or more embodiments, $CY_3$ and $CY_4$ in Formula 5 are each independently as defined in connection with $CY_2$.

In one or more embodiments, $CY_3$ may be a pyridine group, a pyrimidine group, a pyridazine group, a triazine group, a quinoline group, an isoquinoline group, a quinoxaline group, a quinazoline group, a phenanthroline group, a pyrazole group, a triazole group, an imidazole group, an indole group, a benzopyrazole group, a benzimidazole group, an azadibenzothiophene group, an azadibenzofuran group, an azacarbazole group, an azafluorene group, or an azadibenzosilole group.

In one or more embodiments, $CY_3$ may be represented by one of Formulae CY3-1 to CY3-13:

CY3-1

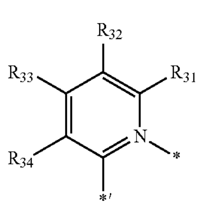

-continued

CY3-2

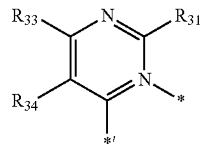

CY3-3

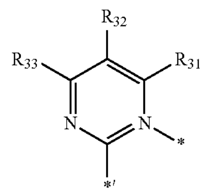

CY3-4

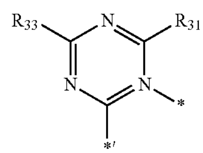

CY3-5

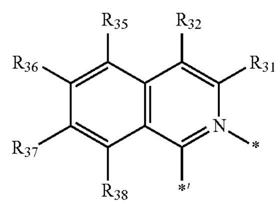

CY3-6

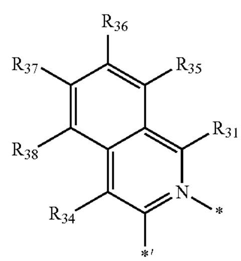

CY3-7

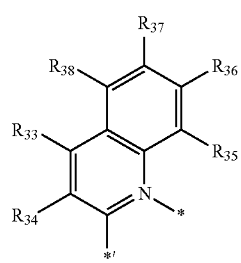

CY3-8

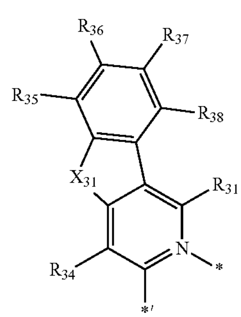

-continued

CY3-9

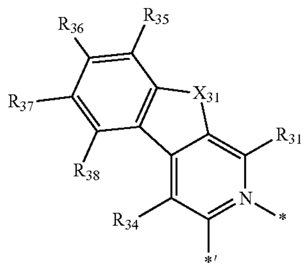

CY3-10

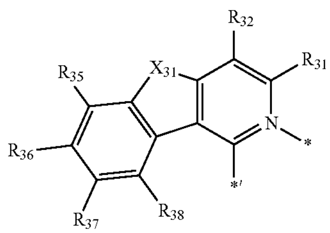

CY3-11

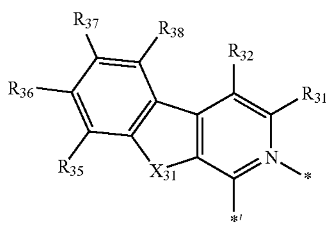

CY3-12

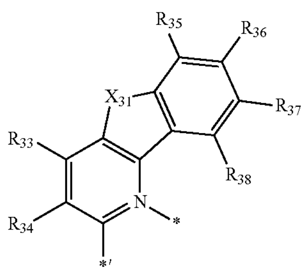

CY3-13

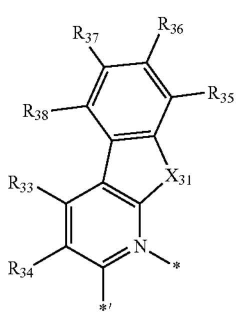

wherein, in Formulae CY3-1 to CY3-13,

- $X_{31}$ may be O, S, $N(R_{39a})$, $C(R_{30a})(R_{39b})$, or $Si(R_{39a})(R_{39b})$,
- $R_{31}$ to $R_{38}$, $R_{39a}$, and $R_{30b}$, are each independently as defined in connection with $R_{30}$,
- two or more adjacent groups of $R_{31}$ to $R_{38}$, $R_{39a}$, and $R_{39b}$ may optionally be linked to each other to form a substituted or unsubstituted $C_5$-$C_{30}$ carbocyclic group or a substituted or unsubstituted $C_1$-$C_{30}$ heterocyclic group, and
- * and *' each indicate a binding site to a neighboring atom.

In one or more embodiments, two or more adjacent groups of $R_{31}$ to $R_{38}$, $R_{39a}$, and $R_{39b}$ may optionally be linked to each other to form a cyclopentane group, a cyclopentene group, a cyclopentadiene group, a furan group, a thiophene group, a pyrrole group, a silole group, an adamantane group, a norbornane group, a norbornene group, a cyclohexane group, a cyclohexene group, a benzene group, a naphthalene group, an indene group, an indole group, a benzofuran group, a benzothiophene group, a benzosilole group, a fluorene group, a carbazole group, a dibenzofuran group, a dibenzothiophene group, or a dibenzosilole group, each unsubstituted or substituted with at least one $R_{10a}$. $R_{10a}$ is as defined in connection with $R_1$.

In one or more embodiments, $CY_4$ may be a benzene group, a naphthalene group, a 1,2,3,4-tetrahydronaphthalene group, a benzothiophene group, a benzofuran group, an indole group, an indene group, a benzosilole group, a dibenzothiophene group, a dibenzofuran group, a carbazole group, a fluorene group, a dibenzosilole group, an azadibenzothiophene group, an azadibenzofuran group, an azacarbazole group, an azafluorene group, or an azadibenzosilole group.

In one or more embodiments, $CY_4$ may be represented by one of Formulae CY4-1 to CY4-13:

CY4-1

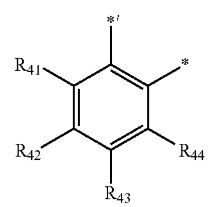

CY4-2

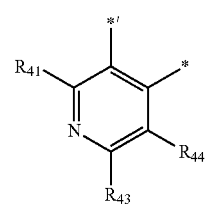

CY4-3

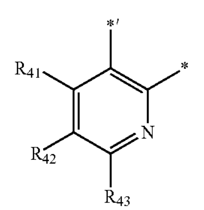

CY4-4

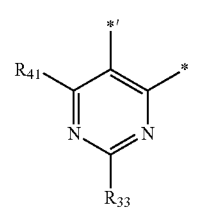

CY4-5

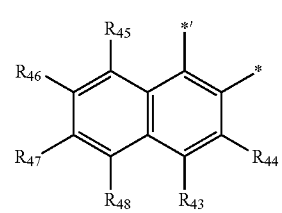

-continued

CY4-6

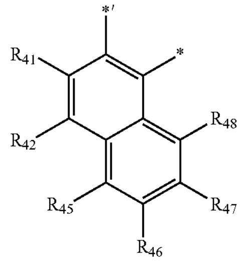

CY4-7

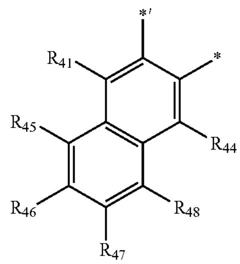

CY4-8

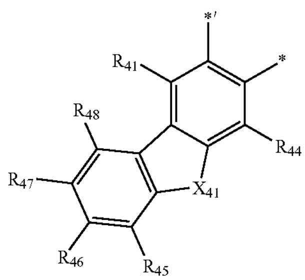

CY4-9

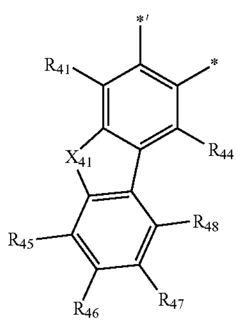

CY4-10

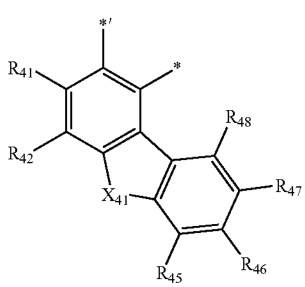

-continued

CY4-11

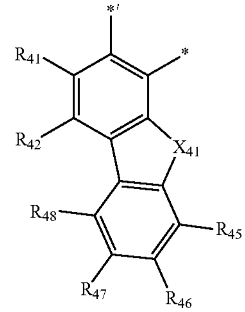

CY4-12

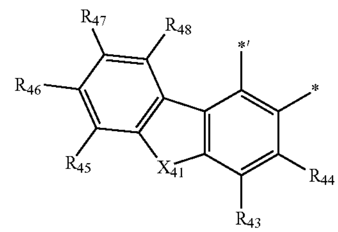

CY4-13

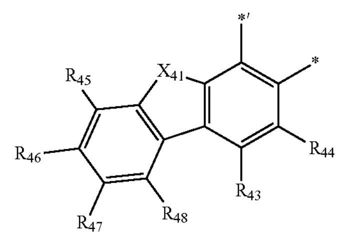

wherein, in Formulae CY4-1 to CY4-13, $X_{41}$ may be O, S, $N(R_{49a})$, $C(R_{49a})(R_{49b})$, or $Si(R_{49a})(R_{49b})$, $R_{41}$ to $R_{48}$, $R_{49a}$, and $R_{40b}$, are each independently as defined in connection with $R_{40}$, two or more adjacent groups of $R_{41}$ to $R_{48}$, $R_{49a}$, and $R_{40b}$, may optionally be linked to each other to form a substituted or unsubstituted $C_5$-$C_{30}$ carbocyclic group or a substituted or unsubstituted $C_1$-$C_{30}$ heterocyclic group, and

* and *' each indicate a binding site to a neighboring atom.

In one or more embodiments, two or more adjacent groups of $R_{41}$ to $R_{43}$, $R_{49a}$, and $R_{49b}$ may optionally be linked to each other to form a cyclopentane group, a cyclopentene group, a cyclopentadiene group, a furan group, a thiophene group, a pyrrole group, a silole group, an adamantane group, a norbornane group, a norbornene group, a cyclohexane group, a cyclohexene group, a benzene group, a naphthalene group, an indene group, an indole group, a benzofuran group, a benzothiophene group, a benzosilole group, a fluorene group, a carbazole group, a dibenzofuran group, a dibenzothiophene group, or a dibenzosilole group, each unsubstituted or substituted with at least one $R_{10a}$. $R_{10a}$ is as defined in connection with $R_1$.

In one or more embodiments, $X_3$ may be N, and $X_4$ may be C, a bond between $M_1$ and $X_3$ may be a coordinate bond, and a bond between $M_1$ and $X_4$ may be a covalent bond.

In one or more embodiments, $X_5$ and $X_6$ may each be O, a bond between $M_1$ and $X_5$ may be a coordinate bond, and a bond between $M_1$ and $X_6$ may be a covalent bond.

$R_{30}$ and $R_{40}$ are each independently as defined in connection with $R_5$, $R_6$, $R_{10}$, or $R_{20}$.
When b30 is 2 or more, two or more of $R_{30}$(s) may be identical to or different from each other, and when b40 is 2 or more, two or more of $R_{40}$(s) may be identical to or different from each other.
In one or more embodiments, $Ln_2$ may be represented by one of Formulae 5-1 to 5-129:
5-1
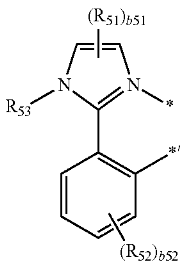
5-2
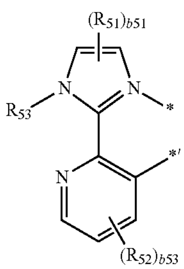
5-3
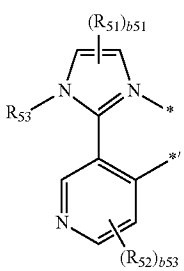
5-4
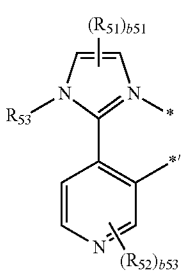
5-5
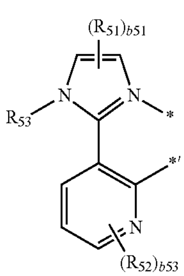
-continued
5-6
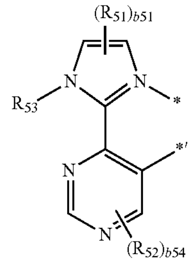
5-7
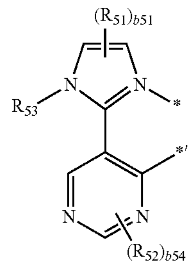
5-8
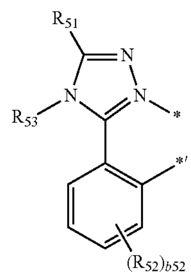
5-9
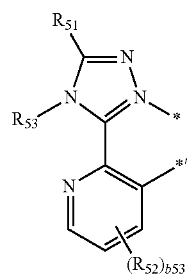
5-10
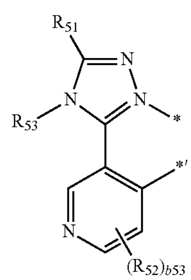
5-11
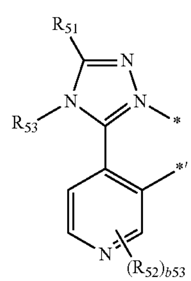

-continued
5-12
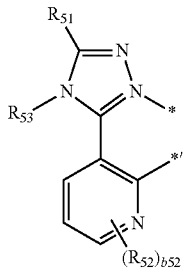
5-13
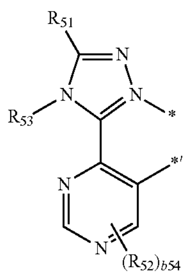
5-14
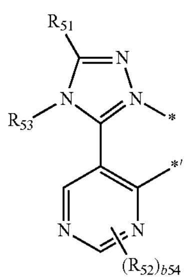
5-15
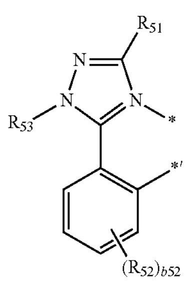
5-16
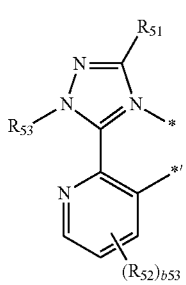
-continued
5-17
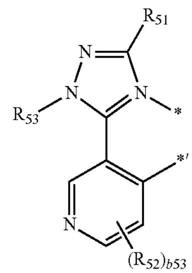
5-18
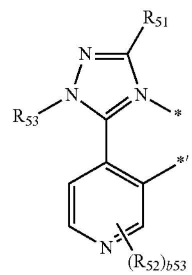
5-19
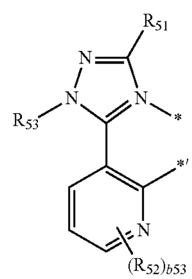
5-20
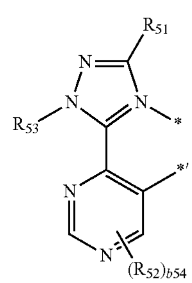
5-21
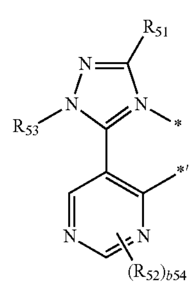

-continued
5-22
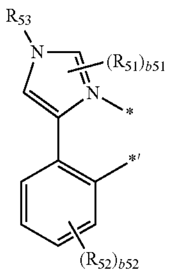
5-23
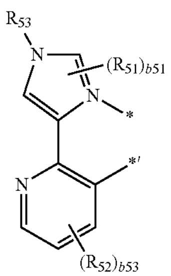
5-24
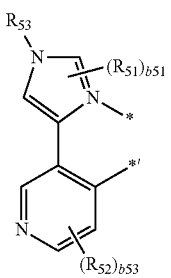
5-25
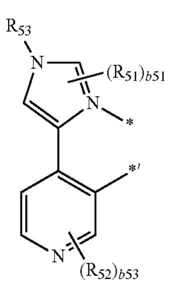
5-26
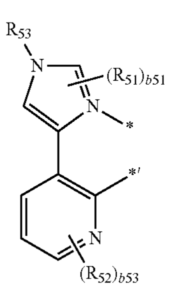
-continued
5-27
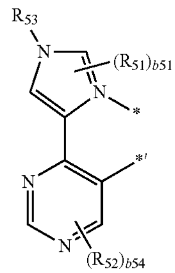
5-28
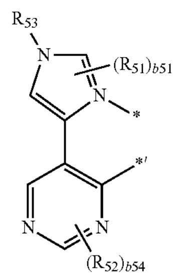
5-29
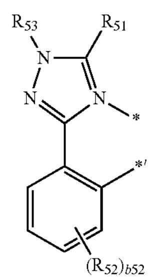
5-30
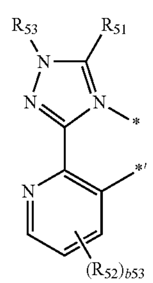
5-31
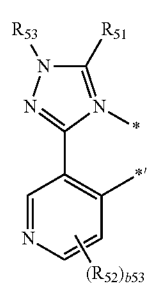

-continued
5-32
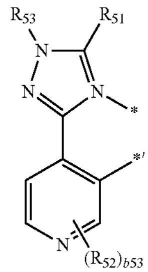
5-33
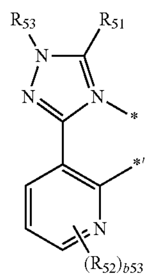
5-34
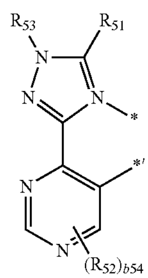
5-35
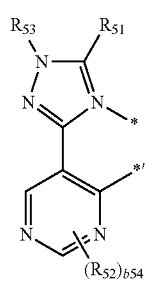
5-36
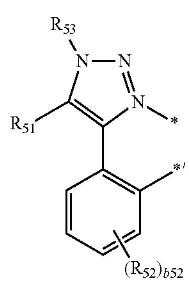
-continued
5-37
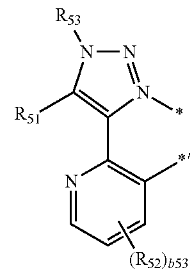
5-38
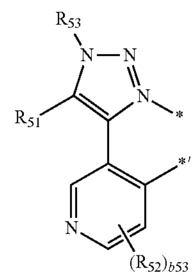
5-39
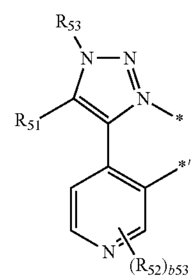
5-40
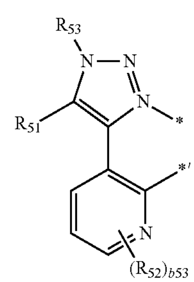
5-41
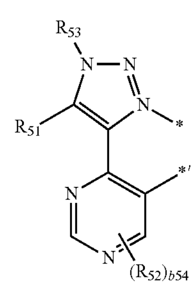

5-42
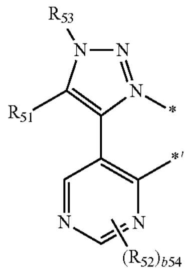
5-43
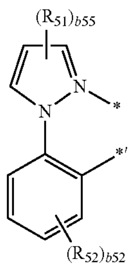
5-44
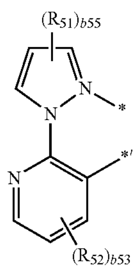
5-45
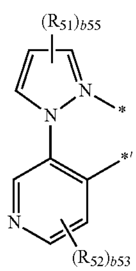
5-46
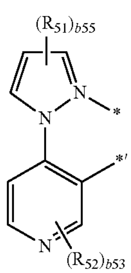
5-47
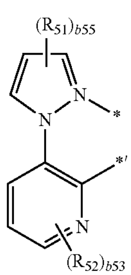
5-48
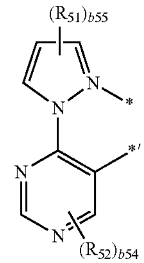
5-49
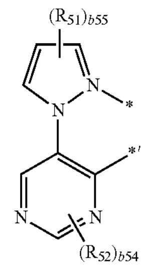
5-50
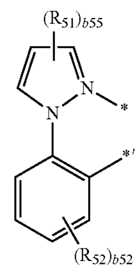
5-51
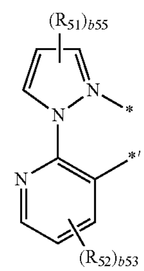
5-52
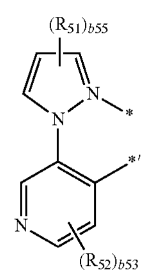
5-53
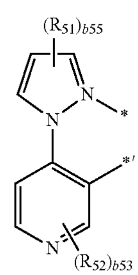

-continued
5-54
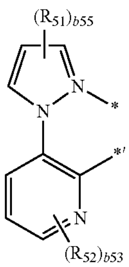
5-55
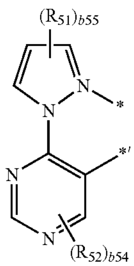
5-56
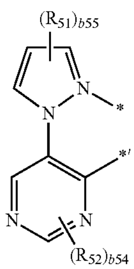
5-57
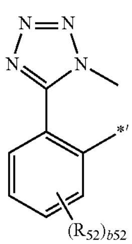
5-58
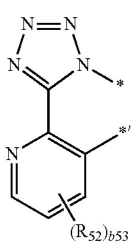
5-59
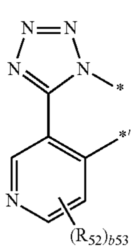
-continued
5-60
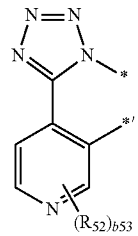
5-61
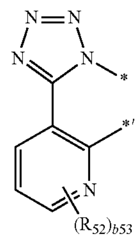
5-62
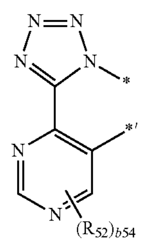
5-63
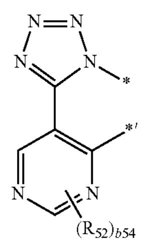
5-64
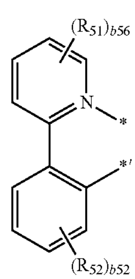
5-65
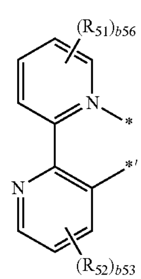

-continued
5-66
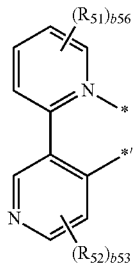
5-67
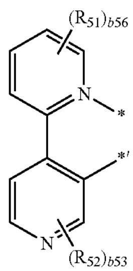
5-68
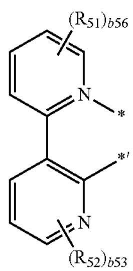
5-69
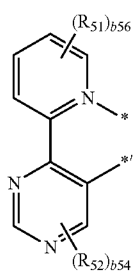
5-70
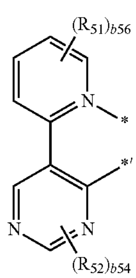
5-71
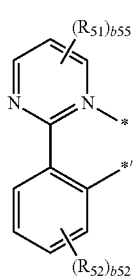
-continued
5-72
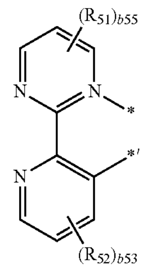
5-73
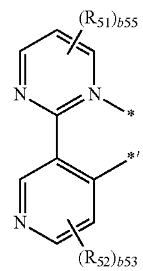
5-74
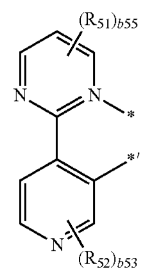
5-75
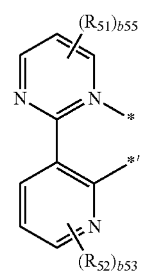
5-76
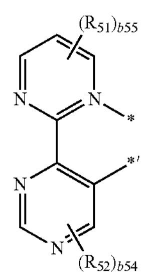
5-77
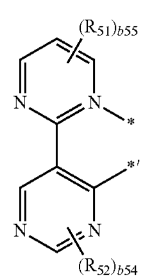

-continued
5-78
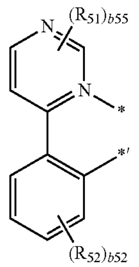
5-79
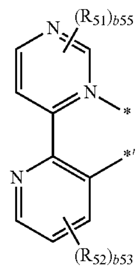
5-80
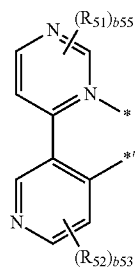
5-81
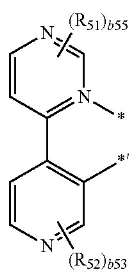
5-82
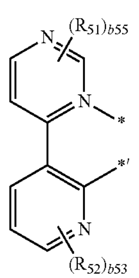
5-83
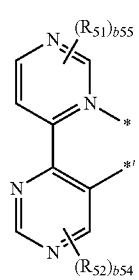
-continued
5-84
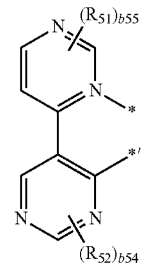
5-85
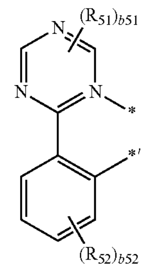
5-86
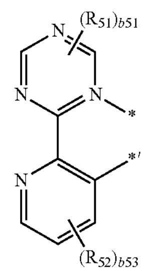
5-87
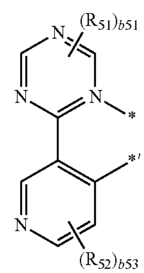
5-88
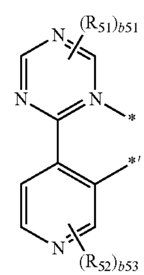
5-89
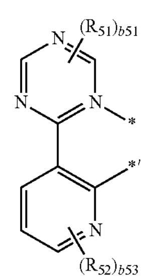

-continued
5-90
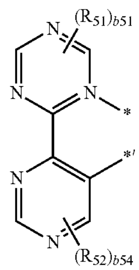
5-91
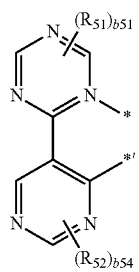
5-92
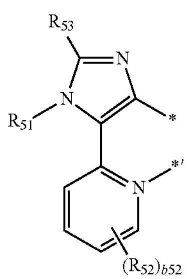
5-93
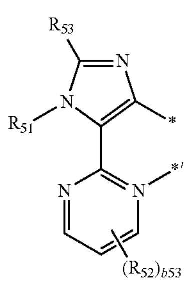
5-94
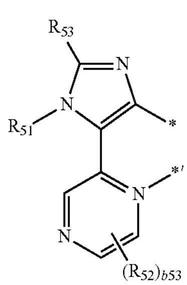
-continued
5-95
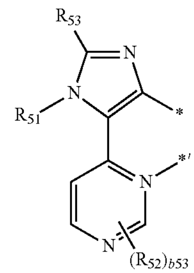
5-96
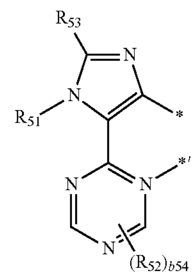
5-97
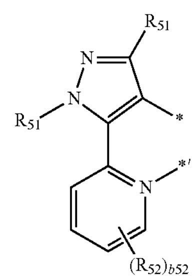
5-98
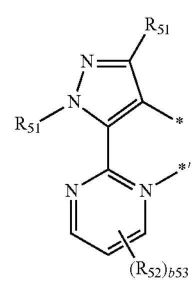
5-99
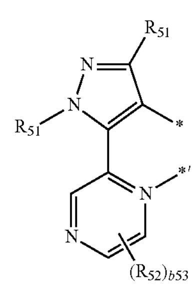

-continued
5-100
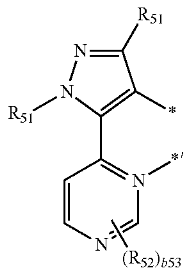
5-101
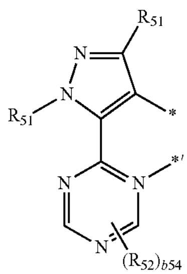
5-102
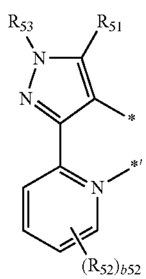
5-103
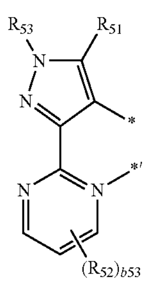
5-104
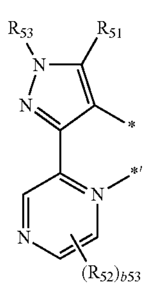
-continued
5-105
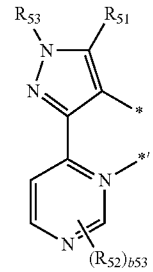
5-106
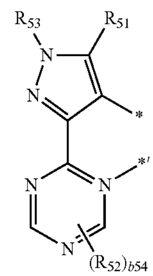
5-107
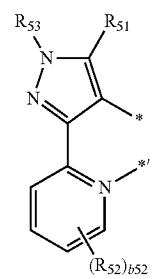
5-108
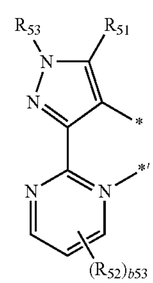
5-109
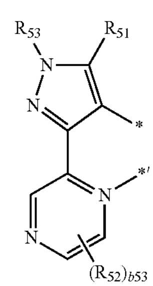

-continued
5-110
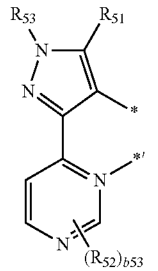
5-111
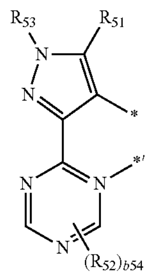
5-112
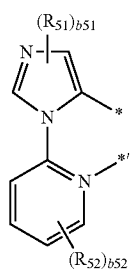
5-113
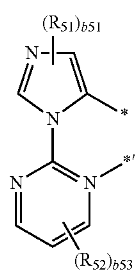
5-114
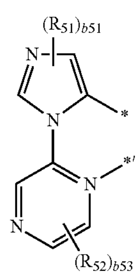
5-115
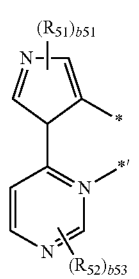
-continued
5-116
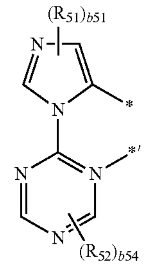
5-117
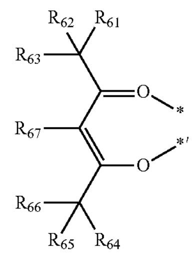
5-118
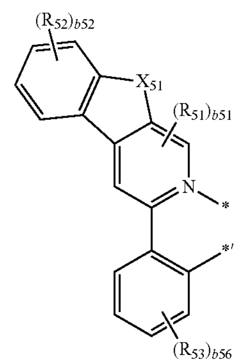
5-119
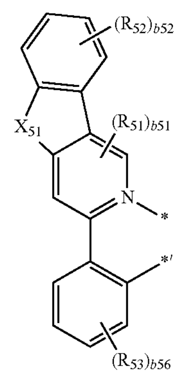
5-120
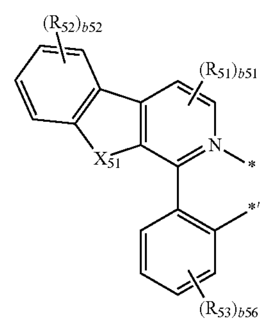

-continued
5-121
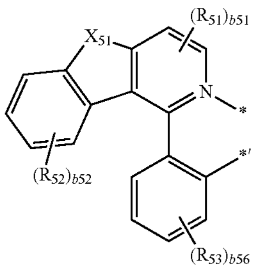
5-122
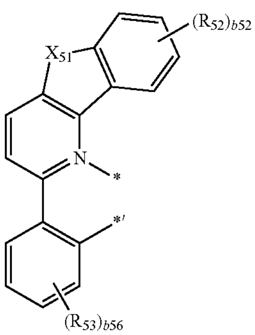
5-123
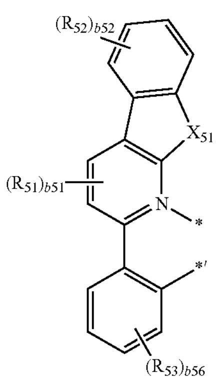
5-124
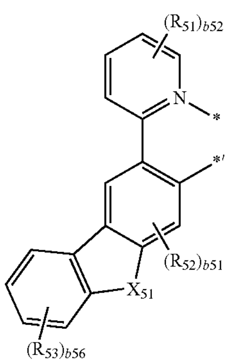
-continued
5-125
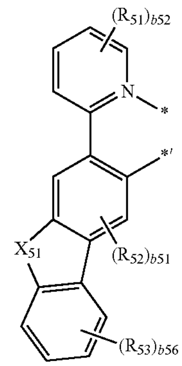
5-126
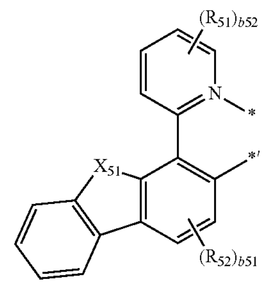
5-127
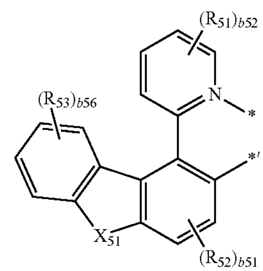
5-128
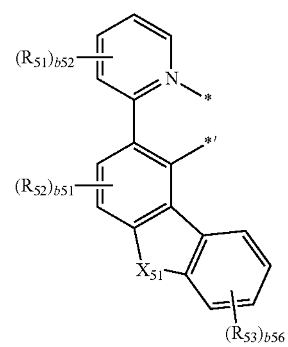
5-129
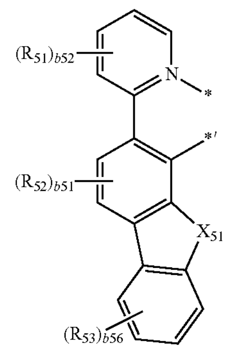

wherein, in Formulae 5-1 to 5-129, $X_{51}$ may be O, S, $N(R_{54})$, $C(R_{54})(R_{55})$, or $Si(R_{54})(R_{55})$, $R_{51}$ to $R_{55}$ and $R_{61}$ to $R_{67}$ may each independently be:

hydrogen, deuterium, —F, —Cl, —Br, —I, $—SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, $—SF_5$, a $C_1$-$C_{20}$ alkyl group, a $C_1$-$C_{20}$ alkoxy group, or a $C_1$-$C_{20}$ alkylthio group;

a $C_1$-$C_{20}$ alkyl group, a $C_1$-$C_{20}$ alkoxy group, or a $C_1$-$C_{60}$ alkylthio group, each substituted with at least one of deuterium, —F, —Cl, —Br, —I, $—SF_5$, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, a bicyclo[2.2.1]heptanyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkylphenyl group, a naphthyl group, a pyridinyl group, a pyrimidinyl group, or a combination thereof;

a cyclopentyl group, a cyclohexyl group, a cycloheptyl group, a cyclooctyl group, a bicyclo[2.2.1]heptanyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, or an imidazopyrimidinyl group;

a cyclopentyl group, a cyclohexyl group, a cycloheptyl group, a cyclooctyl group, a bicyclo[2.2.1]heptanyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, or an imidazopyrimidinyl group, each substituted with at least one of deuterium, —F, —Cl, —Br, —I, $—SF_5$, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_1$-$C_{20}$ alkylthio group, a cyclopentyl group, a cyclohexyl group, a cycloheptyl group, a cyclooctyl group, a bicyclo[2.2.1]heptanyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, $—Si(Q_{11})(Q_{12})(Q_{13})$, $—B(Q_{11})(Q_{12})$, $—N(Q_{11})(Q_{12})$, or a combination thereof, or $—Si(Q_1)(Q_2)(Q_3)$, $—B(Q_1)(Q_2)$, or $—N(Q_1)(Q_2)$, wherein $Q_1$ to $Q_3$ and $Q_{11}$ to $Q_{13}$ may each independently be:

a methyl group, an ethyl group, an n-propyl group, an isopropyl group, an n-butyl group, an isobutyl group, a sec-butyl group, a tert-butyl group, an n-pentyl group, an isopentyl group, a 2-methylbutyl group, a sec-pentyl group, a tert-pentyl group, a neo-pentyl group, 3-pentyl group, a 3-methyl-2-butyl group, a phenyl group, a biphenyl group, a $C_1$-$C_{20}$ alkylphenyl group, or a naphthyl group; or a methyl group, an ethyl group, an n-propyl group, an isopropyl group, an n-butyl group, an isobutyl group, a sec-butyl group, a tert-butyl group, an n-pentyl group, an isopentyl group, a 2-methylbutyl group, a sec-pentyl group, a tert-pentyl group, a neo-pentyl group, a 3-pentyl group, a 3-methyl-2-butyl group, a phenyl group, or a naphthyl group, each substituted with at least one of deuterium, a phenyl group, or a combination thereof, b51 and b54 may each independently be 1 or 2, b53 and b55 may each independently be 1, 2, or 3, b52 and b56 may each independently be 1, 2, 3, or 4, Ph is a phenyl group;

Ph-d5 is a phenyl group in which each hydrogen is substituted with deuterium; and

* and *' each indicate a binding site to a neighboring atom.

n2 in Formula 1-1 may be 0, 1, or 2.

In one or more embodiments, the organometallic compound may be a compound represented by one of Formulae 11-1 to 11-8:

11-1

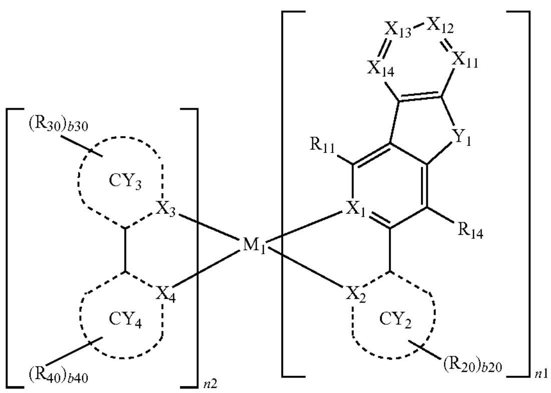

11-2

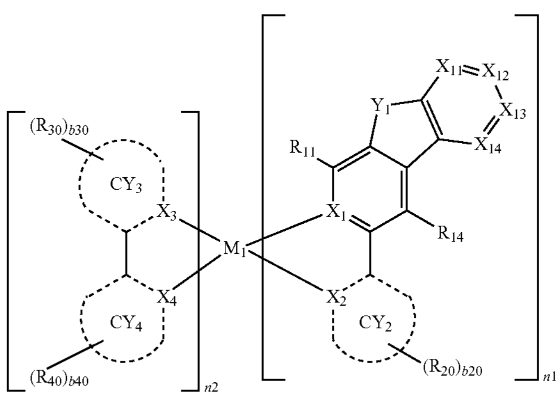

11-3

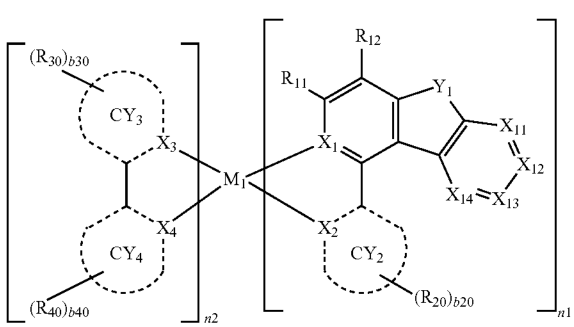

-continued 11-4

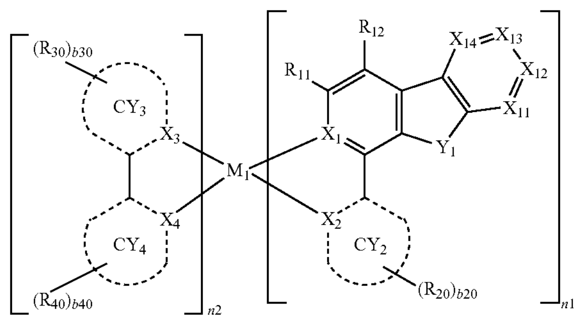

11-5

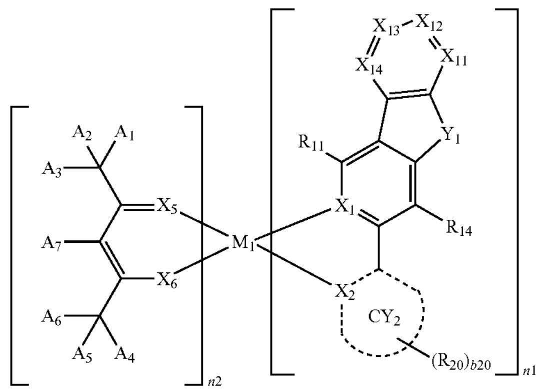

11-6

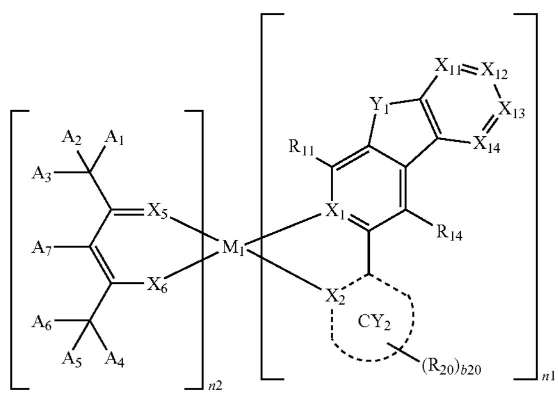

11-7

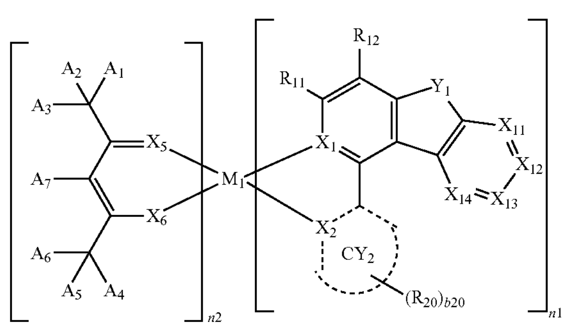

-continued 11-8

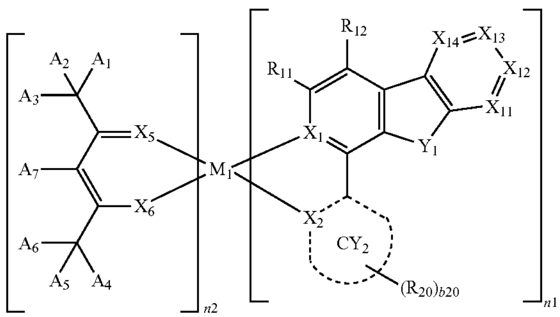

wherein, in Formulae 11-1 to 11-8, $M_1$, $X_1$, $X_2$, $Y_1$, $CY_2$, $X_{11}$ to $X_{14}$, $R_{20}$, and b20 are each as defined in the present disclosure, $R_1$, $R_{12}$, and $R_{14}$ are each independently as defined in connection with $R_1$, $X_3$ may be or N, and $X_4$ may be C or N, $X_6$ and $X_6$ may each independently be O or S, $CY_3$ and $CY_4$ may each independently be a $C_5$-$C_{30}$ carbocyclic group or a $C_1$-$C_{30}$ heterocyclic group, $R_{30}$, $R_{40}$, and $A_1$ to $A_7$ may each independently be hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, —$Ge(Q_1)(Q_2)(Q_3)$, or —$B(Q_1)(Q_2)$, and b30 and b40 may each independently be 1, 2, 3, 4, 5, 6, 7, 8, 9, or 10.

In one or more embodiments, the organometallic compound may be electrically neutral.

In one or more embodiments, $M_1$ may be Ir, and the sum of n1 and n2 may be 3.

In one or more embodiments, the organometallic compound may be one of Compounds 1 to 196:

1

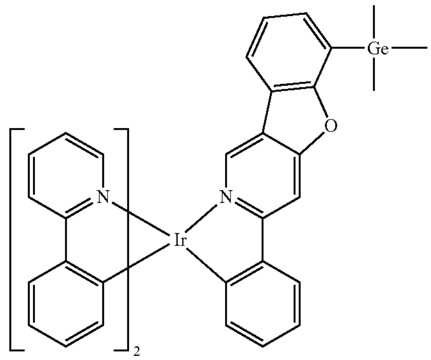

2

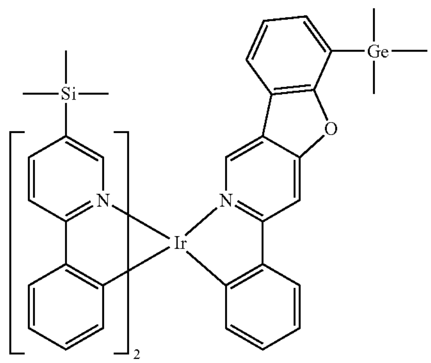

3

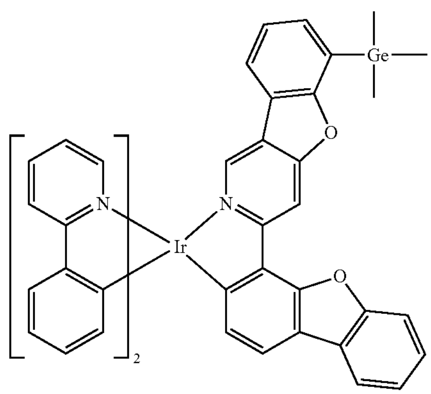

4

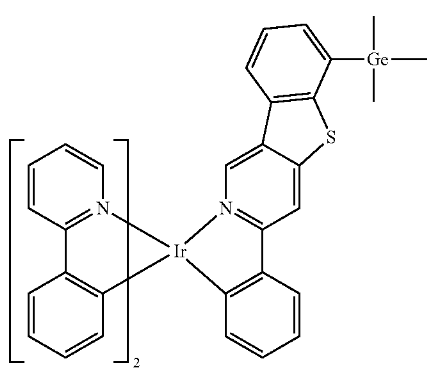

-continued
5
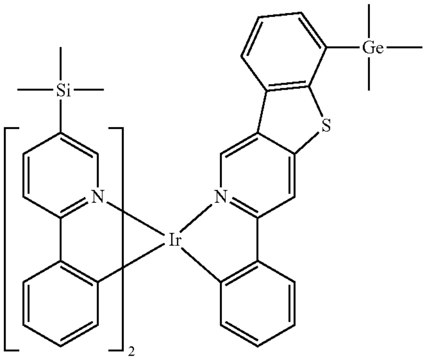
6
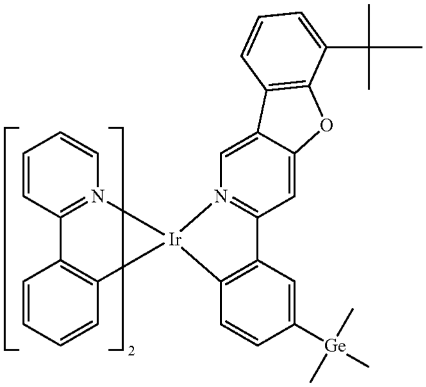
7
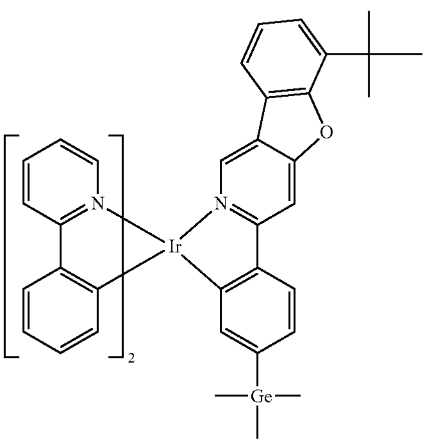
8
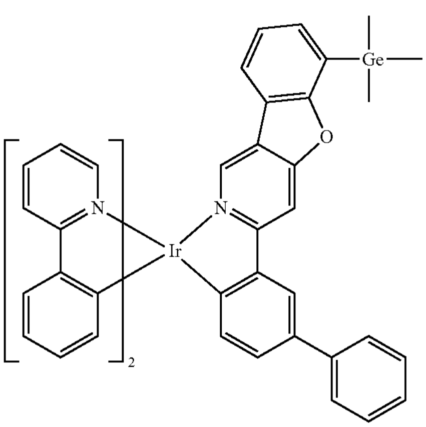
-continued
9
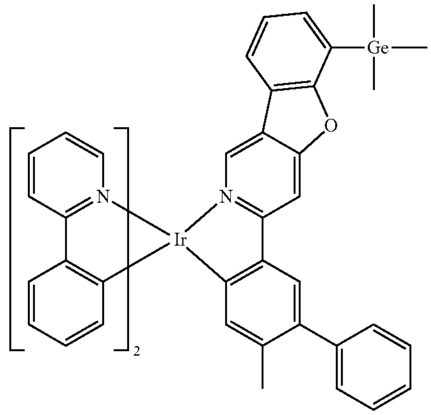
10
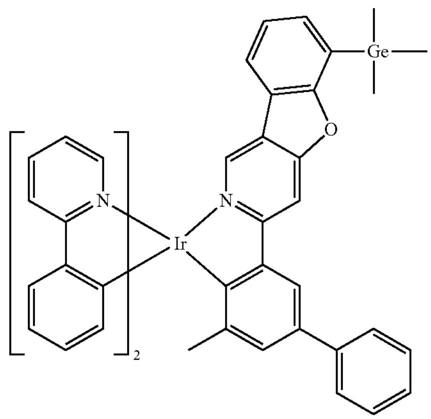
11
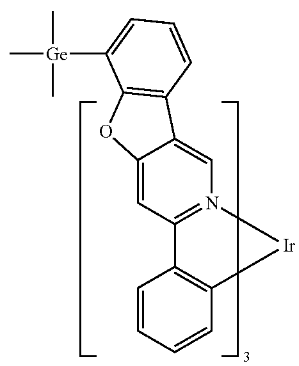
12
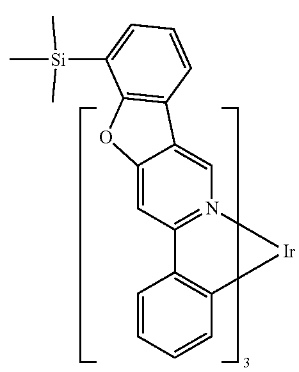

13
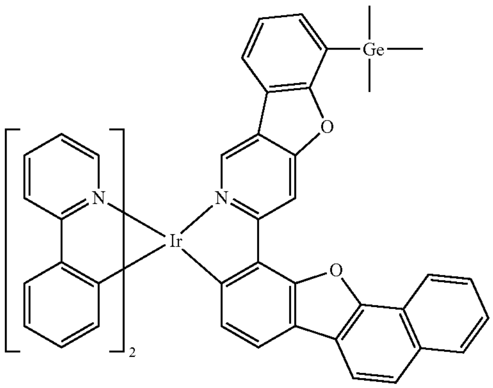
14
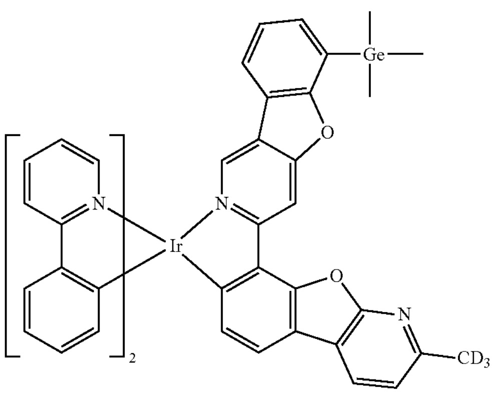
15
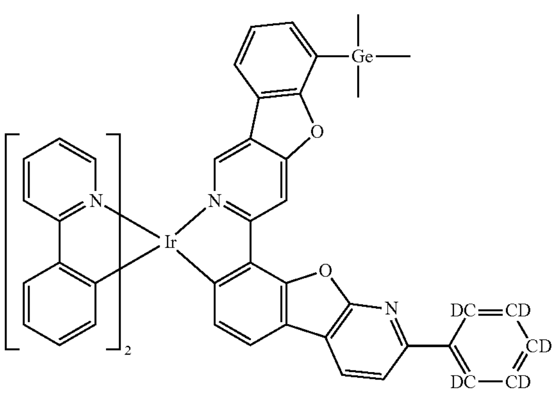
16
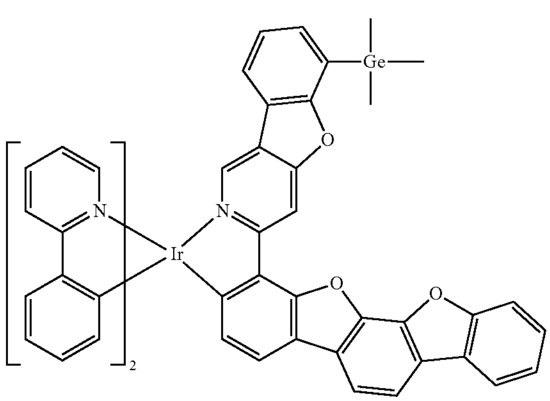
17
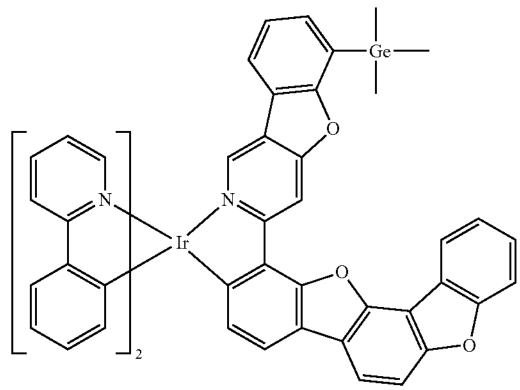
18
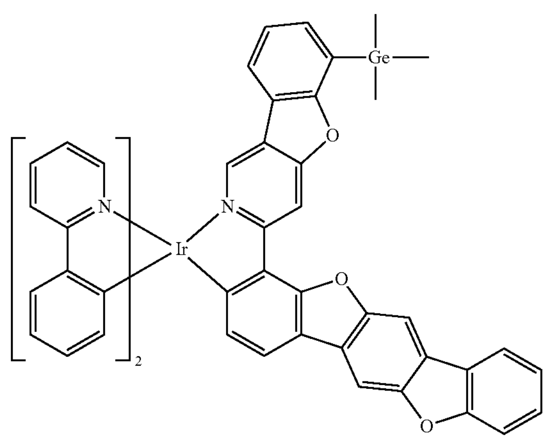
19
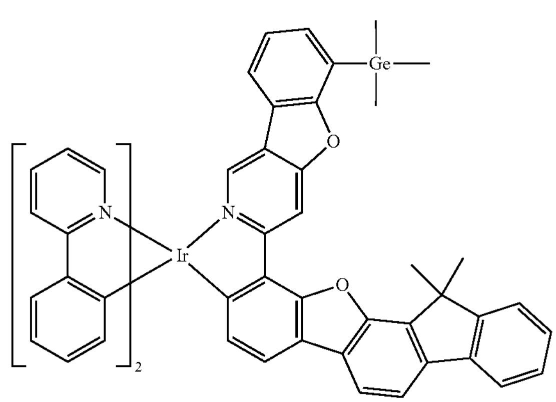

20
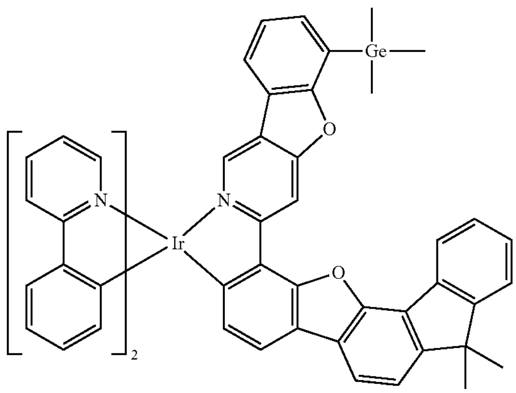
21
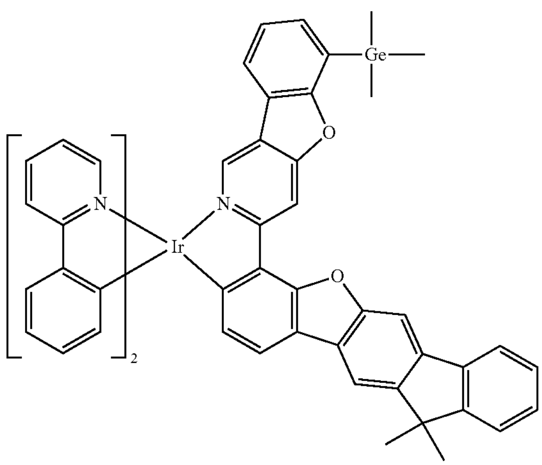
22
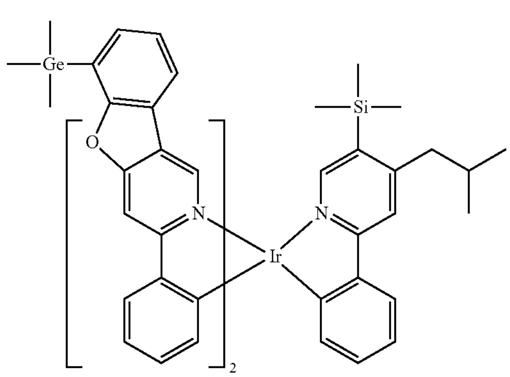
23
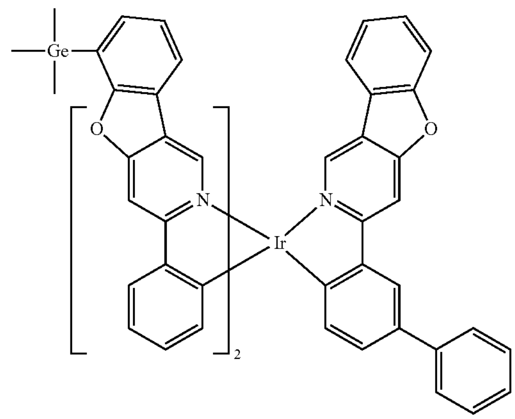
24
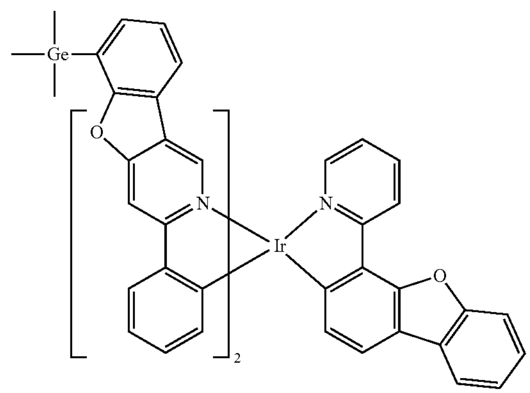
25
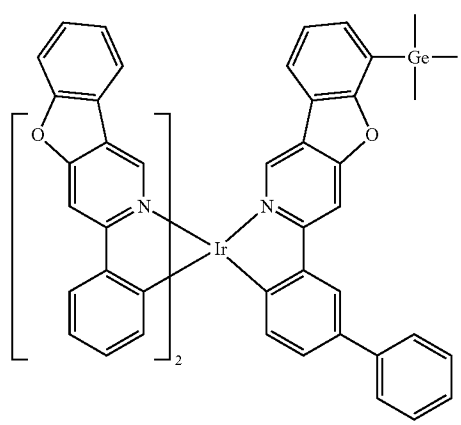
26
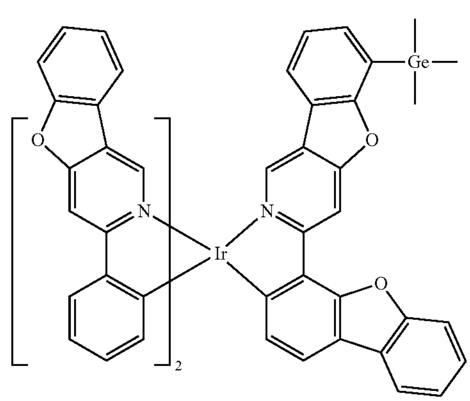

-continued
27
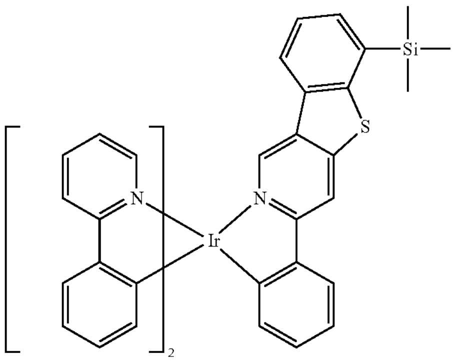
28
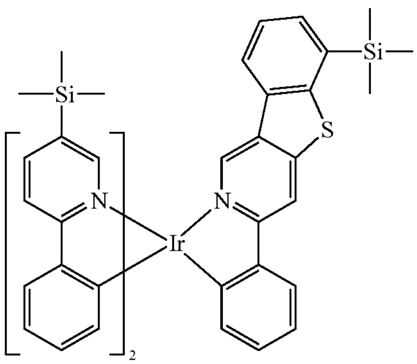
29
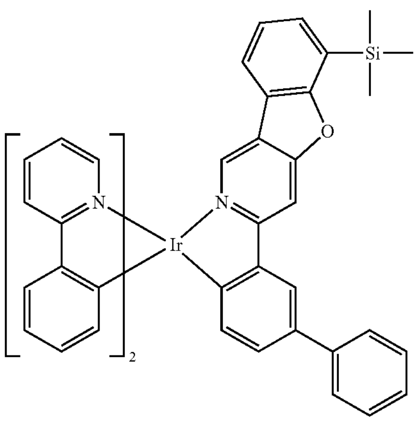
30
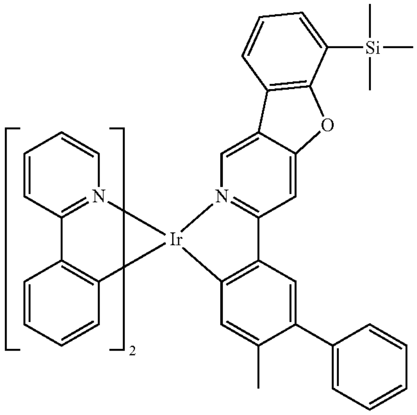
-continued
31
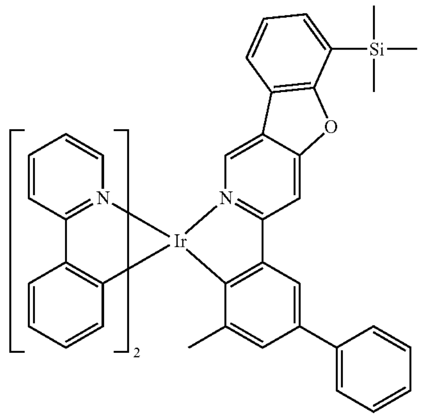
32
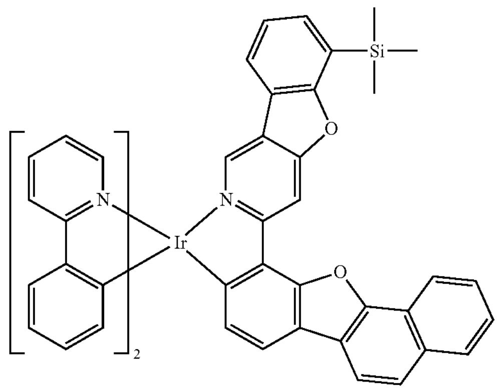
33
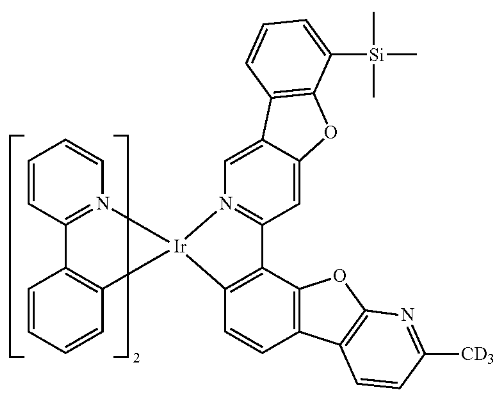
34
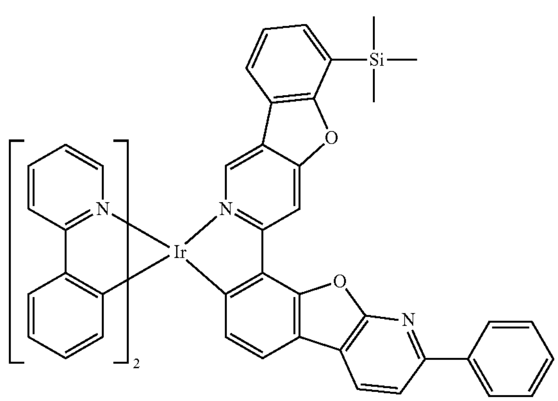

35
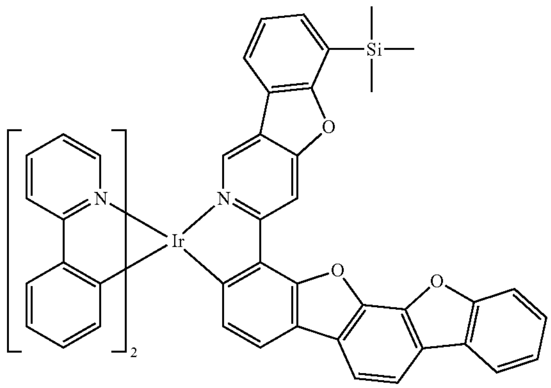
36
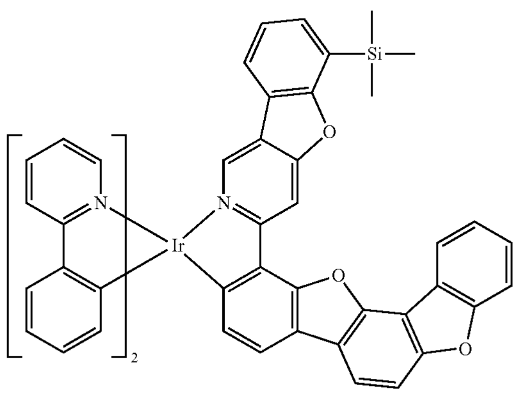
37
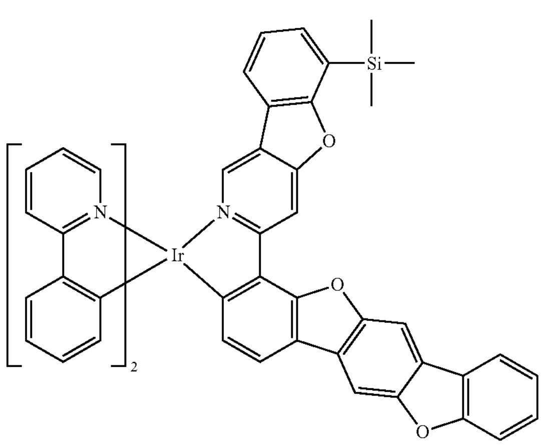
38
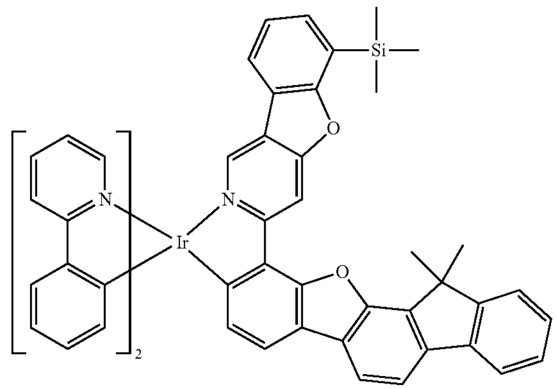
39
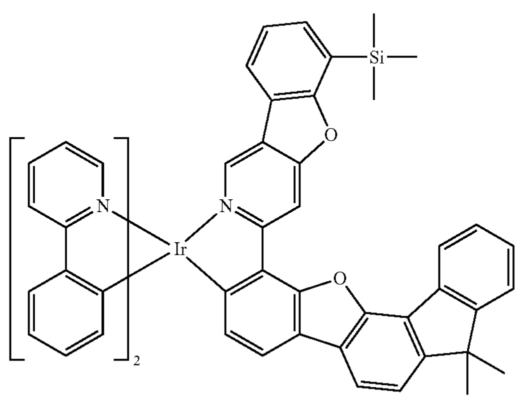
40
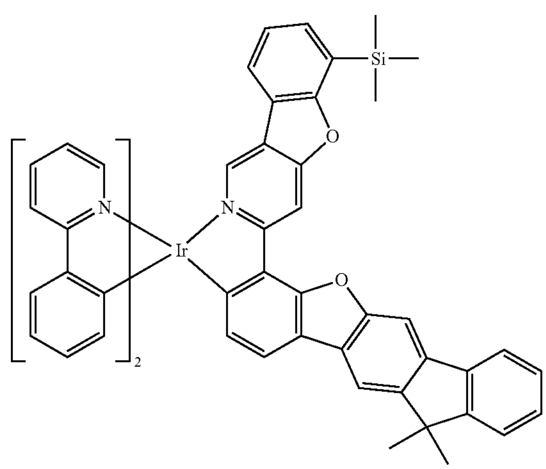

-continued
41
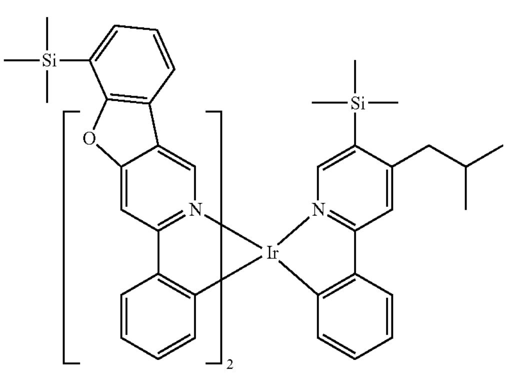
42
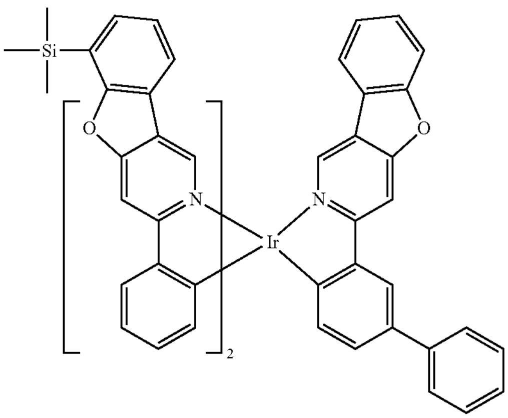
43
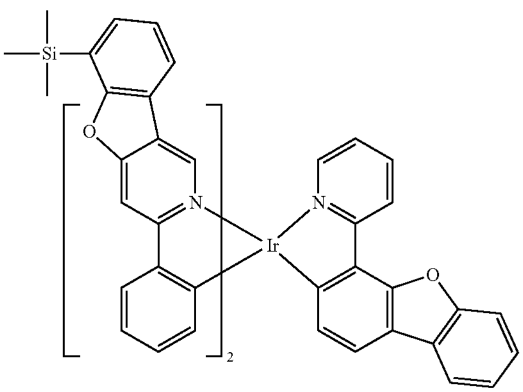
44
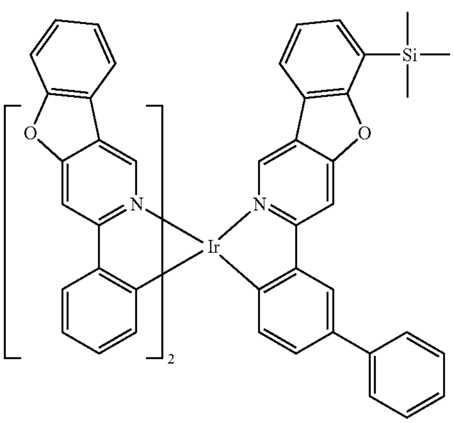
-continued
45
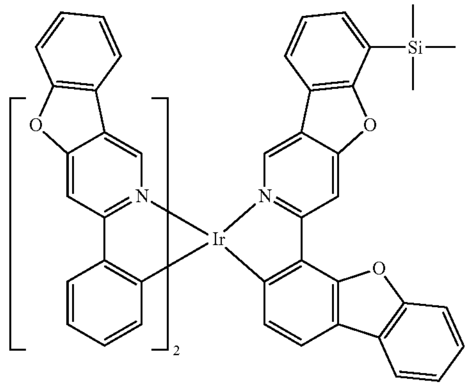
46
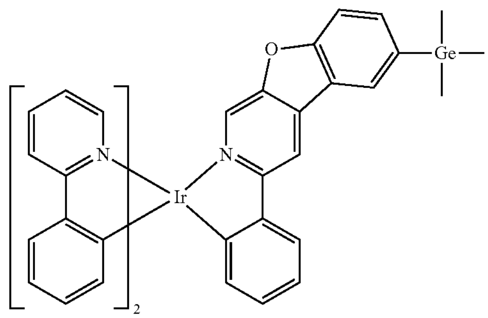
47
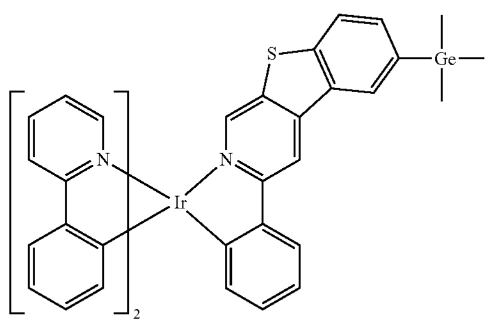
48
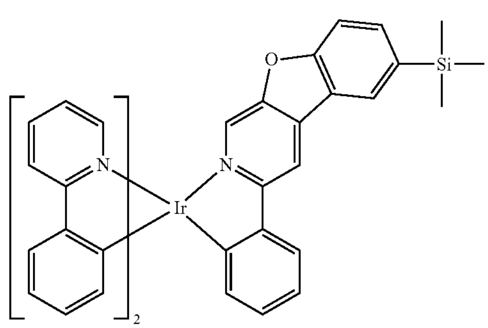

-continued
49
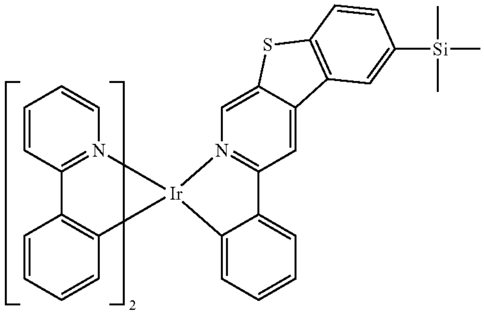
50
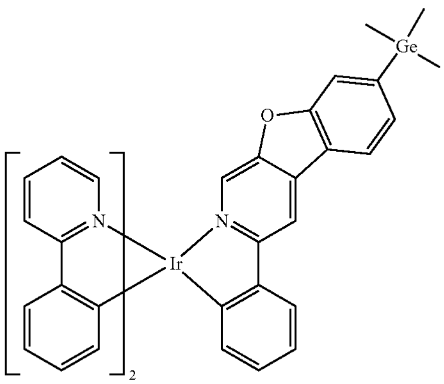
51
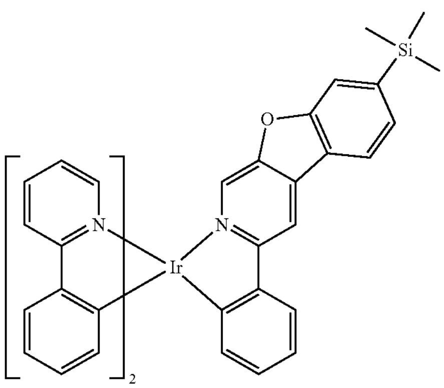
52
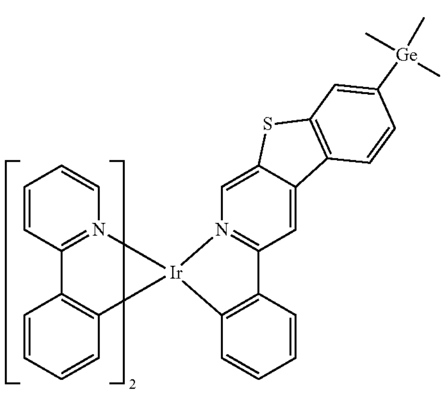
-continued
53
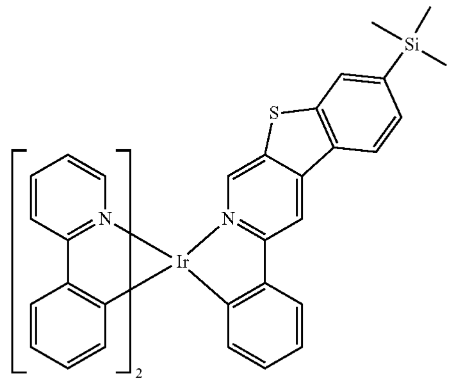
54
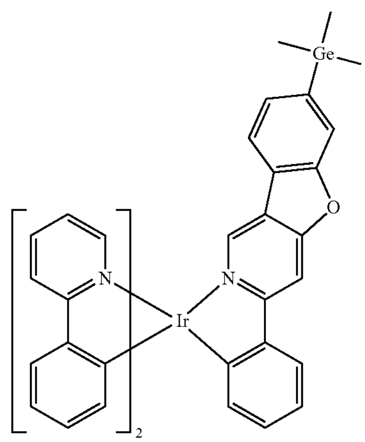
55
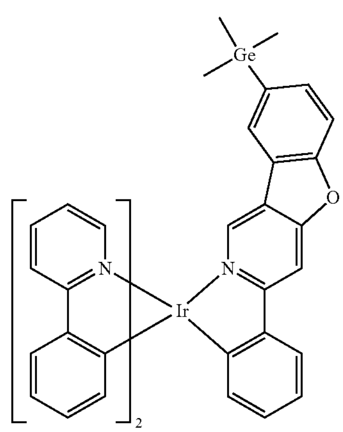

-continued
56
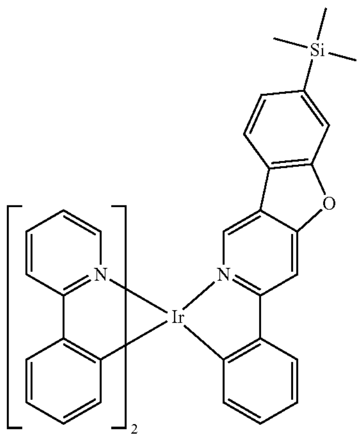
57
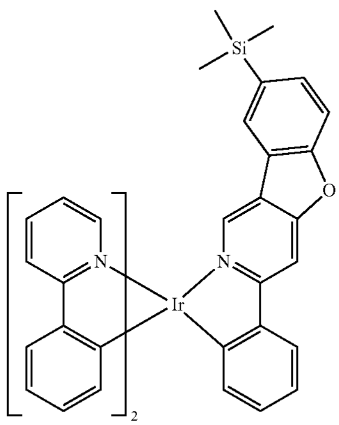
58
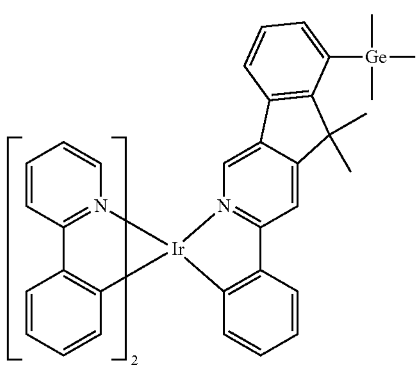
59
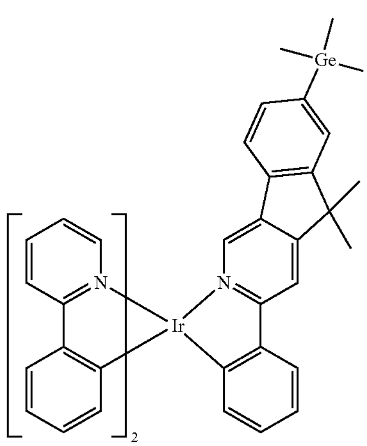
-continued
60
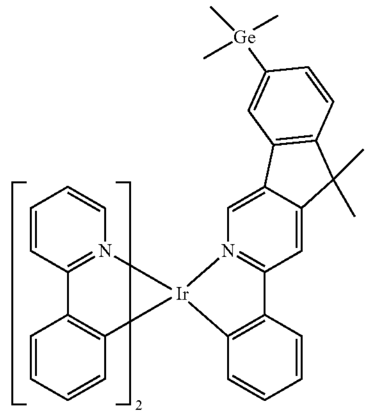
61
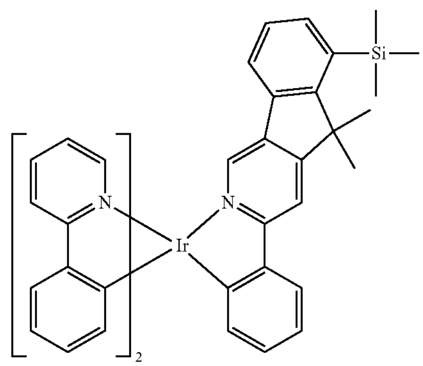
62
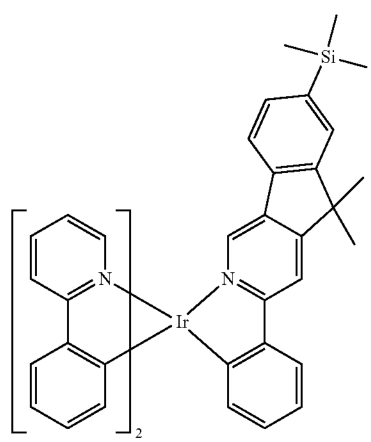
63
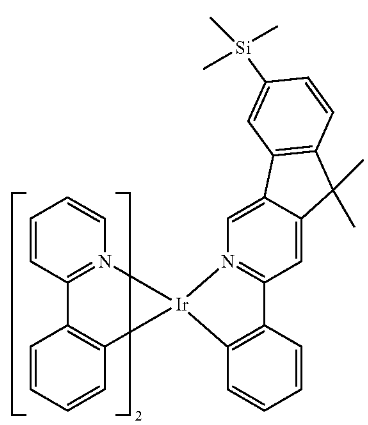

-continued
64
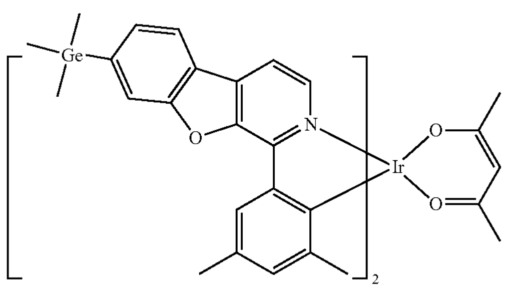
65
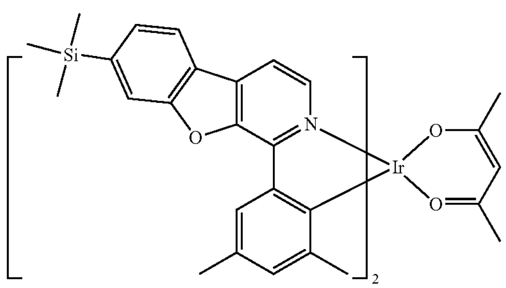
66
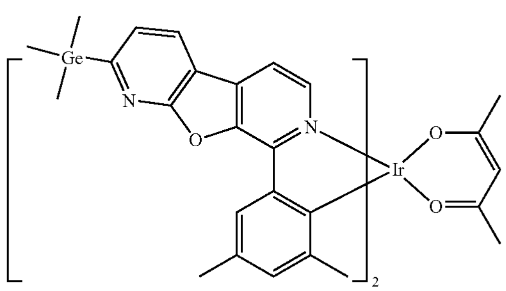
67
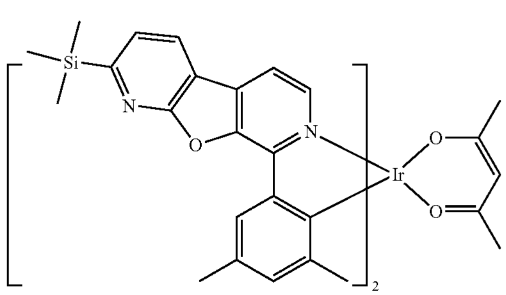
68
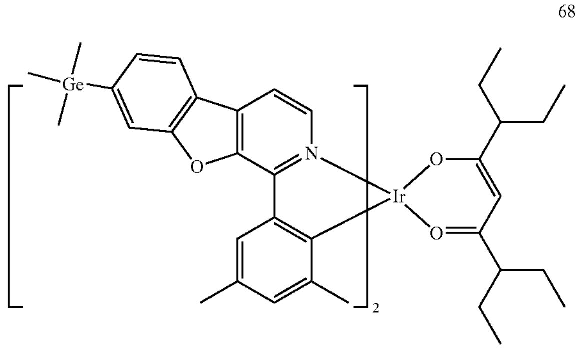
-continued
69
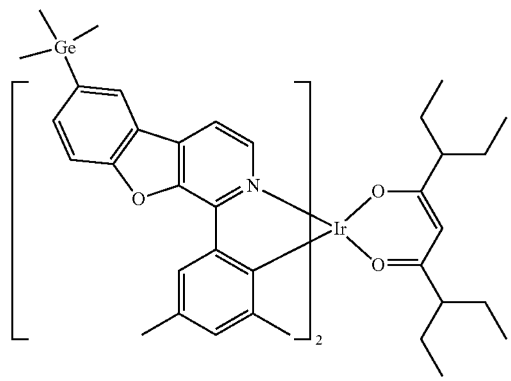
70
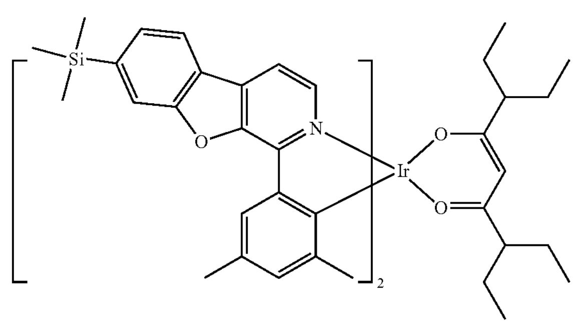
71
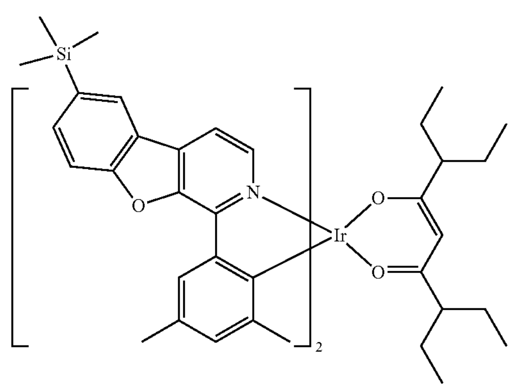
72
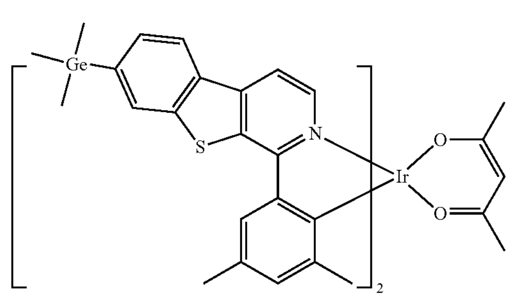

-continued
73
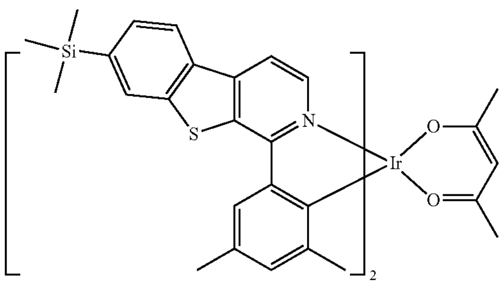
74.
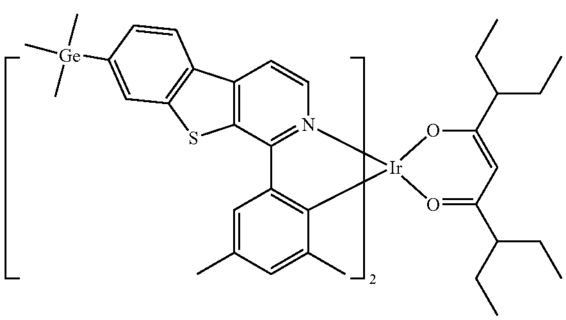
75
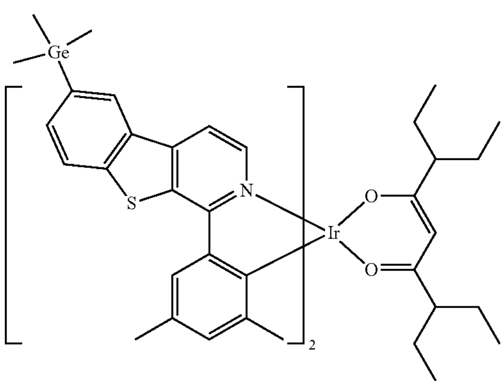
76
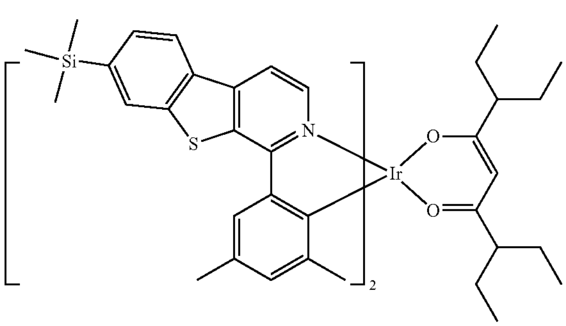
-continued
77
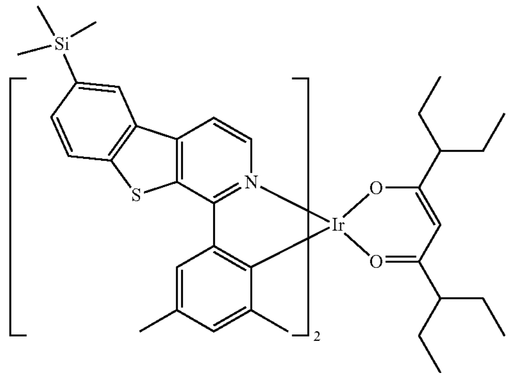
78
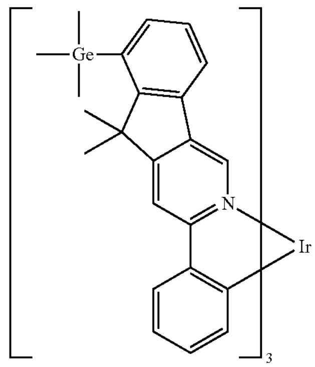
79
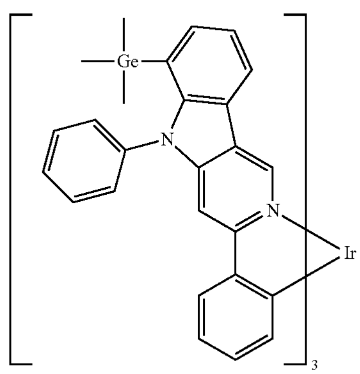
80
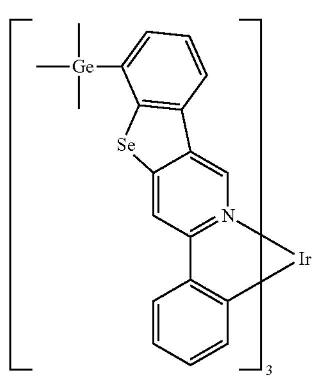

-continued
81
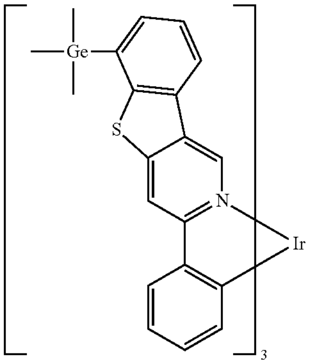
82
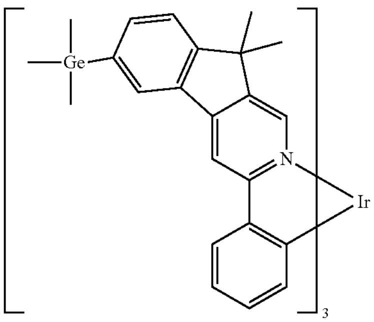
83
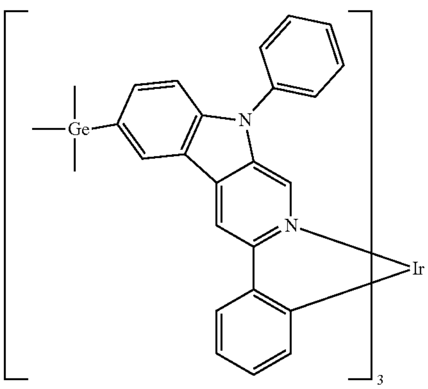
84
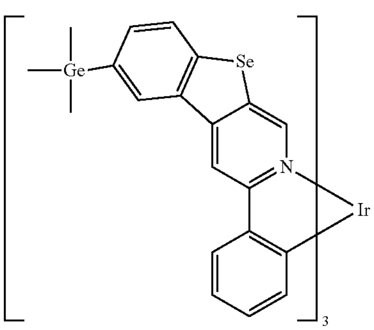
-continued
85
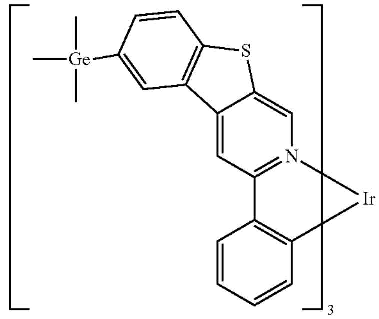
86
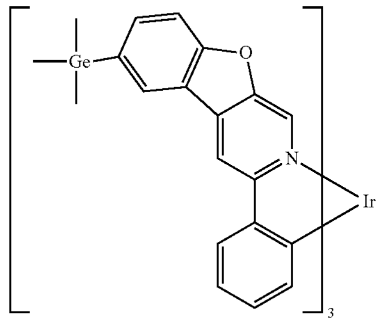
87
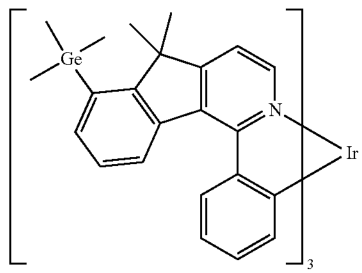
88
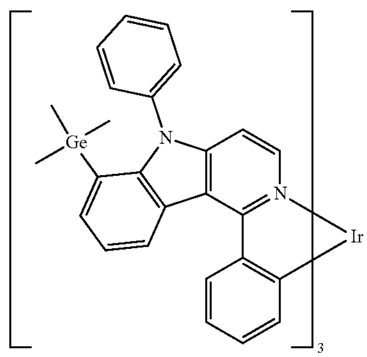
89
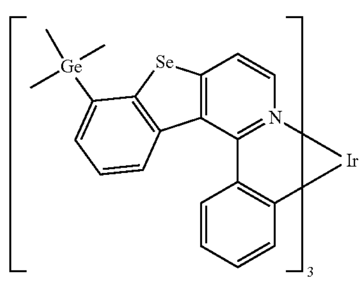

-continued
90
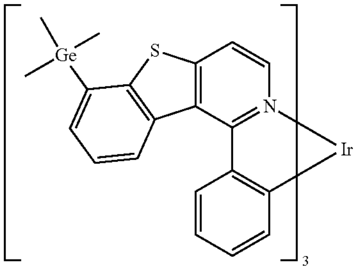
91
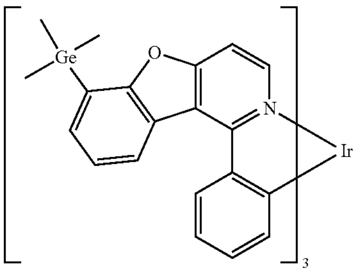
92
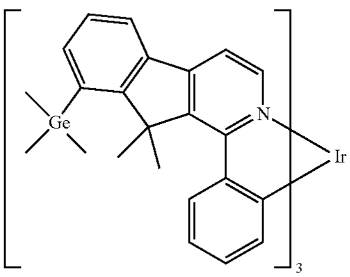
93
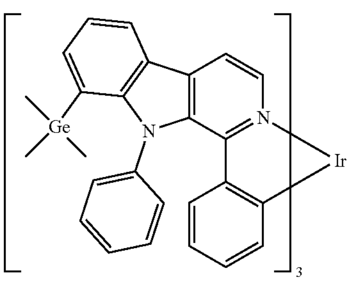
94
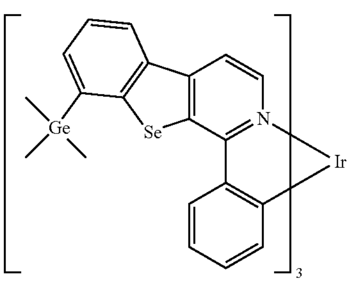
-continued
95
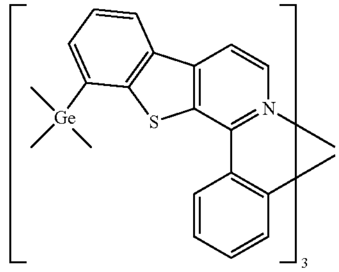
96
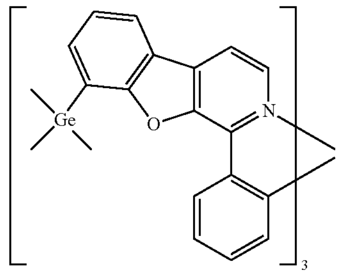
97
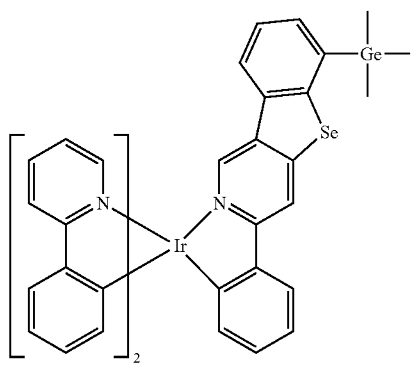
98
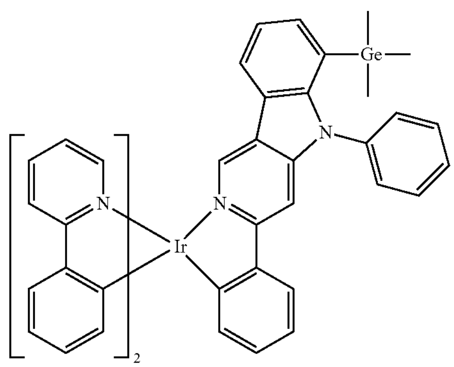
99
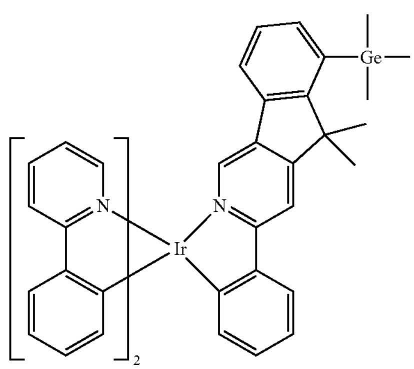

-continued
1100
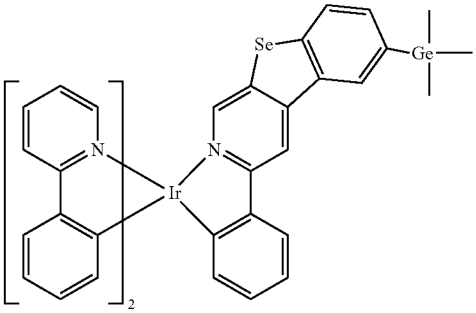
101
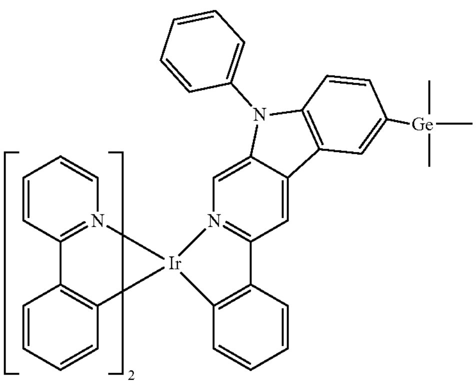
102
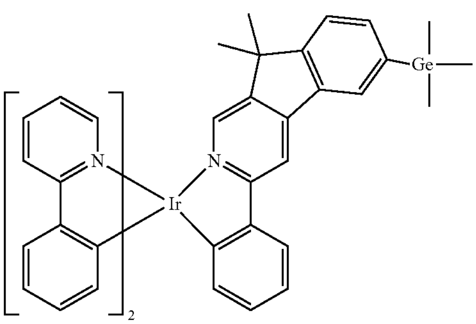
103
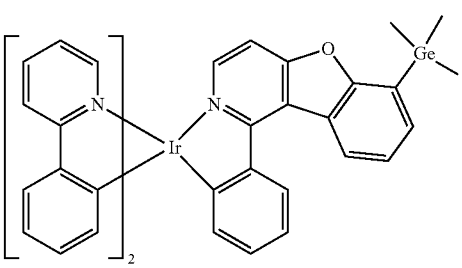
104
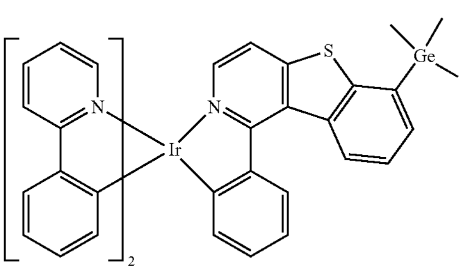
-continued
105
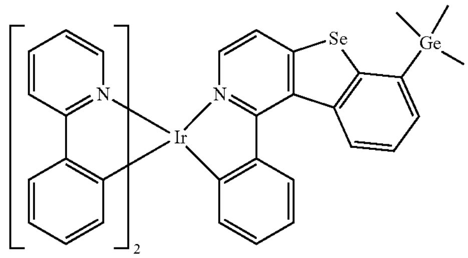
106
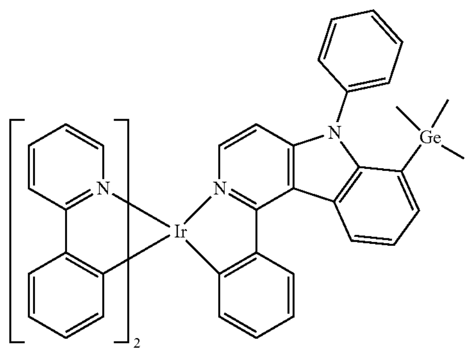
107
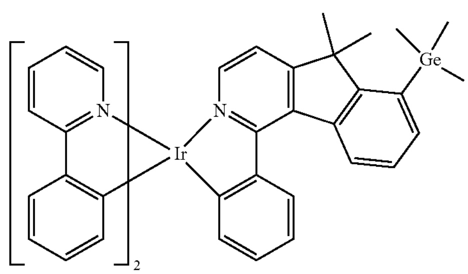
108
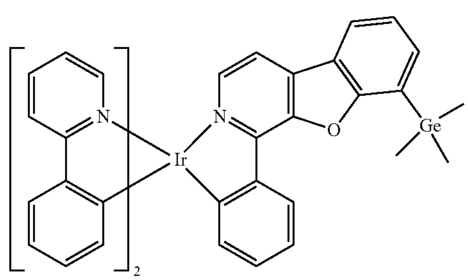
109
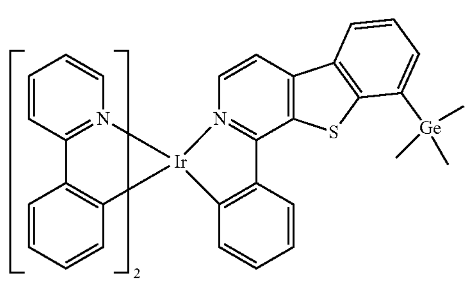

-continued
110
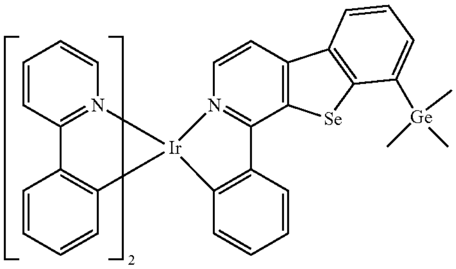
111
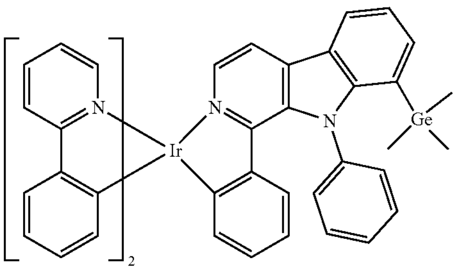
112
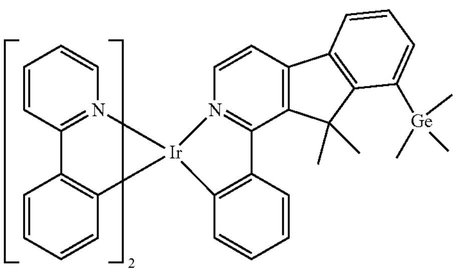
113
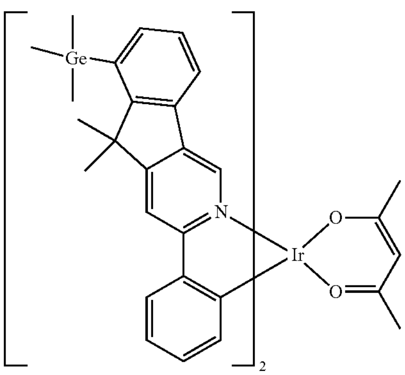
114
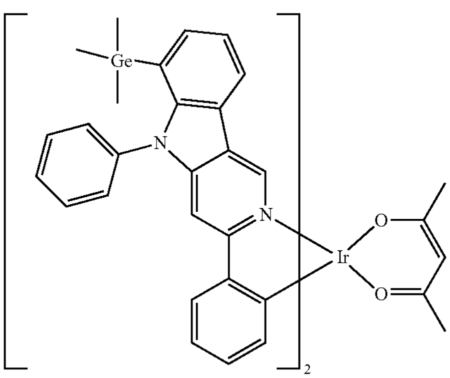
-continued
115
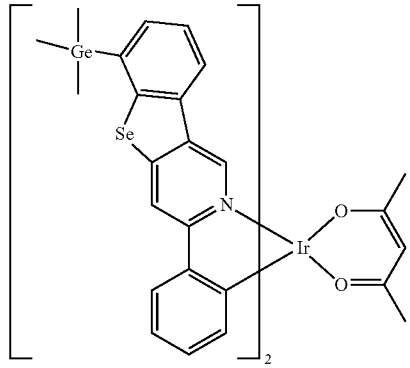
116
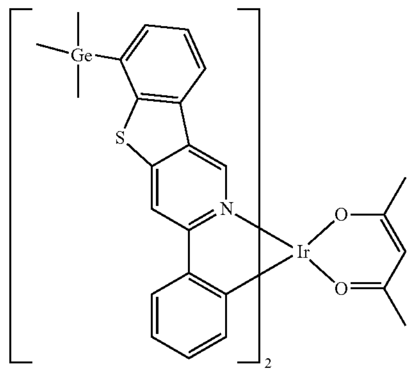
117
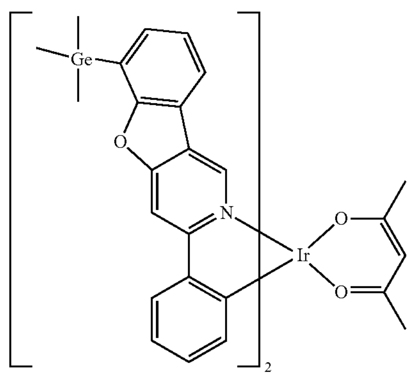
118
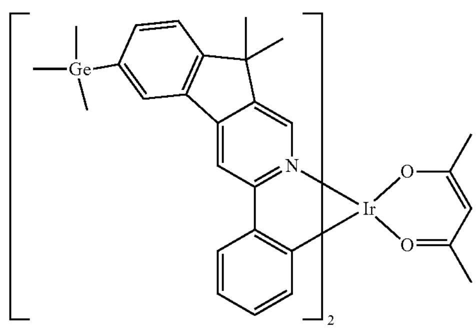

-continued
119
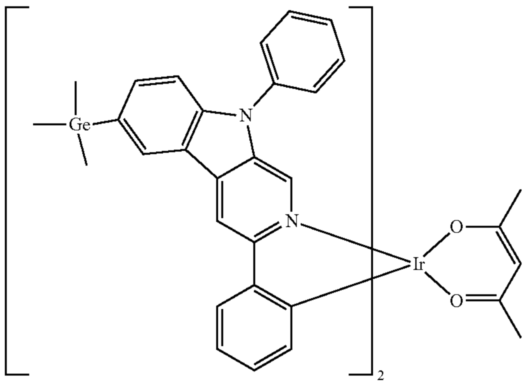
120
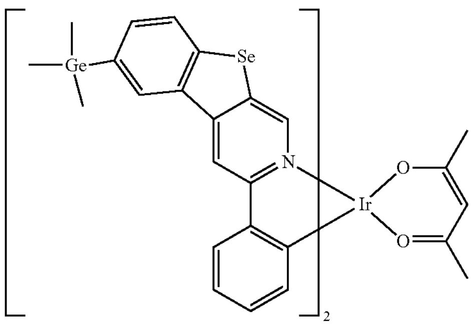
121
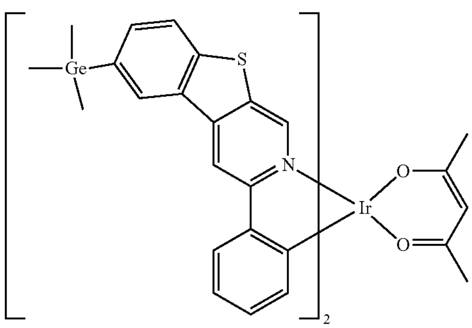
122
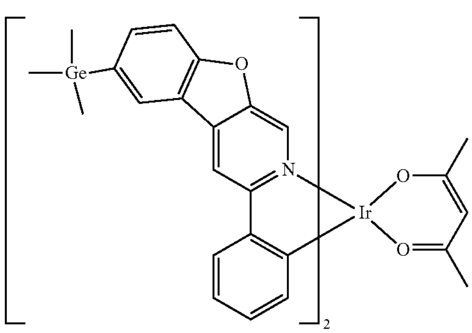
-continued
123
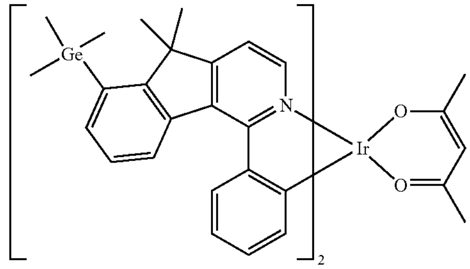
124
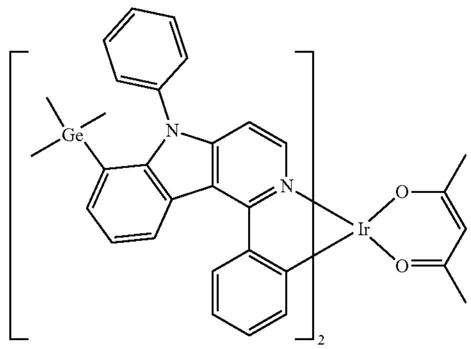
125
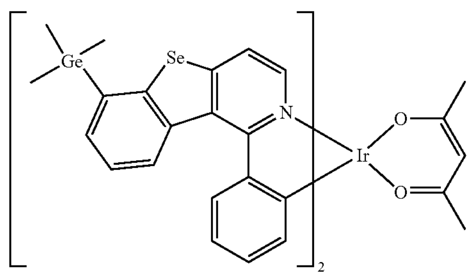
126
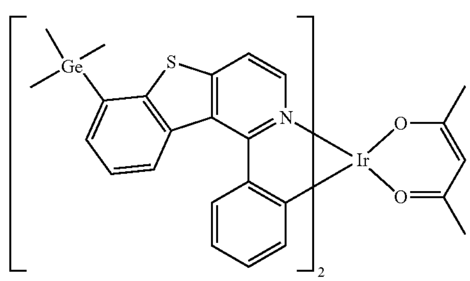
127
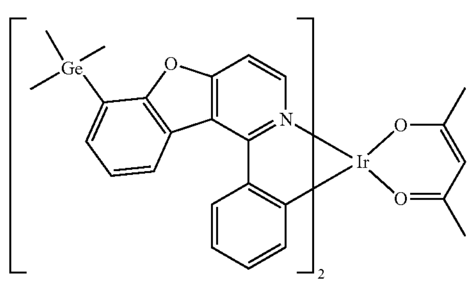

-continued
128
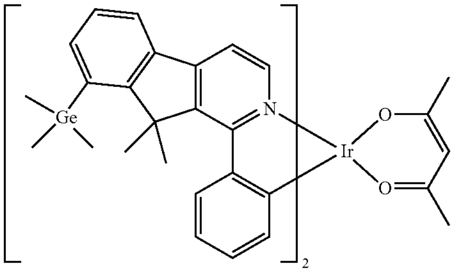
129
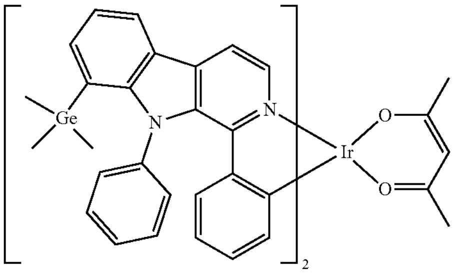
130
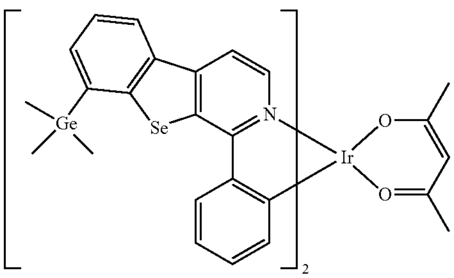
131
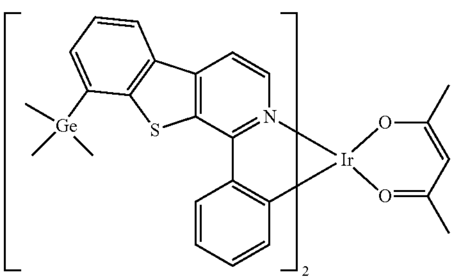
132
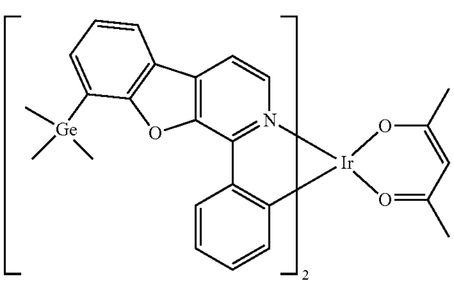
-continued
133
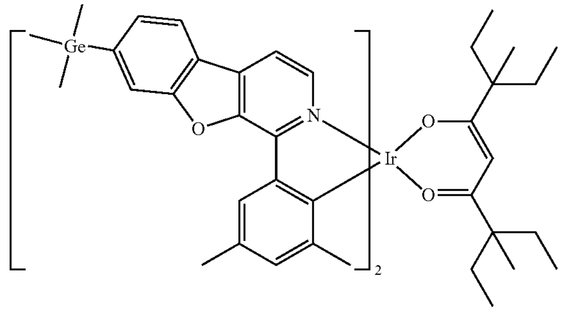
134
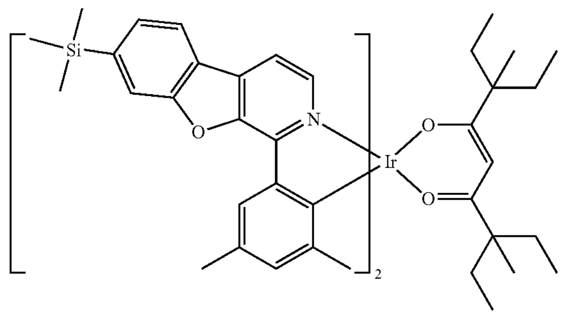
135
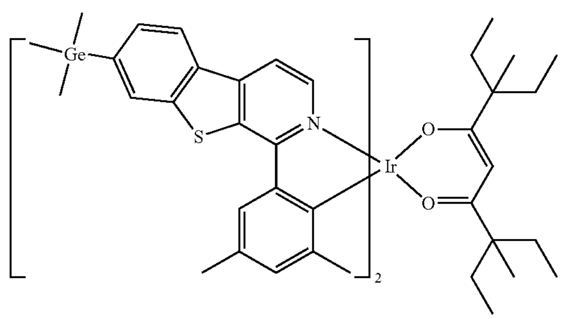
136
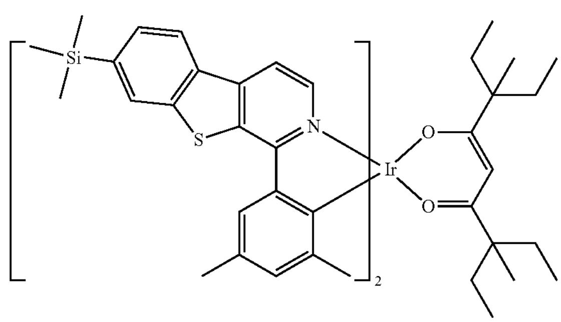

-continued
137
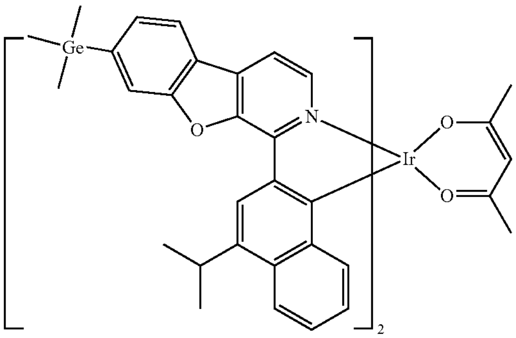
138
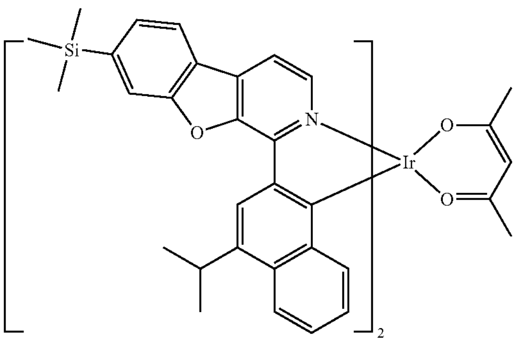
139
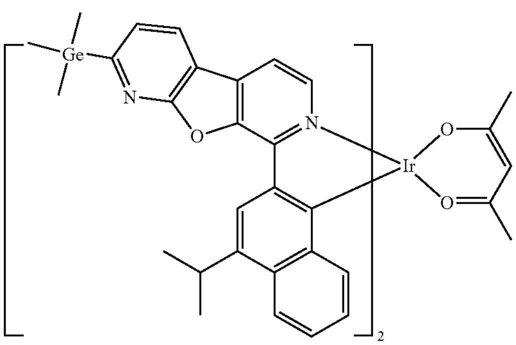
140
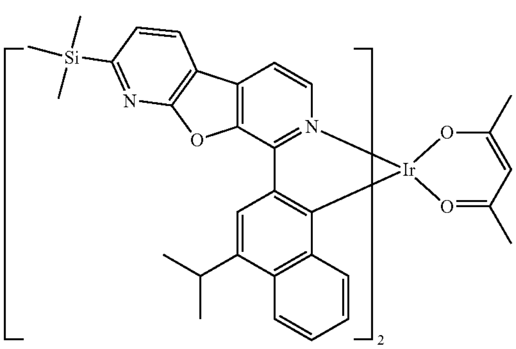
-continued
141
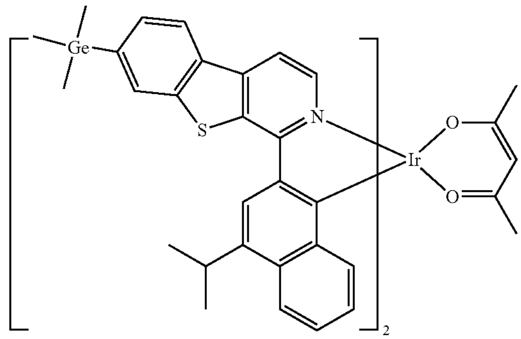
142
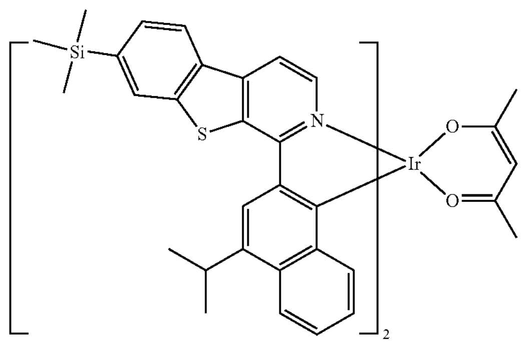
143
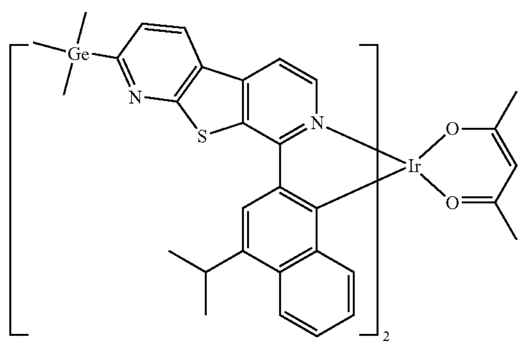
144
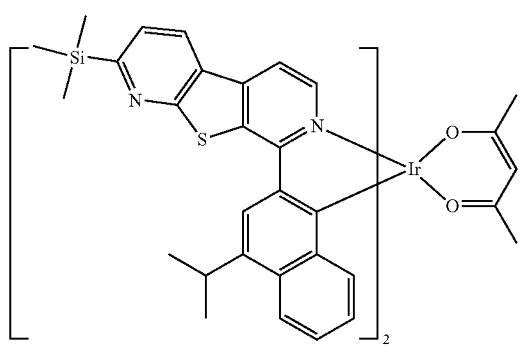

-continued
145
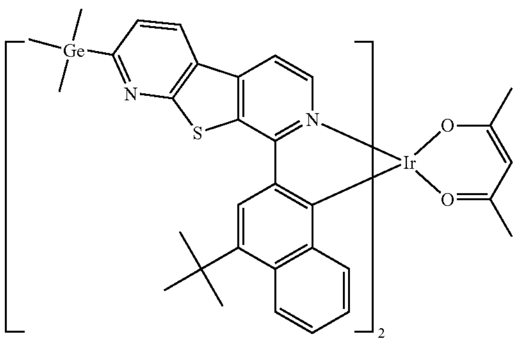
146
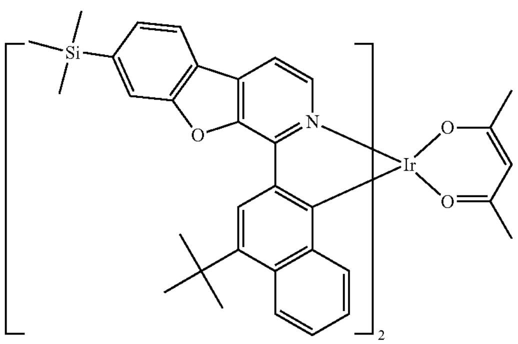
147
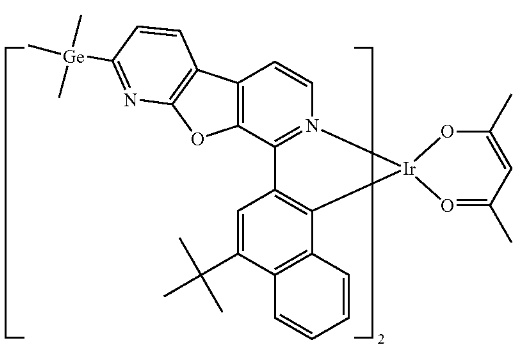
148
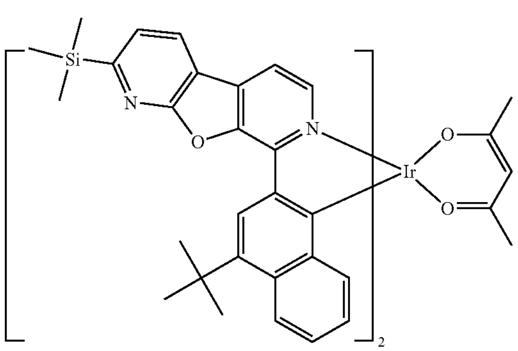
-continued
149
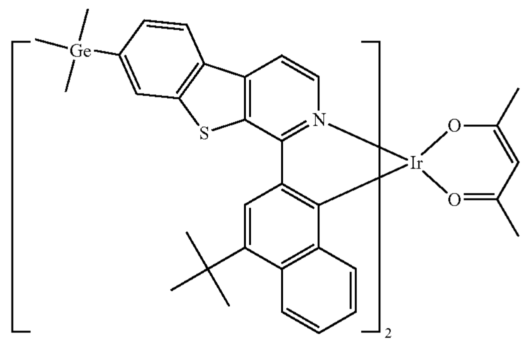
150
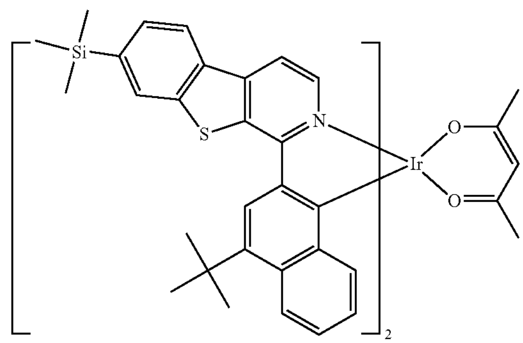
151
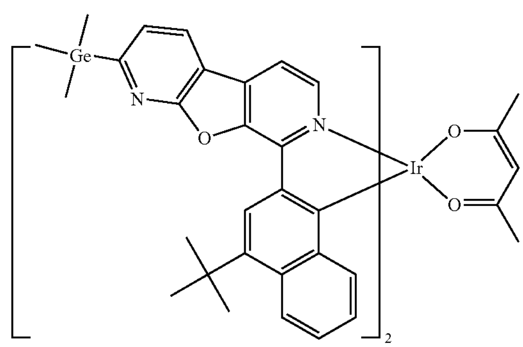
152
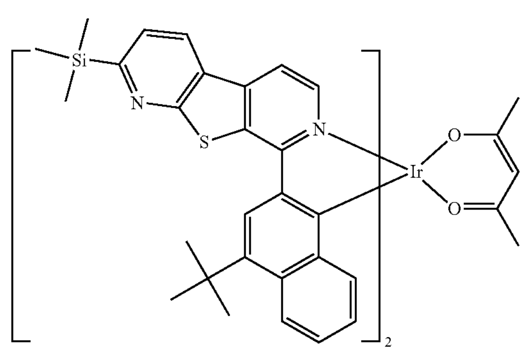

153
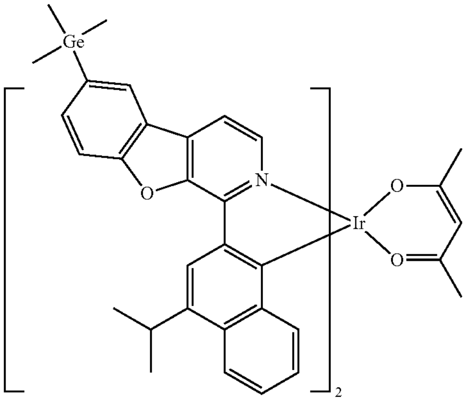
154
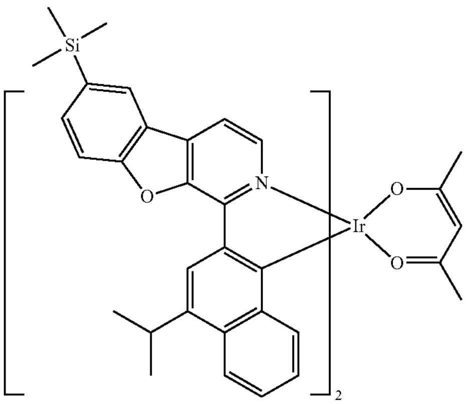
155
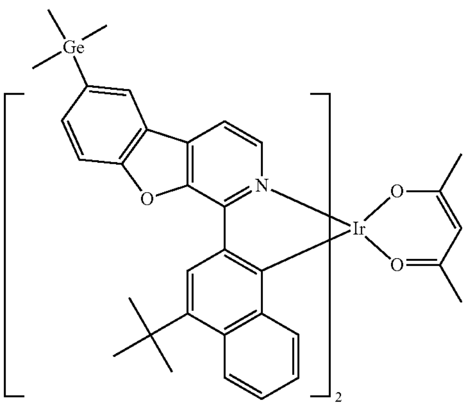
156
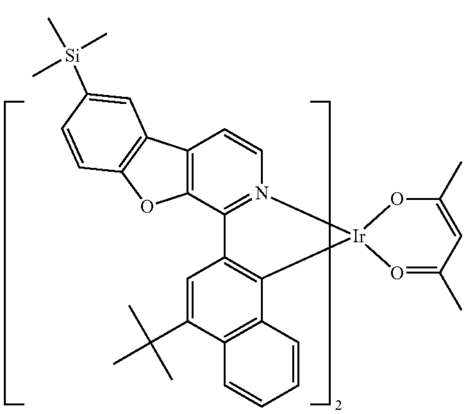
157
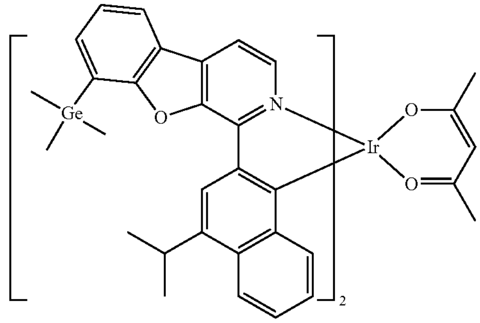
158
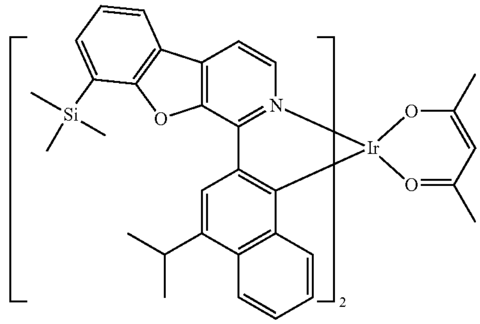
159
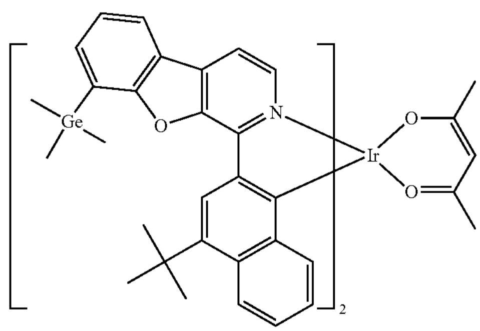
160
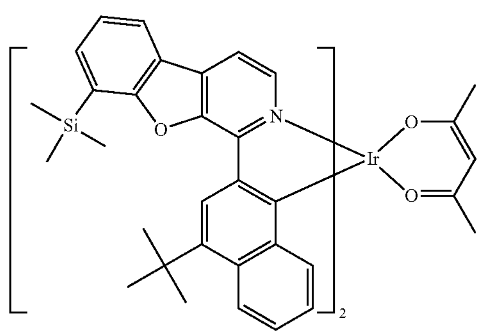

-continued
161
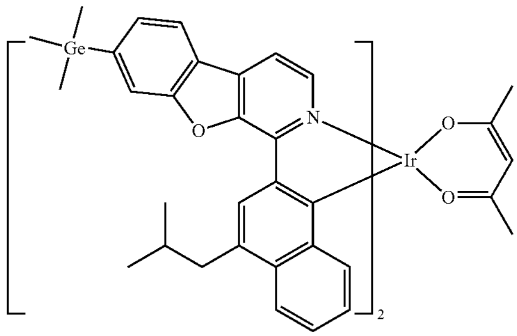
162
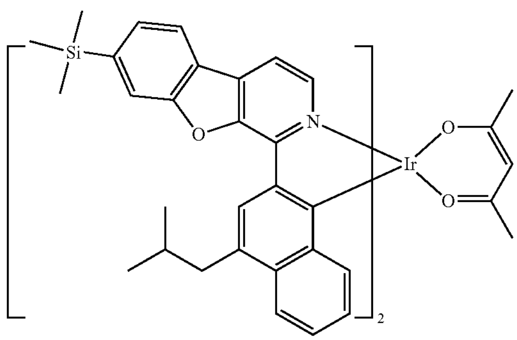
163
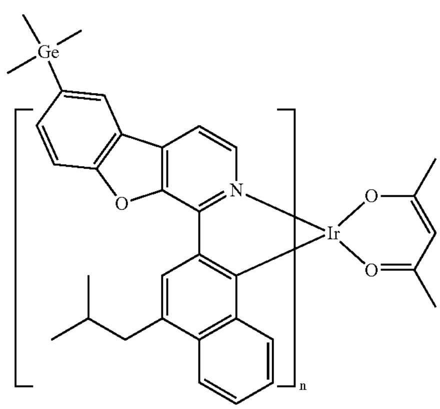
164
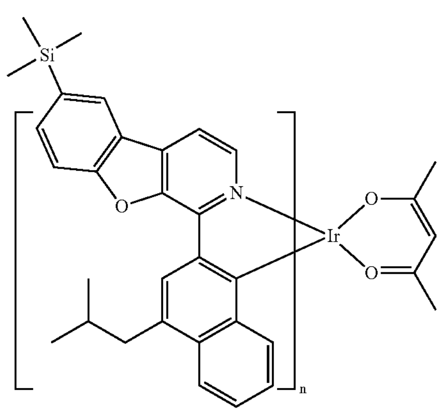
-continued
165
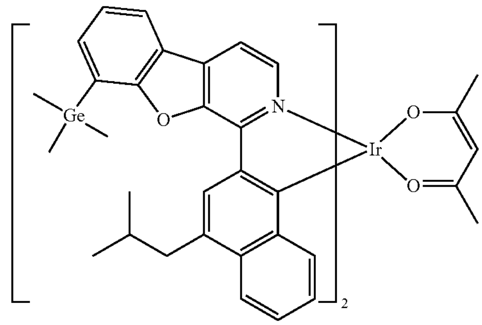
166
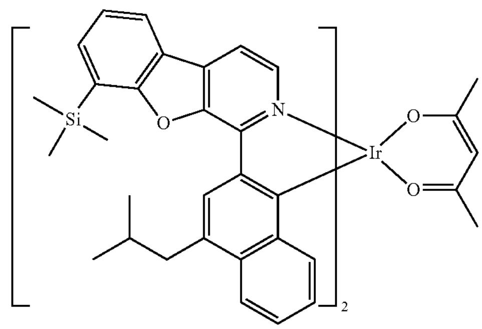
167
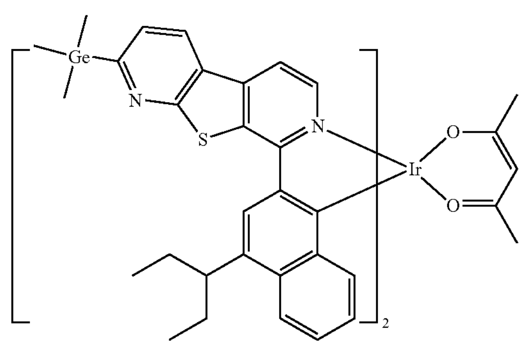
1168
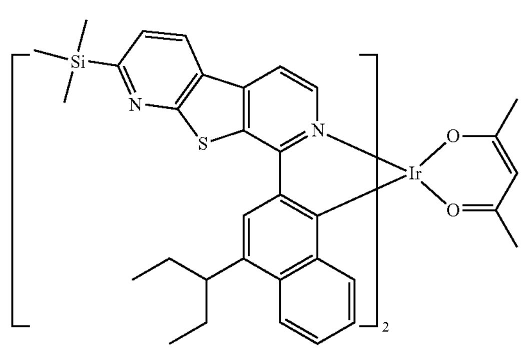

-continued
169
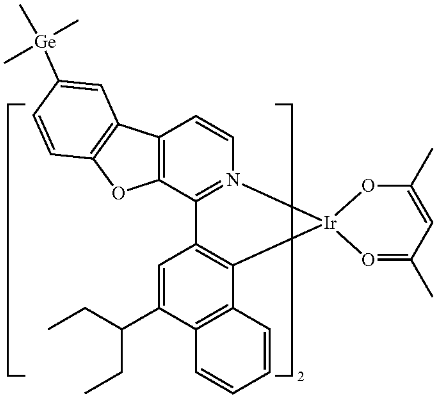
170
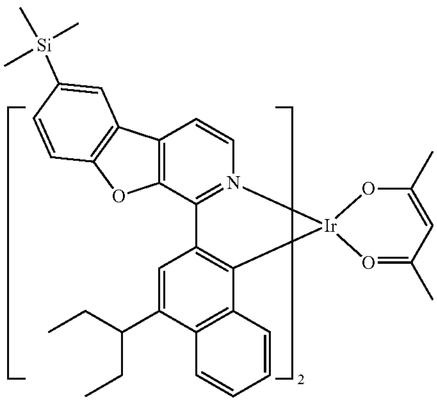
171
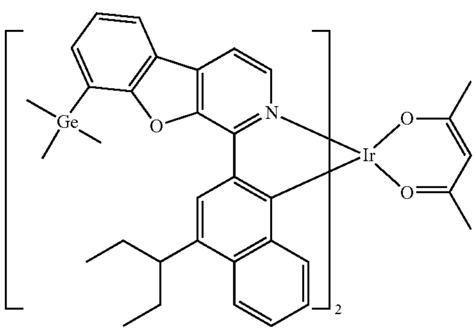
172
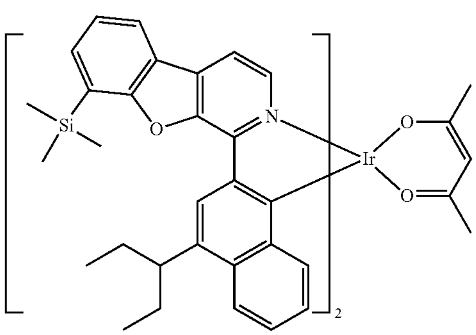
-continued
173
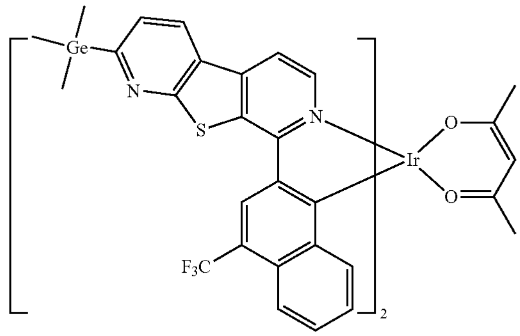
174
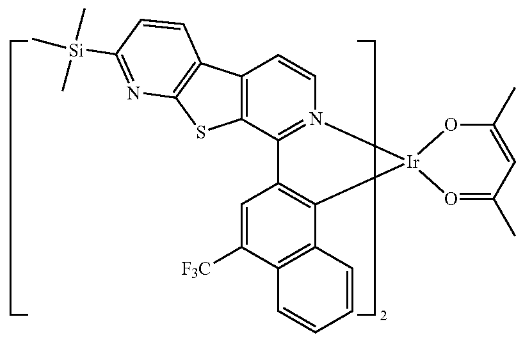
175
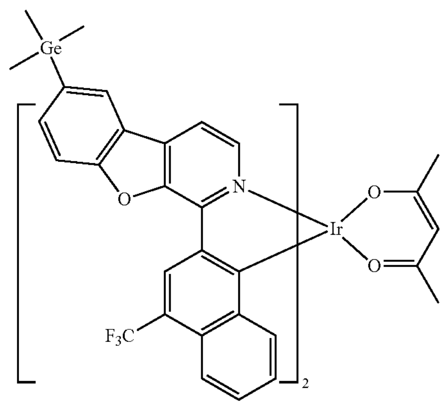
176
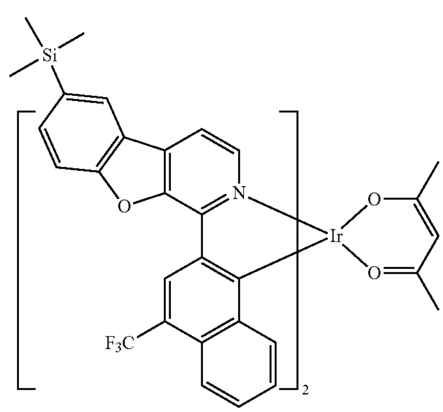

-continued
177
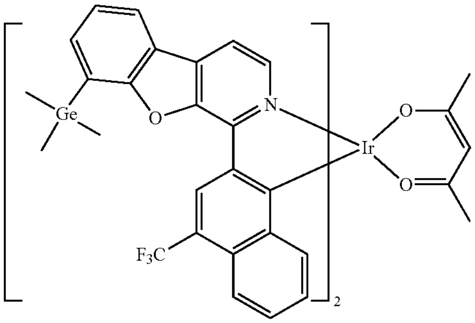
178
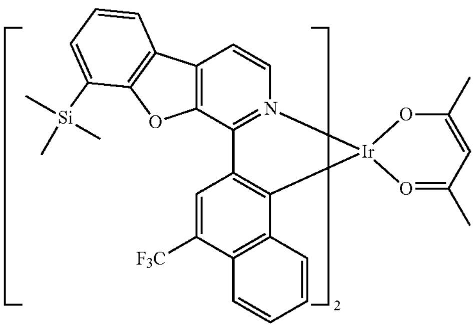
179
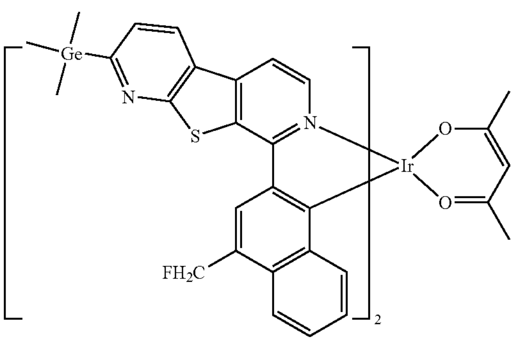
180
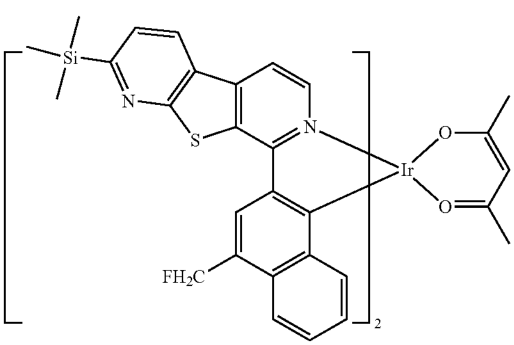
-continued
181
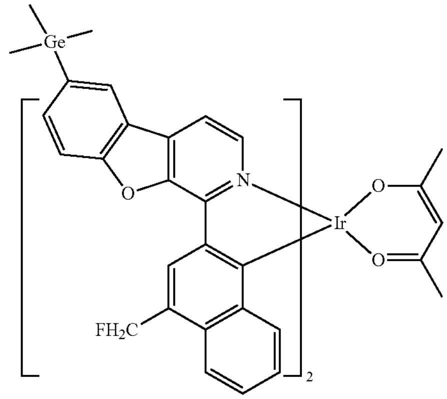
182
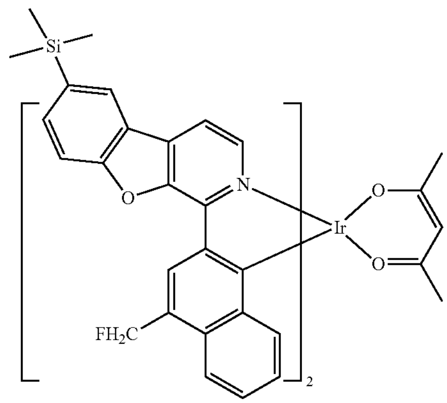
183
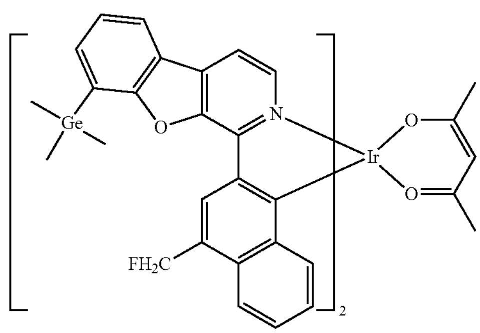
184
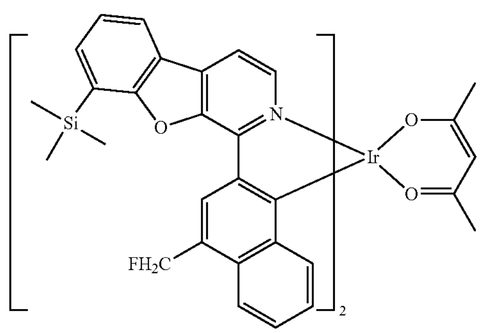

-continued
185
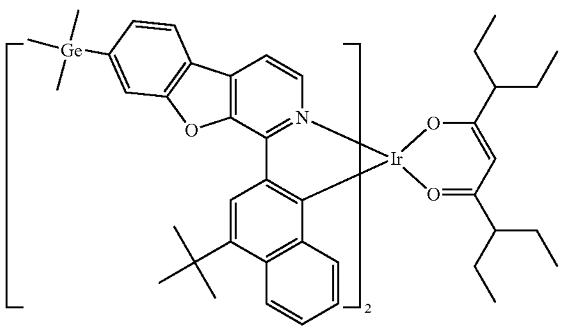
186
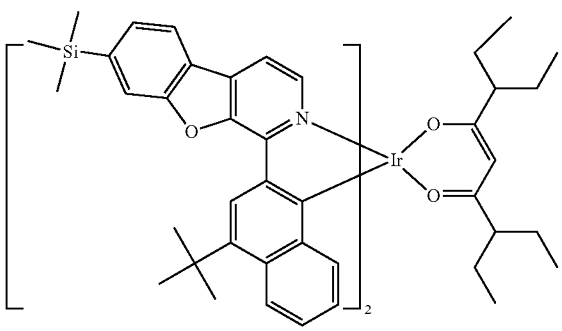
187
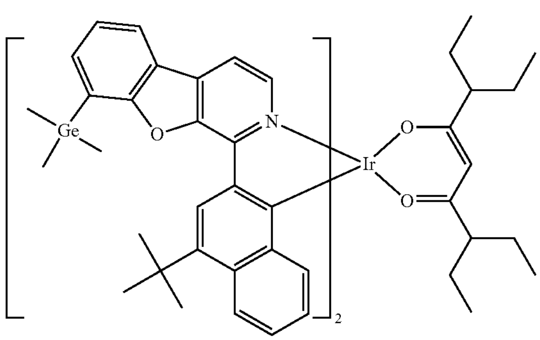
188
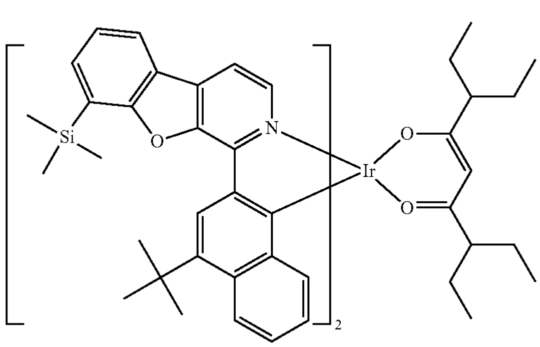
-continued
189
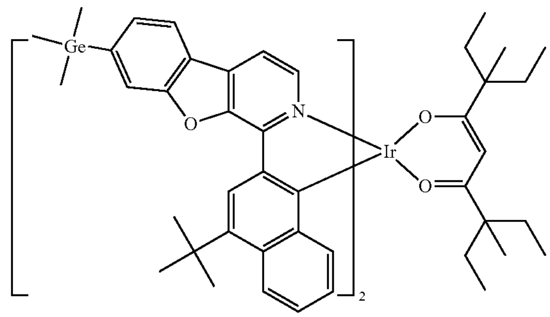
190
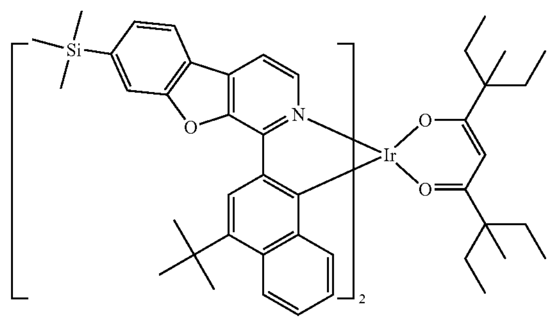
191
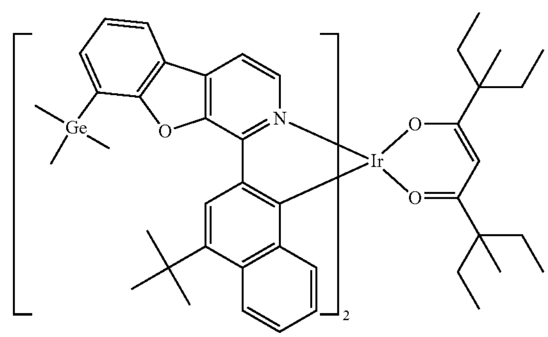
192
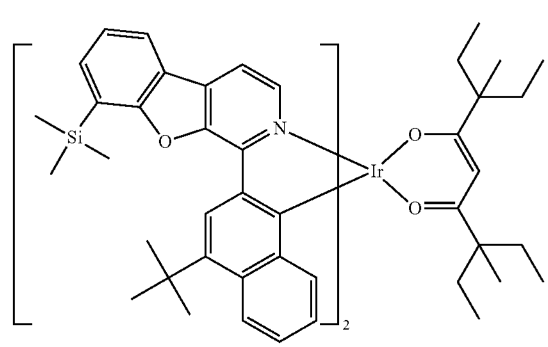

-continued

193

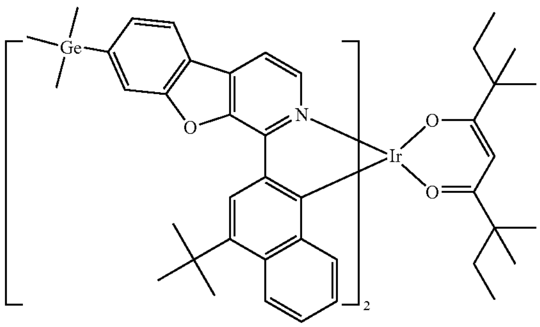

194

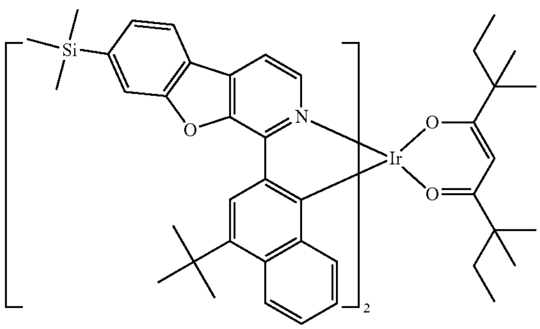

195

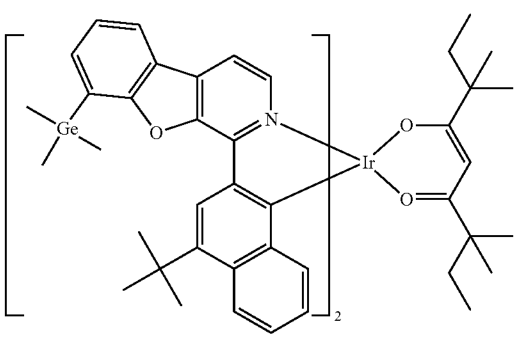

196

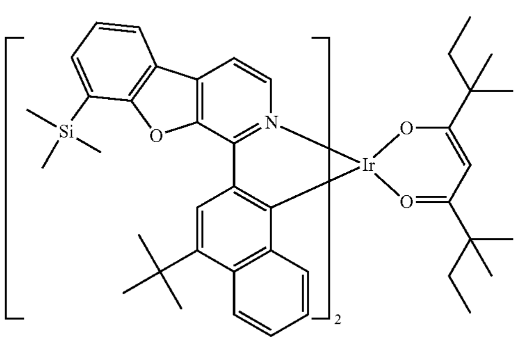

The organometallic compound represented by Formula 1 satisfies the structure of Formula 1 as described above. In detail, the ligand represented by Formula 1-1 has a structure in which heterorings including heteroatoms $Y_1$ are condensed. Among the condensed heterorings, when $CY_2$ is a benzene group, at least one of $R_1$ to $R_4$, which are substituents of a benzene ring, is a group represented by Formula 2-1 or Formula 2-2, that is, a substituent including a Si atom or a Ge atom, or at least one of $R_{10}$ and $R_{20}$ is a group represented by Formula 2-2, that is, a substituent including a Ge atom, and when $CY_2$ is not a benzene group, at least one of $R_1$ to $R_4$, $R_{10}$, and $R_{20}$ is a group represented by Formula 2-1 or Formula 2-2, that is, a substituent including a Si atom or a Ge atom. Without wishing to bound to theory, due to such a structure, an electronic device, for example, an organic light-emitting device, including the organometallic compound represented by Formula 1 may show a low driving voltage, high efficiency, a long lifespan, and a reduced roll-off phenomenon.

The highest occupied molecular orbital (HOMO) energy level, lowest unoccupied molecular orbital (LUMO) energy level, energy gap (electron volts, eV), lowest triplet (Ti) energy level, and lowest singlet (Si) energy level of selected organometallic compounds represented by Formula 1 were evaluated by density functional theory (DFT) using a Gaussian 09 program with the molecular structure optimization obtained at the B3LYP level, and results thereof are shown in Table 1.

TABLE 1

| Compound No. | HOMO (eV) | LUMO (eV) | Energy gap (eV) | $S_1$ (eV) | $T_1$ (eV) |
|---|---|---|---|---|---|
| Compound 1 | −4.840 | −1.417 | 3.423 | 2.830 | 2.520 |
| Compound 2 | −4.800 | −1.400 | 3.400 | 2.800 | 2.507 |
| Compound 3 | −4.829 | −1.418 | 3.411 | 2.843 | 2.454 |

1

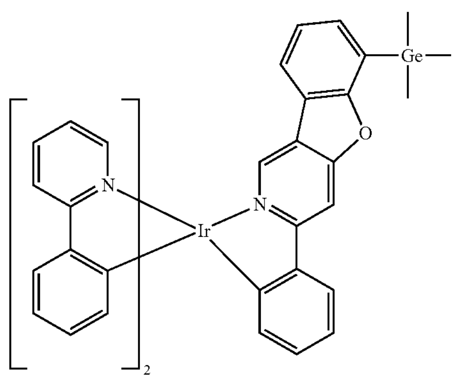

2

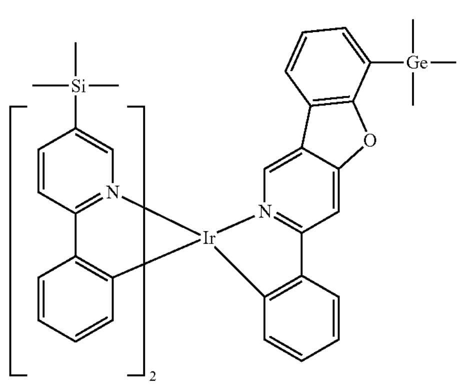

-continued

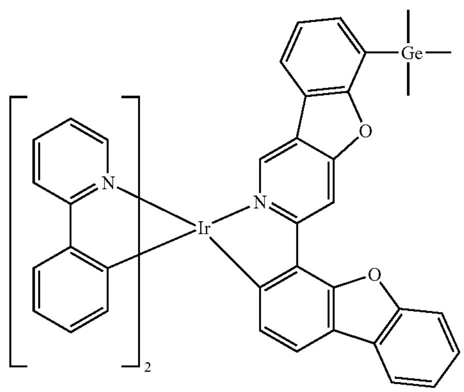

From Table 1, it was confirmed that the organometallic compounds represented by Formula 1 have such electric characteristics that are suitable for use as a dopant for an electronic device, for example, an organic light-emitting device.

In one or more embodiments, the full width at half maximum (FWHM) of the emission peak of the emission spectrum or the electroluminescence (EL) spectrum of the organometallic compound may be 75 nm or less. For example, the FWHM of the emission peak of the emission spectrum or the electroluminescence spectrum of the organometallic compound may be from about 30 nm to about 75 nm, from about 40 nm to about 70 nm, or from about 45 nm to about 68 nm.

In one or more embodiments, the maximum emission wavelength (emission peak wavelength, $\lambda_{max}$) of the emission peak of the emission spectrum or the electroluminescence spectrum of the organometallic compound may be from about 500 nm to about 750 nm.

Synthesis methods of the organometallic compound represented by Formula 1 may be recognizable by one of ordinary skill in the art by referring to Synthesis Examples provided herein.

The organometallic compound represented by Formula 1 is suitable for use in an organic layer of an organic light-emitting device, for example, for use as a dopant in an emission layer of the organic layer. Thus, another aspect provides an organic light-emitting device that includes: a first electrode; a second electrode; and an organic layer that is located between the first electrode and the second electrode, wherein the organic layer includes an emission layer, and wherein the organic layer further includes at least one of the organometallic compounds represented by Formula 1.

Since the organic light-emitting device has an organic layer including the organometallic compound represented by Formula 1 as described herein, excellent characteristics may be obtained with respect to driving voltage, current efficiency, external quantum efficiency, a roll-off ratio, and lifespan, and the FWHM of the emission peak of the EL spectrum is relatively narrow.

The organometallic compound of Formula 1 may be used between a pair of electrodes of an organic light-emitting device. In one or more embodiments, the organometallic compound represented by Formula 1 may be included in the emission layer. In this regard, the organometallic compound may act as a dopant, and the emission layer may further include a host (that is, an amount of the organometallic compound represented by Formula 1 in the emission layer is smaller than an amount of the host).

In one or more embodiments, the emission layer may emit green light. For example, the emission layer may emit green light having a maximum emission wavelength of about 500 nm to about 600 nm.

In one or more embodiments, the emission layer may emit red light. For example, the emission layer may emit red light having a maximum emission wavelength of about 600 nm to about 750 nm.

The expression "(an organic layer) includes at least one of organometallic compounds" used herein may include a case in which "(an organic layer) includes identical organometallic compounds represented by Formula 1" and a case in which "(an organic layer) includes two or more different organometallic compounds represented by Formula 1."

In one or more embodiments, the organic layer may include, as the organometallic compound, only Compound 1. In this regard, Compound 1 may be present in the emission layer of the organic light-emitting device. In one or more embodiments, the organic layer may include, as the organometallic compound, Compound 1 and Compound 2, wherein Compound 1 and Compound 2 are different from each other. In this regard, Compound 1 and Compound 2 may be present in an identical layer (for example, both Compound 1 and Compound 2 may be present in an emission layer).

The first electrode may be an anode, which is a hole injection electrode, and the second electrode may be a cathode, which is an electron injection electrode; or the first electrode may be a cathode, which is an electron injection electrode, and the second electrode may be an anode, which is a hole injection electrode.

In one or more embodiments, in the organic light-emitting device, the first electrode may be an anode, and the second electrode may be a cathode, and the organic layer may further include a hole transport region located between the first electrode and the emission layer and an electron transport region located between the emission layer and the second electrode, and the hole transport region may include a hole injection layer, a hole transport layer, an electron blocking layer, a buffer layer, or a combination thereof, and the electron transport region may include a hole blocking layer, an electron transport layer, an electron injection layer, or a combination thereof.

The term "organic layer" as used herein refers to a single layer and/or a plurality of layers located between the first electrode and the second electrode of an organic light-emitting device. The "organic layer" may include, in addition to an organic compound, an organometallic complex including a metal.

The FIGURE is a schematic cross-sectional view of an organic light-emitting device 10 according to one or more embodiments of the present disclosure. Hereinafter, the structure of an organic light-emitting device according to one or more embodiments of the present disclosure and a method of manufacturing an organic light-emitting device according to one or more embodiments of the present disclosure will be described in connection with FIGURE. The organic light-emitting device 10 includes a first electrode 11, an organic layer 15, and a second electrode 19, which are sequentially stacked.

A substrate may be additionally located under the first electrode 11 or above the second electrode 19. For use as the substrate, any substrate that is used in organic light-emitting devices available in the art may be used, and the substrate may be a glass substrate or a transparent plastic substrate, each having excellent mechanical strength, thermal stability, transparency, surface smoothness, ease of handling, and water resistance.

In one or more embodiments, the first electrode 11 may be formed by depositing or sputtering a material for forming the first electrode 11 on the substrate. The first electrode 11 may be an anode. The material for forming the first electrode 11 may be chosen from materials with a high work function to facilitate hole injection. The first electrode 11 may be a reflective electrode, a semi-transmissive electrode, or a transmissive electrode. The material for forming the first electrode 11 may be indium tin oxide (ITO), indium zinc oxide (IZO), tin oxide ($SnO_2$), or zinc oxide (ZnO). In one or more embodiments, the material for forming the first electrode 11 may be metal, such as magnesium (Mg), aluminum (Al), silver (Ag), aluminum-lithium (Al—Li), calcium (Ca), magnesium-indium (Mg—In), or magnesium-silver (Mg—Ag).

The first electrode 11 may have a single-layered structure or a multi-layered structure including two or more layers. For example, the first electrode 11 may have a three-layered structure of ITO/Ag/ITO, but the structure of the first electrode 11 is not limited thereto.

The organic layer 15 is located on the first electrode 11.

The organic layer 15 may include a hole transport region, an emission layer, and an electron transport region.

The hole transport region may be located between the first electrode 11 and the emission layer.

The hole transport region may include a hole injection layer, a hole transport layer, an electron blocking layer, a buffer layer, or a combination thereof.

The hole transport region may include only either a hole injection layer or a hole transport layer. In one or more embodiments, the hole transport region may have a hole injection layer/hole transport layer structure or a hole injection layer/hole transport layer/electron blocking layer structure, wherein, for each structure, each layer is sequentially stacked in this stated order and extending away from the first electrode 11 and towards the second electrode 19.

When the hole transport region includes a hole injection layer, the hole injection layer may be formed (e.g., deposited or coated) on the first electrode 11 by using one or more suitable methods, for example, vacuum deposition, spin coating, casting, and/or Langmuir-Blodgett (LB) deposition.

When the hole injection layer is formed by vacuum deposition, the deposition conditions may vary according to a material that is used to form the hole injection layer, and the structure and thermal characteristics of the hole injection layer. For example, the deposition conditions may include a deposition temperature of about 100 to about 500° C., a vacuum pressure of about $10^{-8}$ torr to about $10^{-3}$ torr, and a deposition rate of about 0.01 angstroms per second (A/sec) to about 100 Å/sec. However, the deposition conditions are not limited thereto.

When the hole injection layer is formed using spin coating, coating conditions may vary according to the material used to form the hole injection layer, and the structure and thermal properties of the hole injection layer. For example, a coating speed may be from about 2,000 revolutions per minute (rpm) to about 5,000 rpm, and a temperature at which a heat treatment is performed to remove a solvent after coating may be from about 80° C. to about 200° C. However, the coating conditions are not limited thereto.

The conditions for forming the hole transport layer and the electron blocking layer may be the same as the conditions for forming the hole injection layer.

The hole transport region may include one or more of 4,4',4"-tris(3-methylphenylphenylamino)triphenylamine (m-MTDATA), 4,4',4"-tris(N,N-diphenylamino)triphenylamine (TDATA), 4,4',4"-tris{N-(2-naphthyl)-N-phenylamino}-triphenylamine (2-TNATA), N,N'-di(naphthalene-1-yl)-N,N'-diphenyl-benzidine (NPB), pi-NPB, N,N'-bis(3-methylphenyl)-N,N'-diphenyl-[1,1-biphenyl]-4,4'-diamine (TPD), spiro-TPD, spiro-NPB, methylated NPB, 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or a compound represented by one of Formula 201 or 202:

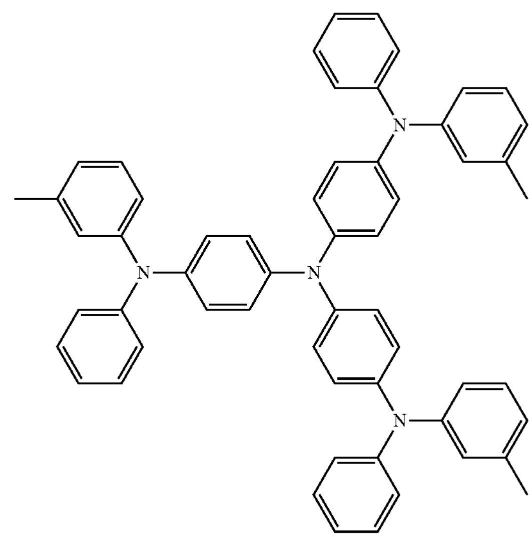

m-MTDATA

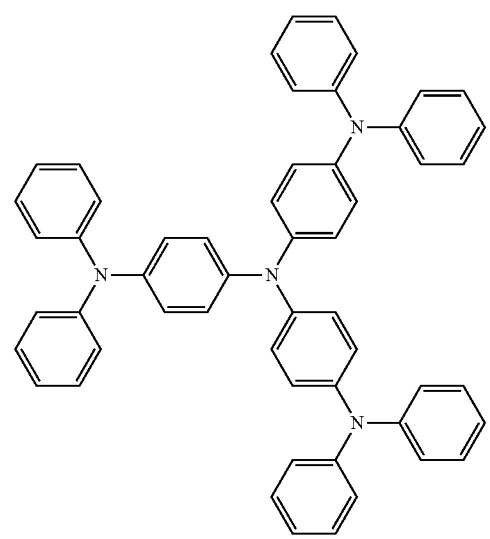

TDATA

-continued
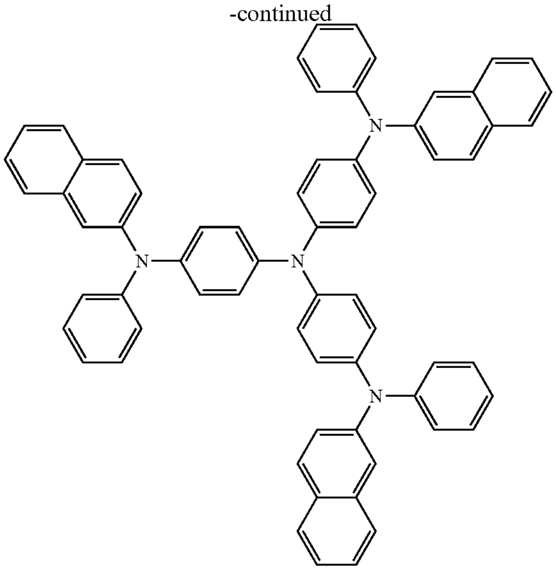
2-TNATA
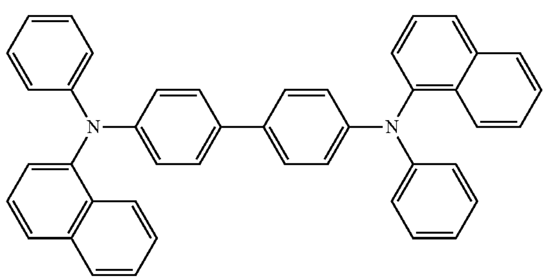
NPB
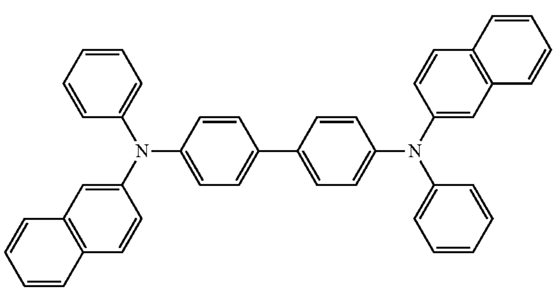
β-NPB
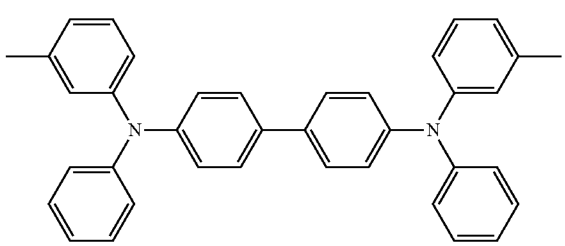
TPD
-continued
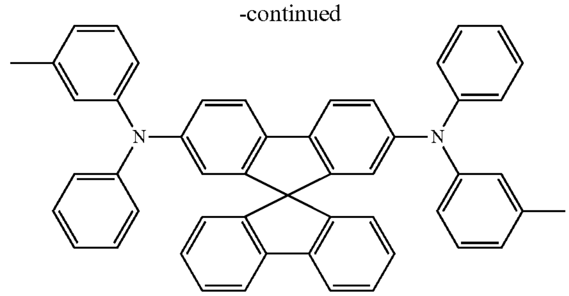
Spiro-TPD
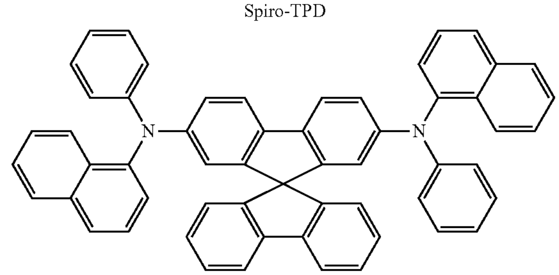
Spiro-NPB
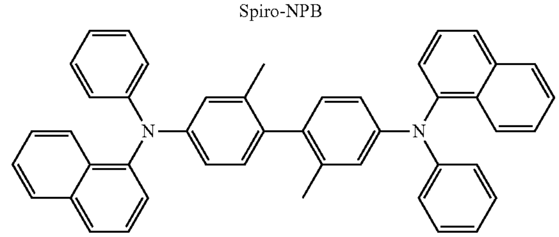
methylated NPB
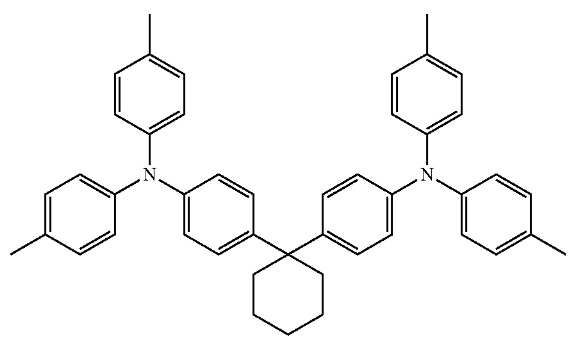
TAPC
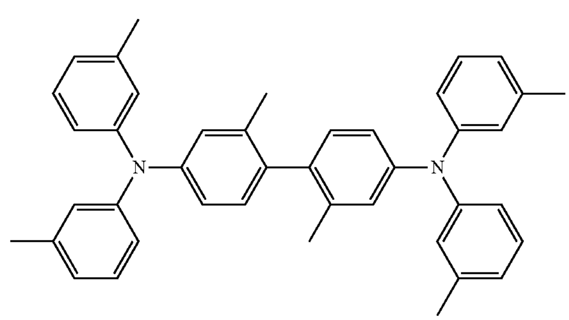
HMTPD -continued Formula 201

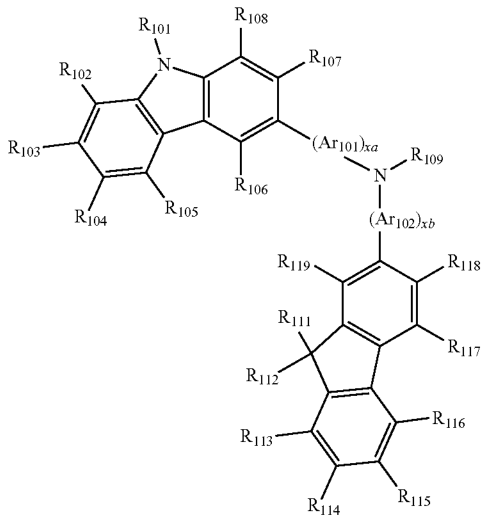

Formula 202

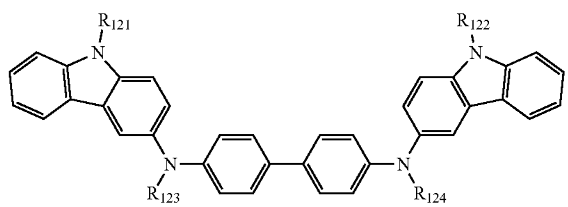

wherein, in Formula 201, $Ar_{101}$ and $Ar_{102}$ may each independently be:

- a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group; or
- a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each substituted with at least one of deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_3$-$C_{10}$ cycloalkenyl group, a $C_1$-$C_{10}$ heterocycloalkyl group, a $C_2$-$C_{10}$ heterocycloalkenyl group, a $C_6$-$C_{60}$ aryl group, a $C_7$-$C_{60}$ alky aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, or a combination thereof.

xa and xb in Formula 201 may each independently be an integer from 0 to 5, or 0, 1, or 2. For example, xa may be 1 and xb may be 0, but xa and xb are not limited thereto.

$R_{101}$ to $R_{108}$, $R_{111}$ to $R_{119}$, and $R_{121}$ to $R_{124}$ in Formulae 201 and 202 may each independently be:

- hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, pentyl group, a hexyl group, or the like), a $C_1$-$C_{10}$ alkoxy group (for example, a methoxy group, an ethoxy group, a propoxy group, a butoxy group, a pentoxy group, or the like), or a $C_1$-$C_{10}$ alkylthio group;
- a $C_1$-$C_{10}$ alkyl group, a $C_1$-$C_{10}$ alkoxy group, or a $C_1$-$C_{10}$ alkylthio group, each substituted with at least one of deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or a combination thereof;
- a phenyl group, a naphthyl group, an anthracenyl group, a fluorenyl group, or a pyrenyl group; or
- a phenyl group, a naphthyl group, an anthracenyl group, a fluorenyl group, or a pyrenyl group, each substituted with at least one of deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, a $C_1$-$C_{10}$ alkylthio group, or a combination thereof, but embodiments of the present disclosure are not limited thereto.

$R_{109}$ in Formula 201 may be:

- a phenyl group, a naphthyl group, an anthracenyl group, or a pyridinyl group; or
- a phenyl group, a naphthyl group, an anthracenyl group, or a pyridinyl group, each substituted with at least one of deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_1$-$C_{20}$ alkylthio group, a phenyl group, a naphthyl group, an anthracenyl group, a pyridinyl group, or a combination thereof.

In one or more embodiments, the compound represented by Formula 201 may be represented by Formula 201A below, but embodiments of the present disclosure are not limited thereto:

Formula 201A

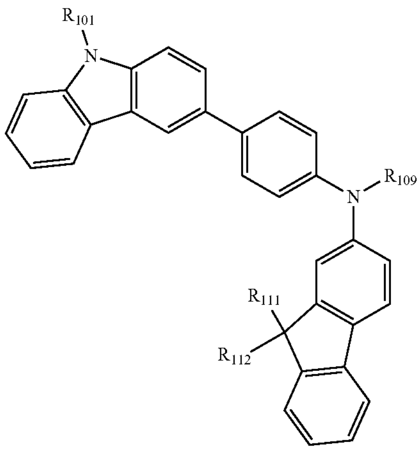

wherein, in Formula 201A, $R_{101}$, $R_{111}$, $R_{112}$, and $R_{109}$ are as defined in the present disclosure.

For example, the compound represented by one of Formulae 201 or 202 may include one of Compounds HT1 to HT20, but are not limited thereto:

HT1

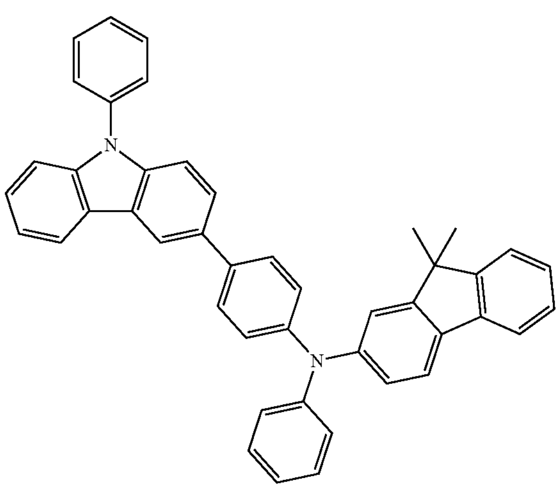

-continued

HT2

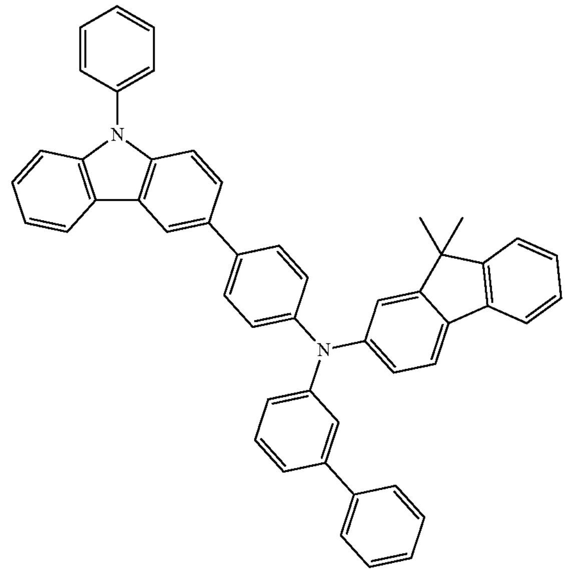

HT3

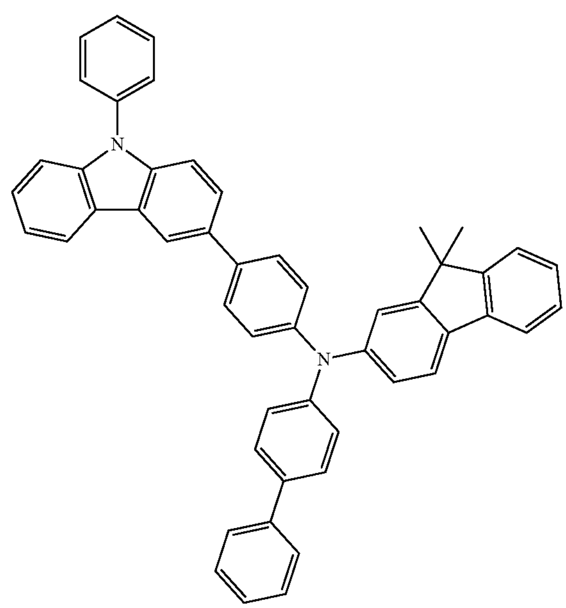

-continued
HT4
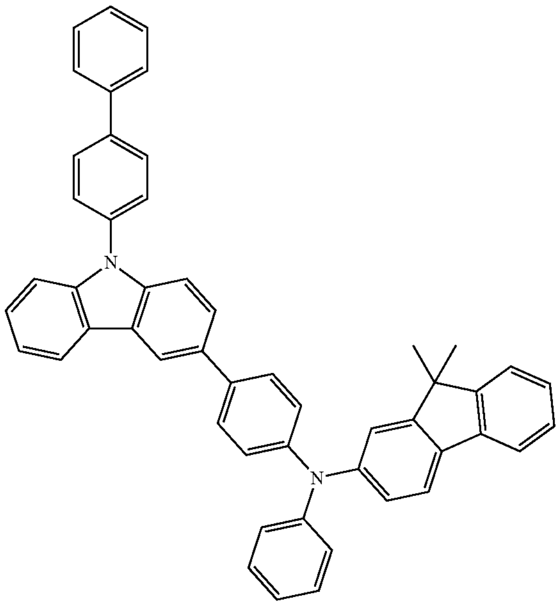
HT5
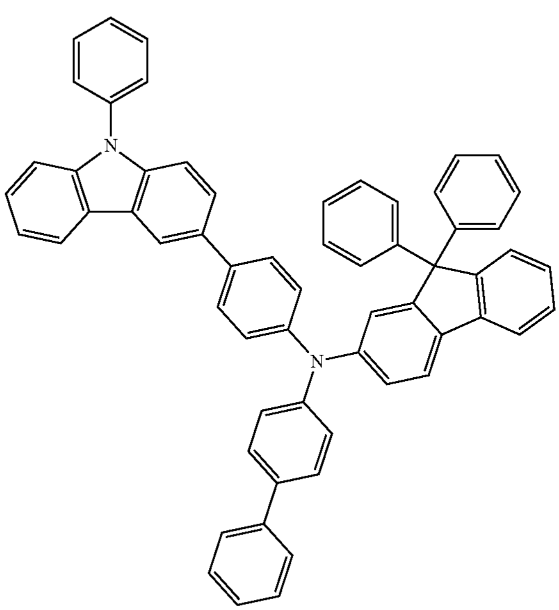
-continued
HT6
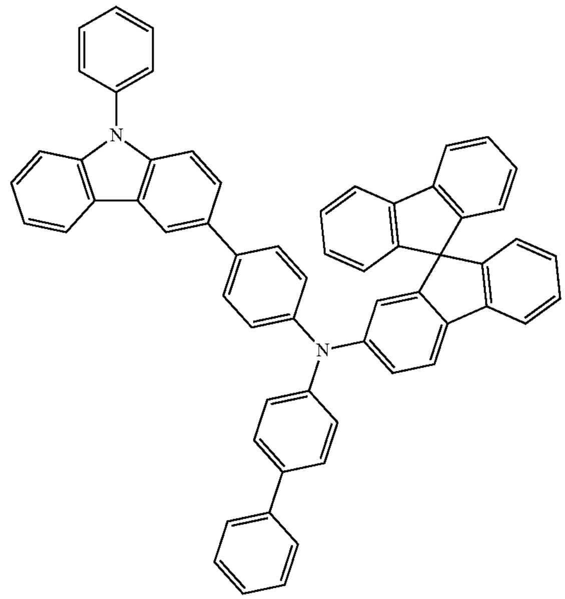
HT7
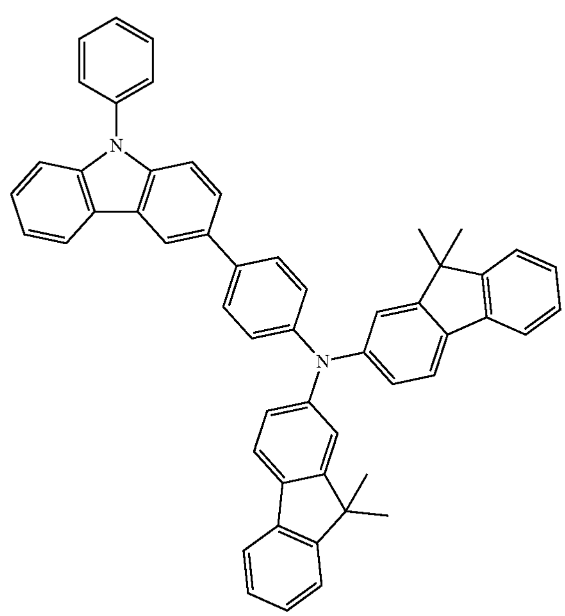

-continued
HT8
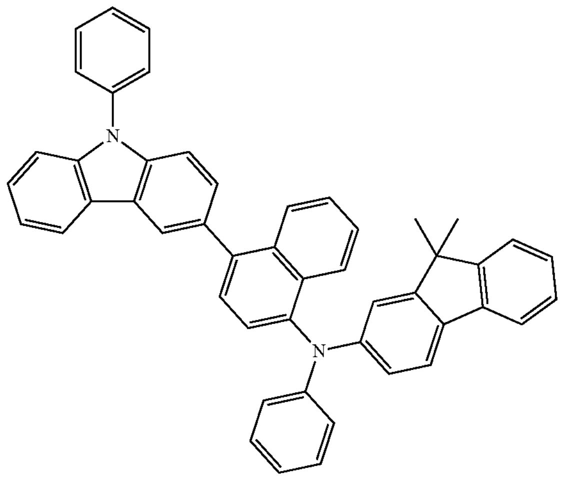
HT9
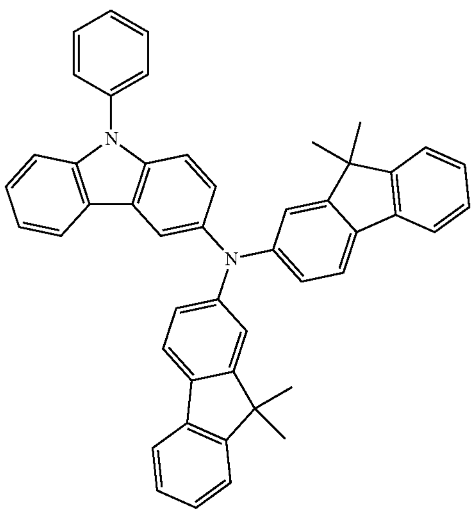
HT10
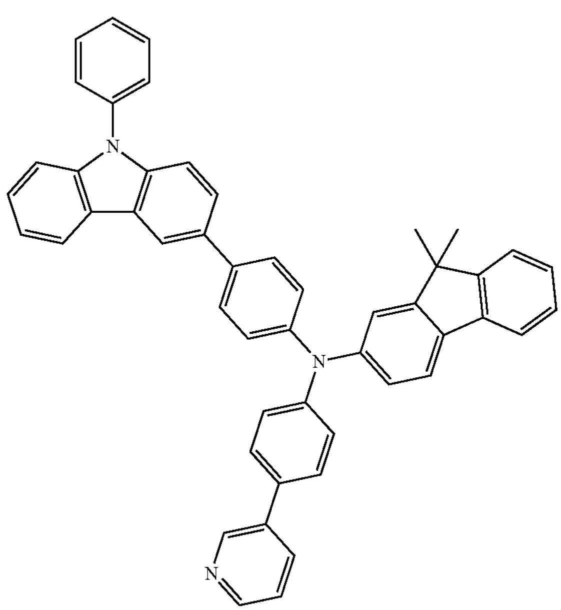
-continued
HT11
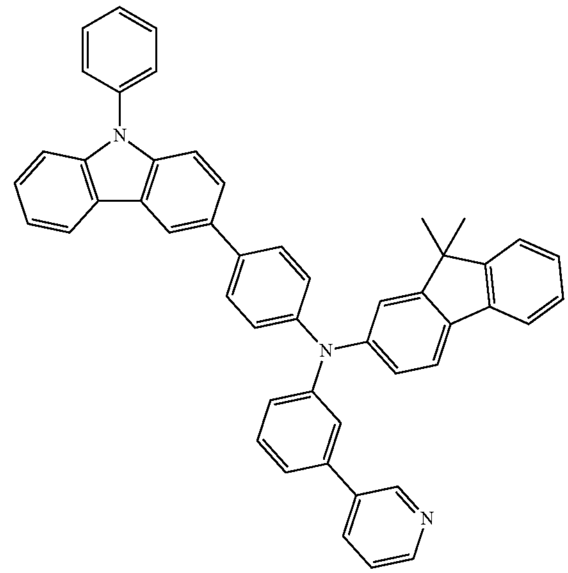
HT12
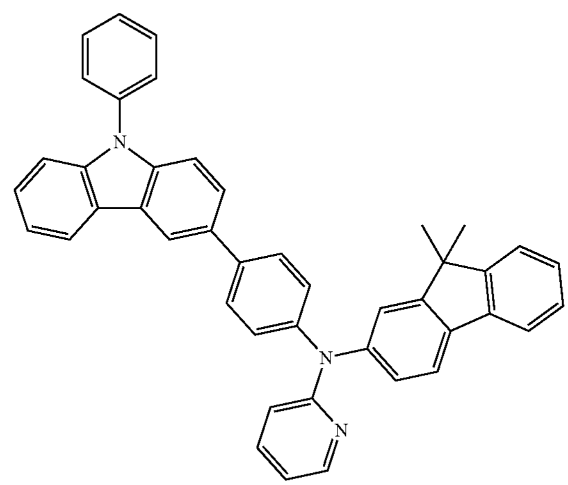
HT13
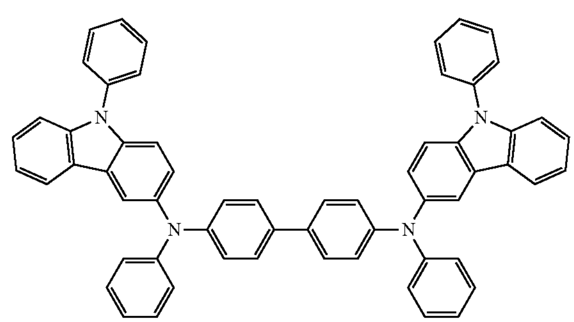

-continued

HT14

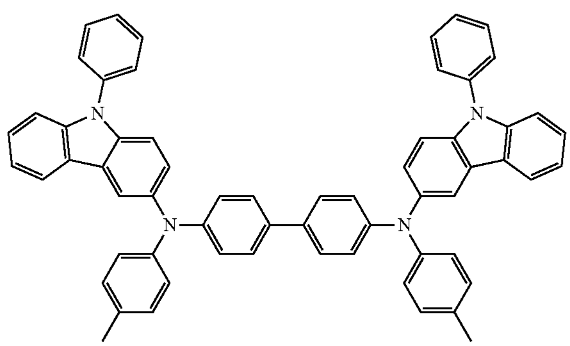

HT15

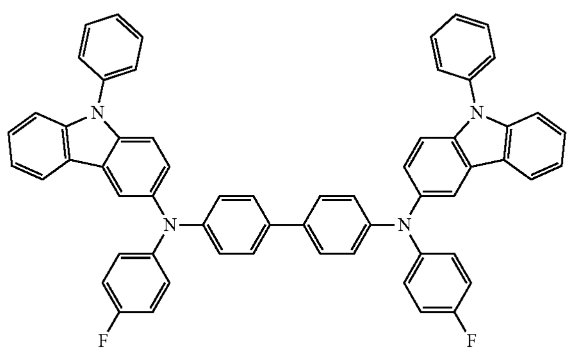

HT16

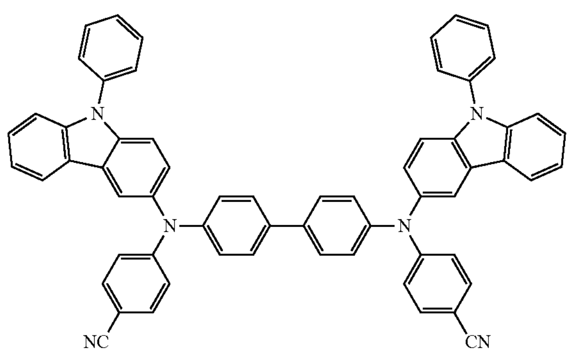

HT17

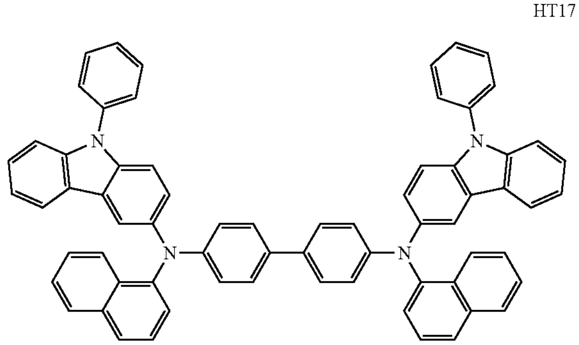

-continued

HT18

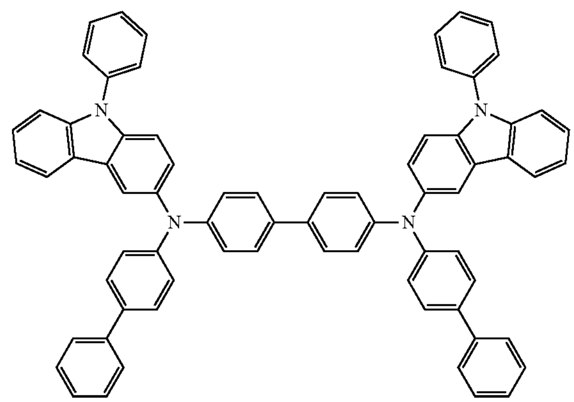

HT19

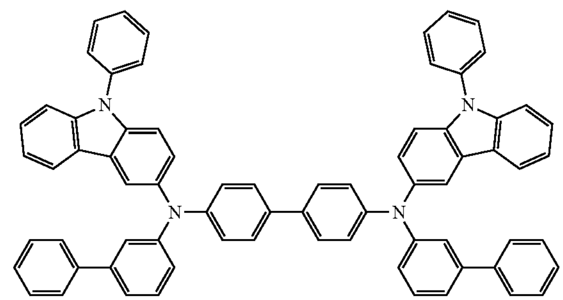

HT20

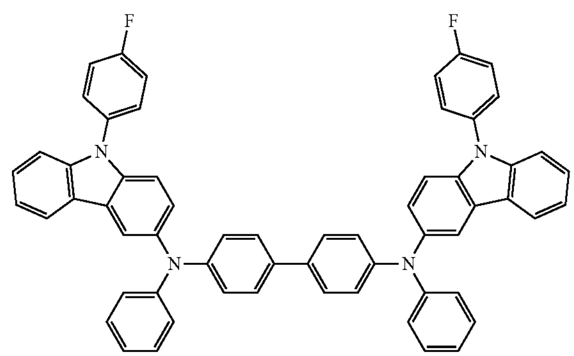

A thickness of the hole transport region may be in the range of about 100 angstroms (Å) to about 10,000 Å, for example, about 100 Å to about 1,000 Å. When the hole transport region includes at least one of a hole injection layer and a hole transport layer, a thickness of the hole injection layer may be in a range of about 100 Å to about 10,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be a quinone derivative, a metal oxide, or a cyano group-containing compound, but embodiments of the present disclosure are not limited thereto. Non-limiting examples of the p-dopant are a quinone derivative, such as tetracyanoquinonedimethane (TCNQ), 2,3,5,6-tetrafluoro-tetracyano-1,4-benzoquinonedimethane (F4-TCNQ), or F6-TCNNQ; a metal oxide, such as a tungsten oxide or a molybdenum oxide; and a cyano group-containing compound, such as Compound HT-D1 or F12, but are not limited thereto.

HT-D1

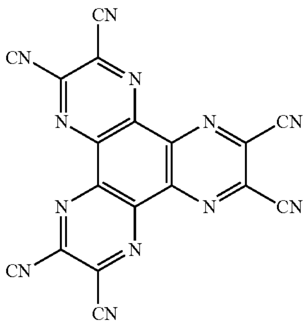

F4-TCNQ

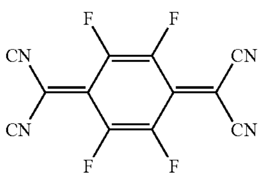

F6-TCNNQ

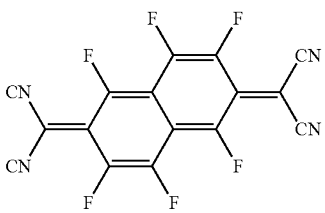

F12

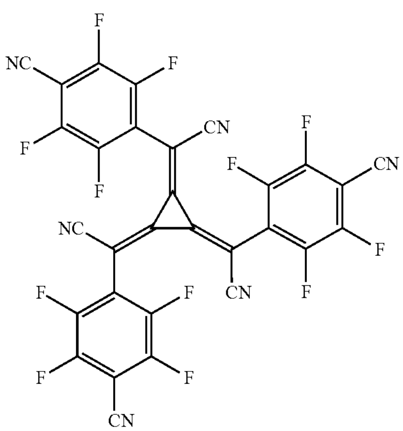

The hole transport region may further include a buffer layer.

The buffer layer may compensate for an optical resonance distance according to a wavelength of light emitted from the emission layer, and thus, efficiency of a formed organic light-emitting device may be improved.

An emission layer may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a material that is used to form the emission layer.

Meanwhile, when the hole transport region includes an electron blocking layer, a material for the electron blocking layer may be chosen from materials for the hole transport region described above and materials for a host to be explained later. However, the material for the electron blocking layer is not limited thereto. For example, when the hole transport region includes an electron blocking layer, a material for the electron blocking layer may be mCP, which will be explained later.

The emission layer may include a host and a dopant, and the dopant may include the organometallic compound represented by Formula 1.

The host may include at least one of 1,3,5-tris(N-phenylbenzimidazole-2-yl)benzene (TPBi), 3-tert-butyl-9,10-di(naphth-2-yl)anthracene (TBADN), 9,10-di(naphthalene-2-yl)anthracene (ADN) (also referred to as "DNA"), 4,4'-bis(N-carbazolyl)-1,1'-biphenyl (CBP), 4,4'-bis(9-carbazolyl)-2,2'-dimethyl-biphenyl (CDBP), TCP, mCP, Compound H50, or Compound H51:

TPBi

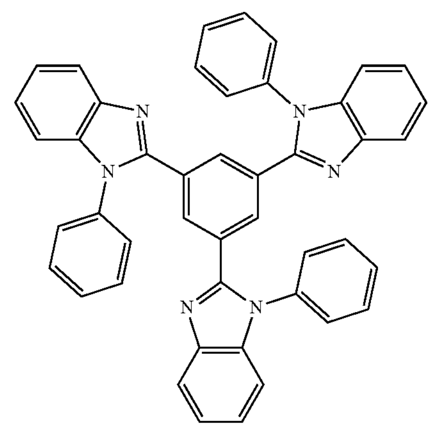

TBADN

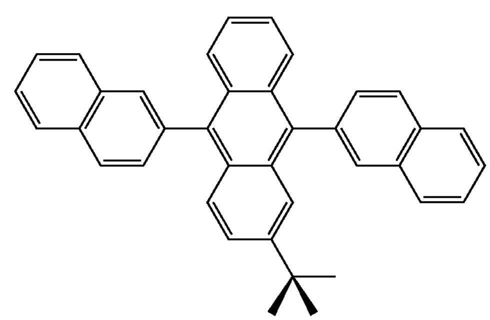

ADN

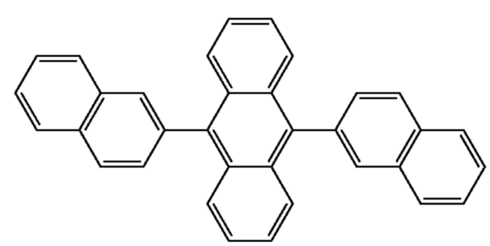

-continued

CBP

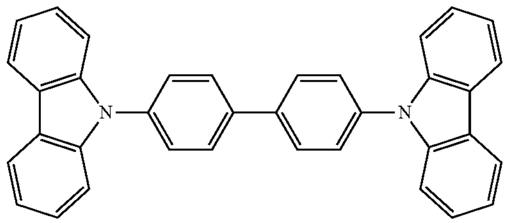

CDBP

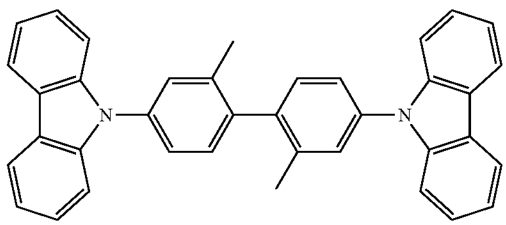

TCP

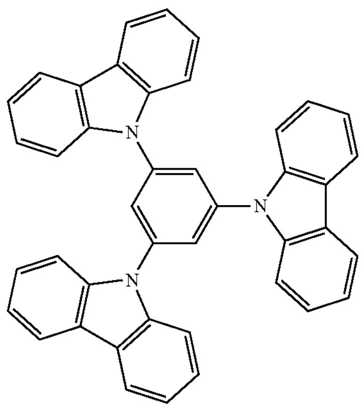

mCP

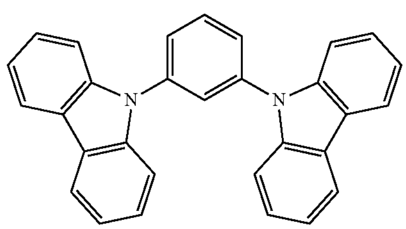

H50

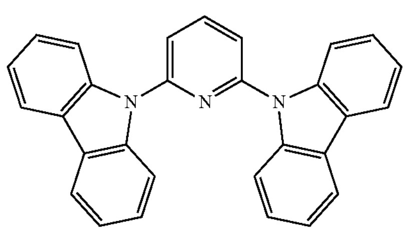

H51

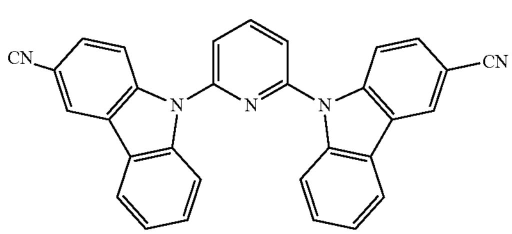

In one or more embodiments, the host may include a compound represented by Formula 301:

Formula 301

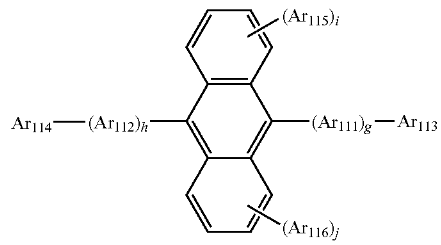

wherein, in Formula 301, $Ar_{111}$ and $Ar_{112}$ may each independently be:

a phenylene group, a naphthylene group, a phenanthrenylene group, or a pyrenylene group; or a phenylene group, a naphthylene group, a phenanthrenylene group, or a pyrenylene group, each substituted with at least one of a phenyl group, a naphthyl group, an anthracenyl group, or a combination thereof.

$Ar_{113}$ to $Ar_{116}$ in Formula 301 may each independently be:

a $C_1$-$C_{10}$ alkyl group, a phenyl group, a naphthyl group, a phenanthrenyl group, or a pyrenyl group; or a phenyl group, a naphthyl group, a phenanthrenyl group, or a pyrenyl group, each substituted with at least one of a phenyl group, a naphthyl group, an anthracenyl group, or a combination thereof.

g, h, i, and j in Formula 301 may each independently be an integer from 0 to 4, and may be, for example, 0, 1, or 2.

$Ar_{113}$ and $Ar_{116}$ in Formula 301 may each independently be:

a $C_1$-$C_{10}$ alkyl group substituted with at least one of a phenyl group, a naphthyl group, an anthracenyl group, or a combination thereof;

a phenyl group, a naphthyl group, an anthracenyl group, a pyrenyl group, a phenanthrenyl group, or a fluorenyl group;

a phenyl group, a naphthyl group, an anthracenyl group, a pyrenyl group, a phenanthrenyl group, or a fluorenyl group, each substituted with at least one of deuterium, —F, —Cl, —Br, —I, $—SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a phenyl group, a naphthyl group, an anthracenyl group, a pyrenyl group, a phenanthrenyl group, a fluorenyl group, or a combination thereof, or

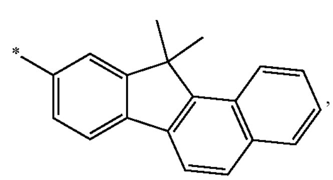 [SMILES: *c1ccc2c(c1)C(C)(C)c1c-2ccc2ccccc12]

but embodiments of the present disclosure are not limited thereto.

In one or more embodiments, the host may include a compound represented by Formula 302 below:

Formula 302

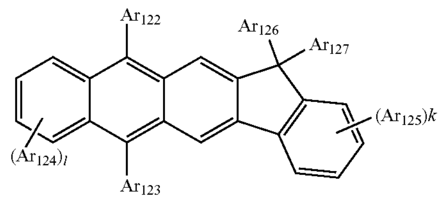

wherein, in Formula 302, $Ar_{122}$ to $Ar_{125}$ are as defined in connection with $Ar_{113}$ in Formula 301.

$Ar_{126}$ and $Ar_{127}$ in Formula 302 may each independently be a $C_1$-$C_{10}$ alkyl group (for example, a methyl group, an ethyl group, or a propyl group).

k and l in Formula 302 may each independently be an integer from 0 to 4. For example, k and l may each be 0, 1, or 2.

When the organic light-emitting device is a full-color organic light-emitting device, the emission layer may be patterned into a red emission layer, a green emission layer, and a blue emission layer. In one or more embodiments, due to a stacked structure including a red emission layer, a green emission layer, and/or a blue emission layer, the emission layer may emit white light.

When the emission layer includes a host and a dopant, an amount of the dopant may be in a range of about 0.01 parts by weight to about 15 parts by weight based on 100 parts by weight of the host, but embodiments of the present disclosure are not limited thereto.

A thickness of the emission layer may be in a range of about 100 Å to about 1,000 Å, for example, about 200 Å to about 600 Å. When the thickness of the emission layer is within the range described above, excellent light-emission characteristics may be obtained without a substantial increase in driving voltage.

Then, an electron transport region may be located on the emission layer.

The electron transport region may include a hole blocking layer, an electron transport layer, an electron injection layer, or a combination thereof.

For example, the electron transport region may have a hole blocking layer/electron transport layer/electron injection layer structure or an electron transport layer/electron injection layer structure, and the structure of the electron transport region is not limited thereto. The electron transport layer may have a single-layered structure or a multi-layered structure including two or more different materials.

Conditions for forming the hole blocking layer, the electron transport layer, and the electron injection layer which may constitute the electron transport region may be understood by referring to the conditions for forming the hole injection layer.

When the electron transport region includes a hole blocking layer, the hole blocking layer may include, for example, at least one of 2,9-dimethyl-4,7-diphenyl-1,10-phenanthroline (BCP), bis(2-methyl-8-quinolinolato-N1,08)-(1,1'-biphenyl-4-olato)aluminum (Bphen), and bis(2-methyl-8-quinolinolato-N1,08)-(1,1'-biphenyl-4-olato)aluminum (BAlq), but embodiments of the present disclosure are not limited thereto.

BCP

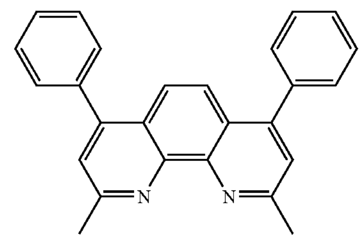

Bphen

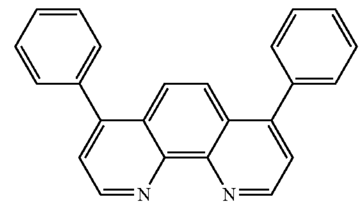

A thickness of the hole blocking layer may be in a range of about 20 Å to about 1,000 Å, for example, about 30 Å to about 300 Å. When the thickness of the hole blocking layer is within the range described above, excellent hole blocking characteristics may be obtained without a substantial increase in driving voltage.

The electron transport layer may further include at least one of BCP, Bphen, tris(8-hydroxy-quinolinato)aluminum ($Alq_3$), BAlq, 3-(4-biphenylyl)-4-phenyl-5-tert-butylphenyl-1,2,4-triazole (TAZ), or 4-(naphthalen-1-yl)-3,5-diphenyl-4H-1,2,4-triazole (NTAZ).

$Alq_3$

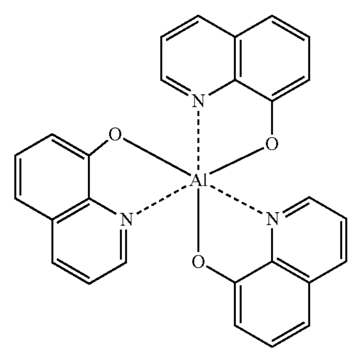

BAlq

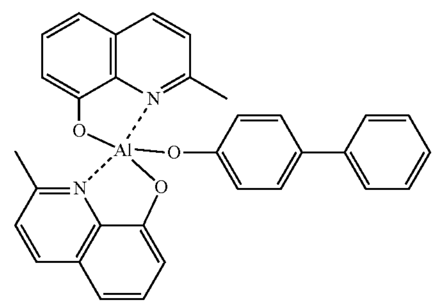

-continued
TAZ
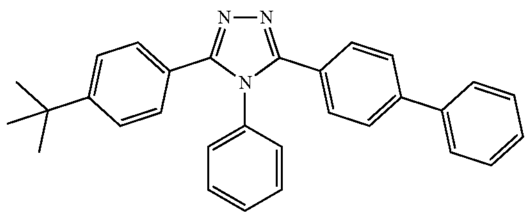
NTAZ
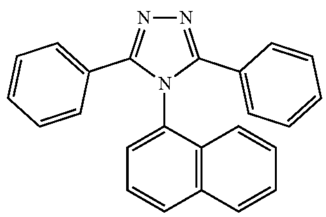
In one or more embodiments, the electron transport layer may include at least one of ET1 to ET25, but embodiments of the present disclosure are not limited thereto:
ET1
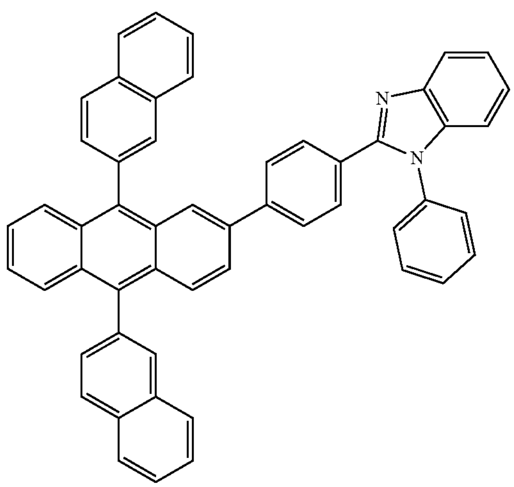
ET2
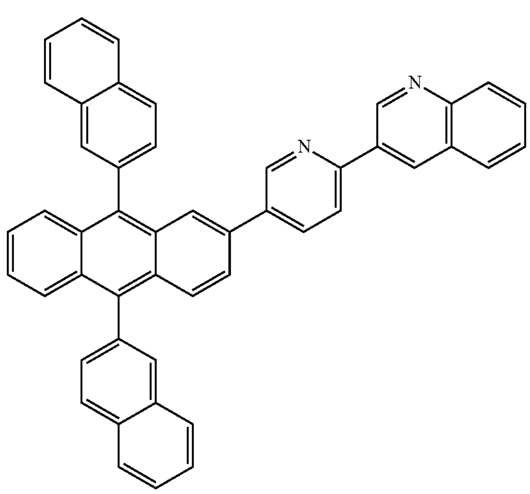
-continued
ET3
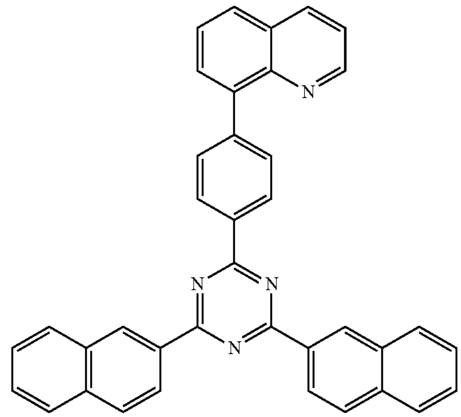
ET4
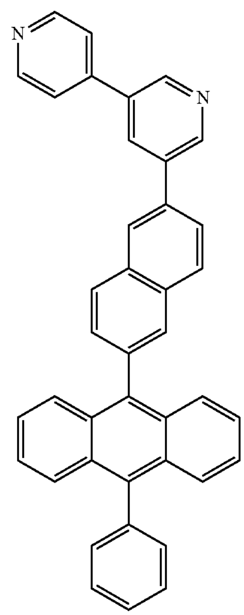
ET5
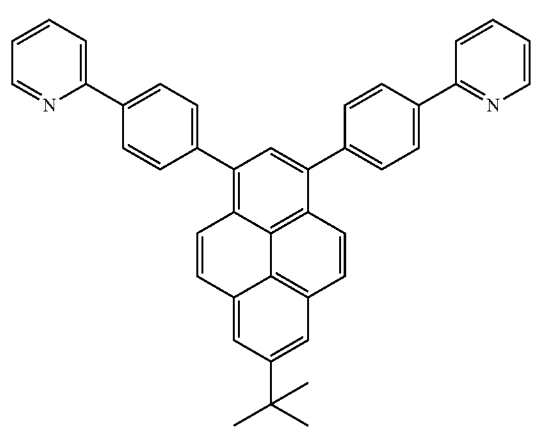

ET6
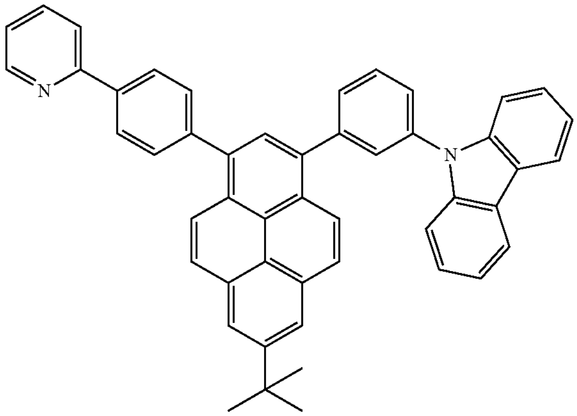
ET7
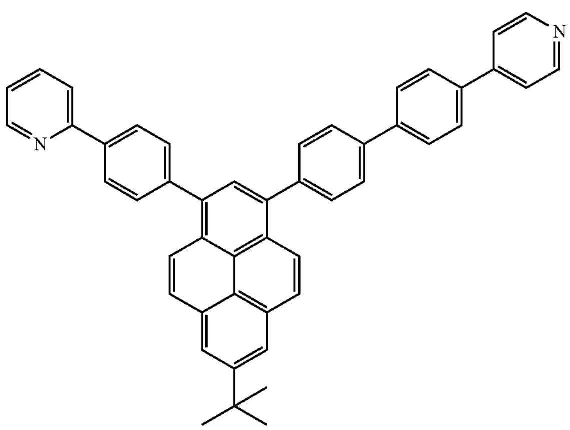
ET8
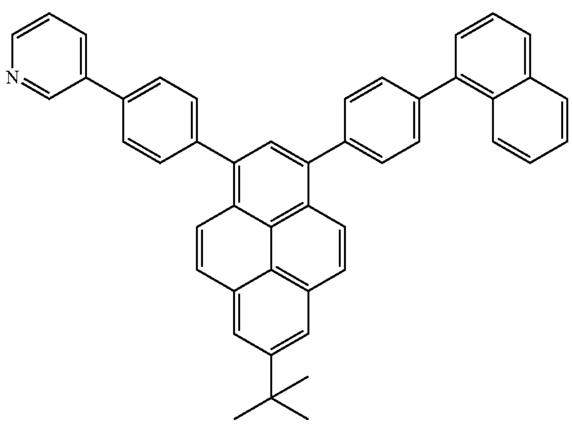
ET9
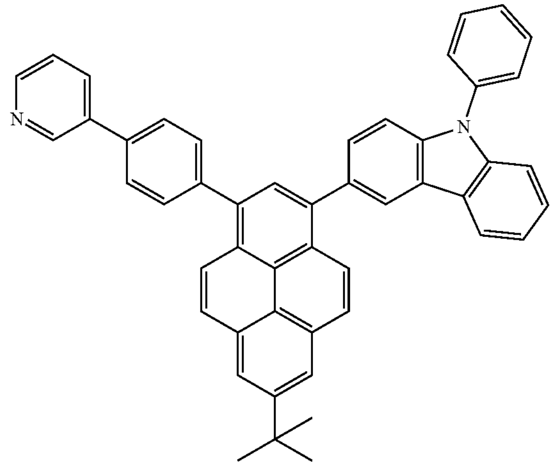
ET10
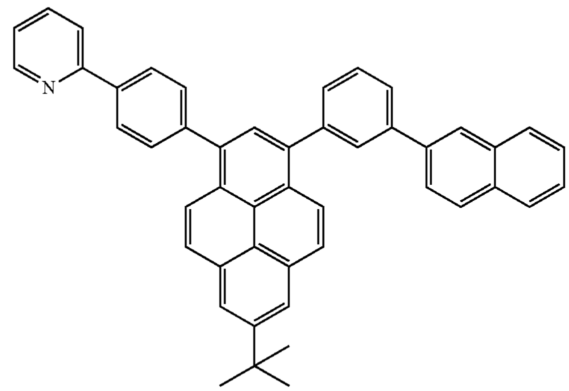
ET11
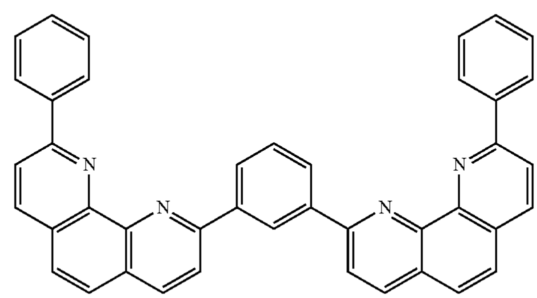
ET12
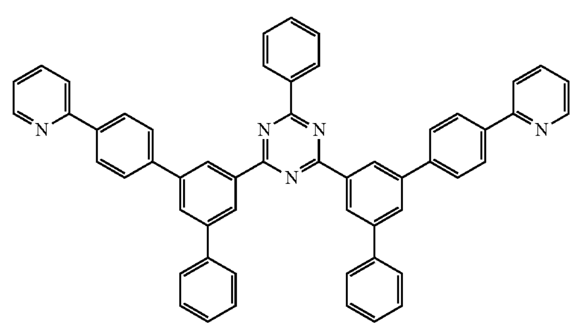

-continued
ET13
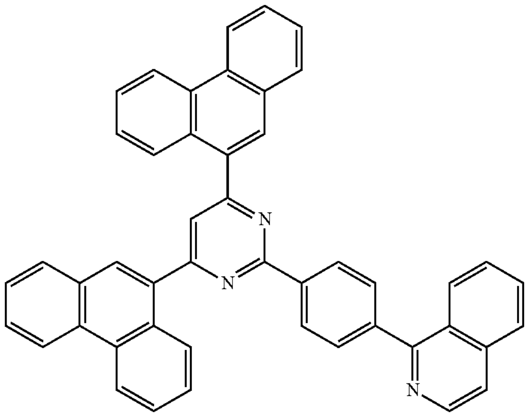
ET14
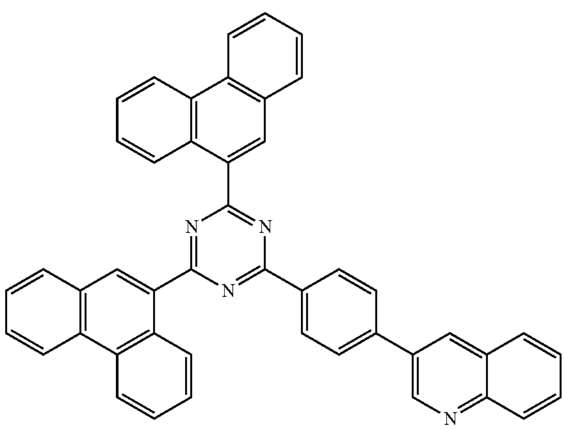
ET15
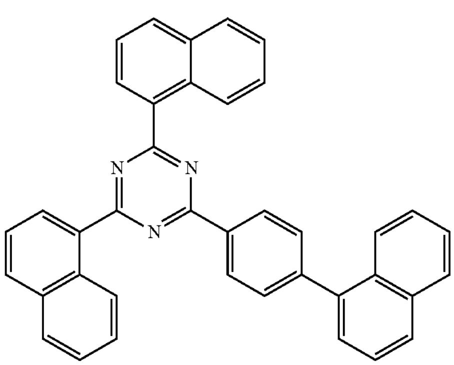
-continued
ET16
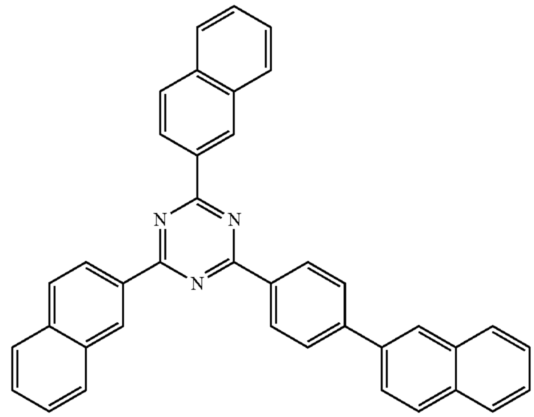
ET17
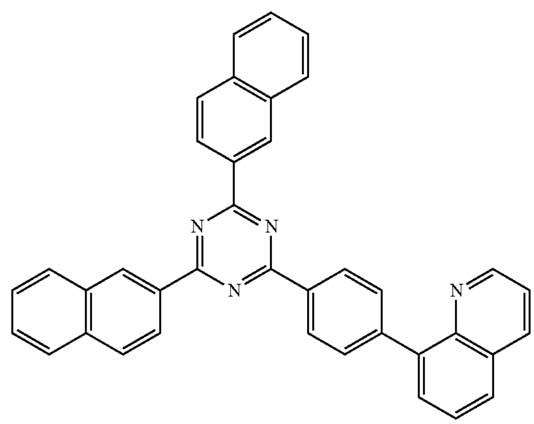
ET18
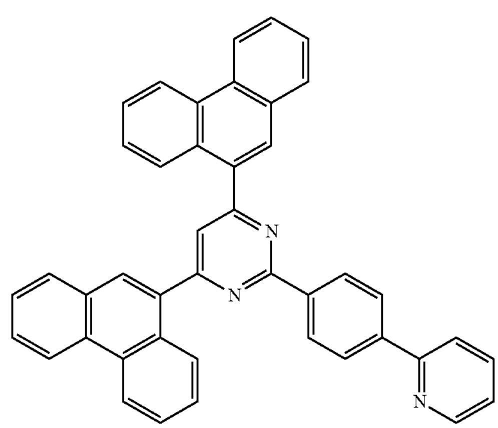

-continued
ET19
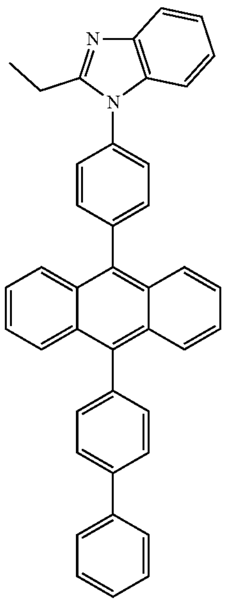
ET20
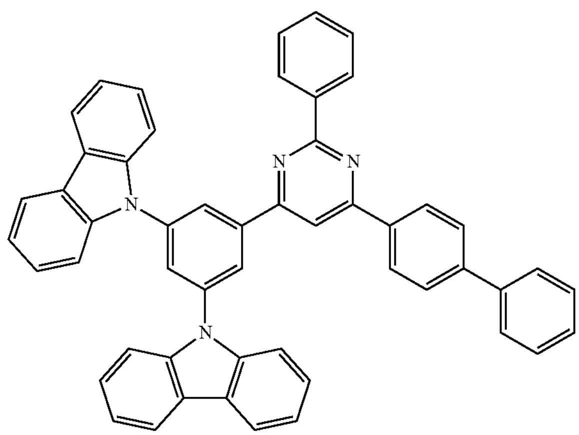
ET21
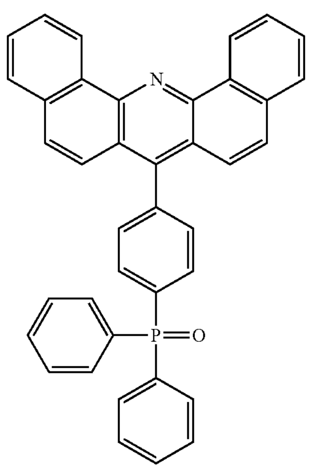
-continued
ET22
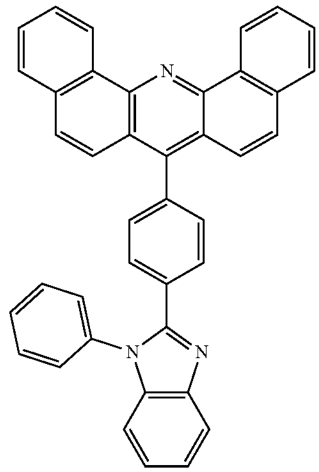
ET23
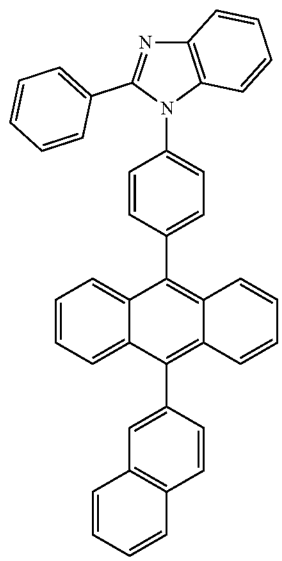
ET24
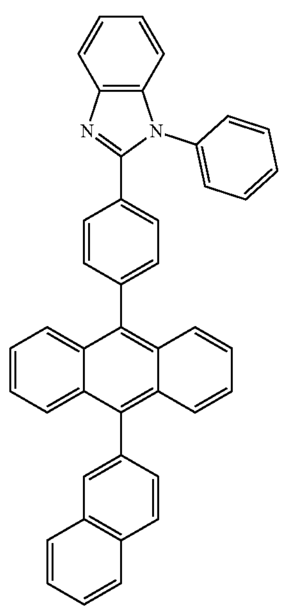

-continued

ET25

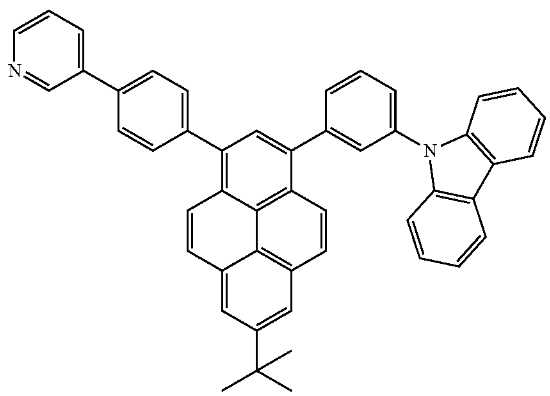

A thickness of the electron transport layer may be in a range of about 100 Å to about 1,000 Å, for example, about 150 Å to about 500 Å. When the thickness of the electron transport layer is within the range described above, satisfactory electron transporting characteristics may be obtained without a substantial increase in driving voltage.

The electron transport layer may include a metal-containing material in addition to the material as described above.

The metal-containing material may include a Li complex. The Li complex may include, for example, Compound ET-D1 (lithium quinolate, LiQ) or ET-D2:

ET-D1

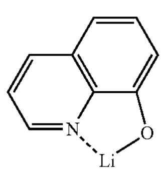

ET-D2

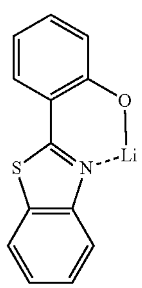

Also, the electron transport region may include an electron injection layer that facilitates injection of electrons from the second electrode 19.

The electron injection layer may include LiF, NaCl, CsF, $Li_2O$, BaO, or a combination thereof.

A thickness of the electron injection layer may be in a range of about 1 Å to about 100 Å, for example, about 3 Å to about 90 Å. When the thickness of the electron injection layer is within the range described above, satisfactory electron injection characteristics may be obtained without a substantial increase in driving voltage.

The second electrode 19 is located on the organic layer 15. The second electrode 19 may be a cathode. A material for forming the second electrode 19 may be a metal, an alloy, an electrically conductive compound, or a combination thereof, which have a relatively low work function. For example, lithium (Li), magnesium (Mg), aluminum (Al), silver (Ag), aluminum-lithium (Al—Li), calcium (Ca), magnesium-indium (Mg—In), or magnesium-silver (Mg—Ag) may be used as the material for forming the second electrode 19. In one or more embodiments, to manufacture a top-emission type light-emitting device, a transmissive electrode formed using ITO or IZO may be used as the second electrode 19.

Hereinbefore, the organic light-emitting device has been described with reference to FIGURE, but embodiments of the present disclosure are not limited thereto.

Another aspect provides a diagnostic composition including at least one organometallic compound represented by Formula 1.

The organometallic compound represented by Formula 1 provides high luminescence efficiency. Accordingly, a diagnostic composition including the organometallic compound may have high diagnostic efficiency.

The diagnostic composition may be used in various applications including a diagnosis kit, a diagnosis reagent, a biosensor, and a biomarker.

The term "$C_1$-$C_{60}$ alkyl group" as used herein refers to a linear or branched saturated aliphatic hydrocarbon monovalent group having 1 to 60 carbon atoms, and examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof include a methoxy group, an ethoxy group, and an isopropyloxy group. The term "$C_1$-$C_{60}$ alkylthio group" as used herein refers to a monovalent group represented by —$SA_{102}$ (wherein $A_{102}$ is the $C_1$-$C_{60}$ alkyl group).

The term "$C_2$-$C_{60}$ alkenyl group" as used herein refers to a hydrocarbon group formed by substituting at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by substituting at least one carbon-carbon triple bond in the middle or at the terminus of the $C_2$-$C_{60}$ alkyl group, and examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent saturated monocyclic group having at least one heteroatom chosen from N, O, P, Si, S, Se, Ge, and B as a ring-forming atom and 1 to 10 carbon atoms, and examples thereof include a tetrahydrofuranyl group and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_2$-$C_{10}$ heterocycloalkenyl group" as used herein refers to a monovalent monocyclic group that has at least one heteroatom chosen from N, O, P, Si, S, Se, Ge, and B as a ring-forming atom, 1 to 10 carbon atoms, and at least one carbon-carbon double bond in its ring. Examples of the $C_2$-$C_{10}$ heterocycloalkenyl group include a 2,3-dihydrofuranyl group and a 2,3-dihydrothiophenyl group. The term "$C_2$-$C_{10}$ heterocycloalkenylene group" as used herein refers to a divalent group having the same structure as the $C_2$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_7$-$C_{60}$ alkyl aryl group" as used herein refers to a $C_6$-$C_{60}$ aryl group substituted with at least one $C_1$-$C_{60}$ alkyl group. The term "$C_7$-$C_{60}$ aryl alkyl group" as used herein refers to a $C_1$-$C_{60}$ alkyl group substituted with at least one $C_6$-$C_{60}$ aryl group.

The term "$C_1$-$C_{60}$ heteroaryl group" as used herein refers to a monovalent group having a carbocyclic aromatic system that has at least one heteroatom chosen from N, O, P, Si, S, Se, Ge, and B as a ring-forming atom, and 1 to 60 carbon atoms. The term "$C_1$-$C_{60}$ heteroarylene group" as used herein refers to a divalent group having a carbocyclic aromatic system that has at least one heteroatom chosen from N, O, P, Si, S, Se, Ge, and B as a ring-forming atom, and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_6$-$C_{60}$ heteroaryl group and the $C_6$-$C_{60}$ heteroarylene group each include two or more rings, the rings may be fused to each other. The $C_2$-$C_{60}$ alkylheteroaryl group refers to a $C_1$-$C_{60}$ heteroaryl group substituted with at least one $C_1$-$C_{60}$ alkyl group.

The term "$C_2$-$C_{60}$ alkyl heteroaryl group" as used herein refers to a $C_1$-$C_{60}$ heteroaryl group substituted with at least one $C_1$-$C_{60}$ alkyl group. The term "$C_2$-$C_{60}$ heteroaryl alkyl group" as used herein refers to a $C_1$-$C_{60}$ alkyl group substituted with at least one $C_1$-$C_{60}$ heteroaryl group.

The term "$C_6$-$C_{60}$ aryloxy group" as used herein indicates —$OA_{103}$ (wherein $A_{103}$ is the $C_6$-$C_{60}$ aryl group). The term "$C_6$-$C_{60}$ arylthio group" as used herein indicates —$SA_{104}$ (wherein $A_{104}$ is the $C_6$-$C_{60}$ aryl group).

The term "$C_1$-$C_{60}$ heteroaryloxy group" as used herein indicates —$OA_{104}$ (wherein $A_{104}$ is the $C_1$-$C_{60}$ heteroaryl group), and the term "$C_1$-$C_{60}$ heteroarylthio group" as used herein indicates —$SA_{105}$ (wherein $A_{105}$ is the $C_1$-$C_{60}$ heteroaryl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group include a fluorenyl group. The term "divalent non-aromatic condensed polycyclic group" as used herein refers to a divalent group having the same structure as a monovalent non-aromatic condensed polycyclic group.

The term "monovalent non-aromatic condensed heteropolycyclic group" as used herein refers to a monovalent group (for example, having 2 to 60 carbon atoms) having two or more rings condensed to each other, a heteroatom chosen from N, O, P, Si, S, Se, Ge, and B other than carbon atoms, as a ring-forming atom, and no aromaticity in its entire molecular structure. Examples of the monovalent non-aromatic condensed heteropolycyclic group include a carbazolyl group. The term "divalent non-aromatic condensed heteropolycyclic group" as used herein refers to a divalent group having the same structure as a monovalent non-aromatic condensed heteropolycyclic group.

The term "$C_5$-$C_{30}$ carbocyclic group" as used herein refers to a saturated or unsaturated cyclic group having, as ring-forming atoms, 5 to 30 carbon atoms only. The $C_5$-$C_{30}$ carbocyclic group may be a monocyclic group or a polycyclic group.

The term "$C_1$-$C_{30}$ heterocyclic group" as used herein refers to a saturated or unsaturated cyclic group having, as a ring-forming atom, at least one heteroatom chosen from N, O, Si, P, S, Se, Ge, and B other than the 1 to 30 carbon atoms. The $C_1$-$C_{30}$ heterocyclic group may be a monocyclic group or a polycyclic group.

At least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_7$-$C_{60}$ alkyl aryl group, the substituted $C_7$-$C_{60}$ aryl alkyl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted $C_2$-$C_{60}$ heteroaryl alkyl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group may be:

- deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;
- a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —B($Q_{16}$)($Q_{17}$), P(═O)($Q_{18}$)($Q_{19}$), —P($Q_{18}$)($Q_{19}$), or a combination thereof;

a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, or a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, or a monovalent non-aromatic condensed heteropolycyclic group, each substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), P($Q_{28}$)($Q_{29}$), —P(═O)($Q_{28}$)($Q_{29}$), or a combination thereof; or —N($Q_{31}$)($Q_{32}$), —Si($Q_{33}$)($Q_{34}$)($Q_{35}$), —B($Q_{36}$)($Q_{37}$), P($Q_{38}$)($Q_{39}$), or —P(═O)($Q_{38}$)($Q_{39}$), wherein $Q_1$ to $Q_9$, $Q_{11}$ to $Q_{19}$, $Q_{21}$ to $Q_{29}$, and $Q_{31}$ to $Q_{39}$ may each independently be hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group; a $C_1$-$C_{60}$ alkyl group substituted with at least one of deuterium, a $C_1$-$C_{60}$ alkyl group, a $C_6$-$C_{60}$ aryl group, or a combination thereof; a $C_2$-$C_{60}$ alkenyl group; a $C_2$-$C_{60}$ alkynyl group; a $C_1$-$C_{60}$ alkoxy group; a $C_1$-$C_{60}$ alkylthio group; a $C_3$-$C_{10}$ cycloalkyl group; a $C_1$-$C_{10}$ heterocycloalkyl group; a $C_3$-$C_{10}$ cycloalkenyl group; a $C_2$-$C_{10}$ heterocycloalkenyl group; a $C_6$-$C_{60}$ aryl group; a $C_6$-$C_{60}$ aryl group substituted with at least one of deuterium, a $C_1$-$C_{60}$ alkyl group, a $C_6$-$C_{60}$ aryl group, or a combination thereof; a $C_6$-$C_{60}$ aryloxy group; a $C_6$-$C_{60}$ arylthio group; a $C_1$-$C_{60}$ heteroaryl group; a $C_2$-$C_{60}$ alkyl heteroaryl group; a $C_2$-$C_{60}$ heteroaryl alkyl group; a $C_1$-$C_{60}$ heteroaryloxy group; a $C_1$-$C_{60}$ heteroarylthio group; a monovalent non-aromatic condensed polycyclic group; or a monovalent non-aromatic condensed heteropolycyclic group.

Hereinafter, an exemplary compound and an exemplary organic light-emitting device according to one or more embodiments are described in further detail with reference to Synthesis Example and Examples. However, the organic light-emitting device is not limited thereto. The wording "'B' was used instead of 'A'" used in describing Synthesis Examples means that an amount of 'A' used was identical to an amount of 'B' used, in terms of a molar equivalent.

EXAMPLES

Synthesis Example 1: Synthesis of Compound 1

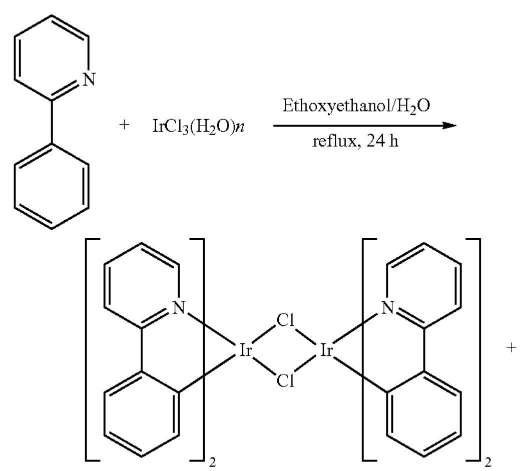

1A(1)

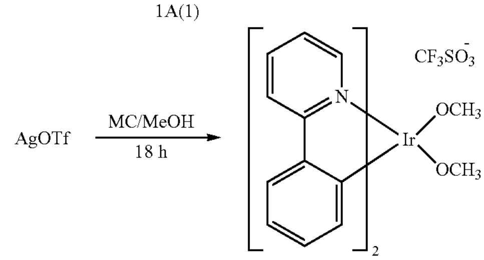

1A

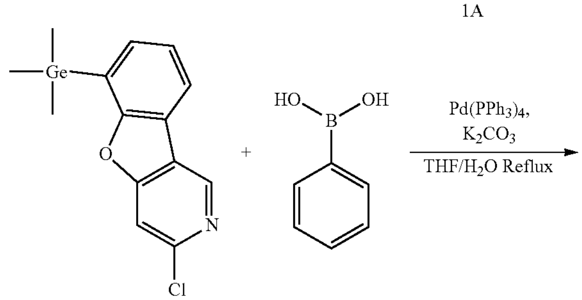

-continued

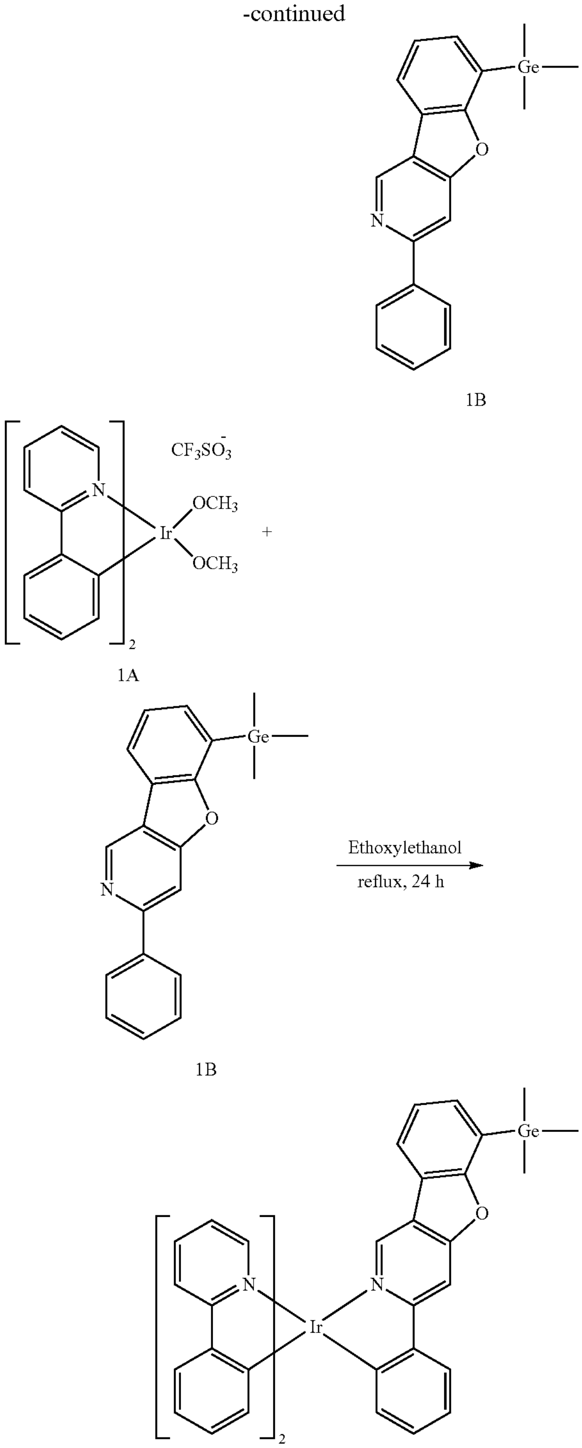

1B

1A

1B

1

(1) Synthesis of Compound 1A(1)

2-phenylpyridine (7.5 grams (g), 33.1 millimoles (mmol)) and iridium chloride hydrate (5.2 g, 14.7 mmol) were mixed with 120 milliliters (mL) of ethoxyethanol and 40 mL of deionized (DI) water, the resultant mixture was stirred while refluxing for 24 hours, and then, the temperature was lowered to room temperature. The resulting solid was separated by filtration, washed sufficiently with water, methanol, and hexane, in this stated order, and then dried in a vacuum oven to obtain 8.2 g (yield of 82%) of Compound 1A(1).

(2) Synthesis of Compound 1A

Compound 1A(1) (1.6 g, 1.2 mmol) and 45 mL of methylene chloride were mixed, and then, silver triflate (AgOTf) (0.6 g, 2.3 mmol) was added thereto after being mixed with 15 mL of methanol (MeOH). Thereafter, the mixture was stirred for 18 hours at room temperature while light was blocked with aluminum foil, and then filtered through Celite to remove the resulting solid, and the filtrate was subjected to reduced pressure to obtain a solid (Compound 1A). Compound 1A was used in the next reaction without an additional purification process.

(3) Synthesis of Compound 1B

In a nitrogen environment, phenyl boronic acid (0.5 g, 3.75 mmol) and 3-chloro-6-(trimethylgermyl)benzofuro[3,2-c]pyridine (1.0 g, 3.1 mmol) were dissolved in 75 mL of 1,4-dioxane to form a reaction mixture. Then, potassium carbonate ($K_2CO_3$) (1.0 g, 9.37 mmol) was dissolved in 25 mL of DI water, and then, the resultant solution was added to the reaction mixture, and a palladium catalyst ($Pd(PPh_3)_4$) (0.18 g, 0.16 mmol) was then added thereto. Then, the reaction mixture was stirred while heating at reflux at 100° C.

After allowing the reaction to cool and subsequent extraction, the obtained solid was subjected to column chromatography (eluent: methylene chloride (MC) and hexanes) to obtain 1.0 g (yield of 88%) of Compound 1B (3-phenyl-6-(trimethylgermyl)benzofuro[3,2-c]pyridine). The obtained compound was identified by high resolution mass spectrometry (HRMS, using matrix assisted laser desorption ionization (MALDI)) and high-performance liquid chromatography (HPLC) analysis.

HRMS (MALDI) calcd for $C_{20}H_{19}GeNO$: m/z: 362.01 Found: 364.08.

(4) Synthesis of Compound 1

Compound 1A (1.3 g, 1.8 mmol) and Compound 1B (0.7 g, 2.0 mmol) were mixed with 35 mL of 2-ethoxyethanol and 35 mL of N,N-dimethylformamide, the resultant mixture was stirred while heating at reflux for 24 hours, and then, the temperature was lowered to room temperature. An extraction process was performed thereon with methylene chloride and water, and then, the water layer was removed therefrom. The resultant was treated with anhydrous magnesium sulfate, followed by filtration and then concentration under reduced pressure. After extraction, the obtained solid was subjected to column chromatography (eluent: methylene chloride (MC) and hexanes) to obtain 0.66 g (yield of 40%) of Compound 1. The obtained compound was identified by HRMS and HPLC analysis.

HRMS (MALDI) calcd for $C_{43}H_{34}GeIrN_2O$: m/z: 859.61 Found: 862.13.

Synthesis Example 2: Synthesis of Compound 2

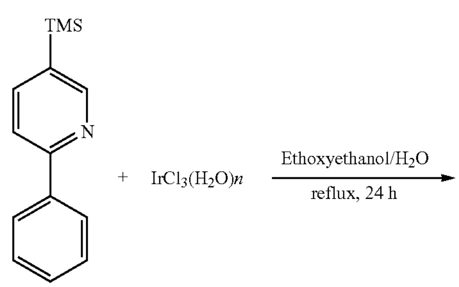

-continued

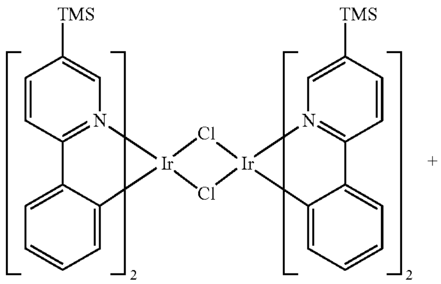

2A(1)

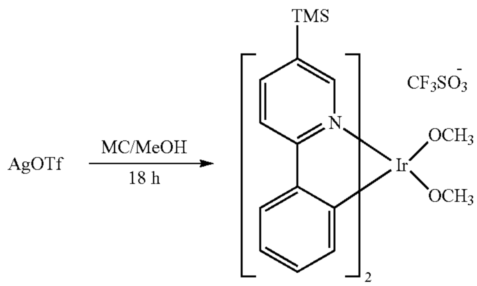

2A

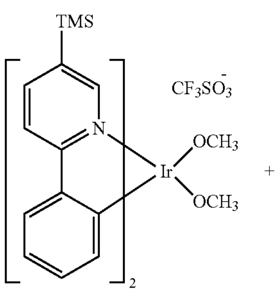

2A

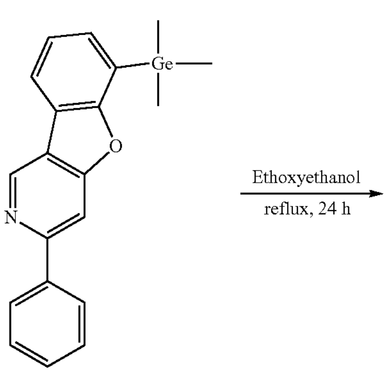

1B

-continued

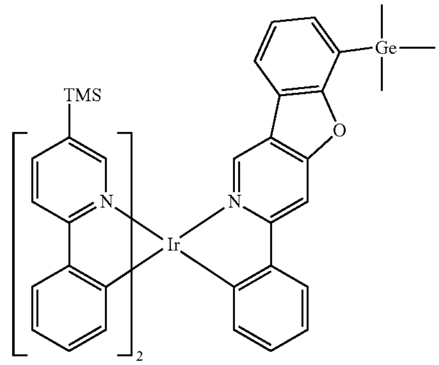

2

0.65 g (yield of 46%) of Compound 2 was obtained in a similar manner as used to synthesize Compound 1 of Synthesis Example 1, except that 2-phenyl-5-(trimethylsilyl) pyridine (8.7 g, 38.3 mmol) was used instead of 2-phenylpyridine in synthesizing Compound 2A(1). The obtained compound was identified by HRMS and HPLC analysis.

HRMS (MALDI) calcd for $C_{49}H_{50}GeIrN_2OSi_2$: m/z: 1003.97 Found: 1006.33.

Synthesis Example 3: Synthesis of Compound 3

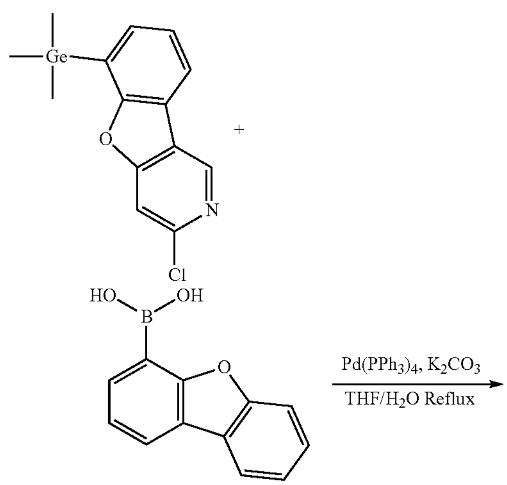

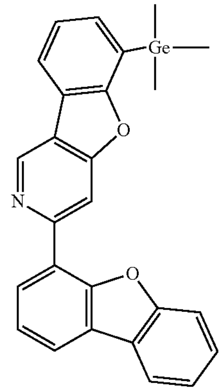

3B

-continued

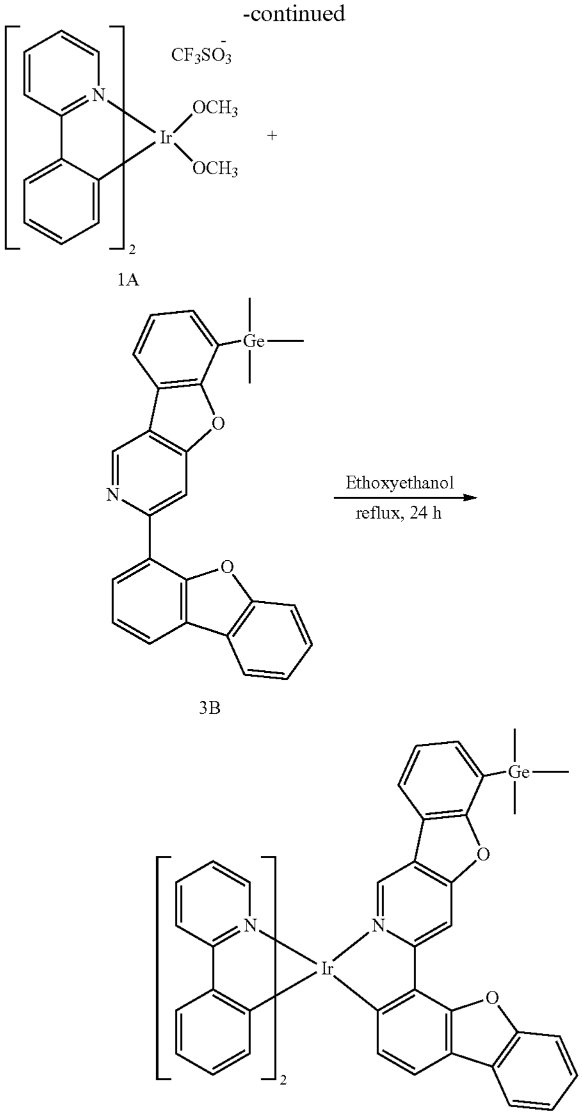

1A

3B

3

(3) Synthesis of Compound 3B

In a nitrogen environment, dibenzo[b,d]furan-4-yl boronic acid (1.0 g, 4.9 mmol) and 3-chloro-6-(trimethylgermyl)benzofuro[3,2-c]pyridine (1.3 g, 4.0 mmol) were dissolved in 90 mL of 1,4-dioxane to form a reaction mixture. Then, potassium carbonate ($K_2CO_3$) (1.3 g, 12.2 mmol) was dissolved in 30 mL of DI water, and then, the resultant solution was added to the reaction mixture, and a palladium catalyst ($Pd(PPh_3)_4$) (0.23 g, 0.2 mmol) was then added thereto. Then, the reaction mixture was stirred while heating at reflux at 100° C. After cooling to room temperature and subsequent extraction, the obtained solid was subjected to column chromatography (eluent: methylene chloride (MC) and hexane) to obtain 1.5 g (yield of 82%) of Compound 3B (3-(dibenzo[b,d]furan-4-yl)-6-(trimethylgermyl)benzofuro[3,2-c]pyridine). The obtained compound was identified by HRMS and HPLC analysis.

HRMS (MALDI) calcd for $C_{21}H_{25}GeNO_2$: m/z: 452.09 Found: 454.08.

(4) Synthesis of Compound 3

Compound 1A (1.4 g, 2.0 mmol) and Compound 1B (1.0 g, 2.2 mmol) were mixed with 40 mL of 2-ethoxyethanol and 40 mL of N,N-dimethylformamide, the resultant mixture was stirred while heating at reflux for 24 hours, and then, the temperature was lowered to room temperature. An extraction process was performed thereon with methylene chloride and water, and then, the water layer was removed therefrom. The resultant was treated with anhydrous magnesium sulfate, followed by filtration and concentration under reduced pressure. After extraction, the obtained solid was subjected to column chromatography (eluent: methylene chloride (MC) and hexanes) to obtain 0.72 g (yield of 38%) of Compound 3. The obtained compound was identified by HRMS and HPLC analysis.

HRMS (MALDI) calcd for $C_{45}H_{36}GeIrN_3O_2$: m/z: 951.68 Found: 954.18.

Synthesis Example 4: Synthesis of Compound 64

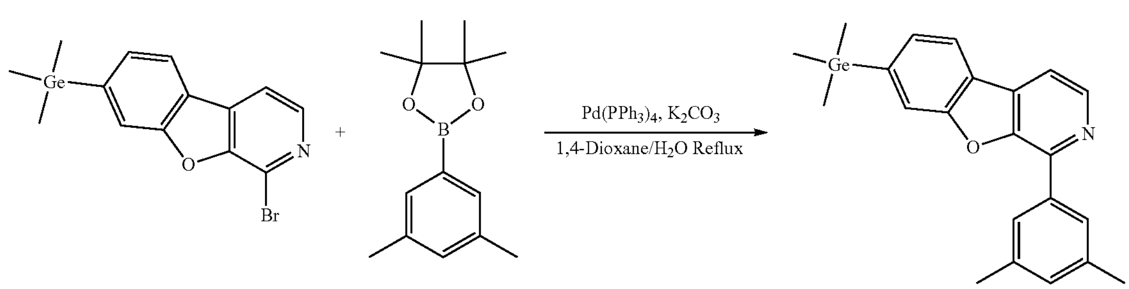

64A

-continued

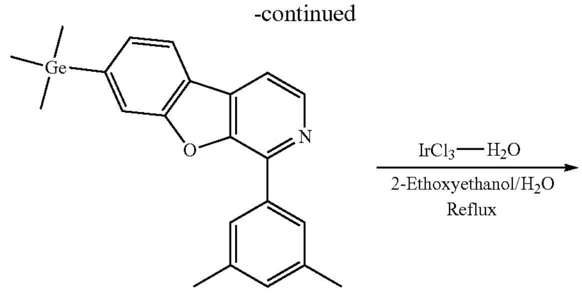

64A

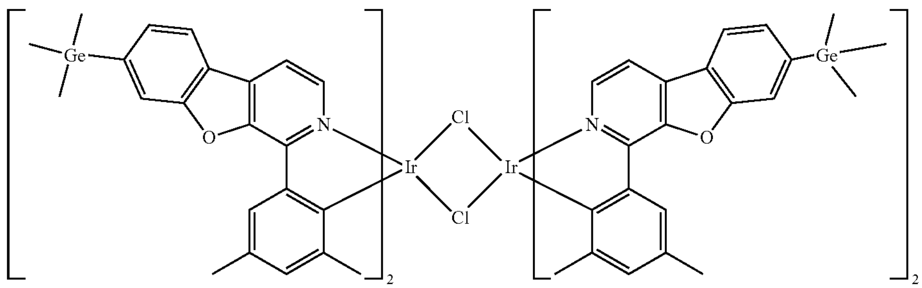

64B

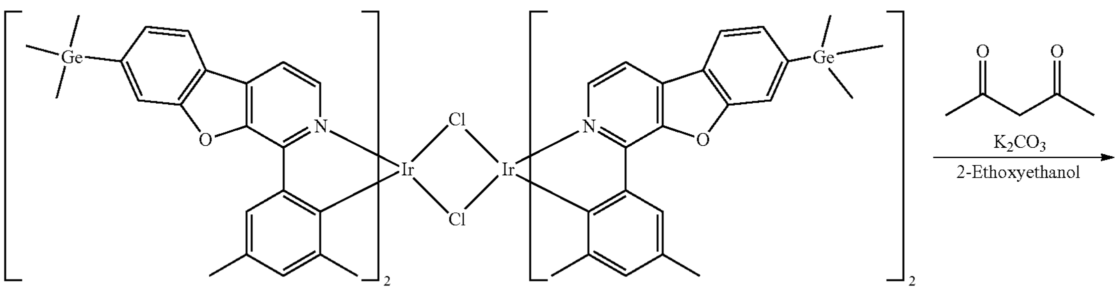

64B

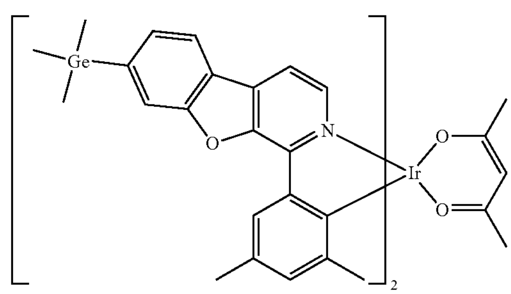

64

(1) Synthesis of Compound 64A

In a nitrogen environment, 1-bromo-7-(trimethylgermyl) benzofuro[2,3-c]pyridine (1.5 g, 4.1 mmol) and 2-(3,5-dimethylphenyl)-4,4,5,5-tetramethyl-1,3,2-dioxoborane (1.1 g, 4.5 mmol) were dissolved in 90 mL of 1,4-dioxane to form a reaction mixture. Then, potassium carbonate ($K_2CO_3$) (1.3 g, 12.3 mmol) was dissolved in 30 mL of DI water, and then, the resultant solution was added to the reaction mixture, and a palladium catalyst ($Pd(PPh_3)_4$) (0.23 g, 0.2 mmol) was then added thereto. Then, the reaction mixture was stirred while heating at reflux at 110° C. After allowing the reaction to cool to room temperature and subsequent extraction, the obtained solid was subjected to column chromatography (eluent: methylene chloride (MC) and hexanes) to obtain 1.4 g (yield of 87%) of Compound 64A (1-(3,5-dimethylphenyl)-7-(trimethylgermyl)benzofuro [2,3-c]pyridine). The obtained compound was identified by HRMS and HPLC analysis.

HRMS(MALDI) calcd for $C_{22}H_{23}GeNO$: m/z: 390.06 Found: 392.04.

(2) Synthesis of Compound 64B

Compound 64A (1.4 g, 3.57 mmol) and iridium chloride (0.6 g, 1.70 mmol) were mixed with 15 mL of 2-ethoxy-ethanol and 5 mL of DI water, and the resultant mixture was stirred while heating at reflux for 24 hours, and then, the temperature was allowed to cool to room temperature. The resulting solid was separated by filtration, washed sufficiently with water, methanol, and hexanes, in this stated order, and the obtained solid was dried in a vacuum oven to obtain 1.5 g of Compound 64B (83% yield). The obtained Compound 64B was used in the next reaction without an additional purification process.

(3) Synthesis of Compound 64

Compound 64B (1.50 g, 0.75 mmol), pentane-2,4-dione (0.19 g, 1.86 mmol), and potassium carbonate ($K_2CO_3$) (0.26 g, 1.86 mmol) were mixed with 15 mL of 2-ethoxyethanol, and the mixture was stirred for 18 hours at room temperature. After allowing the reaction to cool and subsequent extraction, the obtained solid was subjected to column chromatography (eluent: methylene chloride (MC) and hexanes) to obtain 0.68 g (yield of 85%) of Compound 64. The obtained compound was identified by HRMS and HPLC analysis.

HRMS(MALDI) calcd for $C_{49}H_{52}Ge_2IrN_2O_4$: m/z: 1070.44 Found: 1072.83.

Synthesis Example 5: Synthesis of Compound 66

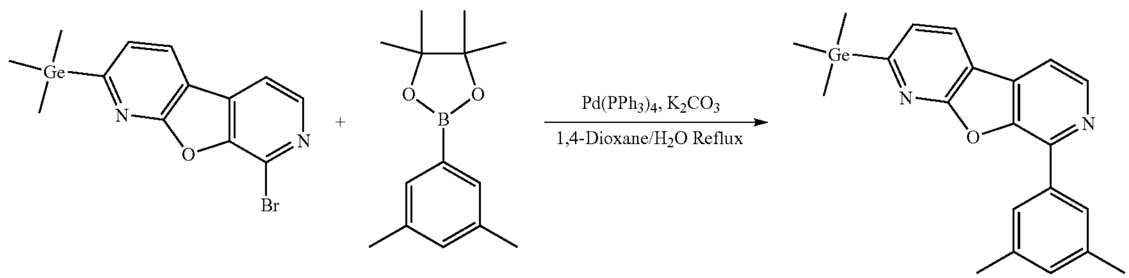

66A

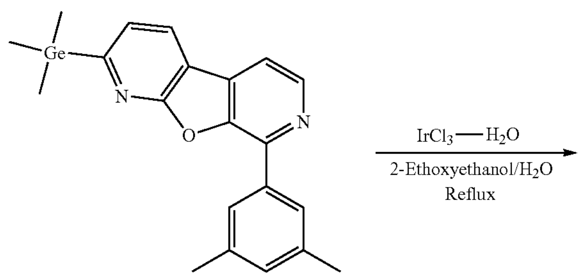

66A

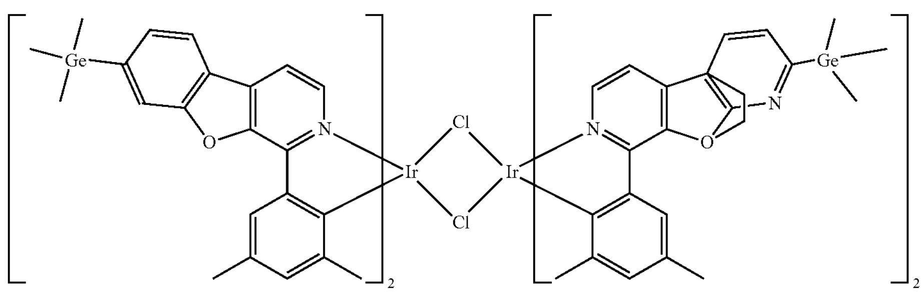

66B

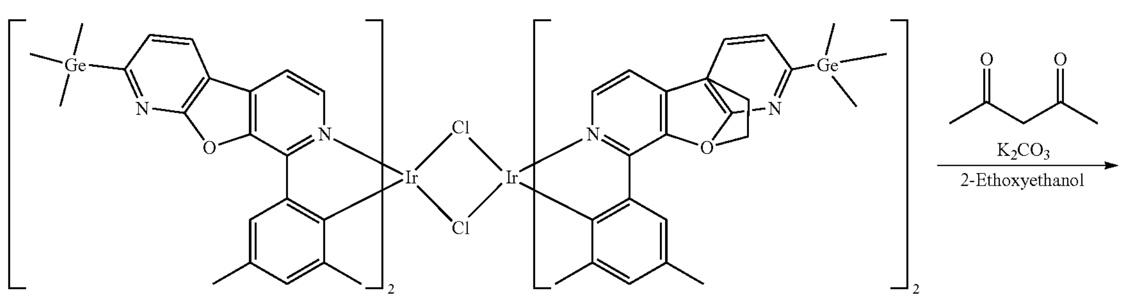

66B

-continued

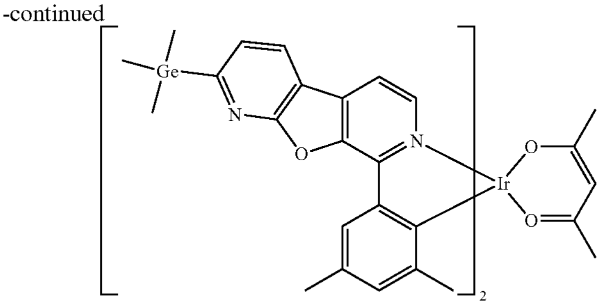

66

0.55 g (yield of 80%) of Compound 66 was obtained in a similar manner as used to synthesize Compound 64 of Synthesis Example 4, except that 8-bromo-2-(trimethylgermyl)furo[2,3-b:5,4-c']dipyridine (1.5 g, 4.10 mmol) was used instead of 1-bromo-7-(trimethylgermyl)benzofuro[2,3-c]pyridine in synthesizing Compound 66A. The obtained compound was identified by HRMS and HPLC analysis.

HRMS(MALDI) calcd for $C_{47}H_{50}Ge_2IrN_4O_4$: m/z: 1072.42 Found: 1074.92.

Synthesis Example 6: Synthesis of Compound 145

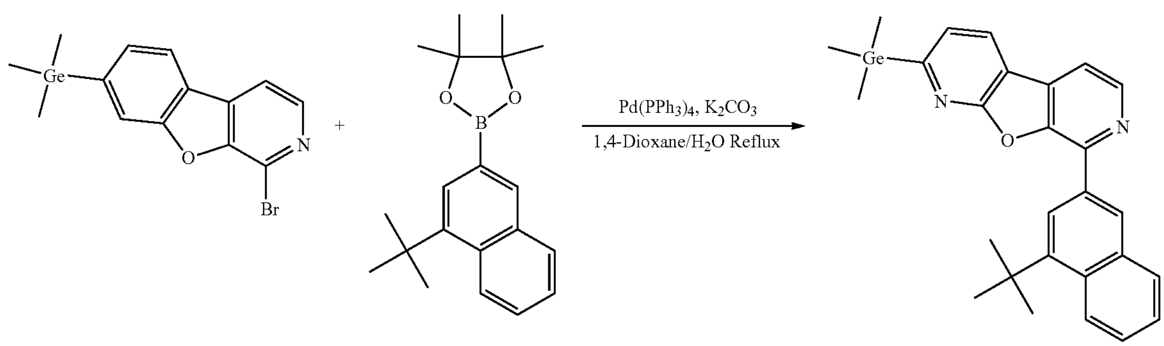

145A

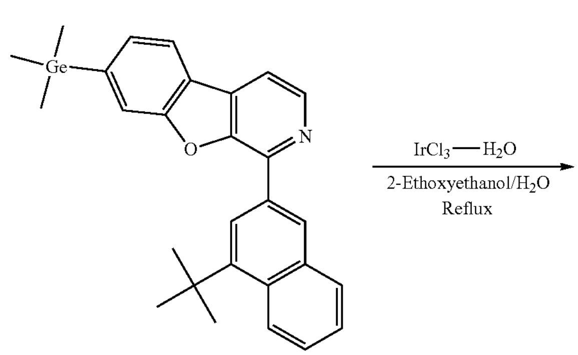

145A

-continued

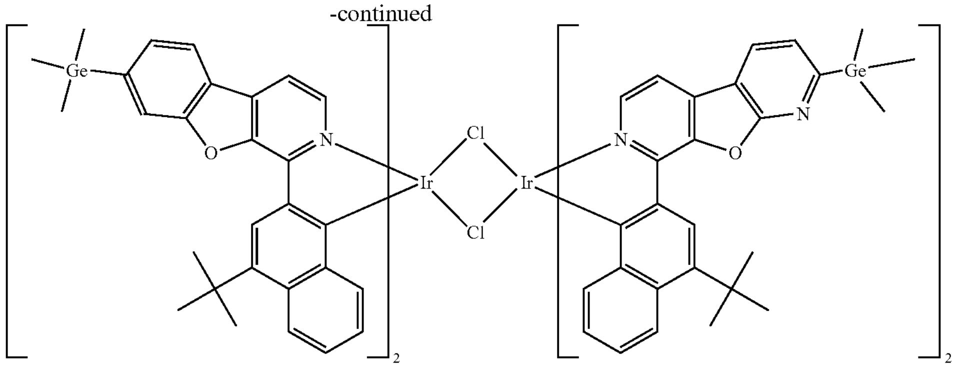

145B

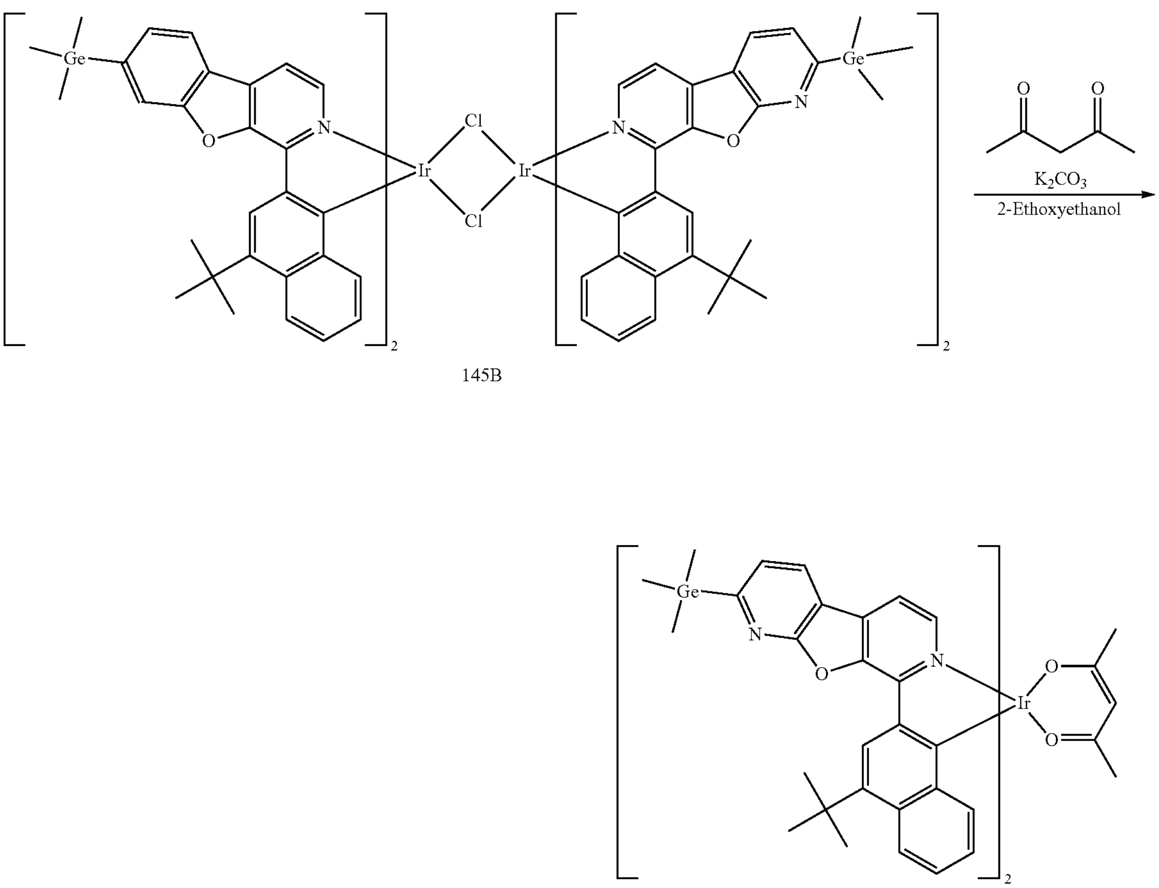

145B

145

0.62 g (yield of 90%) of Compound 145 was obtained in a similar manner as used to synthesize Compound 64 of Synthesis Example 4, except that 2-(4-(t-butyl)naphthalen-2-yl)-4,4,5,5-tetramethyl-1,3,2-dioxoborolane (1.4 g, 4.52 mmol) was used instead of 2-(3,5-dimethylphenyl)-4,4,5,5-tetramethyl-1,3,2-dioxoborolane in synthesizing Compound 145A. The obtained compound was identified by HRMS and HPLC analysis.

HRMS(MALDI) calcd for $C_{61}H_{64}Ge_2IrN_2O_4$: m/z: 1226.67 Found: 1229.31.

Synthesis Example 7: Synthesis of Compound 155
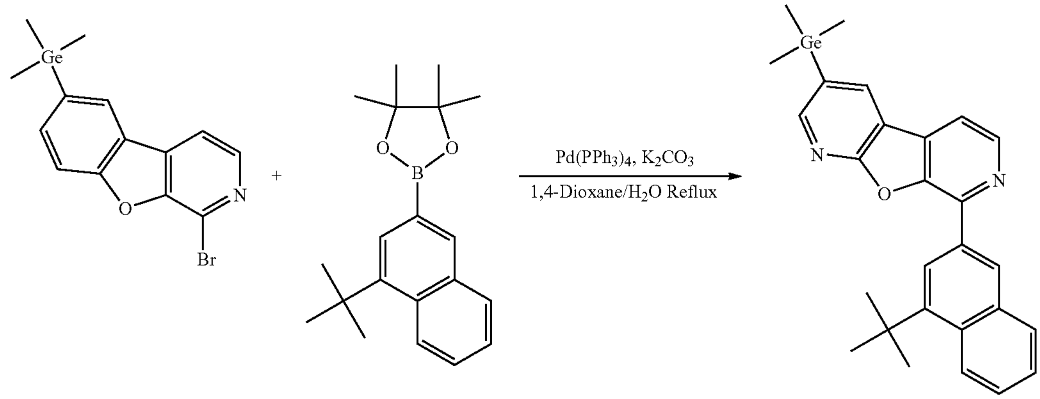
155A
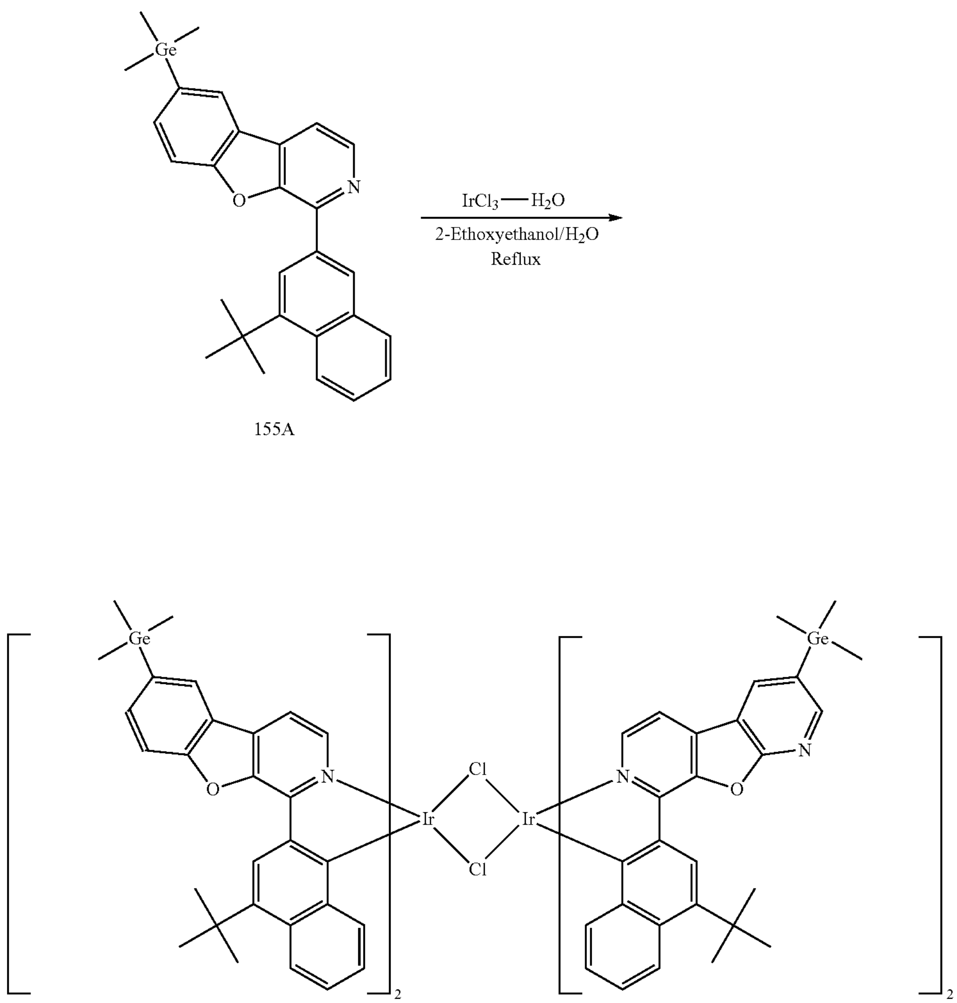
155B -continued

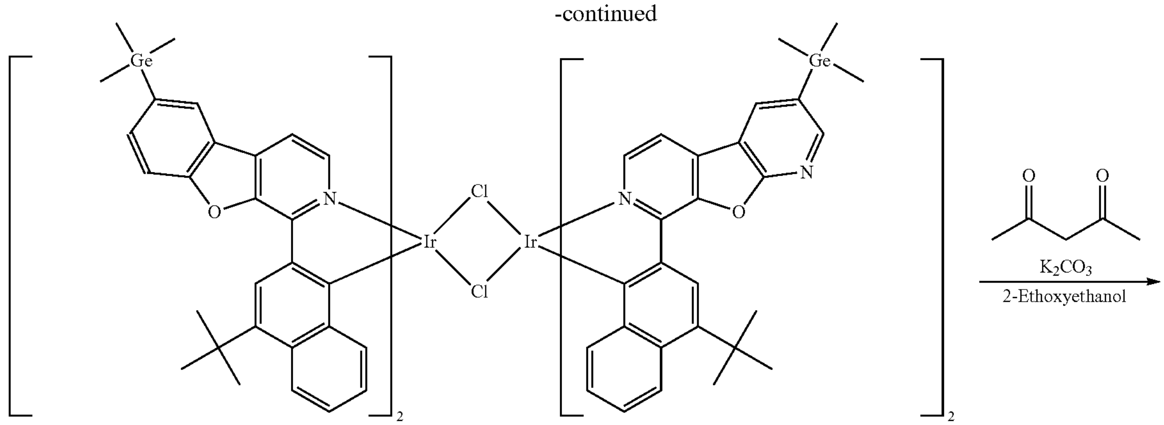

155B

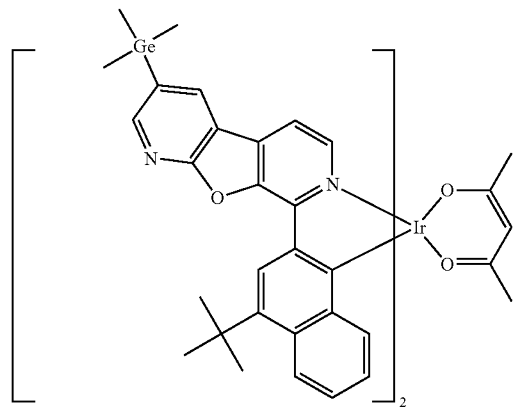

155

0.60 g (yield of 87%) of Compound 155 was obtained in a similar manner as used to synthesize Compound 64 of Synthesis Example 4, except that 1-bromo-6-(trimethylgermyl)benzofuro[2,3-c]pyridine (1.5 g, 4.1 mmol) was used instead of 1-bromo-7-(trimethylgermyl)benzofuro[2,3-c]pyridine in synthesizing Compound 155A. The obtained compound was identified by HRMS and HPLC analysis.

HRMS(MALDI) calcd for $C_{61}H_{64}Ge_2IrN_2O_4$: m/z: 1226.67 Found: 1228.99.

Synthesis Example 8: Synthesis of Compound 159

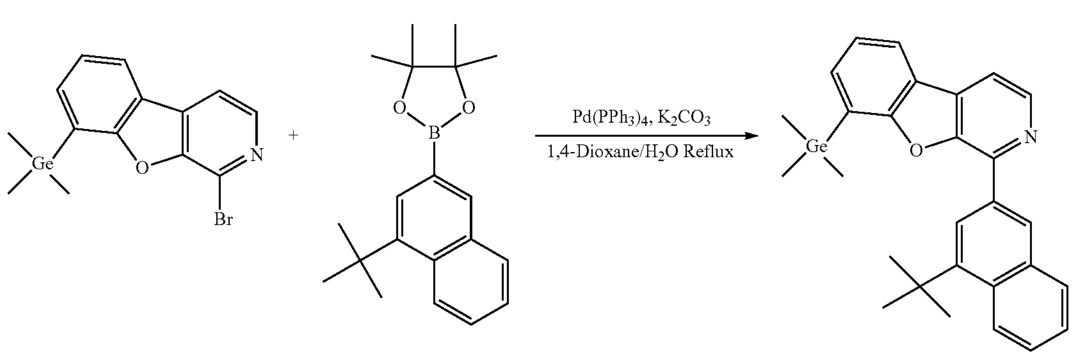

159A

-continued

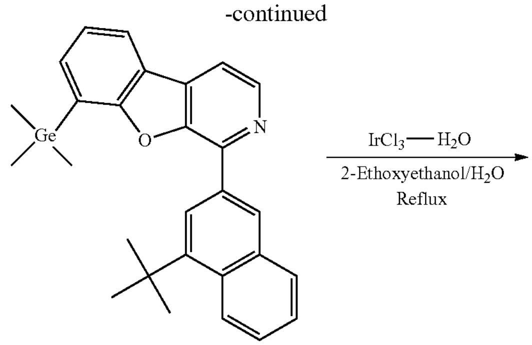

159A

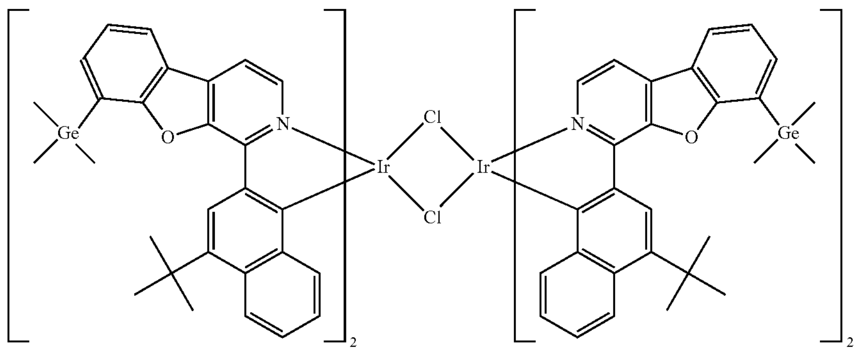

159B

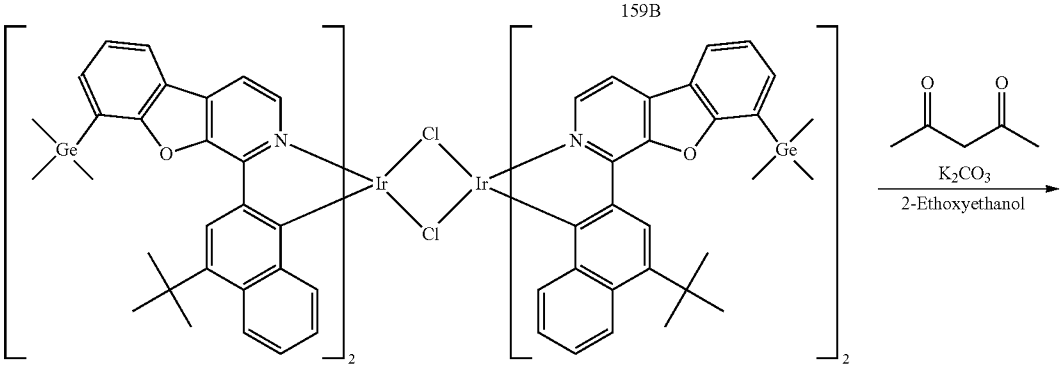

159B

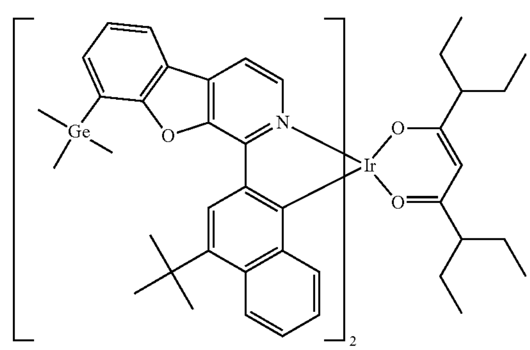

159

0.6 g (yield of 80%) of Compound 159 was obtained in a similar manner as used to synthesize Compound 64 of Synthesis Example 4, except that 1-bromo-8-(trimethylgermyl)benzofuro[2,3-c]pyridine (1.5 g, 4.11 mmol) was used instead of 1-bromo-7-(trimethylgermyl)benzofuro[2,3-c]pyridine in synthesizing Compound 159A, and 3,7-diethylnonane-4,6-dione (0.3 g, 1.40 mmol) was used instead of pentane-2,4-dione in synthesizing Compound 159. The obtained compound was identified by HRMS and HPLC analysis.

HRMS(MALDI) calcd for $C_{69}H_{80}Ge_2IrN_2O_4$: m/z: 1338.89 Found: 1341.30.

Example 1

As an anode, an ITO-patterned glass substrate was cut to a size of 50 millimeters (mm)×50 mm×0.5 mm, sonicated in isopropyl alcohol and pure water, each for 5 minutes, and then cleaned by exposure to ultraviolet rays and ozone for 30 minutes. The resultant glass substrate was loaded onto a vacuum deposition apparatus.

Compounds HT3 and F12 (p-dopant) were vacuum-codeposited at a weight ratio of 98:2 on the anode to form a hole injection layer having a thickness of 100 angstrom (Å), and Compound HT3 was vacuum-deposited on the hole injection layer to form a hole transport layer having a thickness of 1,650 Å.

Then, GH3 (host) and Compound 1 (dopant) were co-deposited at a weight ratio of 92:8 on the hole transport layer to form an emission layer having a thickness of 400 Å.

Then, Compound ET3 and LiQ (n-dopant) were co-deposited at a volume ratio of 50:50 on the emission layer to form an electron transport layer having a thickness of 350 Å, LiQ (n-dopant) was vacuum-deposited on the electron transport layer to form an electron injection layer having a thickness of 10 Å, and Al was vacuum-deposited on the electron injection layer to form a cathode having a thickness of 1,000 Å, thereby completing the manufacture of an organic light-emitting device.

HT3

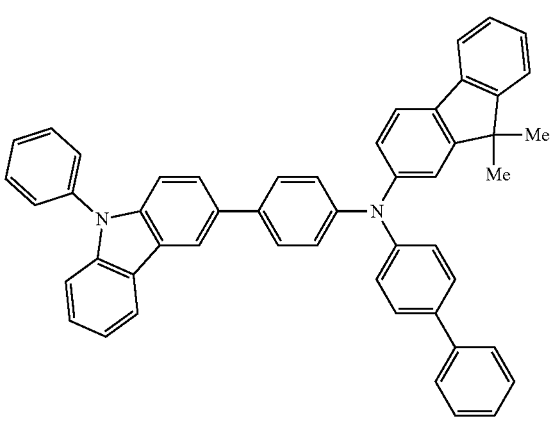

F12

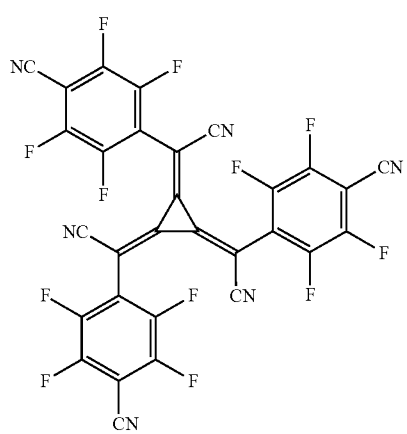

-continued

GH3

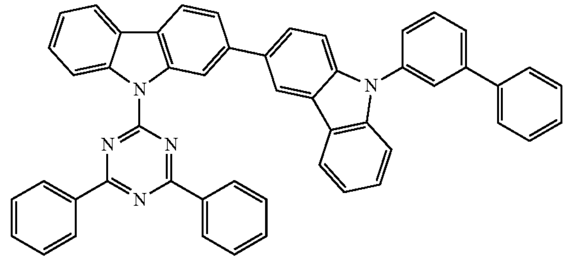

ET3

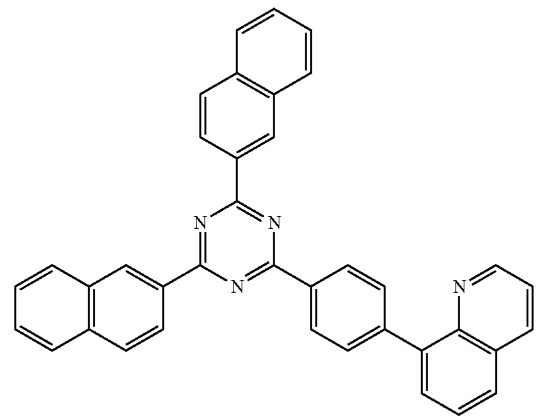

LiQ

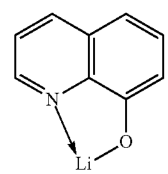

Examples 2 and 3 and Comparative Examples 1 and 2

Organic light-emitting devices were manufactured in a similar manner as in Example 1, except that Compounds shown in Table 2 were each used instead of Compound 1 as a dopant in forming an emission layer.

The maximum value of external quantum efficiency (Max EQE, %), driving voltage (volts, V), maximum emission wavelength ($\lambda_{max}$, nm) of the emission spectrum, and full width at half maximum (FWHM, nm) of each of the organic light-emitting devices manufactured in Examples 1 to 3 and Comparative Examples 1 and 2 were evaluated, and the results thereof are shown in Table 2. As evaluation apparatuses, a current-voltage meter (Keithley 2400) and a luminance meter (Minolta Cs-1000A) were used.

TABLE 2

| | Emission layer Dopant | Max EQE (%) | Driving voltage (V) | $\lambda_{max}$ (nm) | FWHM (nm) |
|---|---|---|---|---|---|
| Example 1 | Compound 1 | 20.5 | 4.1 | 522 | 68 |
| Example 2 | Compound 2 | 21 | 4.1 | 524 | 68 |

TABLE 2-continued

| | Emission layer Dopant | Max EQE (%) | Driving voltage (V) | $\lambda_{max}$ (nm) | FWHM (nm) |
|---|---|---|---|---|---|
| Example 3 | Compound 3 | 22.5 | 4.0 | 527 | 60 |
| Comparative Example 1 | Compound A | 20 | 4.2 | 544 | 80 |
| Comparative Example 2 | Compound B | 20 | 4.3 | 585 | 72 |

1

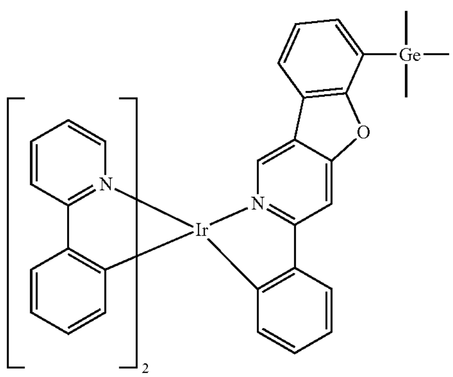

2

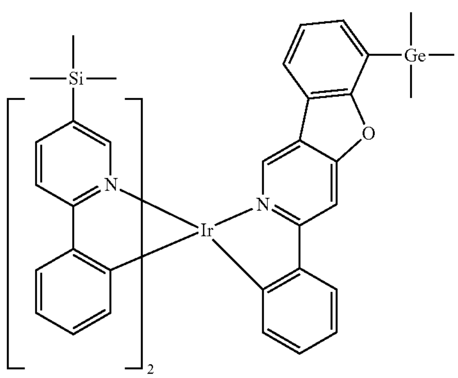

3

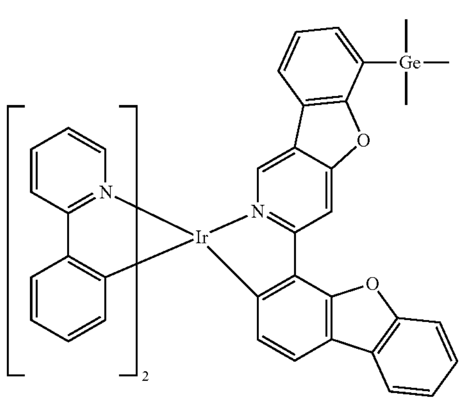

-continued

A

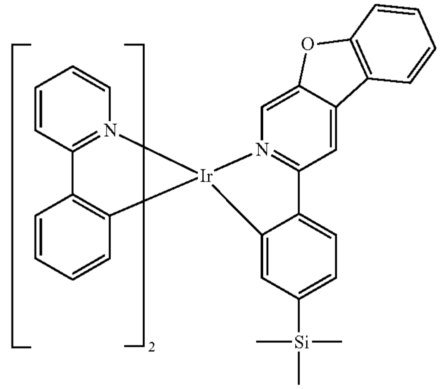

B

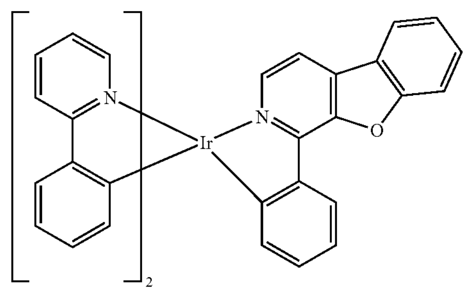

Referring to Table 2, it can be seen that the organic light-emitting devices of Examples 1 to 3 have high external quantum efficiency, a low driving voltage, and a narrow FWHM, as compared with the organic light-emitting devices of Comparative Examples 1 and 2.

Example 4

As an anode, an ITO-patterned glass substrate was cut to a size of 50 millimeter (mm)×50 mm×0.5 mm, sonicated with isopropyl alcohol and DI water, each for 5 minutes, and then cleaned by exposure to Ultraviolet (UV) rays and ozone for 30 minutes. The resultant ITO-patterned glass substrate was loaded onto a vacuum deposition apparatus.

Compounds HT3 and F12(p-dopant) were co-deposited by vacuum on the anode at the weight ratio of 98:2 to form a hole injection layer having a thickness of 100 Å, and Compound HT3 was vacuum-deposited on the hole injection layer to form a hole transport layer having a thickness of 1,600 Å.

Then, RH3 (host) and Compound 64 (dopant) were co-deposited at a weight ratio of 97:3 on the hole transport layer to form an emission layer having a thickness of 400 Å.

Then, Compound ET3 and LiQ (n-dopant) were co-deposited on the emission layer at the volume ratio of 50:50 to form an electron transport layer having a thickness of 350 Å, LiQ was vacuum-deposited on the electron transport layer to form an electron injection layer having a thickness of 10 Å, and Al was vacuum-deposited on the electron injection layer to form a cathode having a thickness of 1,000 Å, thereby completing the manufacture of an organic light-emitting device.

-continued

HT3

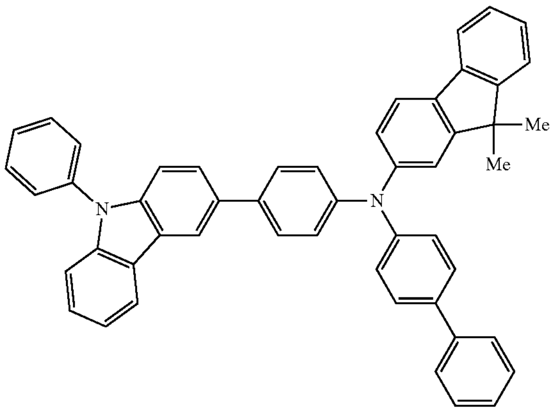

F12

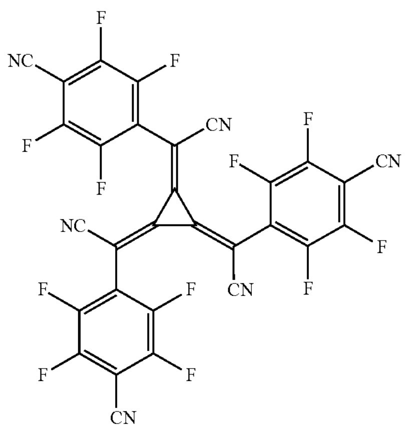

RH3

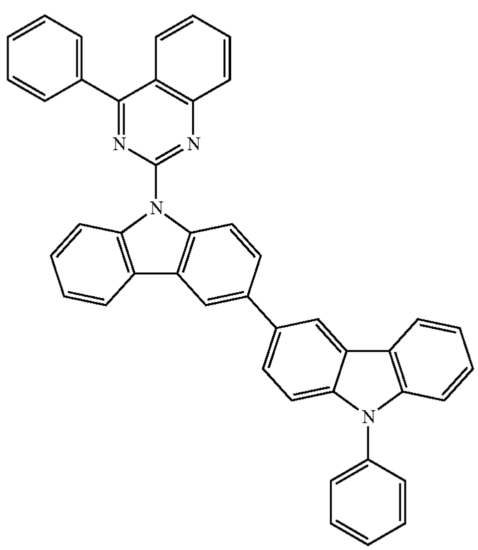

ET3

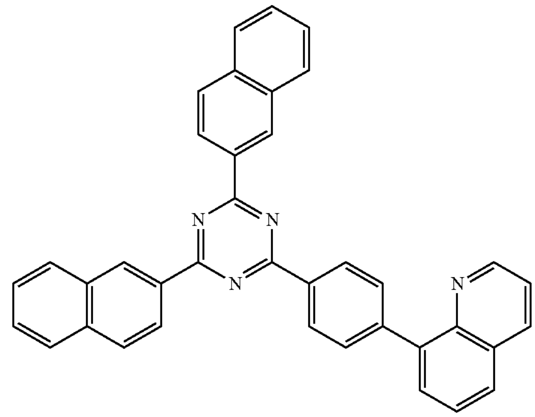

LiQ

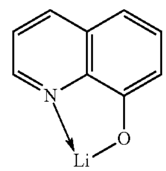

Examples 5 and 6 and Comparative Example 3

Organic light-emitting devices were manufactured in a similar manner as in Example 4, except that Compounds shown in Table 3 were each used instead of Compound 64 as a dopant in forming an emission layer.

The maximum value of external quantum efficiency (Max EQE, %), driving voltage (Volt, V), maximum emission wavelength ($\lambda_{max}$, nm), and lifespan (relative %) of each of the organic light-emitting devices manufactured according to Examples 4 to 6 and Comparative Example 3, and results thereof are shown in Table 3. As evaluation apparatuses, a current-voltage meter (Keithley 2400) and a luminance meter (Minolta Cs-1000A) were used.

TABLE 3

| No. | Emission Layer Dopant | Max EQE (%) | Driving voltage (V) | $\lambda_{max}$ (nm) | Lifespan (Relative value, %) |
|---|---|---|---|---|---|
| Example 4 | Compound 64 | 23 | 4.9 | 610 | 100% |
| Example 5 | Compound 66 | 23 | 4.9 | 624 | 105% |
| Example 6 | Compound 145 | 24 | 4.8 | 634 | 110% |
| Comparative Example 3 | Compound C | 23 | 5.1 | 595 | 100% |

64

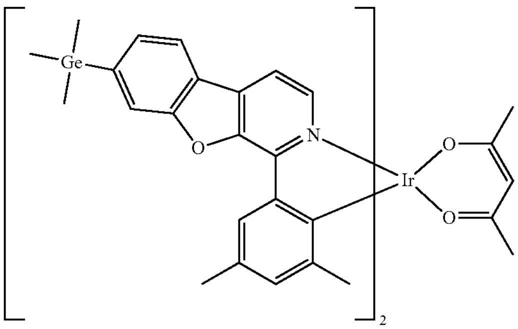

66

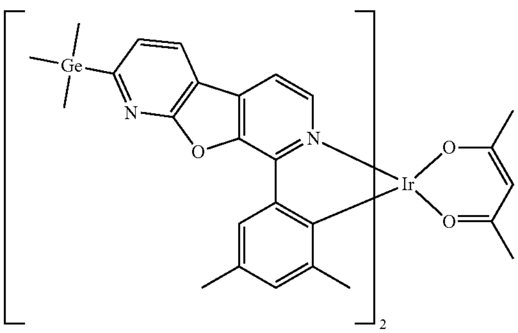

145

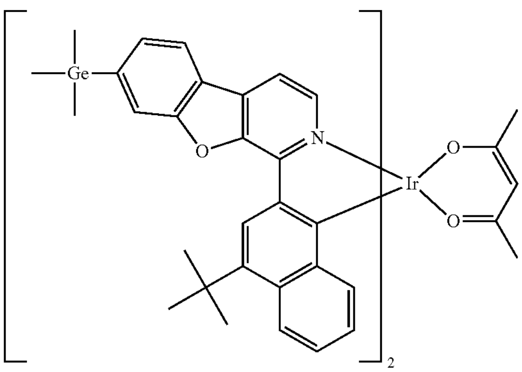

C

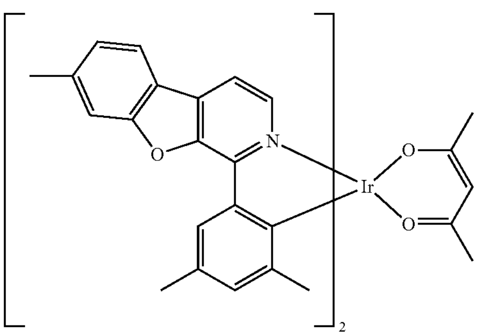

Referring to Table 3, it can be seen that the organic light-emitting devices of Examples 4 to 6 have excellent external quantum efficiency and lifetime characteristics, and low driving voltage. In addition, referring to Table 3, it can be seen that the organic light emitting devices of Examples 4 to 6 have a similar level or higher external quantum efficiency, a lower driving voltage, and a similar level or longer lifespan as compared with the organic light emitting devices of Comparative Example 3. The organometallic compound has excellent electrical characteristics and stability. Thus, an electronic device, for example, an organic light-emitting device, including the organometallic compound may have a low driving voltage, high efficiency, a long lifespan, a reduced roll-off ratio, and a relatively narrow EL spectrum emission peak FWHM. Accordingly, a high-quality organic light-emitting device may be implemented by using the organometallic compound.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments. While one or more exemplary embodiments have been described with reference to the FIGURE, it will be understood by those of ordinary skill in the art that various changes in form and details may be made therein without departing from the spirit and scope as defined by the following claims.

What is claimed is:

1. An organometallic compound represented by Formula 1:

$$M_1(Ln_1)_{n1}(Ln_2)_{n2} \quad \text{Formula 1}$$

wherein, in Formula 1, $M_1$ is a transition metal, $Ln_1$ is a ligand represented by Formula 1-1, $Ln_2$ is a bidentate ligand, n1 is 1, 2, or 3, and n2 is 0, 1, or 2, Formula 1-1

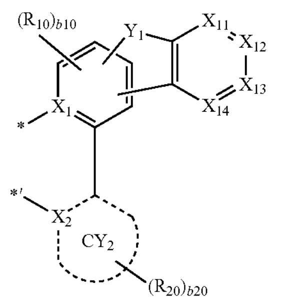

wherein, in Formula 1-1, $X_1$ is C or N, and $X_2$ is C, $X_{11}$ is $C(R_1)$ or N, $X_{12}$ is $C(R_2)$ or N, $X_{13}$ is $C(R_3)$ or N, and $X_{14}$ is $C(R_4)$ or N, $Y_1$ is O, S, Se, $C(R_5)(R_6)$, or $N(R_5)$, $R_1$ to $R_6$, $R_{10}$, and $R_{20}$ are each independently a group represented by one of Formulae 2-1 or 2-2, hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —N($Q_4$)($Q_5$), —B($Q_6$)($Q_7$), —P($Q_8$)($Q_9$), or —P(═O)($Q_8$)($Q_9$), with the proviso that:

when $CY_2$ is a benzene group, at least one of $R_1$ to $R_4$ is a group represented by Formula 2-1 or a group represented by Formula 2-2, or at least one of $R_{10}$ and $R_{20}$ is a group represented by Formula 2-2, 2-1

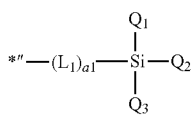

2-2

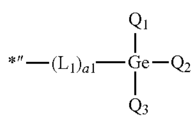

wherein, in Formulae 2-1 and 2-2, each $L_1$ is independently a single bond, a substituted or unsubstituted $C_5$-$C_{30}$ carbocyclic group, or a substituted or unsubstituted $C_1$-$C_{30}$ heterocyclic group, a1 is 0, 1, 2, 3, 4, or 5, and when $CY_2$ is a not benzene group, at least one of $R_1$ to $R_4$, $R_{10}$, and $R_{20}$ is a group represented by Formula 2-1 or a group represented by Formula 2-2, two or more of a plurality of $R_{10}$(s) are optionally linked to each other to form a substituted or unsubstituted $C_5$-$C_{30}$ carbocyclic group or a substituted or unsubstituted $C_1$-$C_{30}$ heterocyclic group, two or more of a plurality of $R_{20}$(s) are optionally linked to each other to form a substituted or unsubstituted $C_5$-$C_{30}$ carbocyclic group or a substituted or unsubstituted $C_1$-$C_{30}$ heterocyclic group, two or more adjacent groups of $R_5$, $R_6$, $R_{10}$, and $R_{20}$ are optionally linked to each other to form a substituted or unsubstituted $C_5$-$C_{30}$ carbocyclic group or a substituted or unsubstituted $C_1$-$C_{30}$ heterocyclic group, b10 is 1 or 2, b20 is 1, 2, 3, 4, 5, 6, 7, 8, 9, or 10,

* and *' each indicate a binding site to $M_1$,

*" indicates a binding site to a neighboring atom, and at least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_7$-$C_{60}$ alkyl aryl group, the substituted $C_7$-$C_{60}$ aryl alkyl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted $C_2$-$C_{60}$ heteroaryl alkyl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group is:

deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —Si($Q_{11}$)($Q_{12}$)($Q_{13}$), —Ge($Q_{11}$)($Q_{12}$)($Q_{13}$), —N($Q_{14}$)($Q_{15}$), —B($Q_{16}$)($Q_{17}$), —P(═O)($Q_{18}$)($Q_{19}$), —P($Q_{18}$)($Q_{19}$), or a combination thereof;

a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, each substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alky aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —Si($Q_{21}$)($Q_{22}$)($Q_{23}$), —Ge($Q_{21}$)($Q_{22}$)($Q_{23}$), —N($Q_{24}$)($Q_{25}$), —B($Q_{26}$)($Q_{27}$), —P($Q_{28}$)($Q_{29}$), —P(═O)($Q_{28}$)($Q_{29}$), or a combination thereof; or —Si($Q_{31}$)($Q_{32}$)($Q_{33}$), —Ge($Q_{31}$)($Q_{32}$)($Q_{33}$), —N($Q_{34}$)($Q_{35}$), —B($Q_{36}$)($Q_{37}$), —P($Q_{38}$)($Q_{39}$), or —P(═O)($Q_{38}$)($Q_{39}$), wherein $Q_1$ to $Q_9$, $Q_{11}$ to $Q_{19}$, $Q_{21}$ to $Q_{29}$, and $Q_{31}$ to $Q_{39}$ are each independently hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, or a substituted or unsubstituted monovalent non-aromatic condensed heteropolycyclic group, and wherein $CY_2$ is represented by one of Formulae CY2-1 to CY2-22:

CY2-1

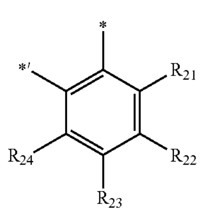

-continued

CY2-2

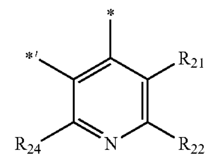

CY2-3

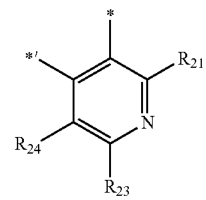

CY2-4

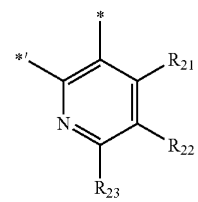

CY2-5

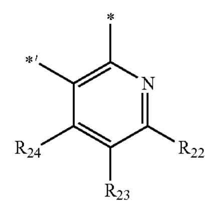

CY2-6

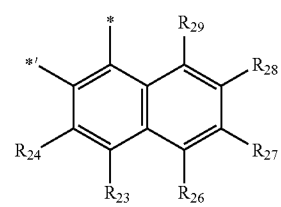

CY2-7

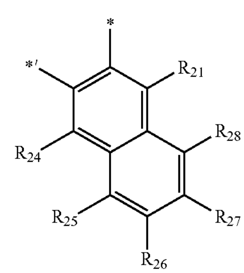

CY2-8

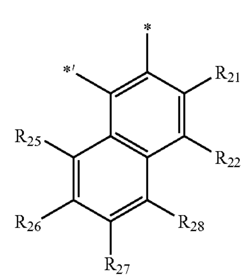

-continued
CY2-9
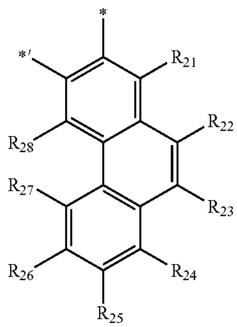
CY2-10
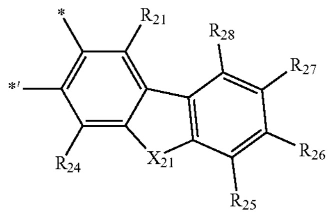
CY2-11
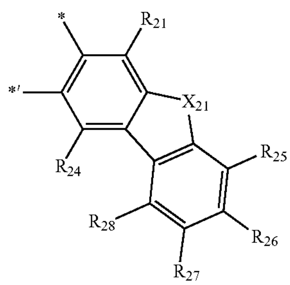
CY2-12
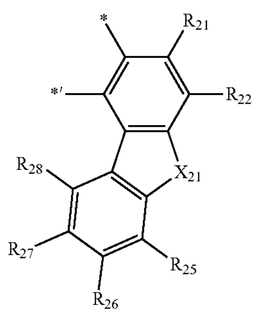
CY2-13
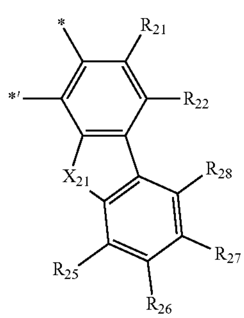
-continued
CY2-14
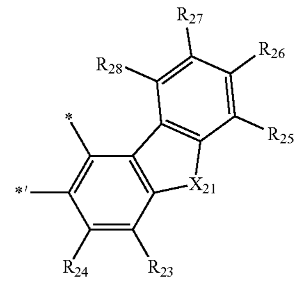
CY2-15
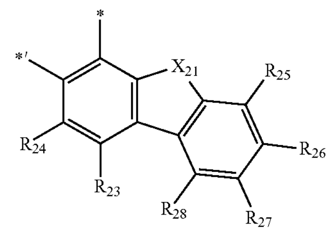
CY2-16
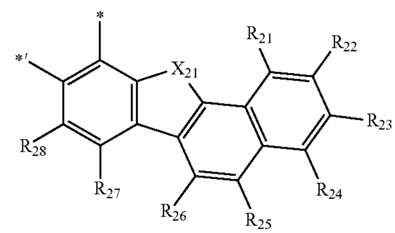
CY2-17
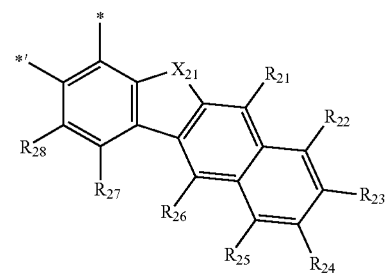
CY2-18
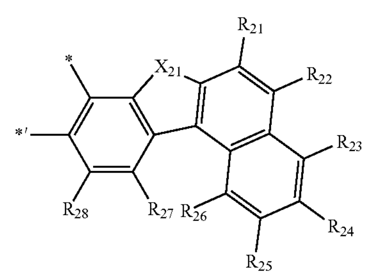
CY2-19
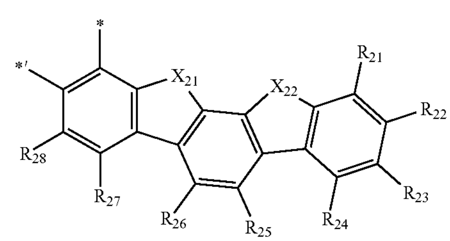

-continued

CY2-20

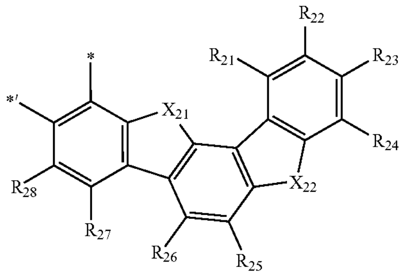

CY2-21

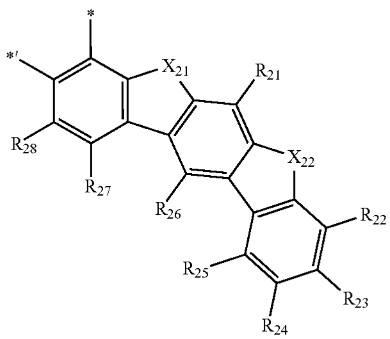

CY2-22

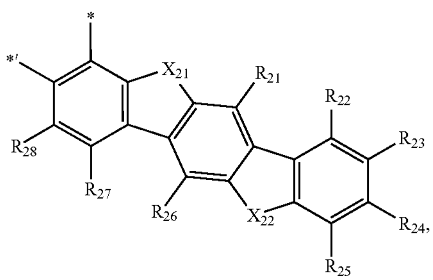

wherein, in Formulae CY2-1 to CY2-22, $X_{21}$ and $X_{22}$ are each independently O, S, $N(R_{29a})$, $C(R_{29a})(R_{29b})$, or $Si(R_{29a})(R_{29b})$, $R_{21}$ to $R_{2s}$, $R_{29a}$, and $R_{29b}$ are each independently as defined for $R_{20}$, two or more adjacent groups of $R_{21}$ to $R_{28}$, $R_{29a}$, and $R_{29b}$ are optionally linked to each other to form a substituted or unsubstituted $C_5$-$C_{30}$ carbocyclic group or a substituted or unsubstituted $C_1$-$C_{30}$ heterocyclic group,

* indicates a binding site to a neighboring atom, and

*' indicates a binding site to $M_1$.

2. The organometallic compound of claim 1, wherein $M_1$ is iridium (Ir), platinum (Pt), palladium (Pd), gold (Au), osmium (Os), titanium (Ti), zirconium (Zr), hafnium (Hf), europium (Eu), terbium (Tb), thulium (Tm), or rhodium (Rh).

3. The organometallic compound of claim 1, wherein $M_1$ is Ir, and the sum of n1 and n2 is 3.

4. The organometallic compound of claim 1, wherein $CY_2$ is:

a benzene group, or a naphthalene group.

5. The organometallic compound of claim 1, wherein each $L_1$ is independently:

a single bond, a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, or an azacarbazolylene group; or a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, or an azacarbazolylene group, each substituted with at least one of deuterium, —F, —Cl, —Br, —I, $—SF_5$, a hydroxyl group, a cyano group, a nitro group, an amidino group, a hydrazino group, a hydrazono group, a $C_1$-$C_{20}$ alkyl group, a $C_1$-$C_{20}$ alkoxy group, a $C_1$-$C_{20}$ alkylthio group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, or a combination thereof.

6. The organometallic compound of claim 1, wherein one of $R_1$ to $R_4$ is a group represented by Formula 2-1 or a group represented by Formula 2-2, and the others of $R_1$ to $R_4$ are each hydrogen.

7. The organometallic compound of claim 1, wherein one of $R_1$ to $R_4$, $R_{10}$, or $R_{20}$ is a group represented by Formula 2-2.

8. The organometallic compound of claim 1, wherein $R_1$ to $R_6$, $R_{10}$, and $R_{20}$ are each independently:

a group represented by one of Formulae 2-1 or 2-2, hydrogen, deuterium, —F, —Cl, —Br, —I, —$SF_5$, —$CD_3$, —$CD_2H$, —$CDH_2$, —$CF_3$, —$CF_2H$, —$CFH_2$, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group; or a group represented by one of Formulae 9-1 to 9-43, 9-201 to 9-237, 10-1 to 10-129, or 10-201 to 10-350:

9-1

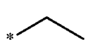

9-2

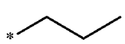

9-3

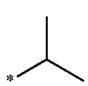

9-4

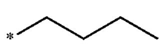

9-5

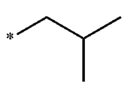

9-6

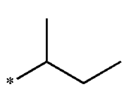

9-7

9-8

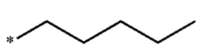

9-9

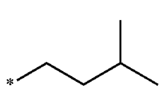

-continued 9-10

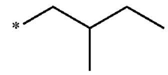

9-11

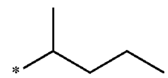

9-12

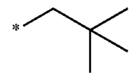

9-13

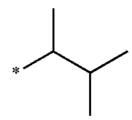

9-14

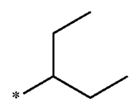

9-15

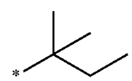

9-16

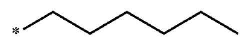

9-17

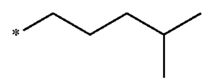

9-18

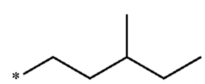

9-19

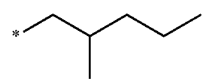

9-20

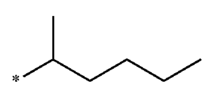

9-21

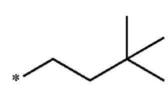

9-22

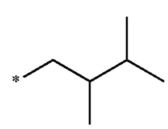

9-23

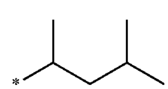

9-24

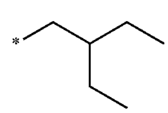

9-25

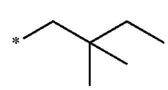

-continued
9-26
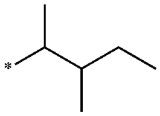
9-27
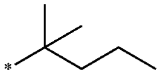
9-28
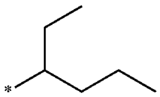
9-29
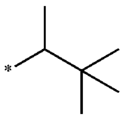
9-30
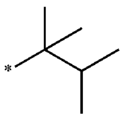
9-31
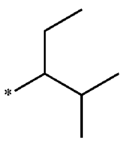
9-32
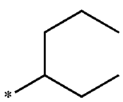
9-33
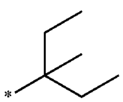
9-34
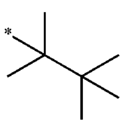
9-35
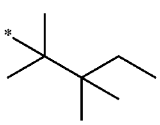
9-36
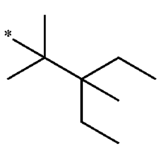
9-37
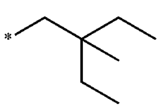
9-38
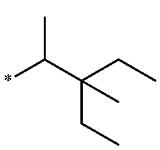
-continued
9-39
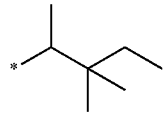
9-40
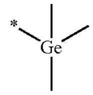
9-41
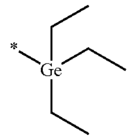
9-42
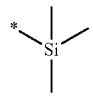
9-43
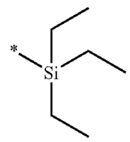
9-201
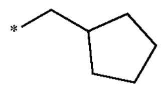
9-202
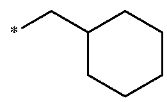
9-203
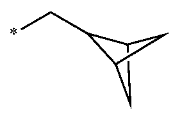
9-204
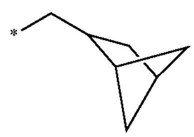
9-205
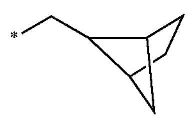
9-206
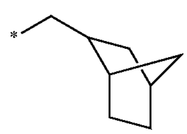
9-207
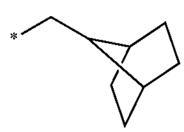
9-208
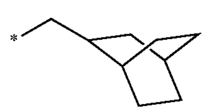

-continued
9-209
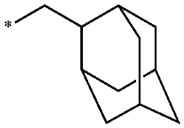
9-210
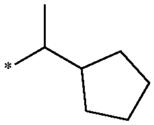
9-211
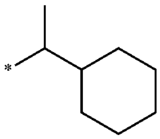
9-212
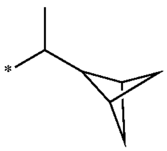
9-213
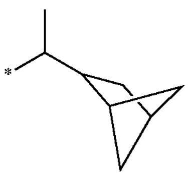
9-214
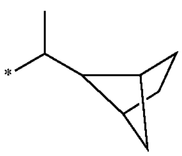
9-215
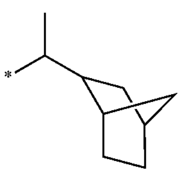
9-216
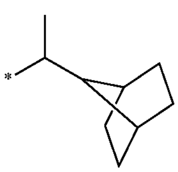
9-217
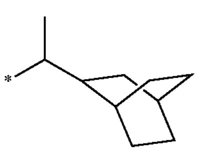
9-218
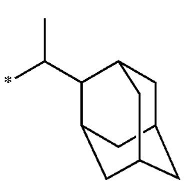
-continued
9-219
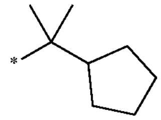
9-220
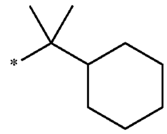
9-221
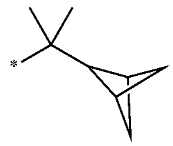
9-222
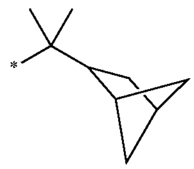
9-223
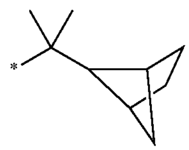
9-224
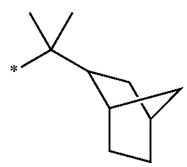
9-225
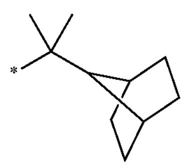
9-226
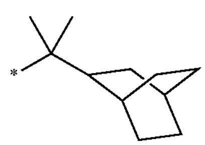
9-227
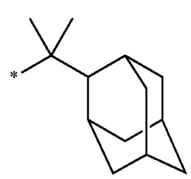
9-228
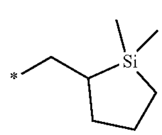

-continued
9-229
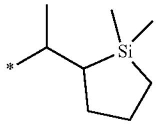
9-230
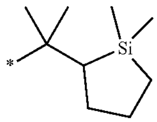
9-231
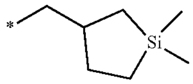
9-232
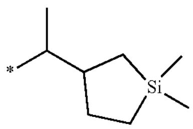
9-233
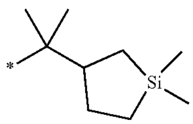
9-234
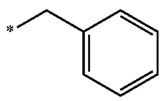
9-235
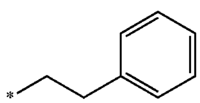
9-236
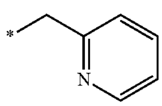
9-237
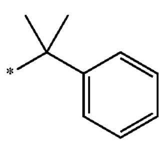
10-1
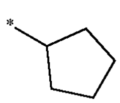
10-2
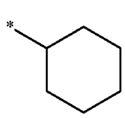
10-3
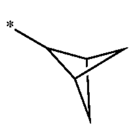
10-4
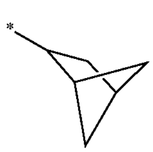
-continued
10-5
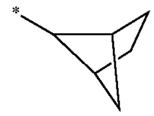
10-6
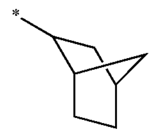
10-7
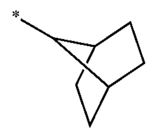
10-8
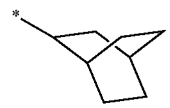
10-9
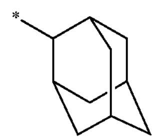
10-10
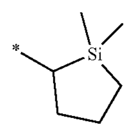
10-11
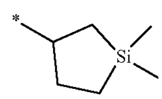
10-12
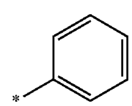
10-13
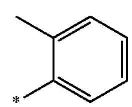
10-14
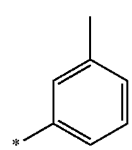
10-15
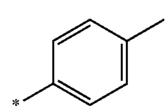
10-16
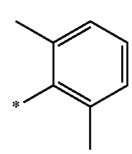

-continued
10-17
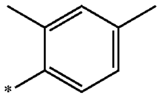
10-18
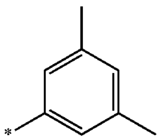
10-19
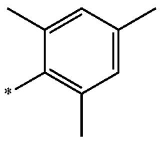
10-20
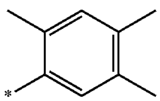
10-21
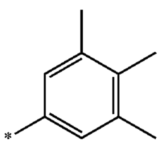
10-22
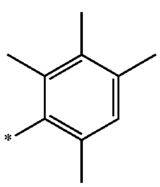
10-23
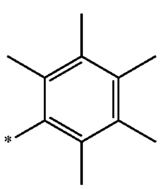
10-24
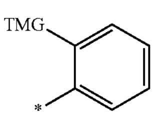
10-25
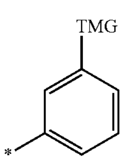
10-26
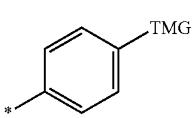
10-27
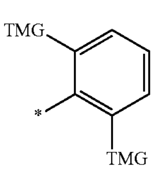
-continued
10-28
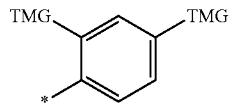
10-29
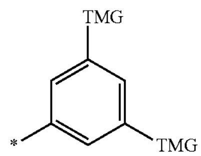
10-30
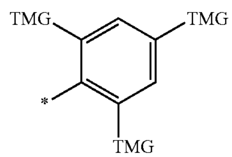
10-31
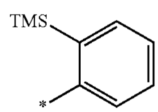
10-32
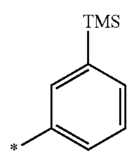
10-33
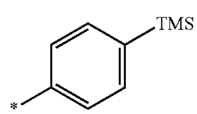
10-34
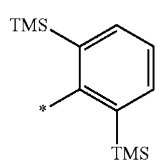
10-35
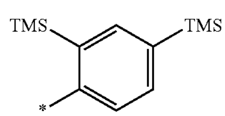
10-36
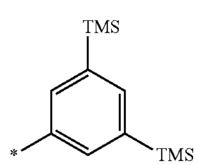
10-37
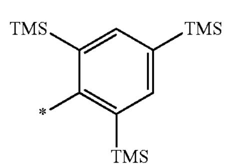
10-38
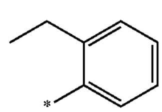

-continued
10-39
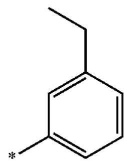
10-40
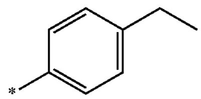
10-41
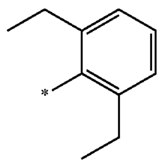
10-42
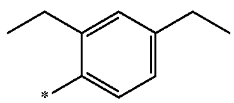
10-43
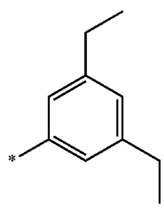
10-44
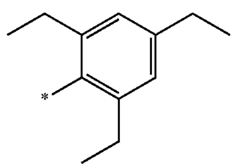
10-45
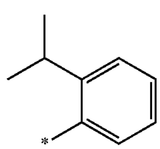
10-46
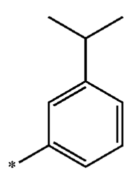
10-47
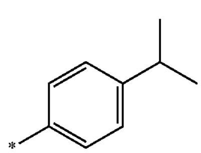
10-48
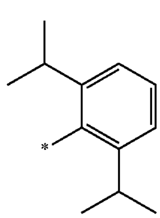
-continued
10-49
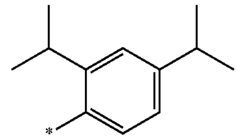
10-50
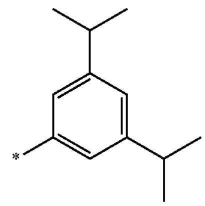
10-51
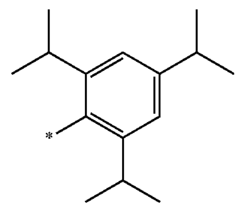
10-52
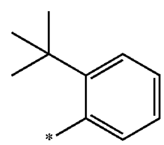
10-53
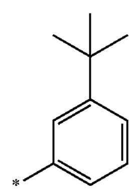
10-54
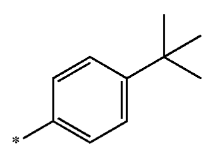
10-55
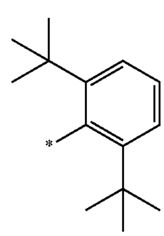
10-56
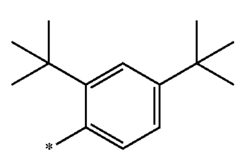

-continued
10-57
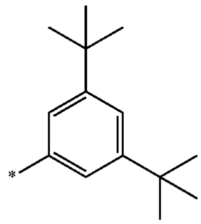
10-58
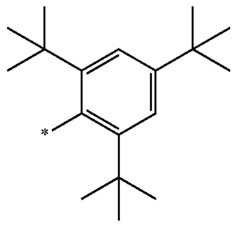
10-59
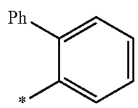
10-60
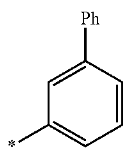
10-61
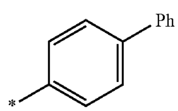
10-62
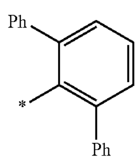
10-63
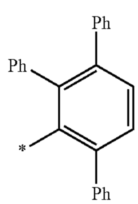
10-64
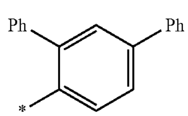
10-65
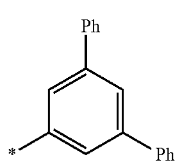
-continued
10-66
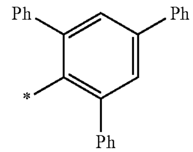
10-67
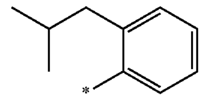
10-68
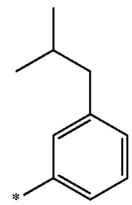
10-69
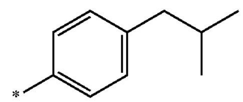
10-70
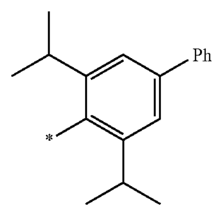
10-71
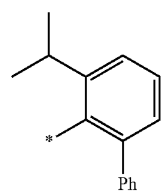
10-72
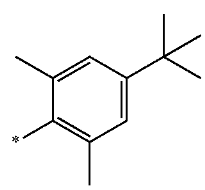
10-73
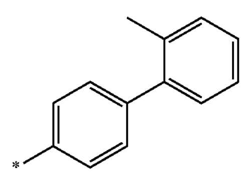
10-74
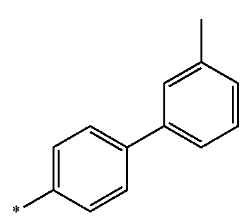

-continued
10-75
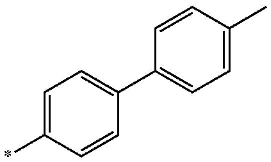
10-76
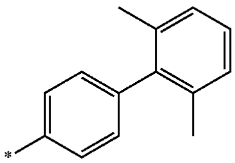
10-77
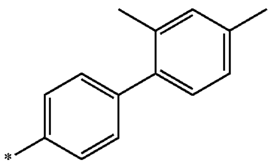
10-78
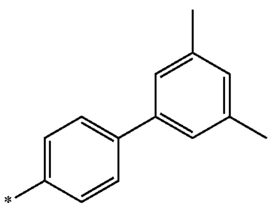
10-79
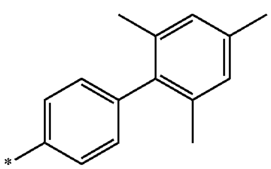
10-80
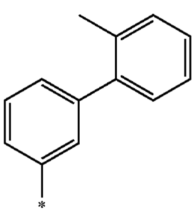
10-81
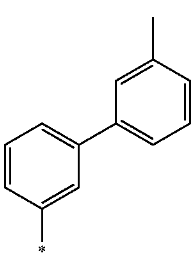
10-82
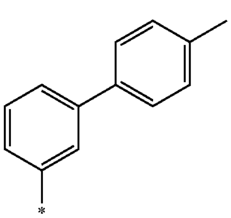
-continued
10-83
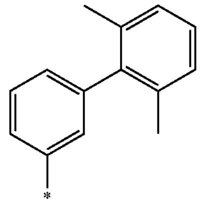
10-84
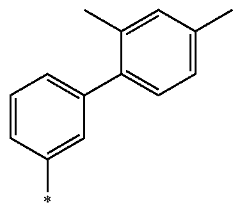
10-85
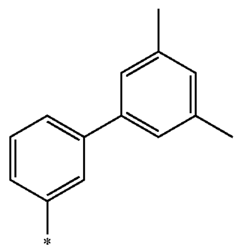
10-86
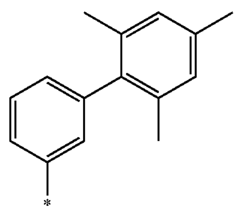
10-87
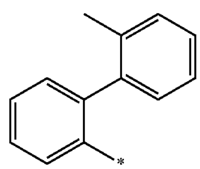
10-88
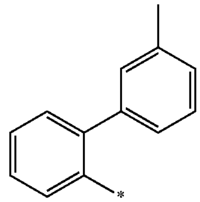
10-89
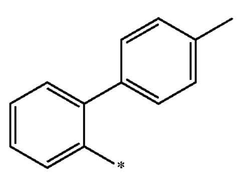
10-90
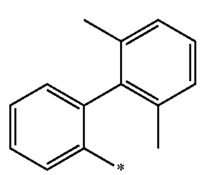

-continued
10-91
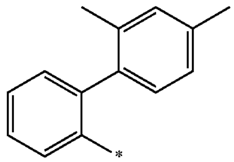
10-92
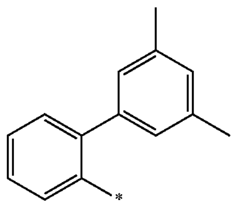
10-93
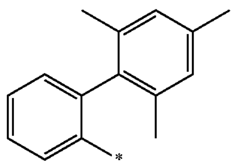
10-94
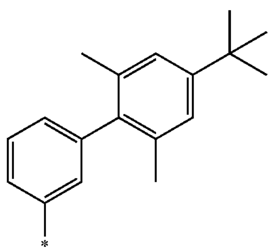
10-95
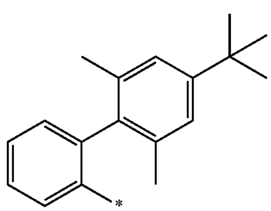
10-96
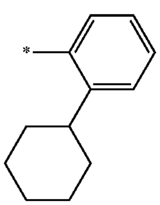
10-97
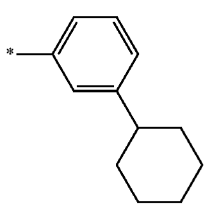
10-98
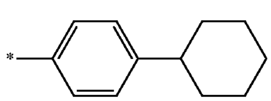
-continued
10-99
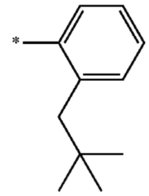
10-100
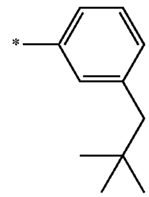
10-101
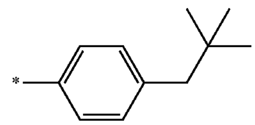
10-102
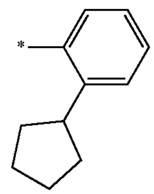
10-103
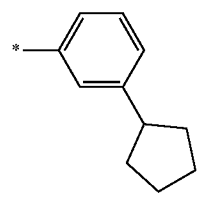
10-104
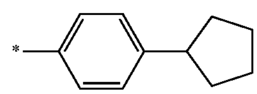
10-105
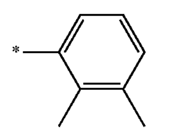
10-106
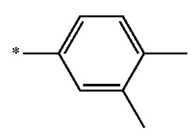
10-107
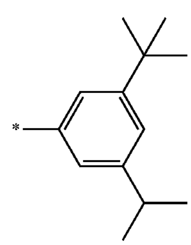

10-108
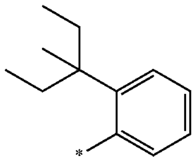
10-109
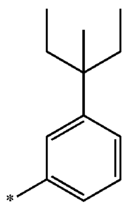
10-110
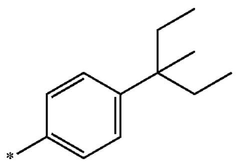
10-111
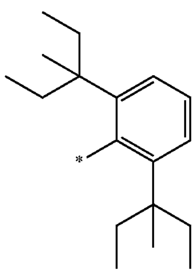
10-112
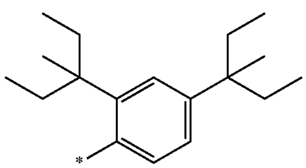
10-113
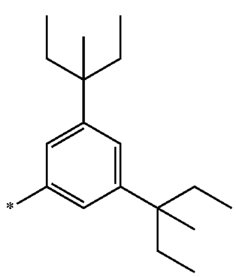
10-114
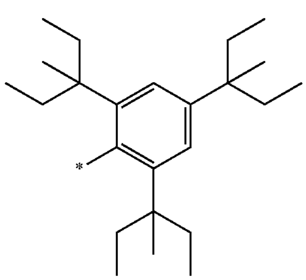
10-115
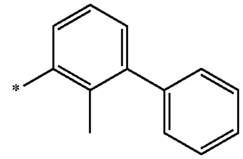
10-116
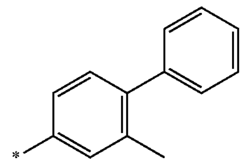
10-117
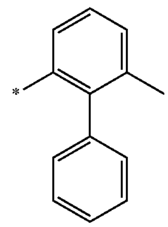
10-118
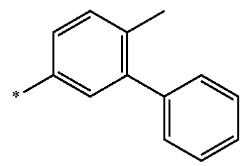
10-119
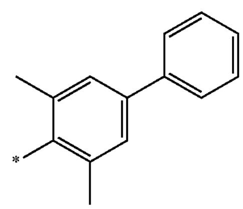
10-120
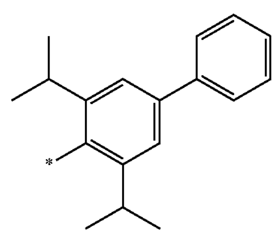
10-121
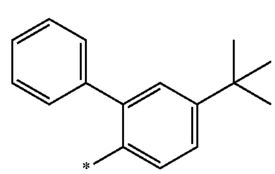
10-122
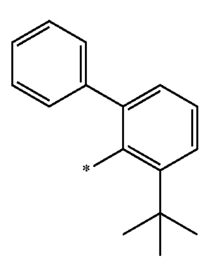

-continued
10-123
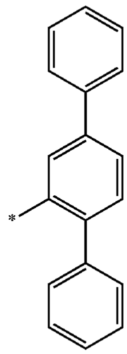
10-124
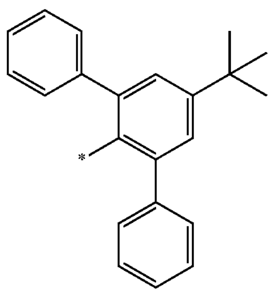
10-125
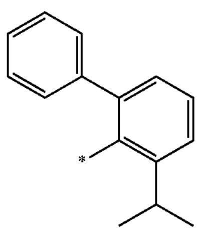
10-126
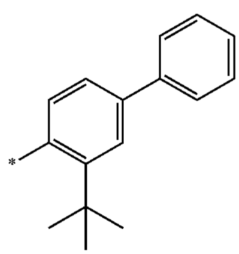
10-127
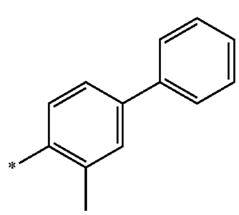
10-128
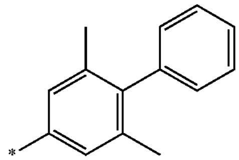
-continued
10-129
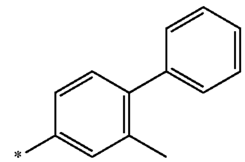
10-201
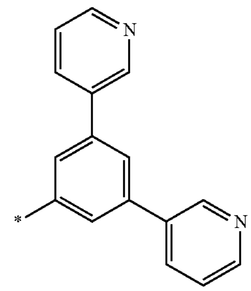
10-202
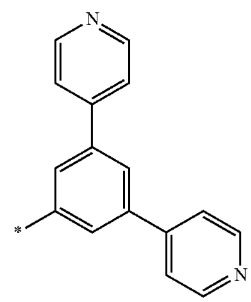
10-203
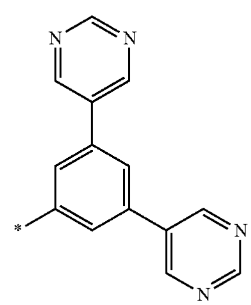
10-204
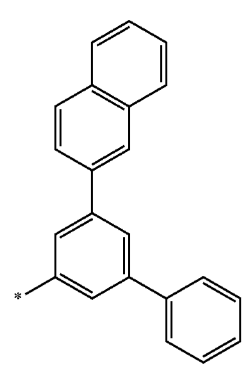

-continued
10-205
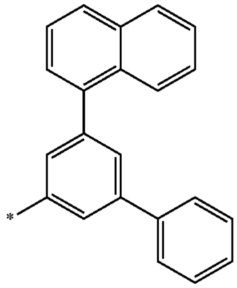
10-206
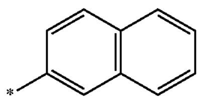
10-207
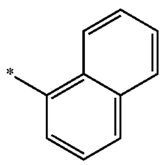
10-208
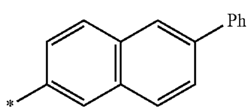
10-209
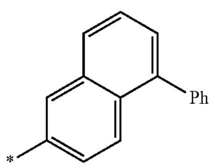
10-210
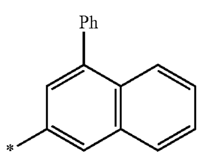
10-211
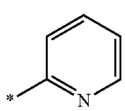
10-212
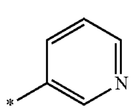
10-213
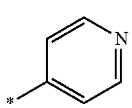
10-214
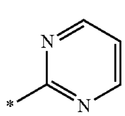
10-215
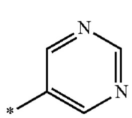
-continued
10-216
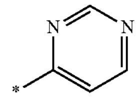
10-217
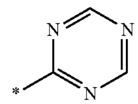
10-218
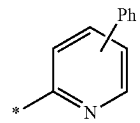
10-219
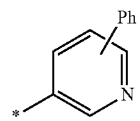
10-220
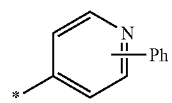
10-221
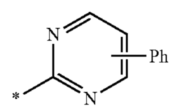
10-222
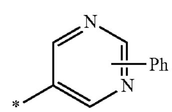
10-223
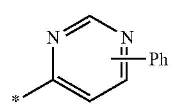
10-224
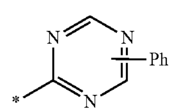
10-225
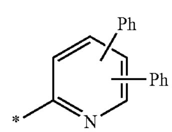
10-226
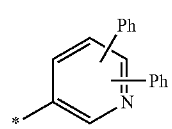
10-227
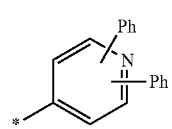
10-228
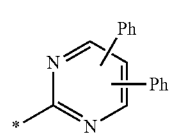

-continued
10-229
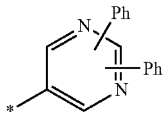
10-230
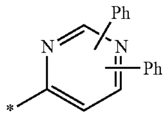
10-231
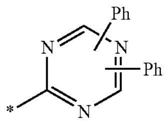
10-232
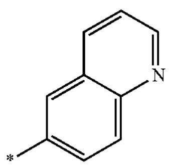
10-233
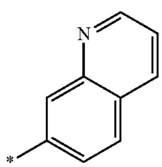
10-234
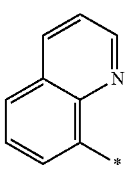
10-235
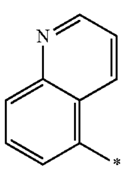
10-236
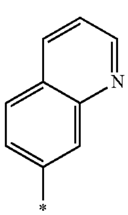
10-237
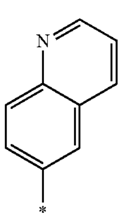
-continued
10-238
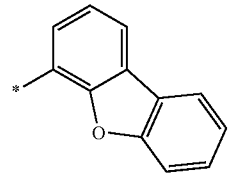
10-239
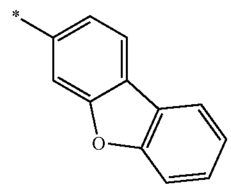
10-240
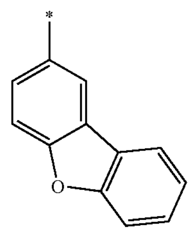
10-241
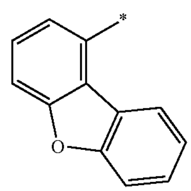
10-242
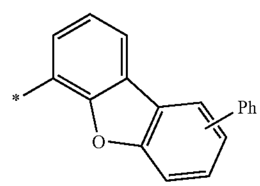
10-243
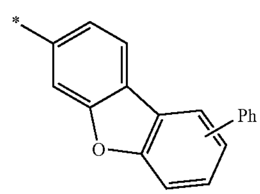
10-244
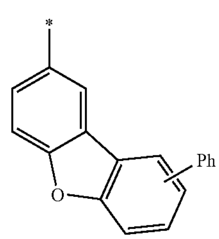
10-245
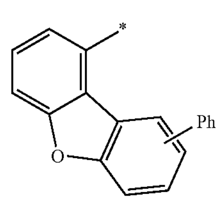

10-246
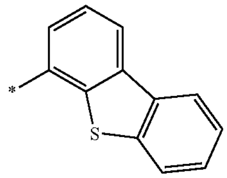
10-247
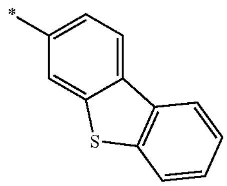
10-248
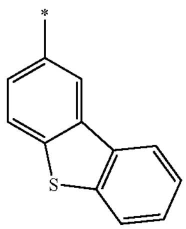
10-249
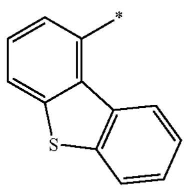
10-250
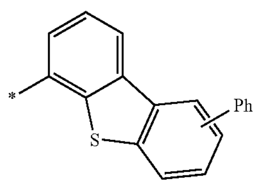
10-251
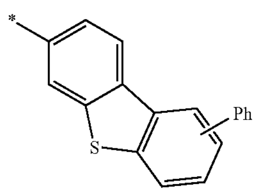
10-252
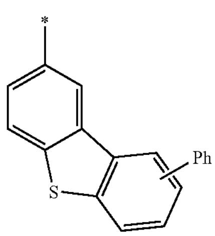
10-253
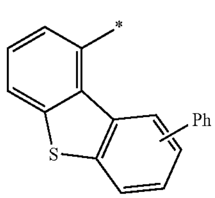
10-254
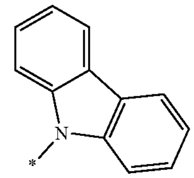
10-255
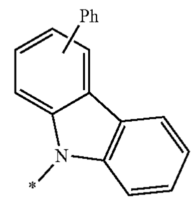
10-256
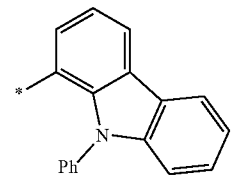
10-257
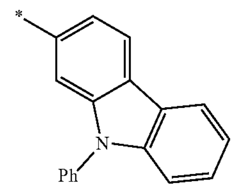
10-258
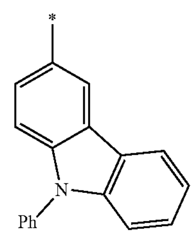
10-259
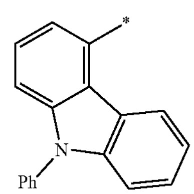
10-260
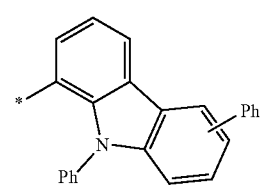
10-261
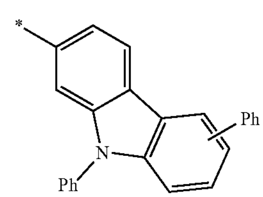

-continued
10-262
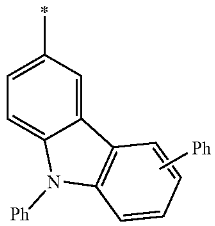
10-263
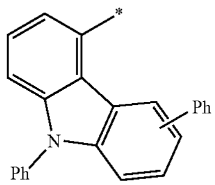
10-264
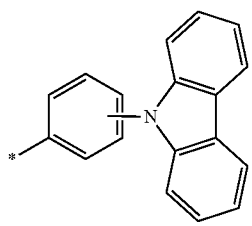
10-265
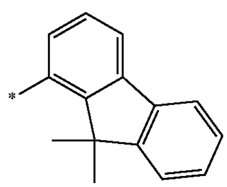
10-266
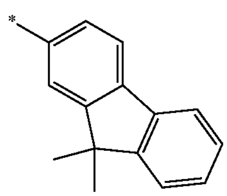
10-267
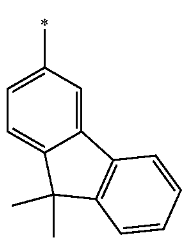
10-268
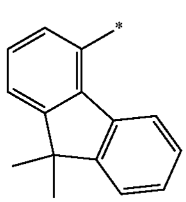
-continued
10-269
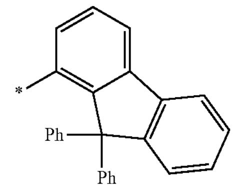
10-270
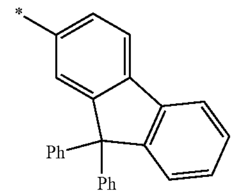
10-271
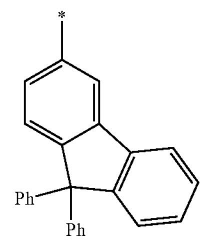
10-272
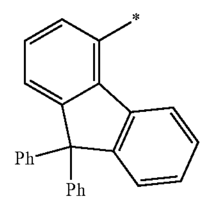
10-273
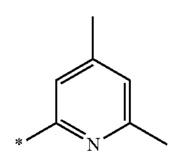
10-274
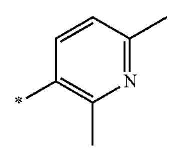
10-275
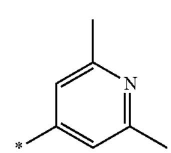
10-276
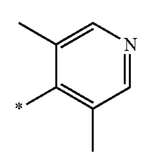
10-277
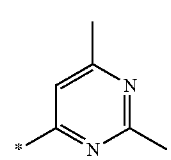

-continued
10-278
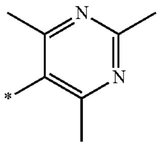
10-279
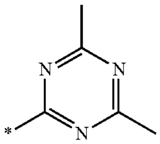
10-280
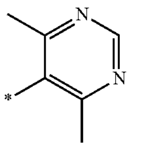
10-281
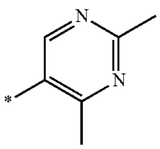
10-282
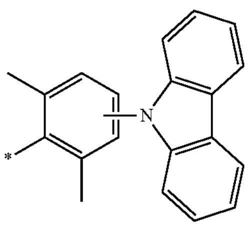
10-283
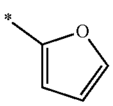
10-284
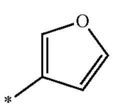
10-285
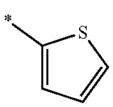
10-286
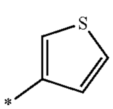
10-287
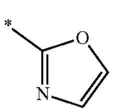
10-288
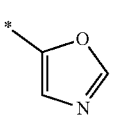
10-289
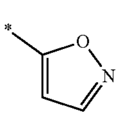
-continued
10-290
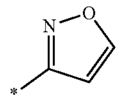
10-291
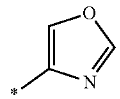
10-292
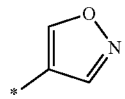
10-293
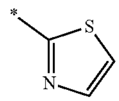
10-294
10-295
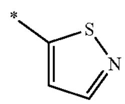
10-296
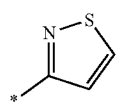
10-297
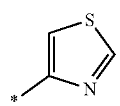
10-298
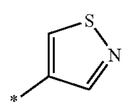
10-299
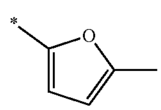
10-300
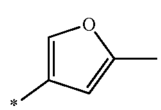
10-301
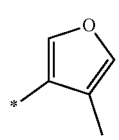
10-302
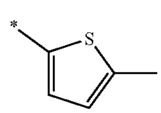
10-303
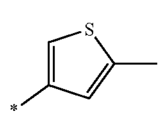

-continued
10-304
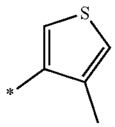
10-305
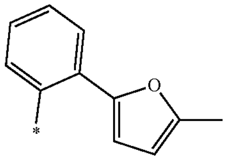
10-306
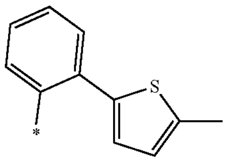
10-307
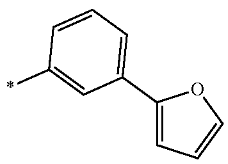
10-308
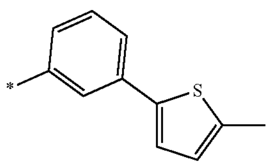
10-309
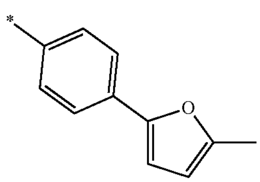
10-310
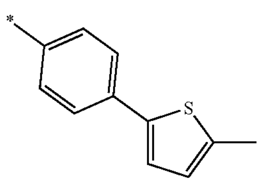
10-311
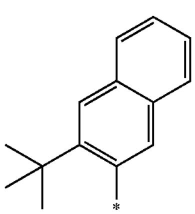
10-312
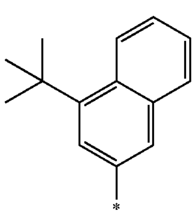
-continued
10-313
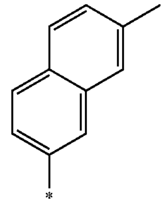
10-314
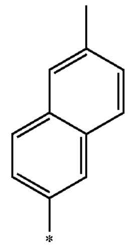
10-315
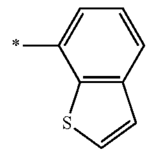
10-316
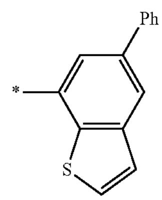
10-317
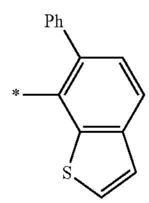
10-318
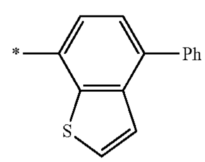
10-319
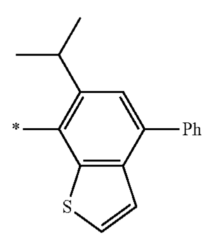

-continued
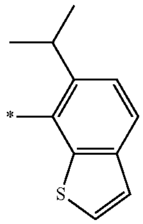
10-320
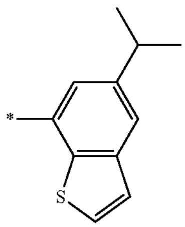
10-321
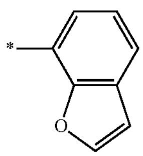
10-322
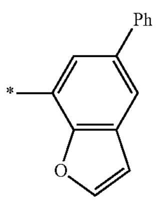
10-323
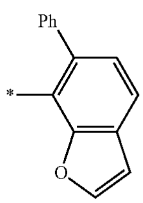
10-324
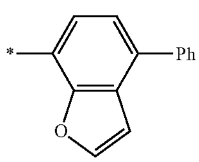
10-325
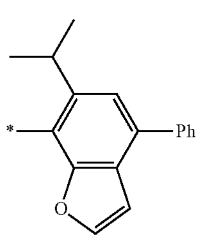
10-326
-continued
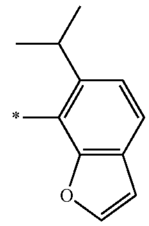
10-327
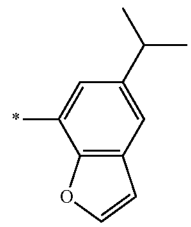
10-328
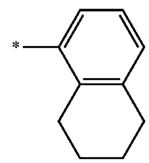
10-329
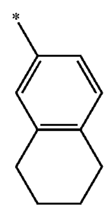
10-330
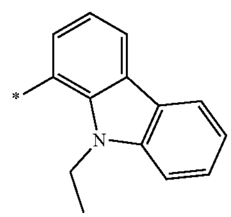
10-331
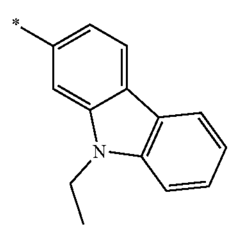
10-332
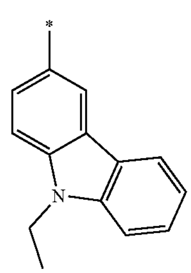
10-333

-continued
10-334
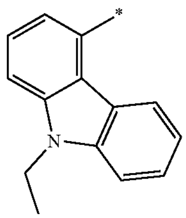
10-335
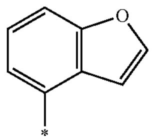
10-336
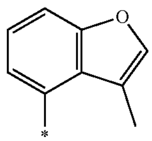
10-337
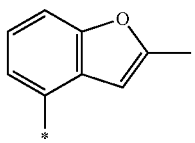
10-338
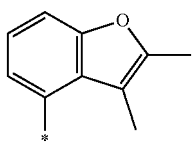
10-339
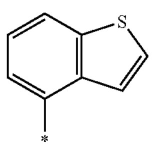
10-340
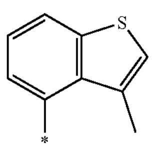
10-341
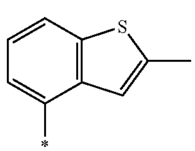
10-342
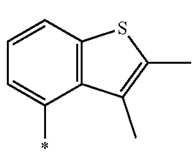
-continued
10-343
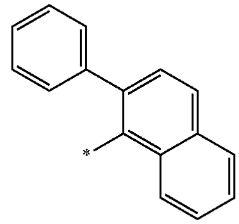
10-344
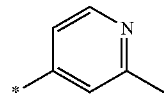
10-345
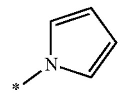
10-346
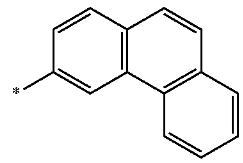
10-347
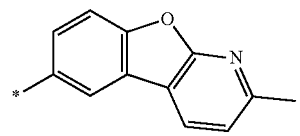
10-348
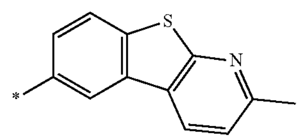
10-349
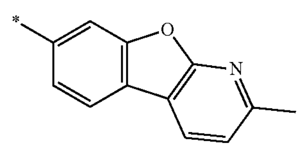
10-350
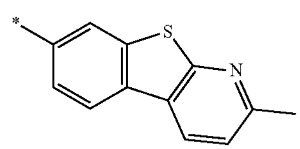
wherein, in Formulae 9-1 to 9-43, 9-201 to 9-237, 10-1 to 10-129, and 10-201 to 10-350, indicates a binding site to a neighboring atom, Ph is a phenyl group, TMS is a trimethylsilyl group, and TMG is a trimethylgermyl group.

9. The organometallic compound of claim 1, wherein $Ln_1$ is represented by one of Formulae 3-1 to 3-4:

3-1

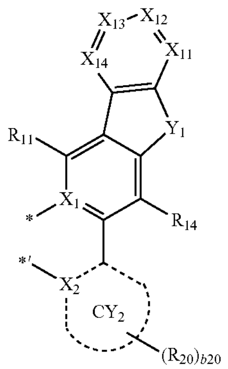

3-2

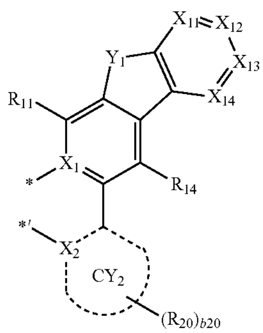

3-3

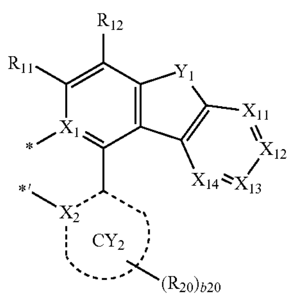

3-4

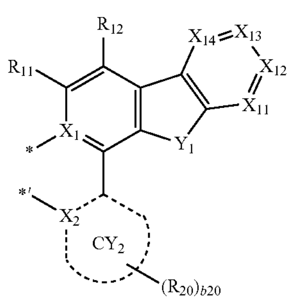

wherein, in Formulae 3-1 to 3-4, $X_1$, $X_2$, $Y_1$, $CY_2$, $X_{11}$ to $X_{14}$, $R_{20}$, and b20 are as defined in claim 1, $R_{11}$, $R_{12}$, and $R_{14}$ are each independently as defined for $R_{10}$ in claim 1, and

* and *' each indicate a binding site to $M_1$.

10. The organometallic compound of claim 1, wherein $Ln_2$ is represented by one of Formulae 5, 6, or one of 8-1 to 8-11:

Formula 5

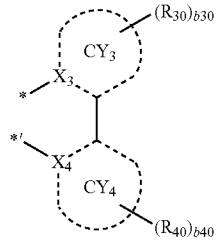

Formula 6

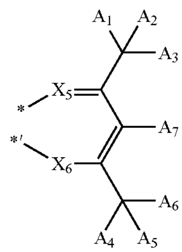

8-1

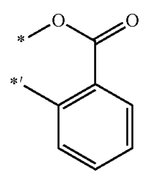

8-2

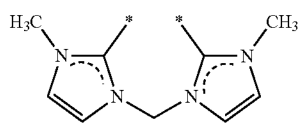

8-3

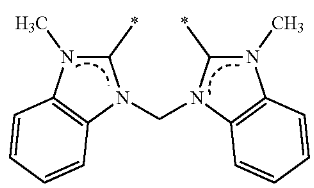

8-4

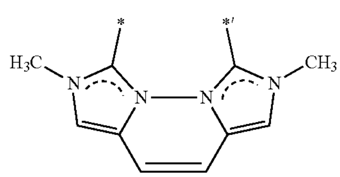

8-5

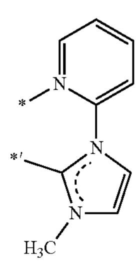

-continued 8-6

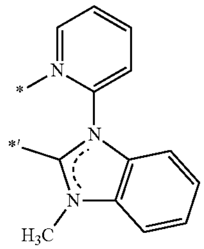

8-7

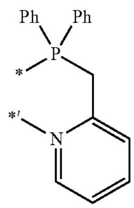

8-8

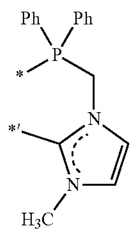

8-9

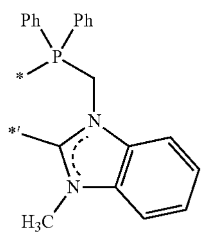

8-10

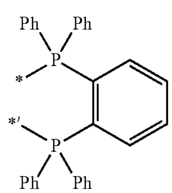

8-11

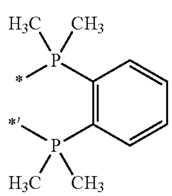

wherein, in Formulae 5, 6, and 8-1 to 8-11, $X_3$ is C or N, and $X_4$ is C or N, $X_5$ and $X_6$ are each independently O or S, $CY_3$ and $CY_4$ are each independently a $C_5$-$C_{30}$ carbocyclic group or a $C_1$-$C_{30}$ heterocyclic group, $R_{30}$, $R_{40}$, and $A_1$ to $A_7$ are each independently hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, —$Ge(Q_1)(Q_2)(Q_3)$, or —$B(Q_1)(Q_2)$, b30 and b40 are each independently 1, 2, 3, 4, 5, 6, 7, 8, 9, or 10, Ph is a phenyl group, and

* and *' each indicate a binding site to $M_1$.

11. The organometallic compound of claim 1, wherein $Ln_2$ is a group represented by one of Formulae 5-1 to 5-129:

5-1

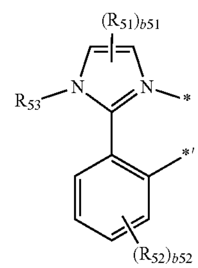

5-2

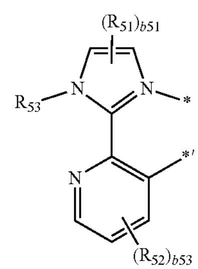

5-3

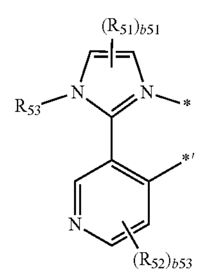

-continued
5-4
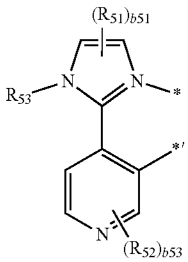
5-5
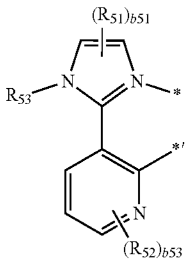
5-6
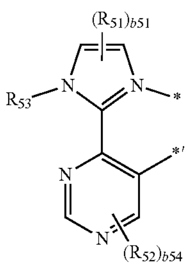
5-7
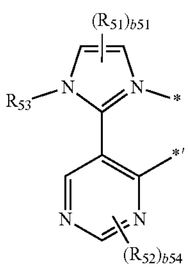
5-8
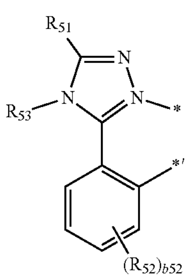
5-9
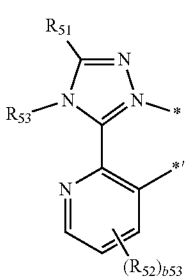
-continued
5-10
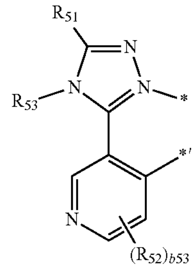
5-11
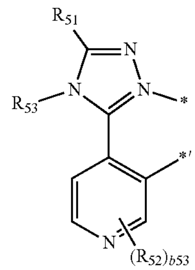
5-12
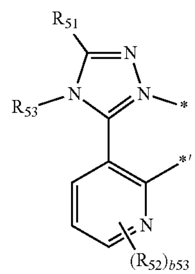
5-13
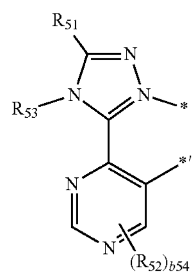
5-14
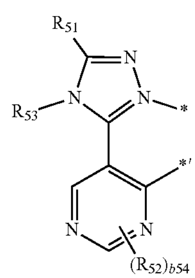
5-15
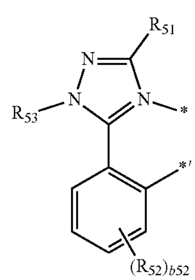

-continued
5-16
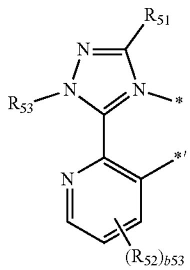
5-17
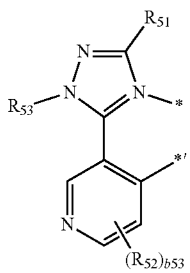
5-18
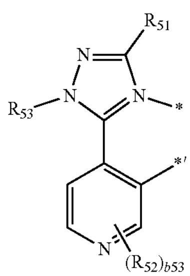
5-19
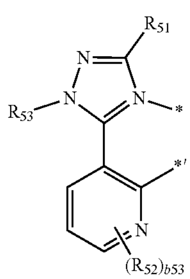
5-20
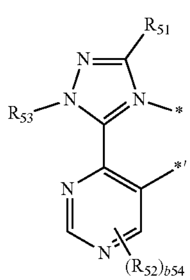
5-21
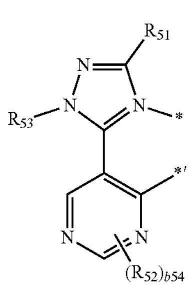
-continued
5-22
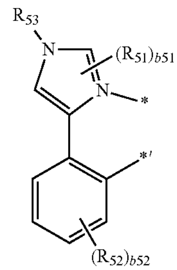
5-23
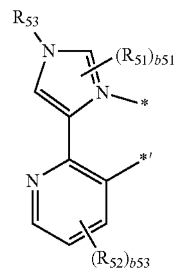
5-24
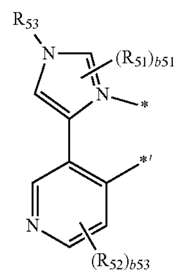
5-25
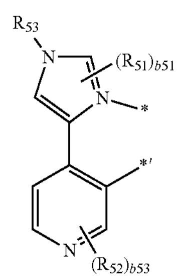
5-26
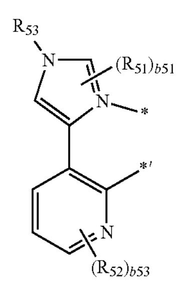
5-27
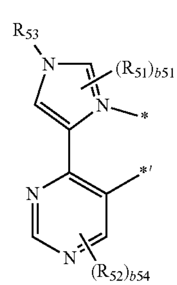

-continued
5-28
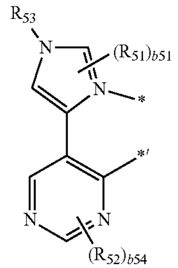
5-29
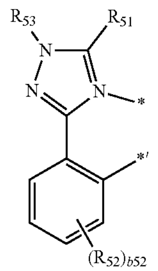
5-30
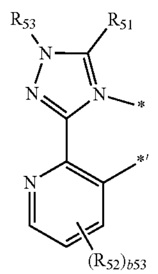
5-31
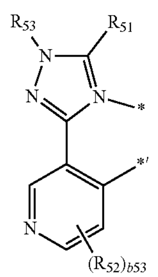
5-32
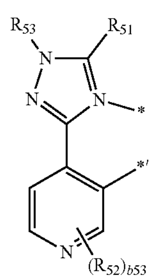
5-33
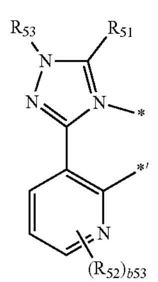
-continued
5-34
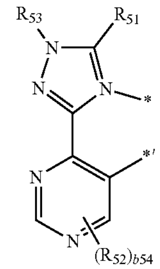
5-35
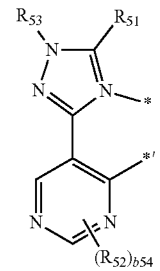
5-36
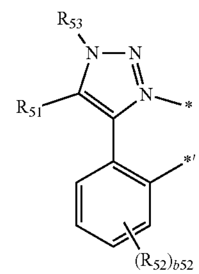
5-37
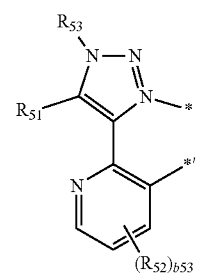
5-38
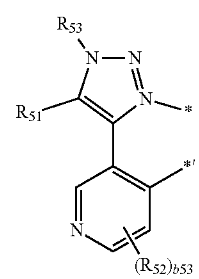
5-39
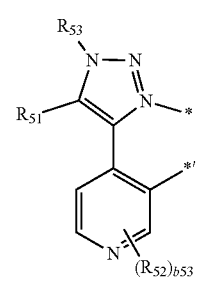

-continued
5-40
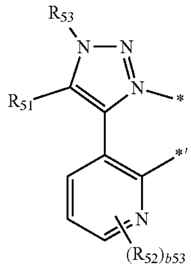
5-41
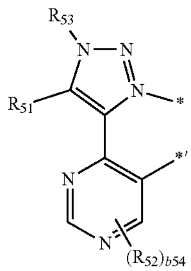
5-42
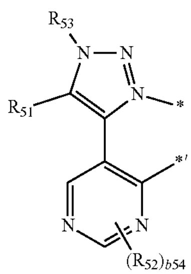
5-43
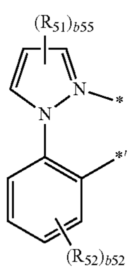
5-44
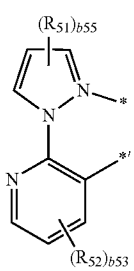
5-45
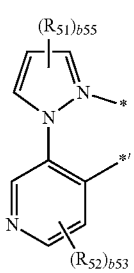
-continued
5-46
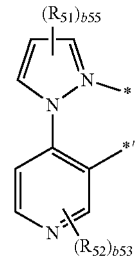
5-47
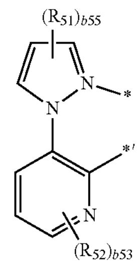
5-48
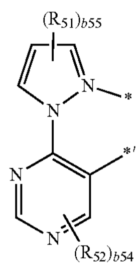
5-49
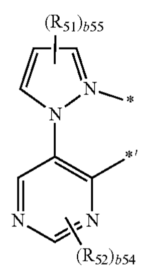
5-50
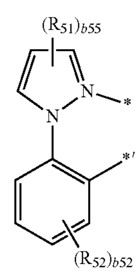
5-51
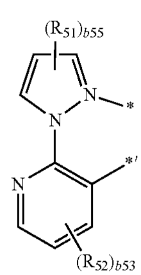

5-52
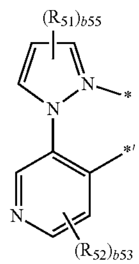
5-53
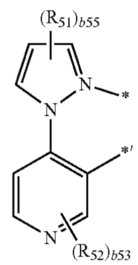
5-54
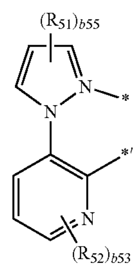
5-55
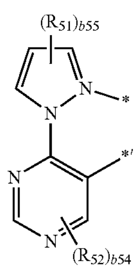
5-56
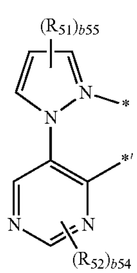
5-57
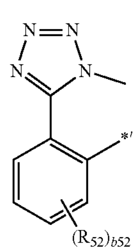
5-58
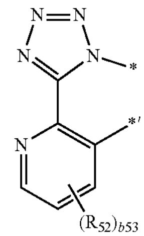
5-59
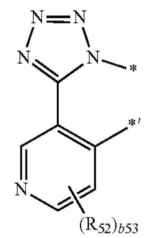
5-60
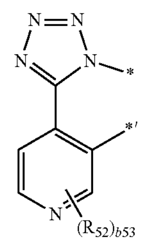
5-61
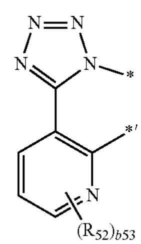
5-62
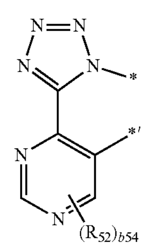
5-63
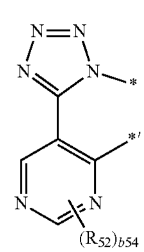

-continued
5-64
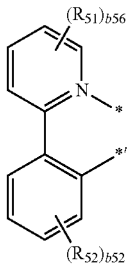
5-65
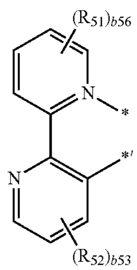
5-66
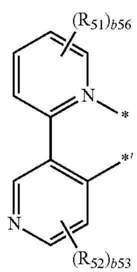
5-67
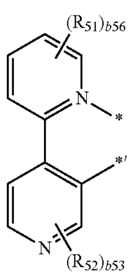
5-68
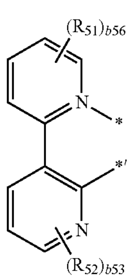
5-69
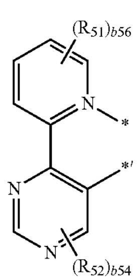
-continued
5-70
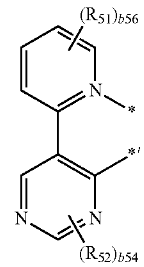
5-71
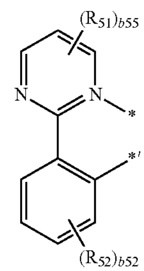
5-72
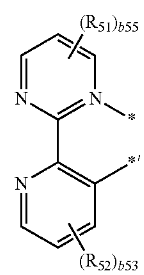
5-73
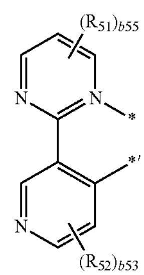
5-74
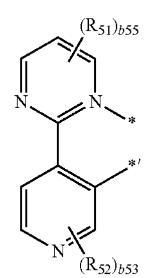
5-75
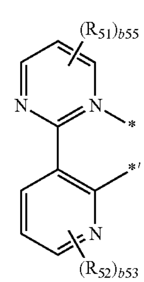

-continued
5-76
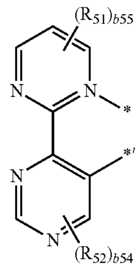
5-77
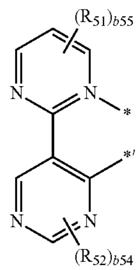
5-78
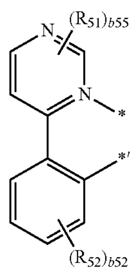
5-79
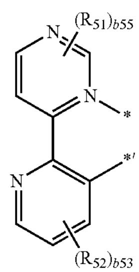
5-80
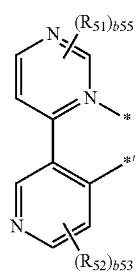
5-81
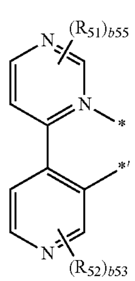
-continued
5-82
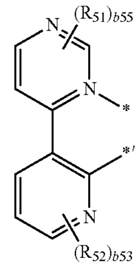
5-83
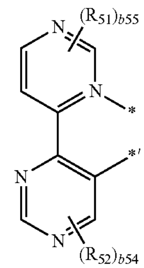
5-84
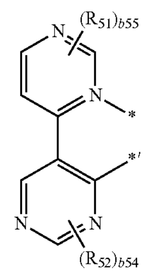
5-85
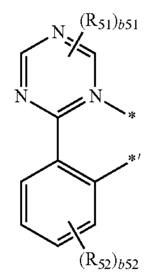
5-86
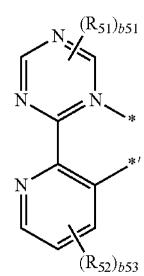
5-87
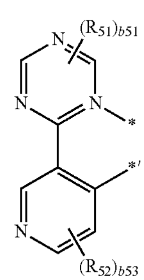

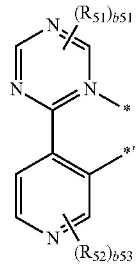
5-88
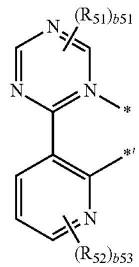
5-89
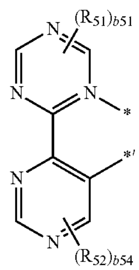
5-90
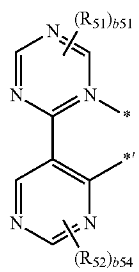
5-91
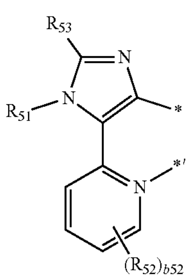
5-92
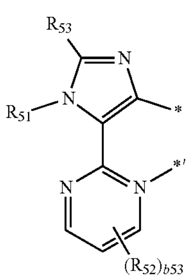
5-93
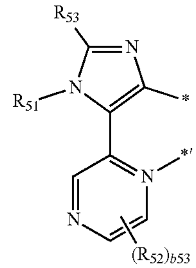
5-94
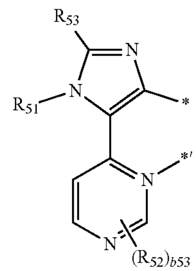
5-95
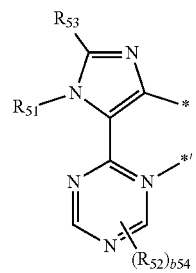
5-96
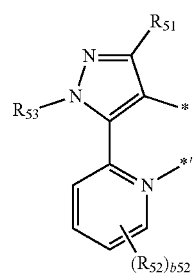
5-97
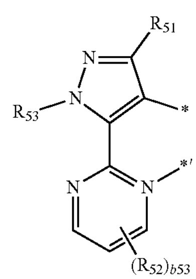
5-98
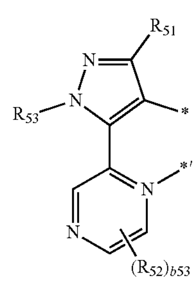
5-99

-continued
5-100
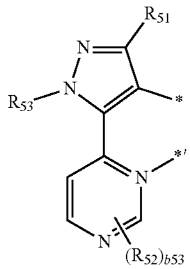
5-101
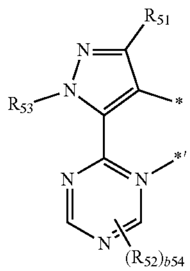
5-102
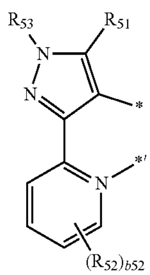
5-103
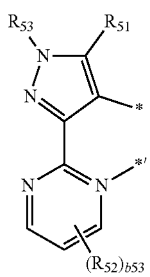
5-104
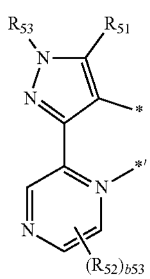
5-105
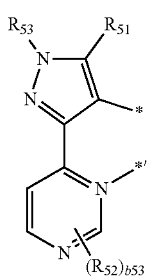
-continued
5-106
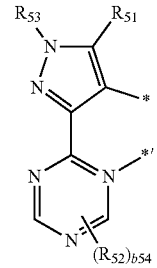
5-107
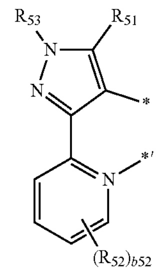
5-108
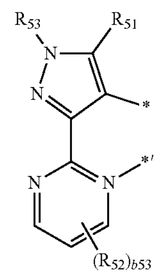
5-109
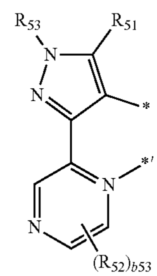
5-110
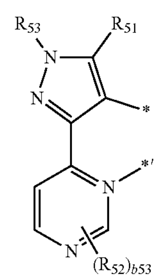
5-111
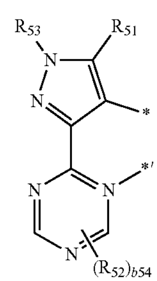

-continued
5-112
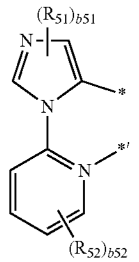
5-113
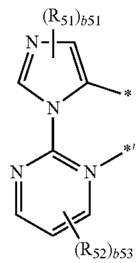
5-114
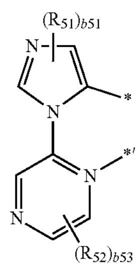
5-115
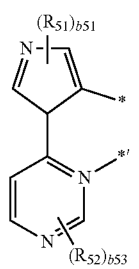
5-116
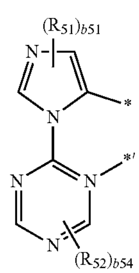
5-117
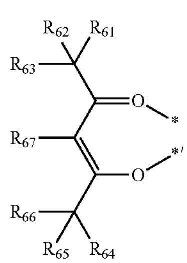
-continued
5-118
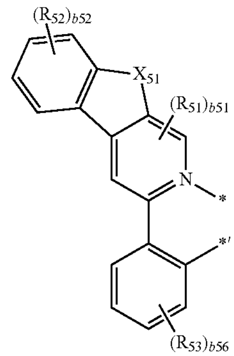
5-119
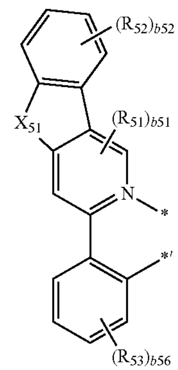
5-120
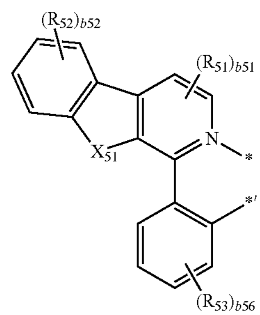
5-121
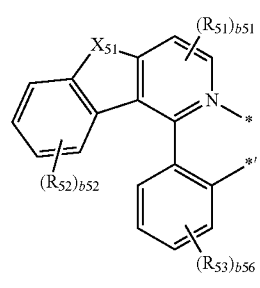
5-122
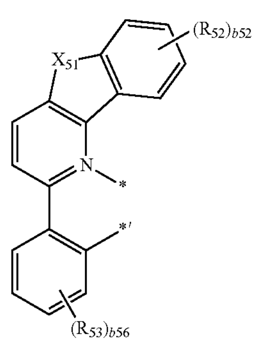

-continued 5-123

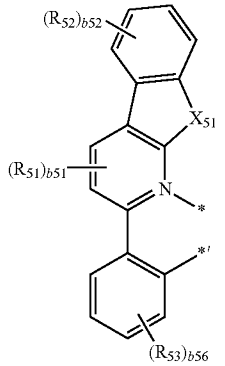

5-124

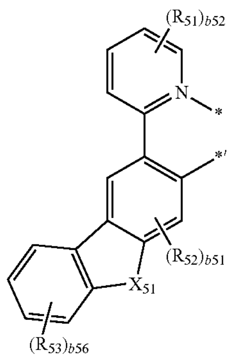

5-125

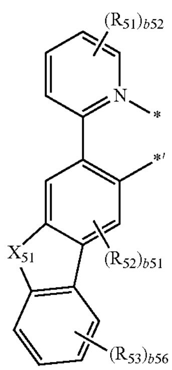

5-126

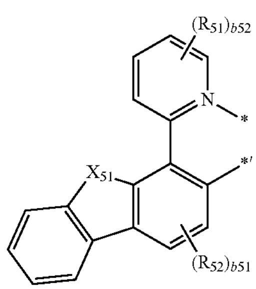

5-127

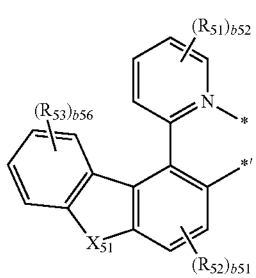

-continued 5-128

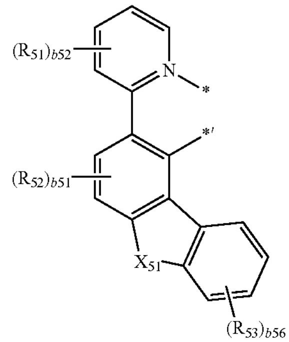

5-129

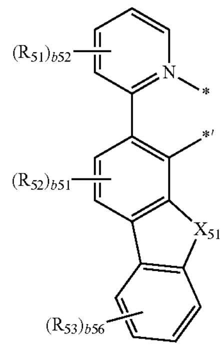

wherein, in Formulae 5-1 to 5-129, $X_{51}$ is O, S, N($R_{54}$), C($R_{54}$)($R_{55}$), or Si($R_{54}$)($R_{55}$), $R_{51}$ to $R_{55}$ and $R_{61}$ to $R_{67}$ are each independently:

hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, a $C_1$-$C_{20}$ alkoxy group, or a $C_1$-$C_{20}$ alkylthio group;

a $C_1$-$C_{20}$ alkyl group, a $C_1$-$C_{20}$ alkoxy group, or a $C_1$-$C_{20}$ alkylthio group, each substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkylphenyl group, a naphthyl group, a pyridinyl group, a pyrimidinyl group, or a combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, or an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, or an imidazopyrimidinyl group, each substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, —Si($Q_{11}$)($Q_{12}$)($Q_{13}$), —B($Q_{11}$)($Q_{12}$), —N($Q_{11}$)($Q_{12}$), or a combination thereof, or —Si($Q_1$)($Q_2$)($Q_3$), —Ge($Q_1$)($Q_2$)($Q_3$), —B($Q_1$)($Q_2$), or —N($Q_1$)($Q_2$), wherein $Q_1$ to $Q_3$ and $Q_{11}$ to $Q_{13}$ are each independently:

a methyl group, an ethyl group, an n-propyl group, an isopropyl group, an n-butyl group, an isobutyl group, a sec-butyl group, a tert-butyl group, an n-pentyl group, an isopentyl group, a 2-methylbutyl group, a sec-pentyl group, a tert-pentyl group, a neo-pentyl group, 3-pentyl group, a 3-methyl-2-butyl group, a phenyl group, a biphenyl group, a $C_1$-$C_{20}$ alkylphenyl group, or a naphthyl group; or a methyl group, an ethyl group, an n-propyl group, an isopropyl group, an n-butyl group, an isobutyl group, a sec-butyl group, a tert-butyl group, an n-pentyl group, an isopentyl group, a 2-methylbutyl group, a sec-pentyl group, a tert-pentyl group, a neo-pentyl group, a 3-pentyl group, a 3-methyl-2-butyl group, a phenyl group, or a naphthyl group, each substituted with at least one of deuterium, a phenyl group, or a combination thereof, b51 and b54 are each independently 1 or 2, b53 and b55 are each independently 1, 2, or 3, b52 and b56 are each independently 1, 2, 3, or 4, and

* and *' each indicate a binding site to $M_1$.

12. The organometallic compound of claim 1, wherein the organometallic compound is a compound represented by one of Formulae 11-1 to 11-8:

11-1

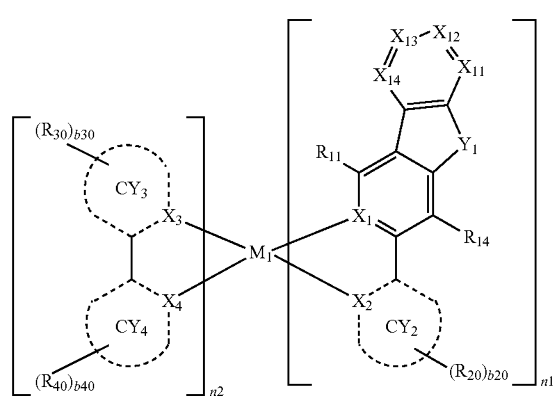

-continued 11-2

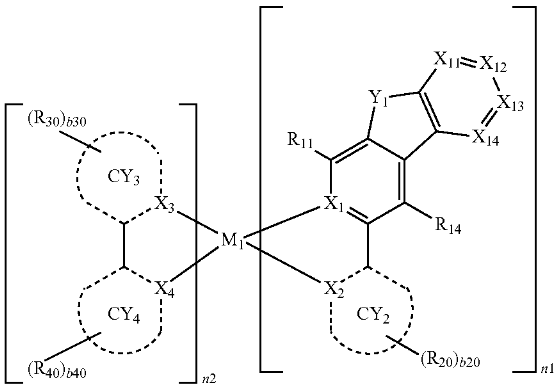

11-3

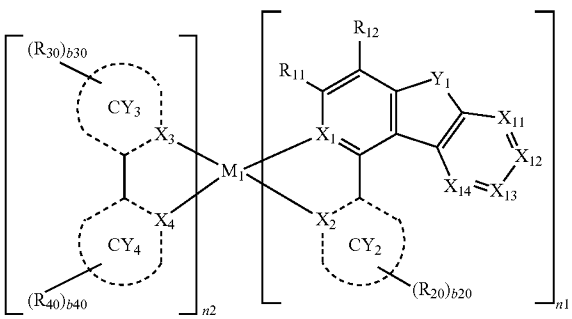

11-4

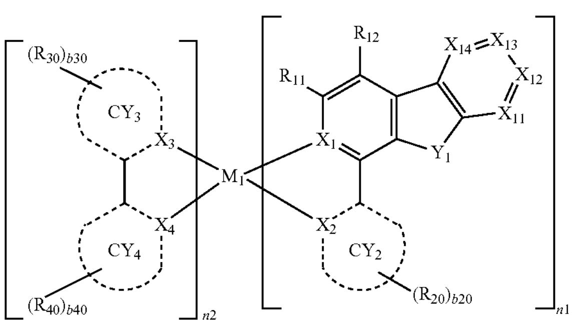

11-5

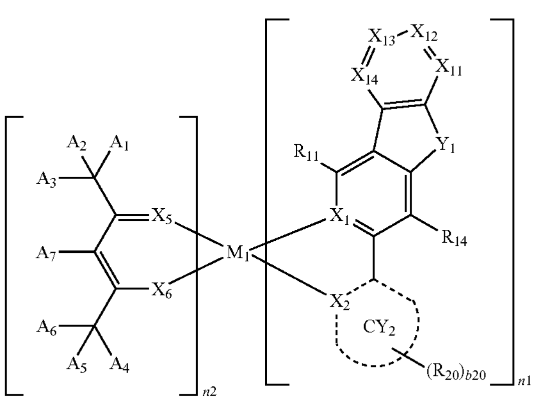

-continued 11-6

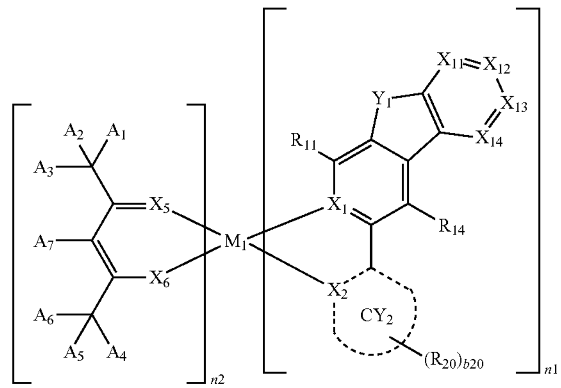

11-7

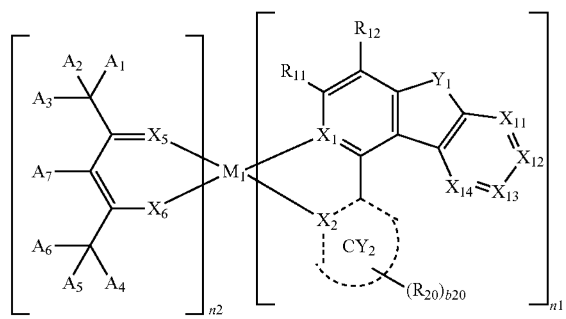

11-8

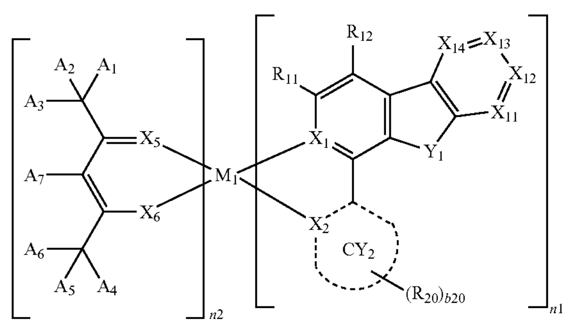

wherein, in Formulae 11-1 to 11-8, $M_1$, $X_1$, $X_2$, $Y_1$, $CY_2$, $X_{11}$ to $X_{14}$, $R_{20}$, and b20 are as defined in claim 1, $R_{11}$, $R_{12}$, and $R_{14}$ are each independently as defined for $R_{10}$ in claim 1, $X_3$ is C or N, and $X_4$ is C or N, $X_5$ and $X_6$ are each independently O or S, $CY_3$ and $CY_4$ are each independently a $C_5$-$C_{30}$ carbocyclic group or a $C_1$-$C_{30}$ heterocyclic group, $R_{30}$, $R_{40}$, and $A_1$ to $A_7$ are each independently hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —Ge($Q_1$)($Q_2$)($Q_3$), or —B($Q_1$)($Q_2$), and b30 and b40 are each independently 1, 2, 3, 4, 5, 6, 7, 8, 9, or 10.

13. The organometallic compound of claim 1, wherein the organometallic compound is electrically neutral.

14. The organometallic compound of claim 1, wherein the organometallic compound is one of Compounds 1 to 196:

1

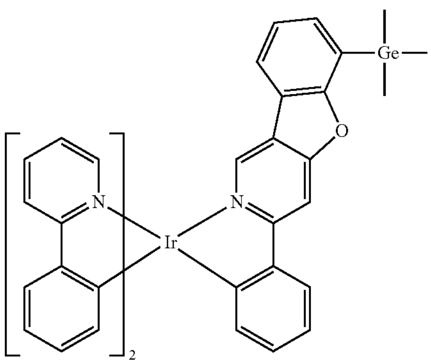

2

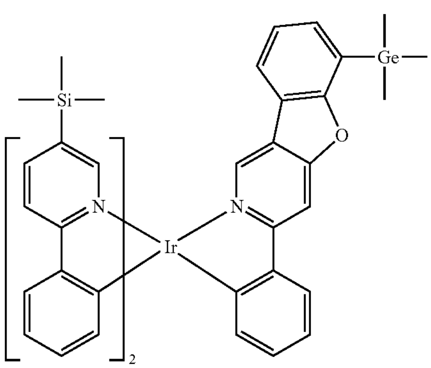

-continued

3

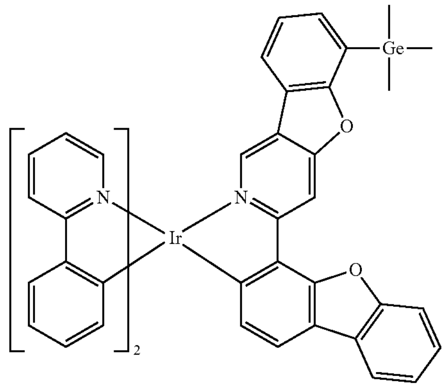

4

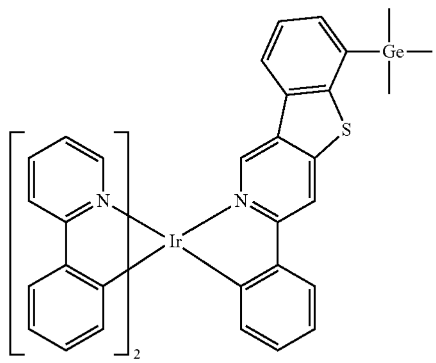

5

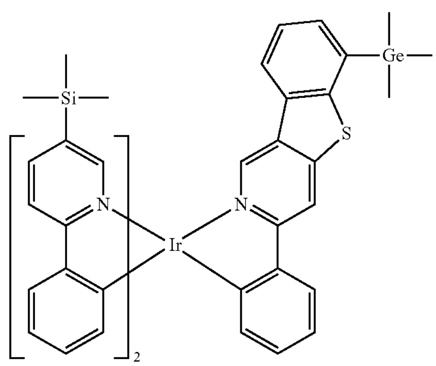

6

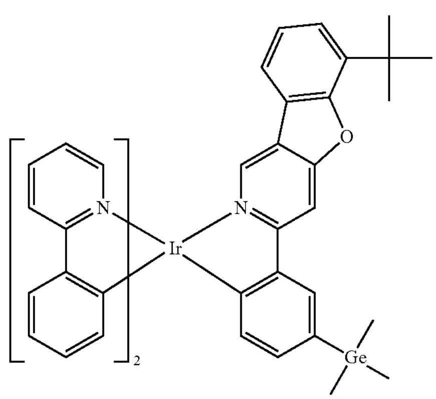

7
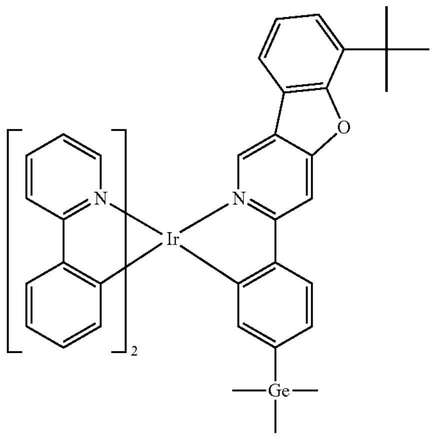
8
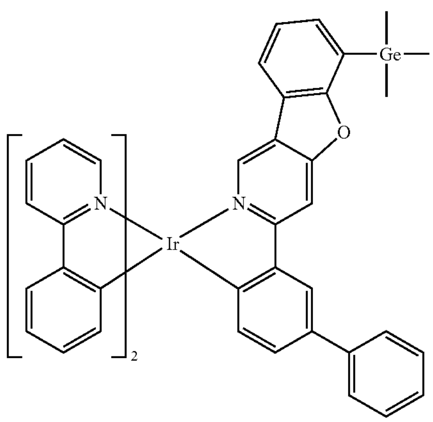
9
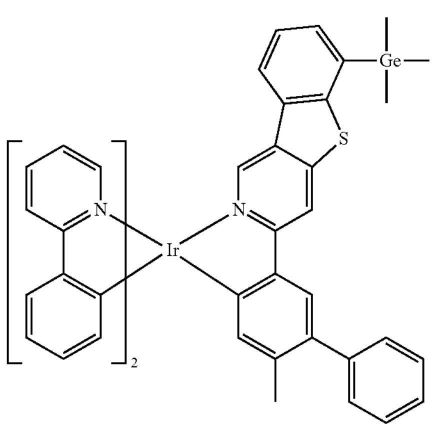
10
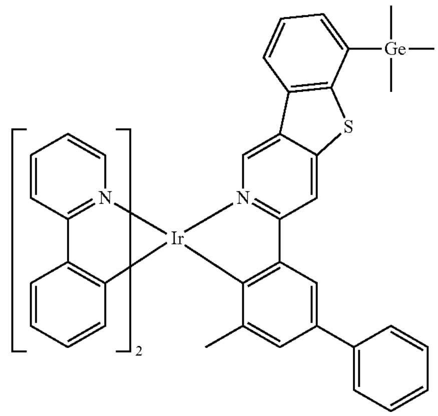
11
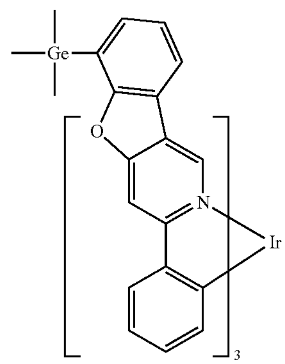
12
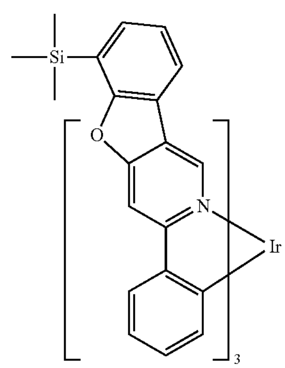
13
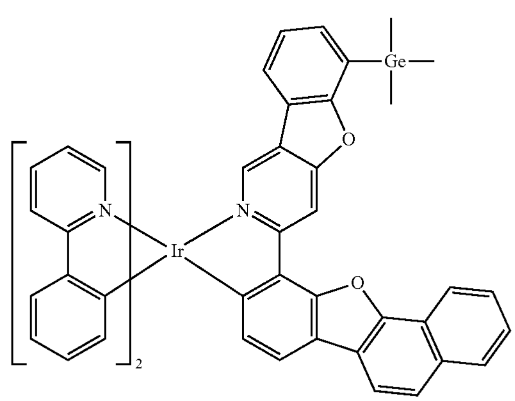

14
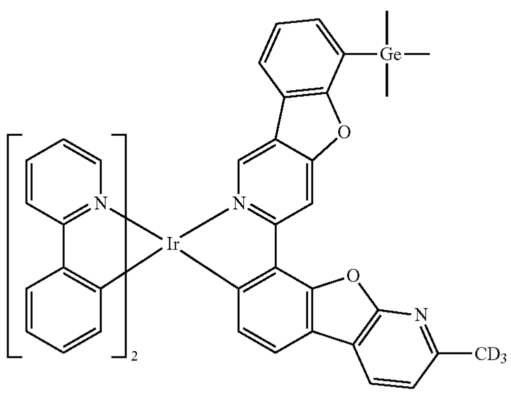
15
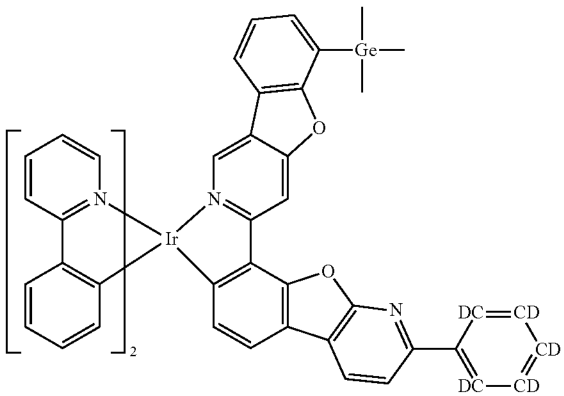
16
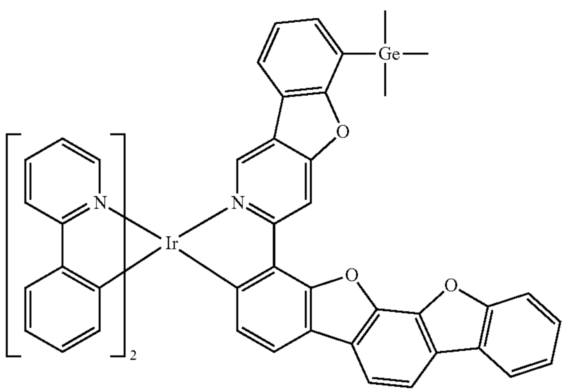
17
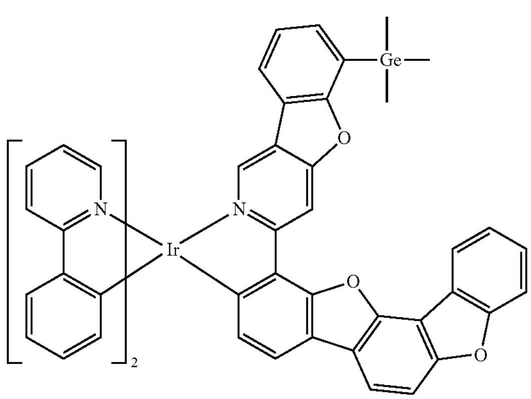
18
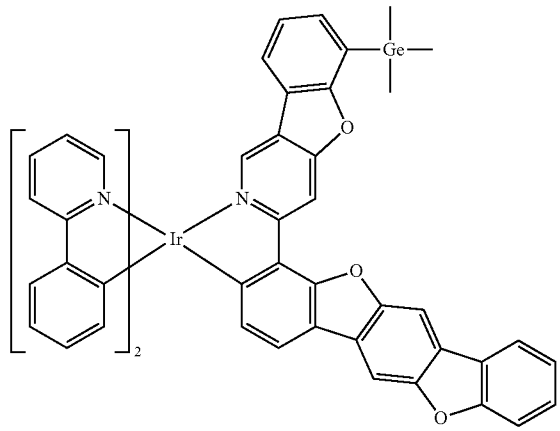
19
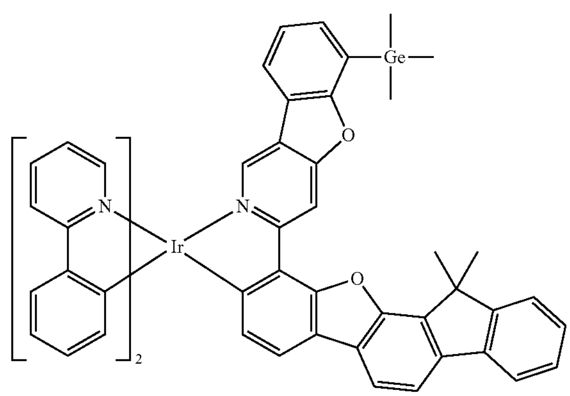
20
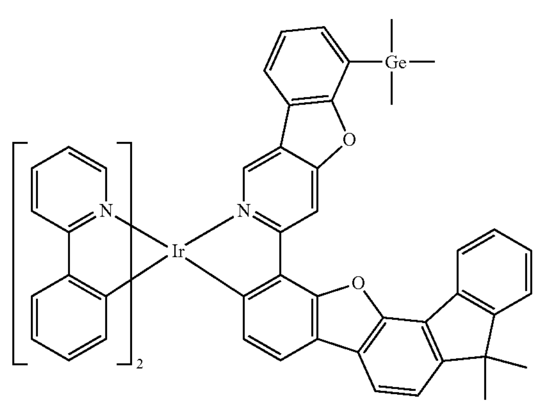

-continued
21
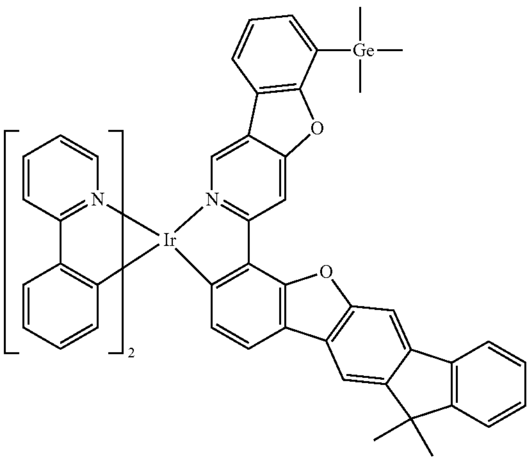
22
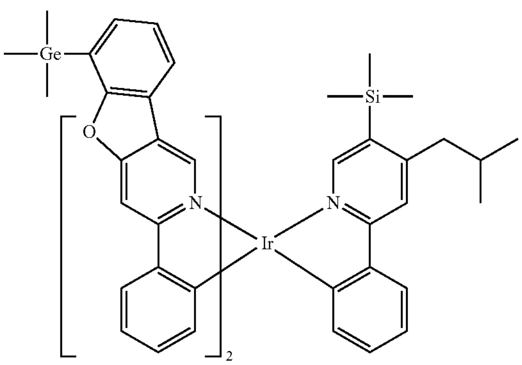
23
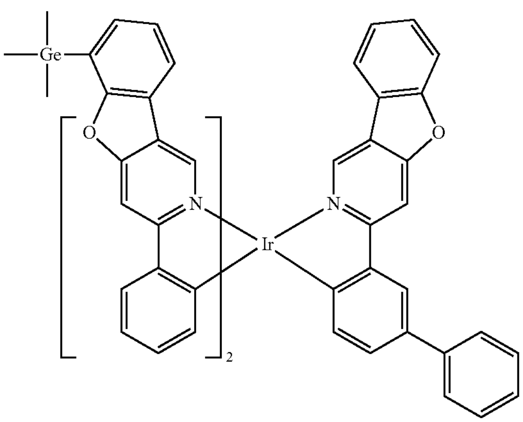
-continued
24
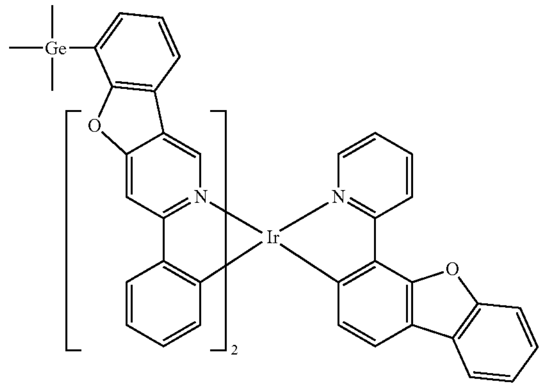
25
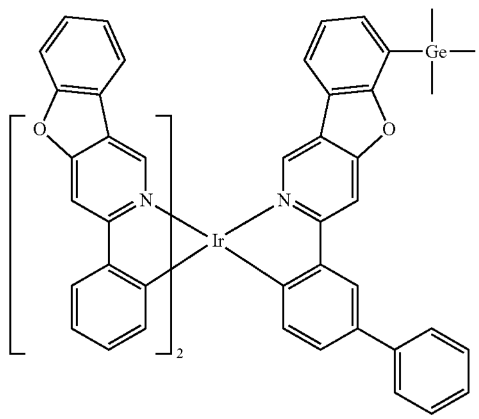
26
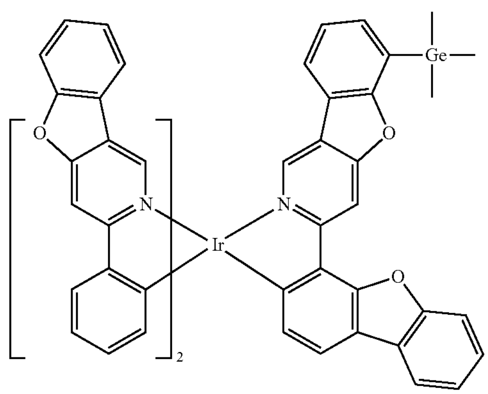
27
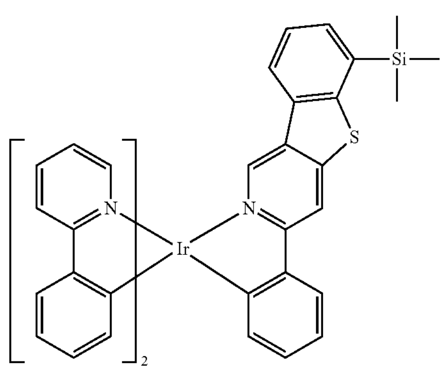

-continued
28
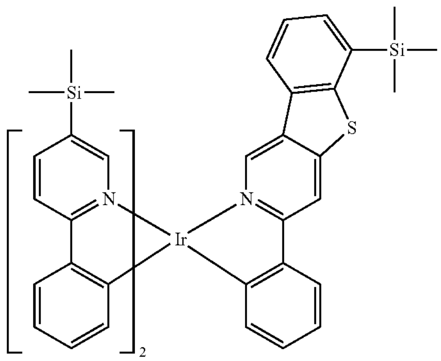
29
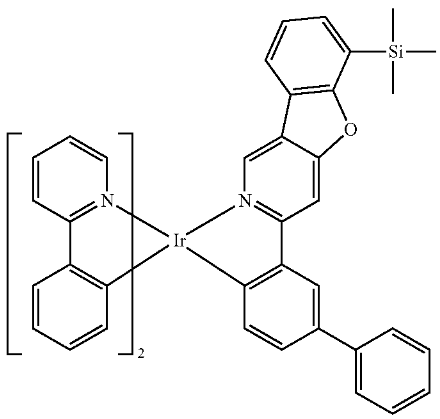
30
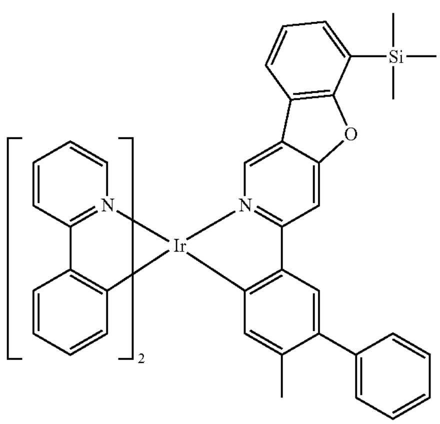
31
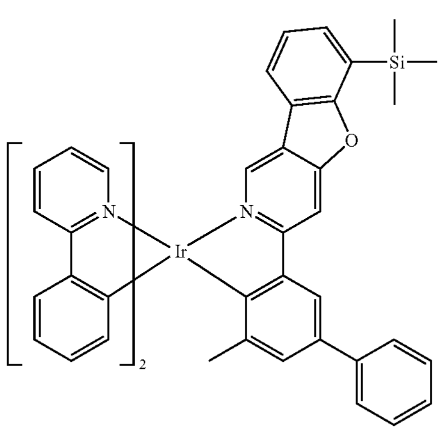
-continued
32
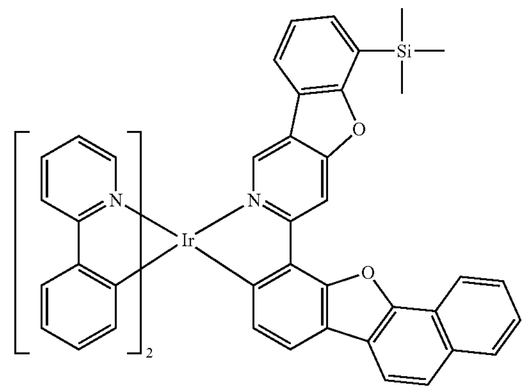
33
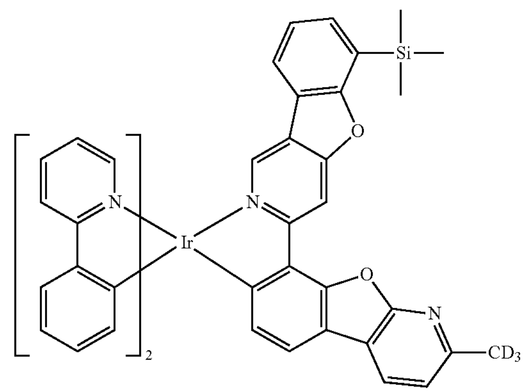
34
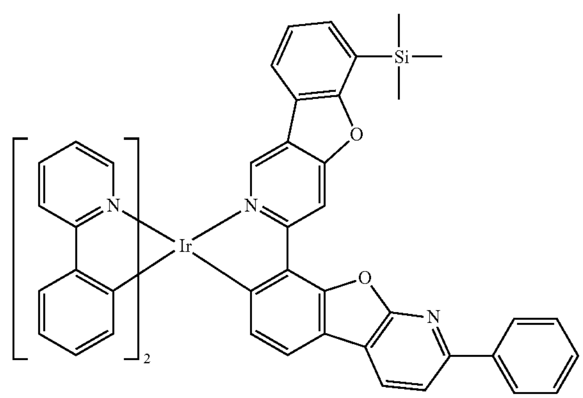
35
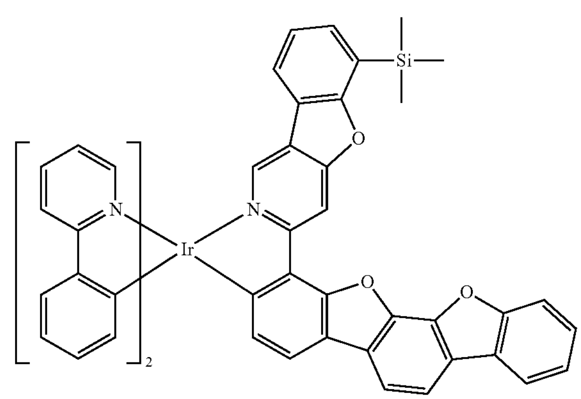

-continued
36
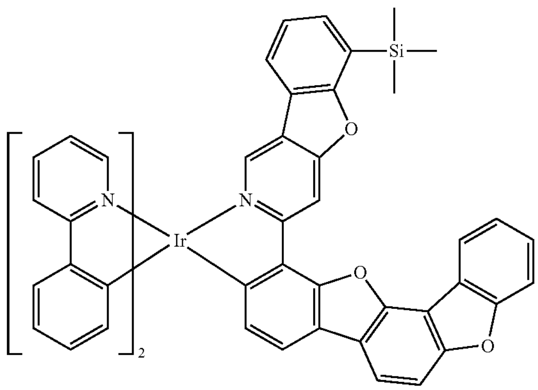
37
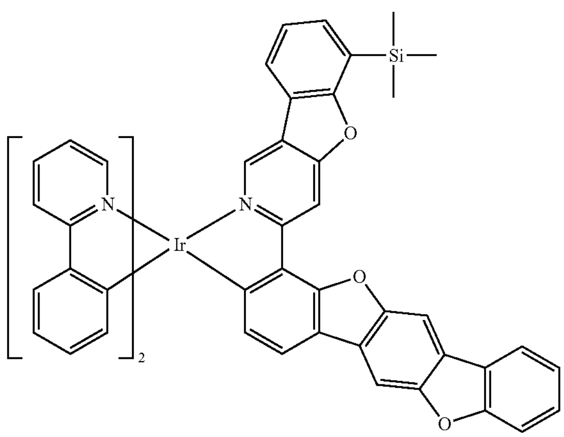
38
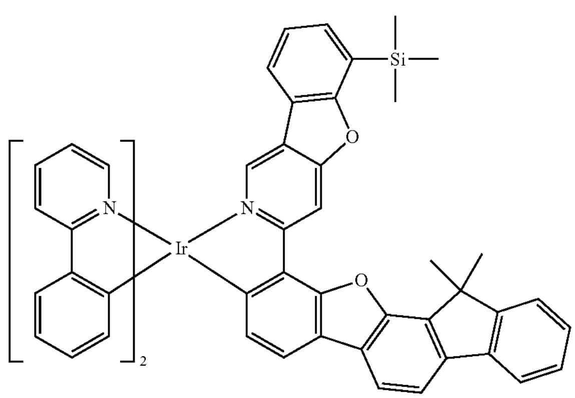
-continued
39
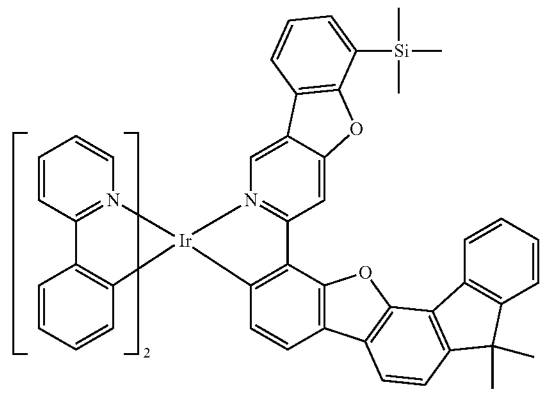
40
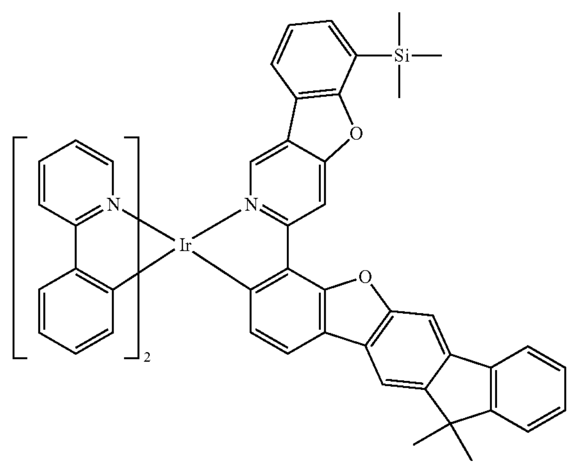
41
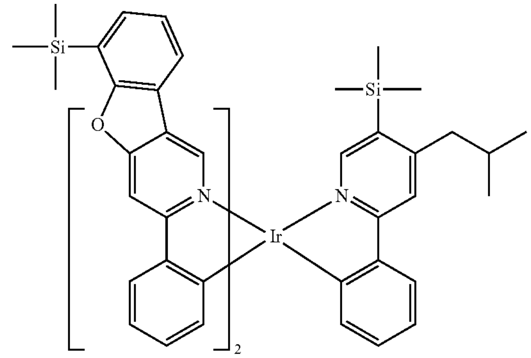

-continued
42
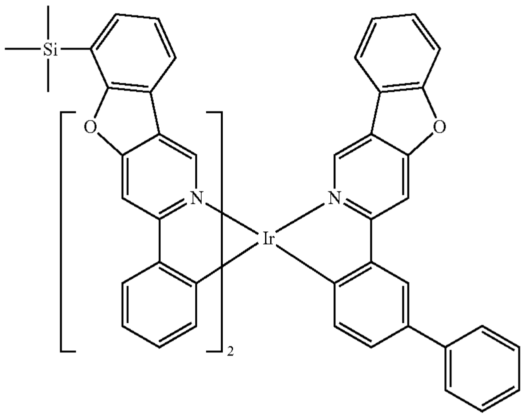
43
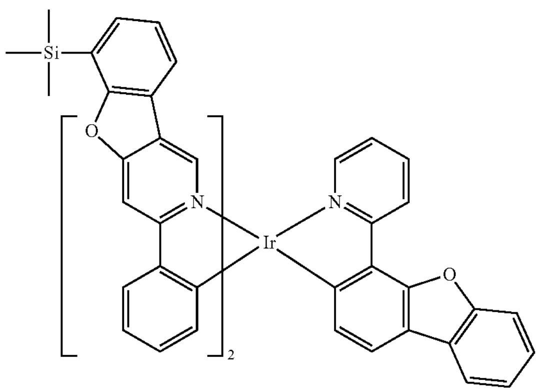
44
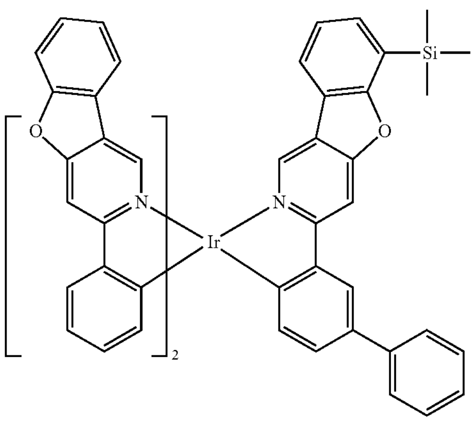
45
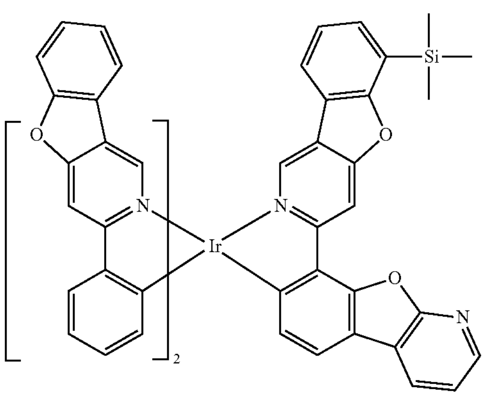
-continued
46
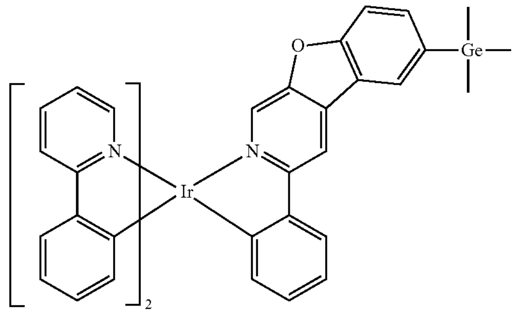
47
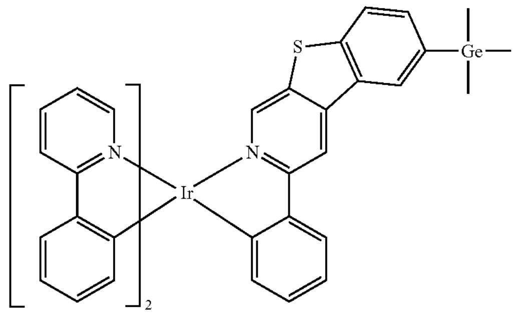
48
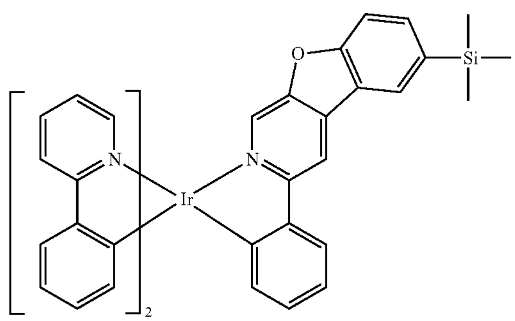
49
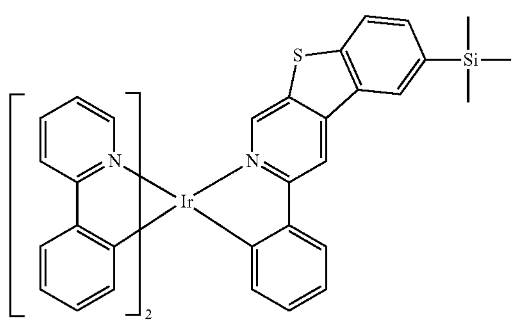

-continued
50
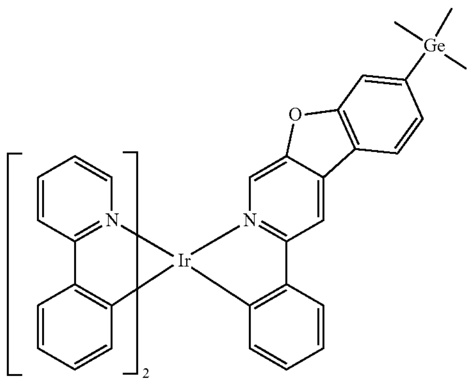
51
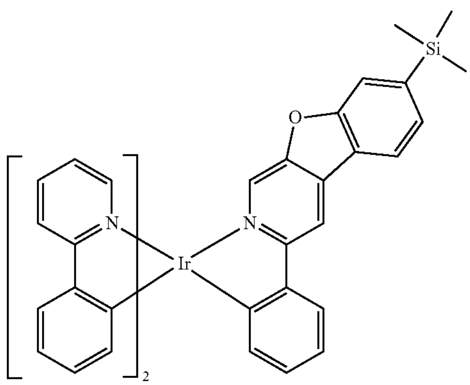
52
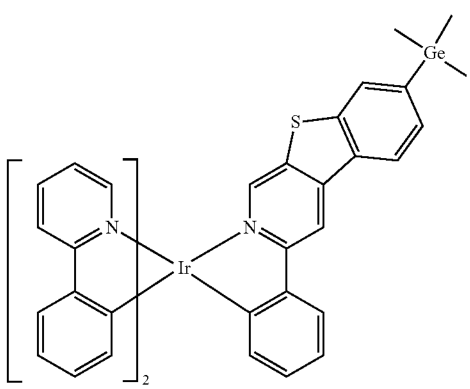
53
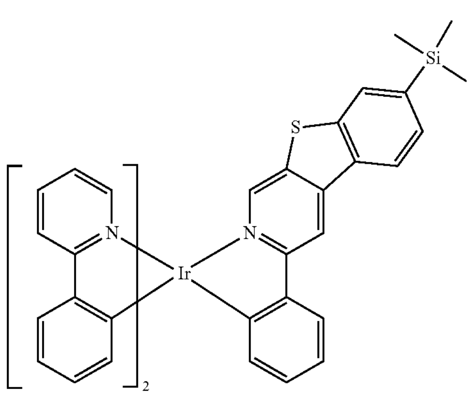
-continued
54
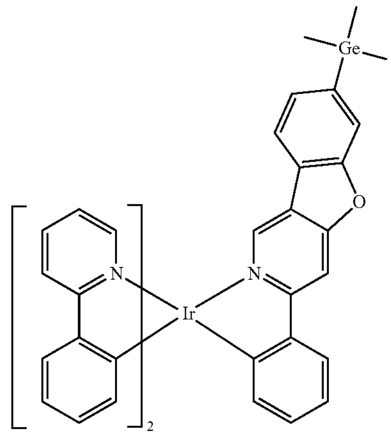
55
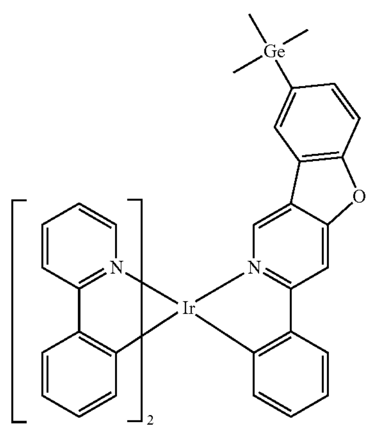
56
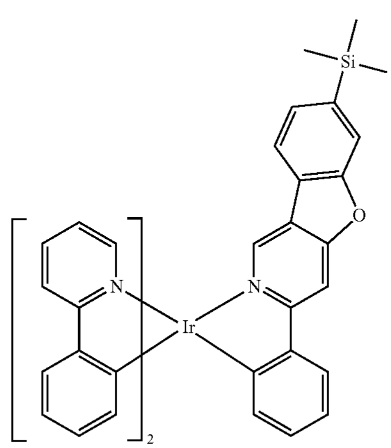

-continued
57
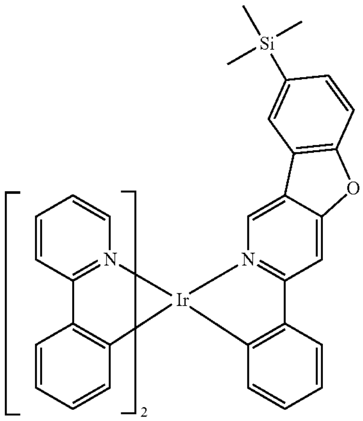
58
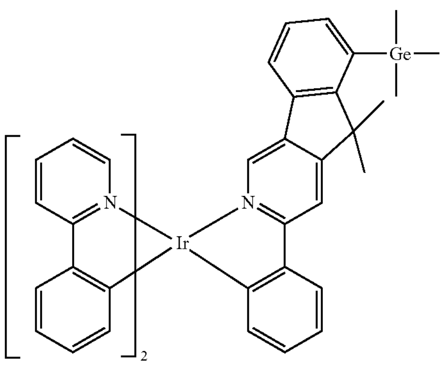
59
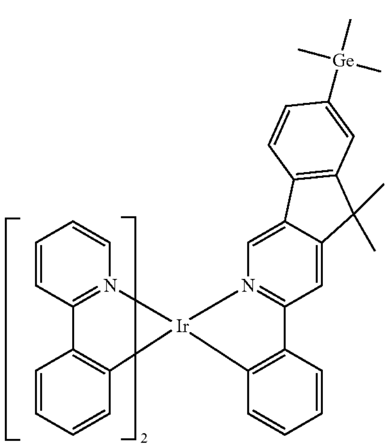
-continued
60
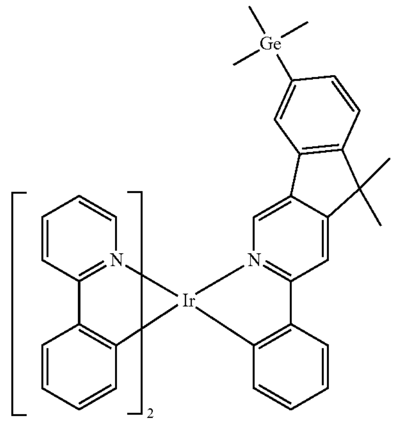
61
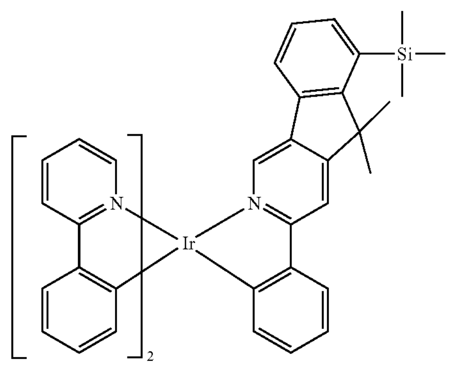
62
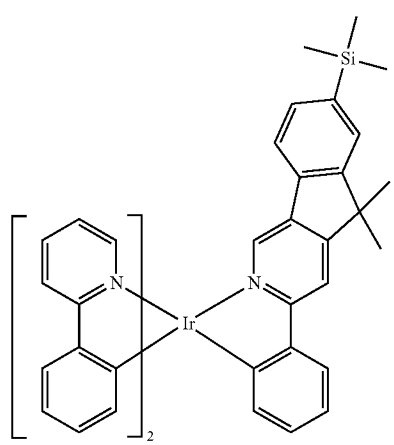

-continued
63
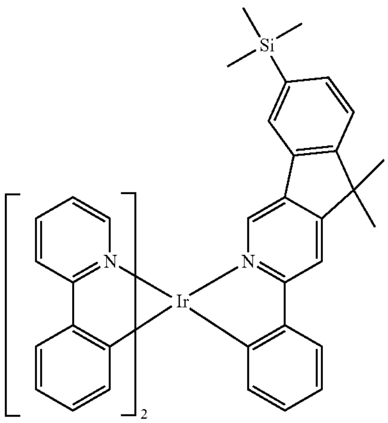
64
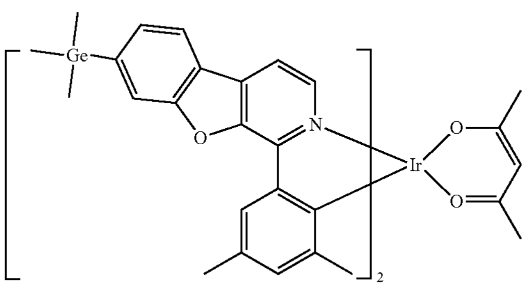
65
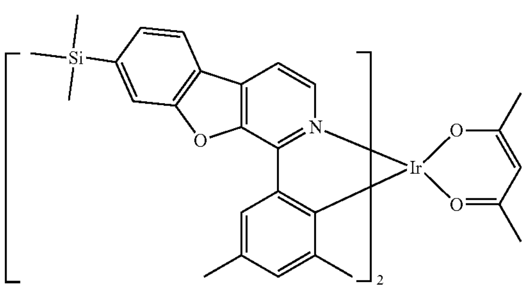
66
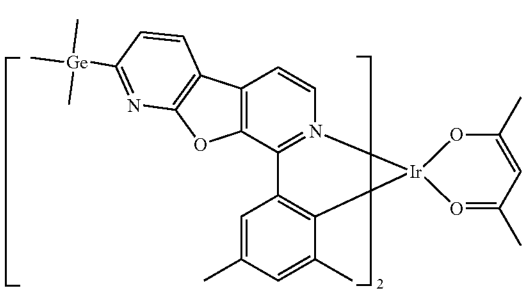
-continued
67
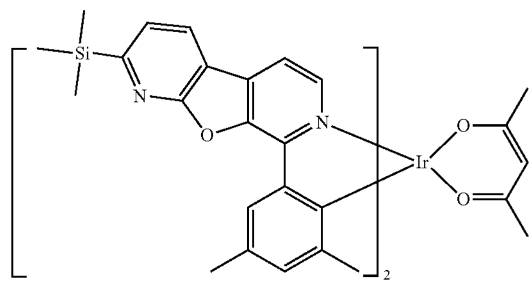
68
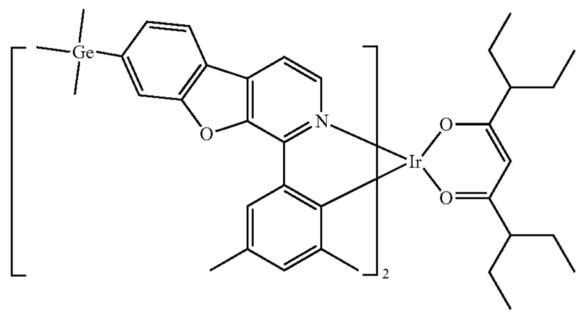
69
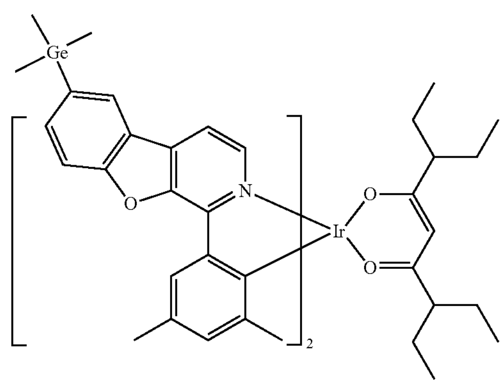
70
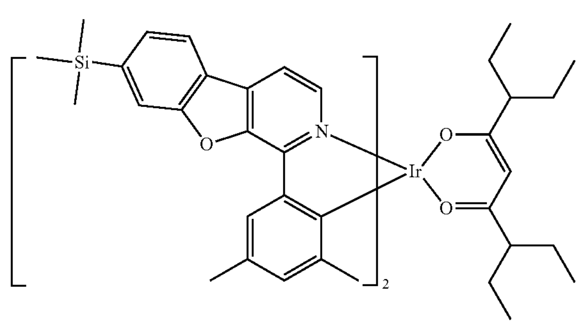

-continued
71
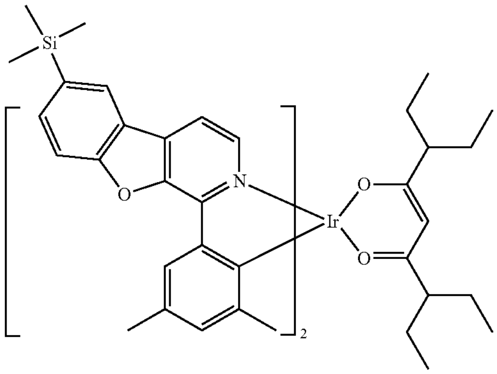
72
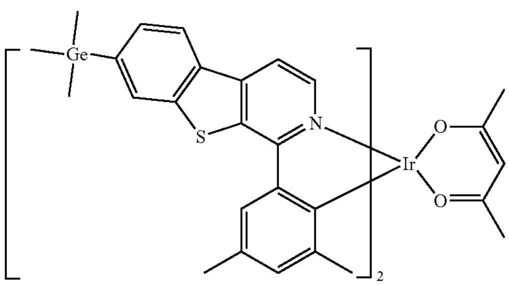
73
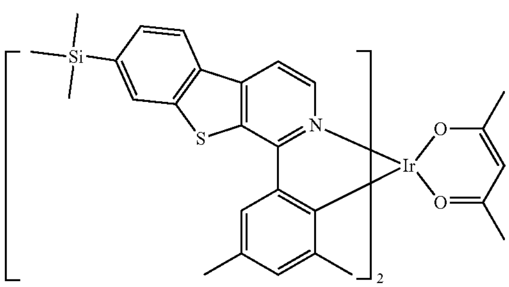
74
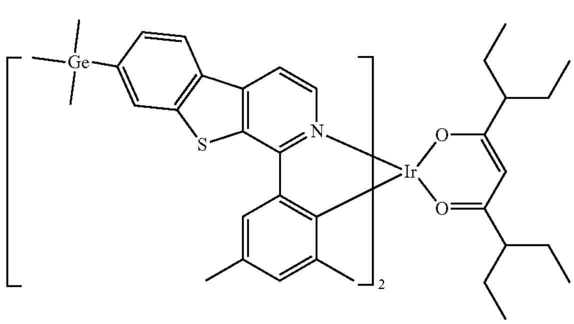
-continued
75
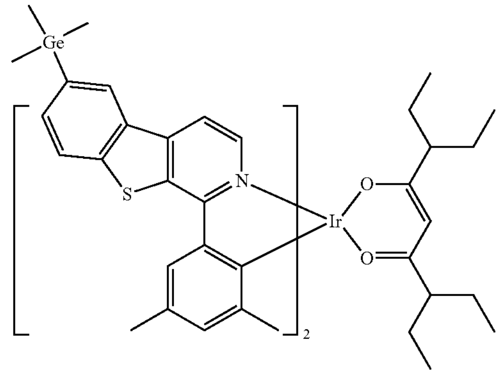
76
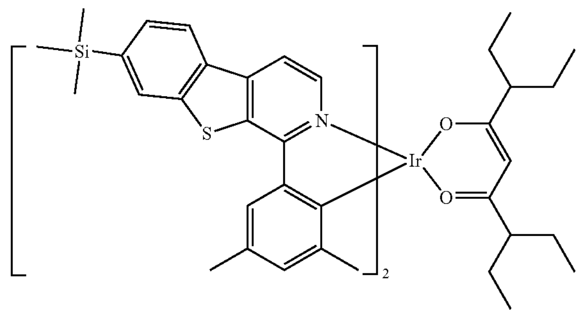
77
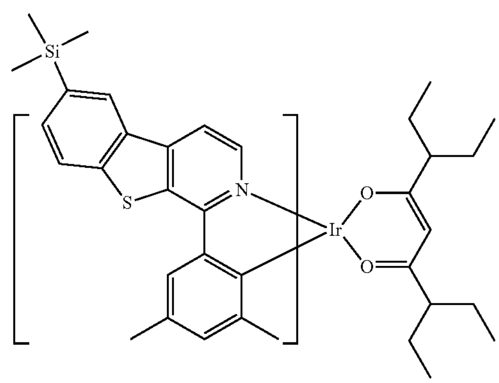
78
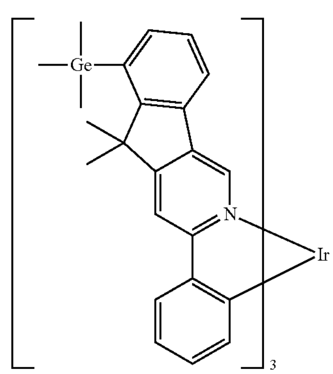

-continued
79
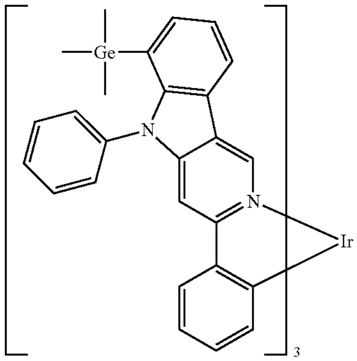
80
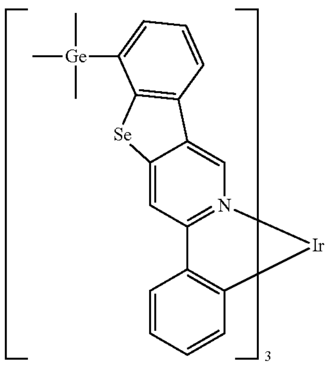
81
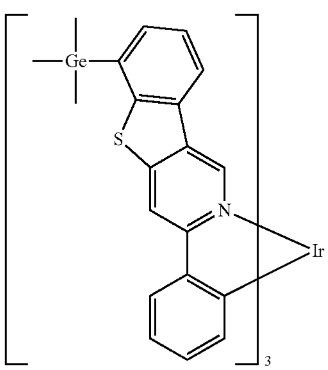
82
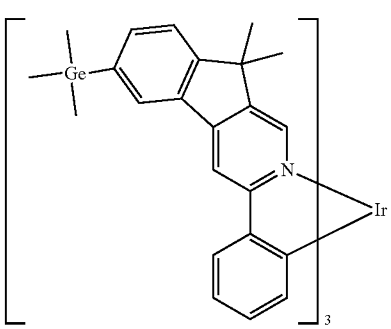
-continued
83
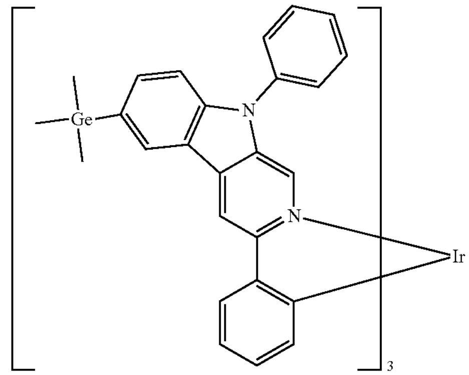
84
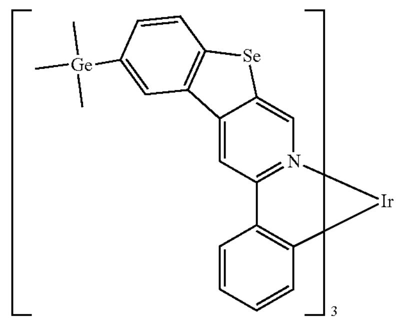
85
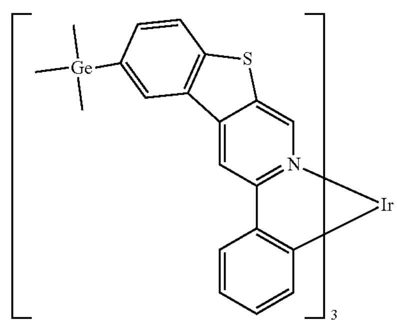
86
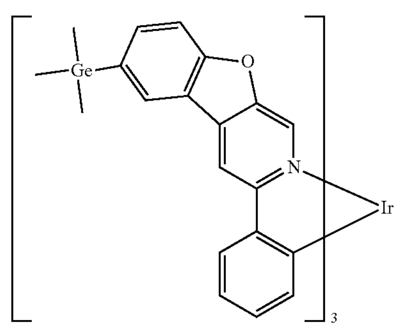
87
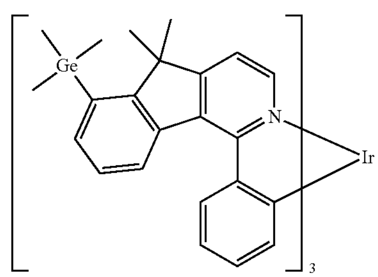

88
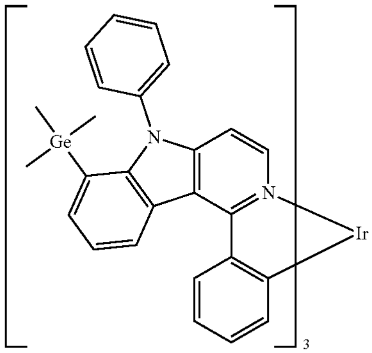
89
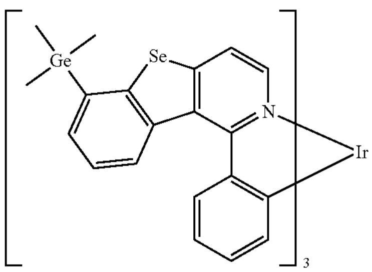
90
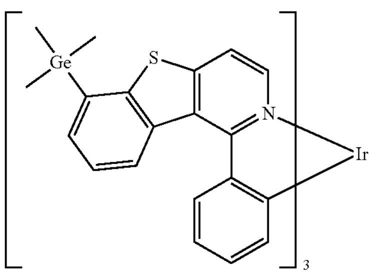
91
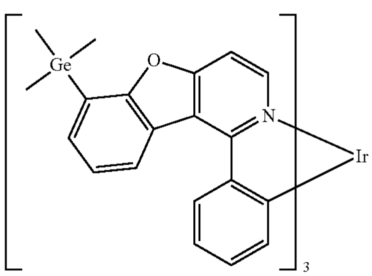
92
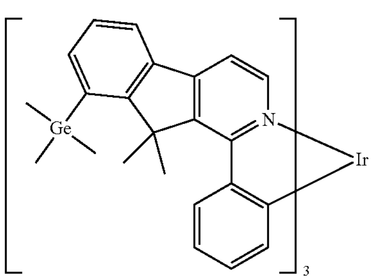
93
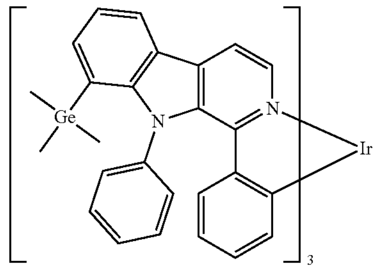
97
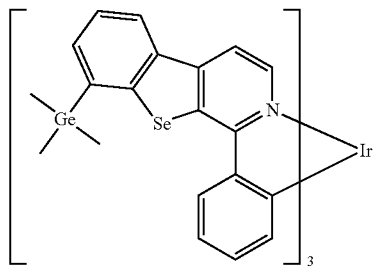
95
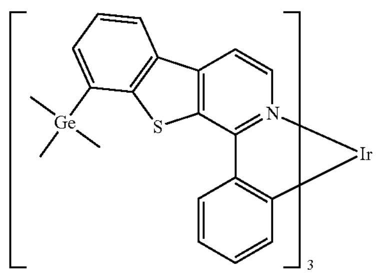
96
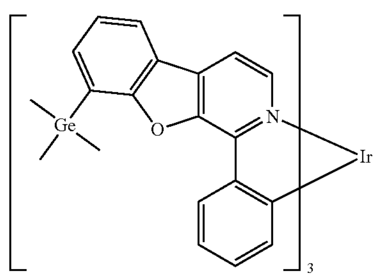
97
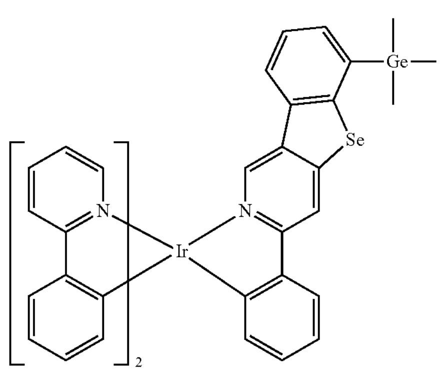

98
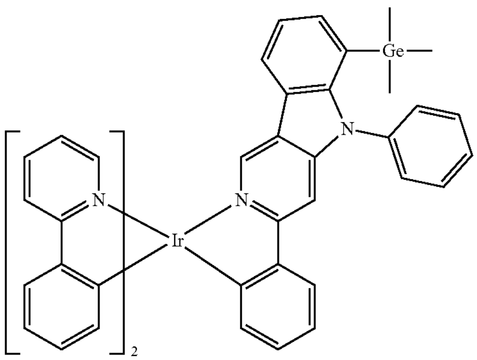
99
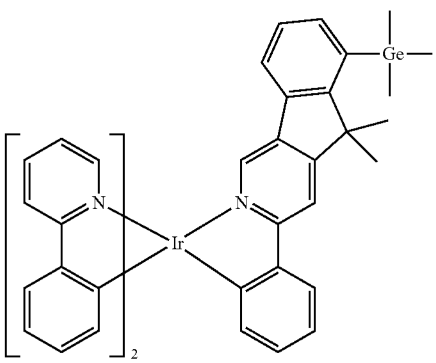
100
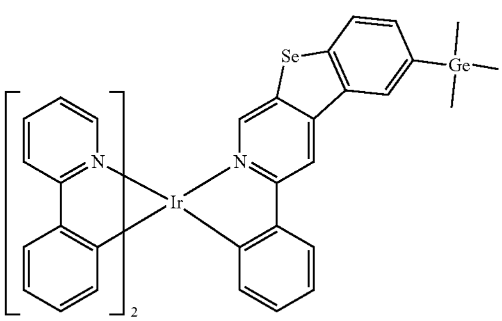
101
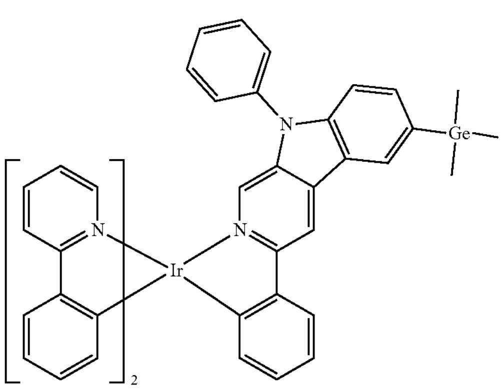
102
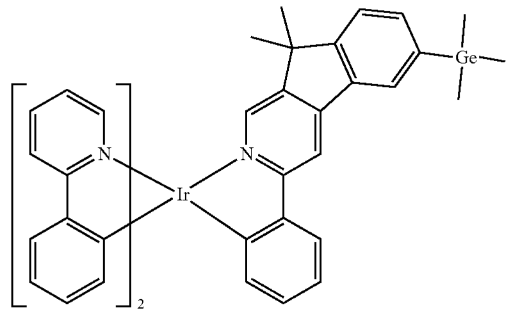
103
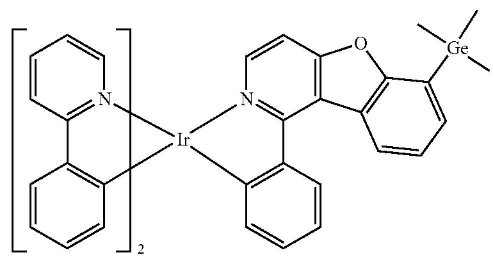
104
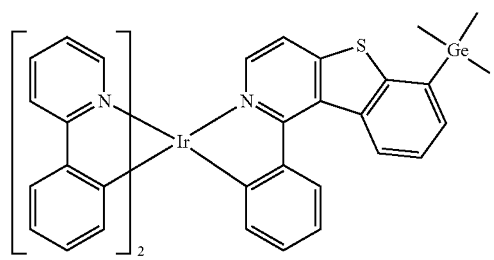
105
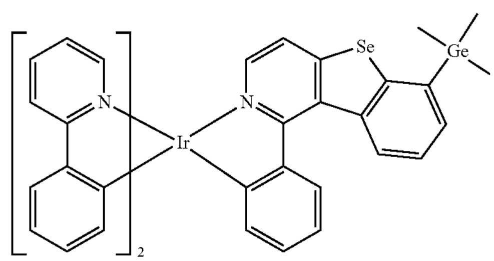
106
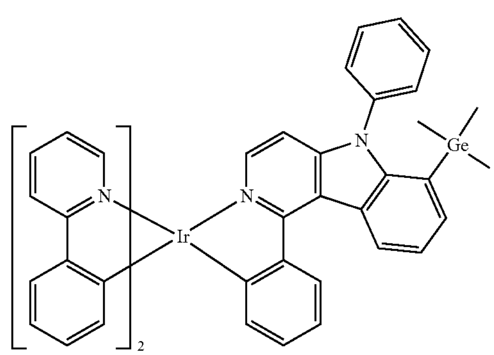

-continued
107
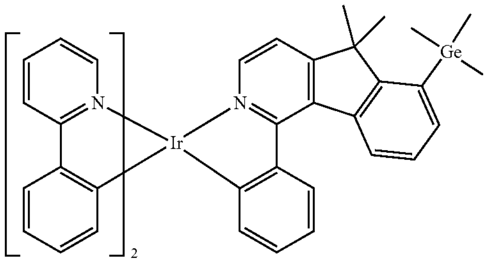
108
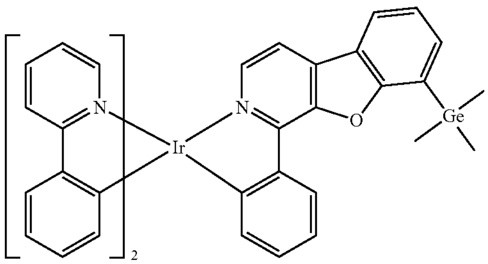
109
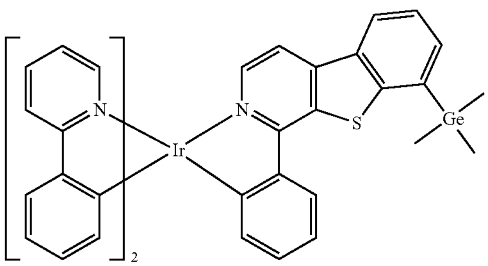
110
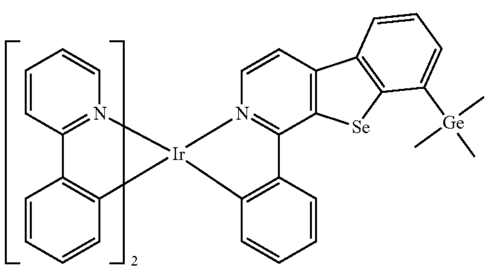
111
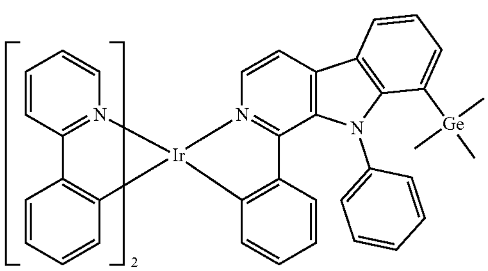
112
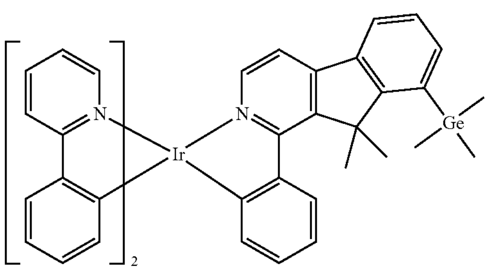
-continued
113
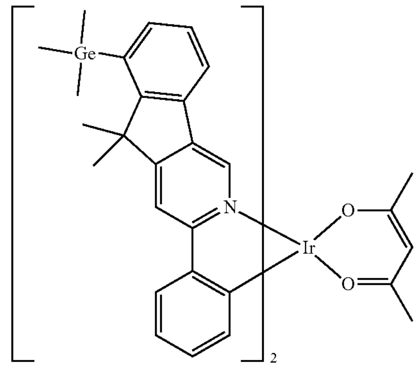
114
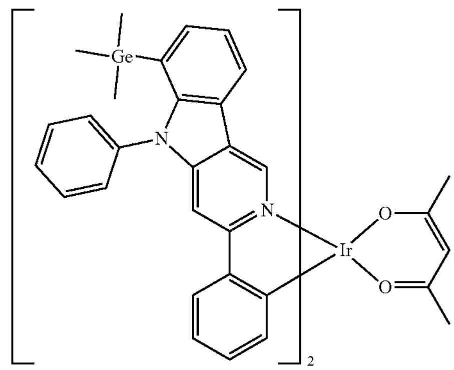
115
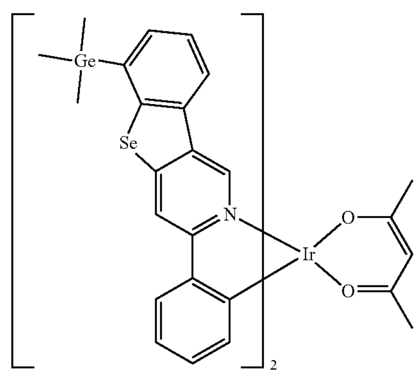
116
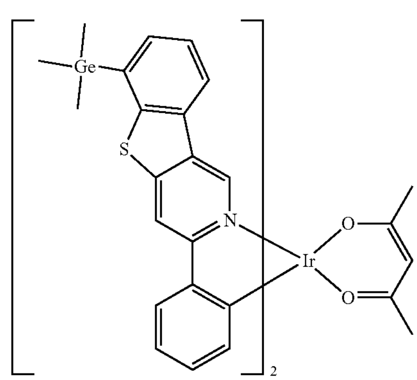

117
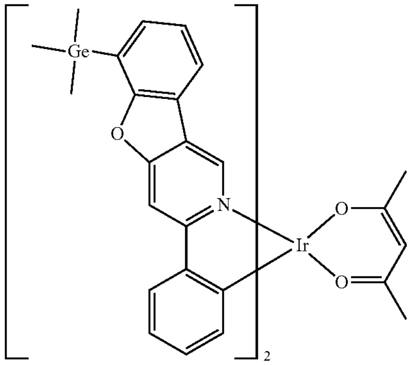
118
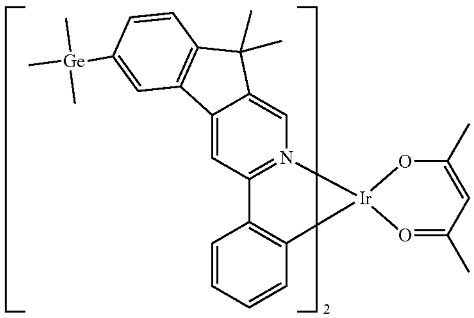
119
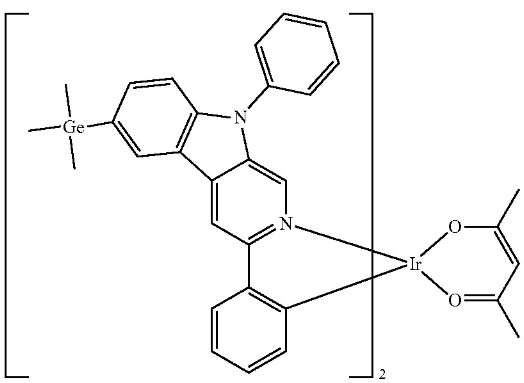
120
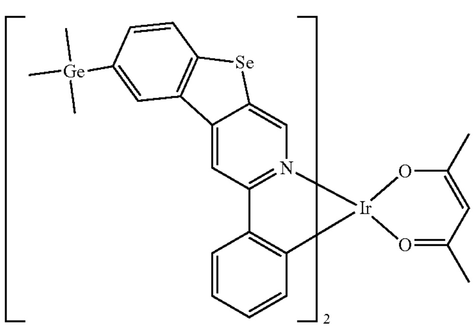
121
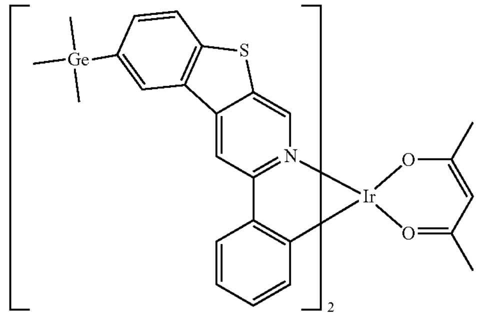
122
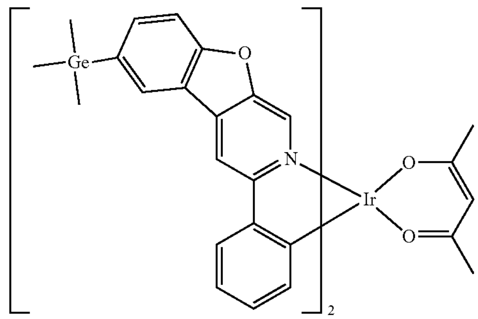
123
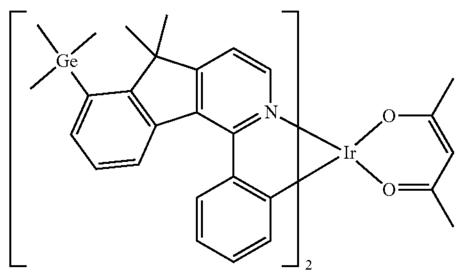
124
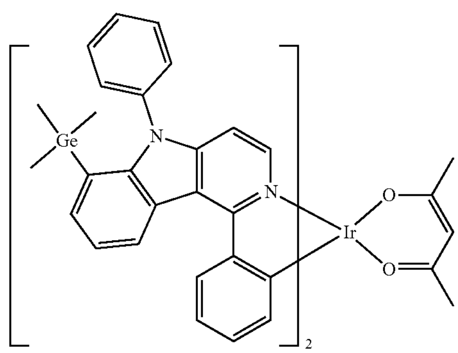
125
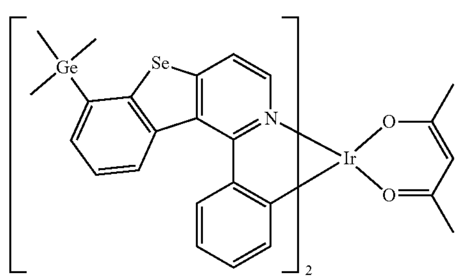

-continued
126
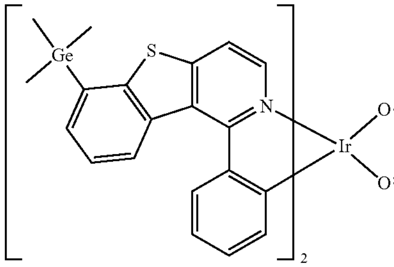
127
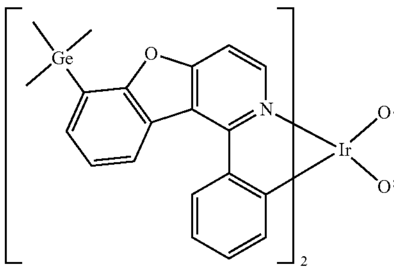
128
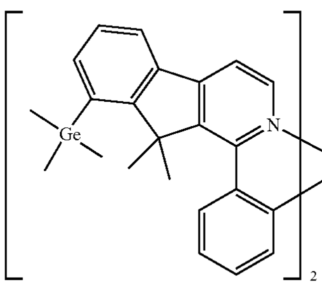
129
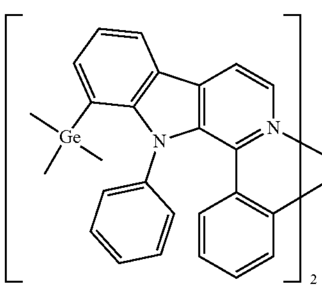
130
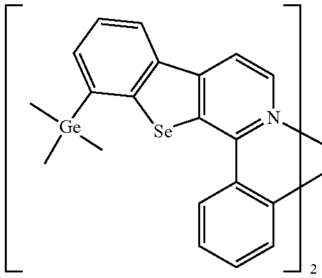
-continued
131
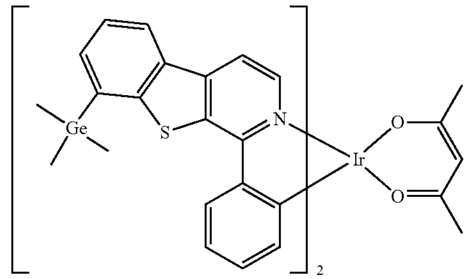
132
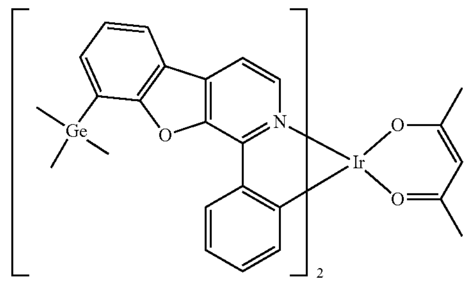
133
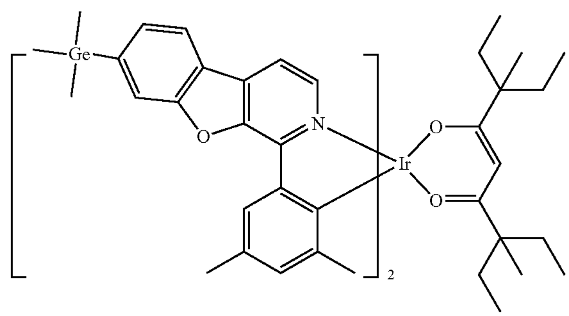
134
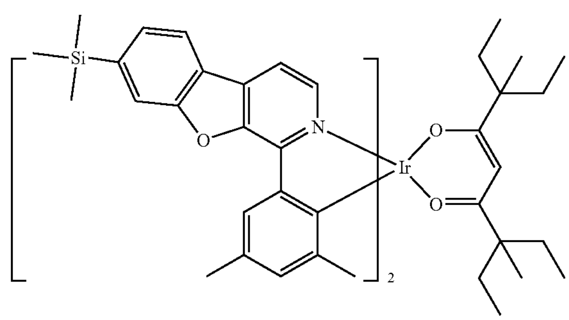
135
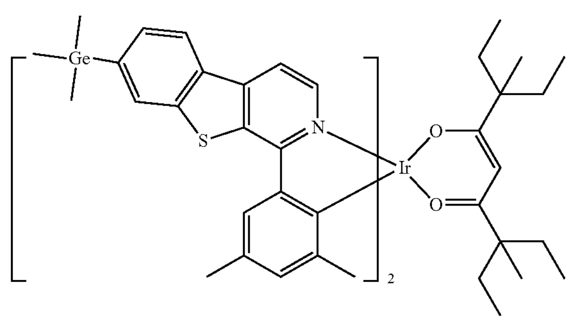

-continued
136
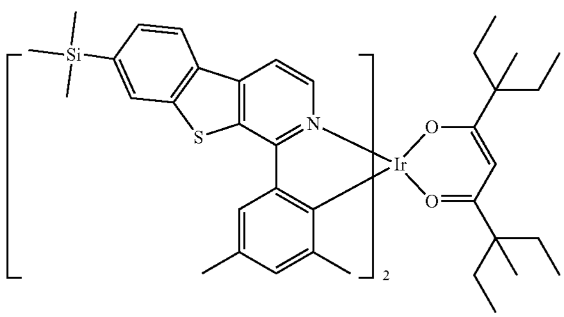
137
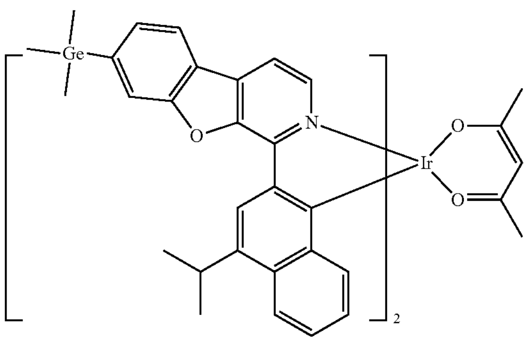
138
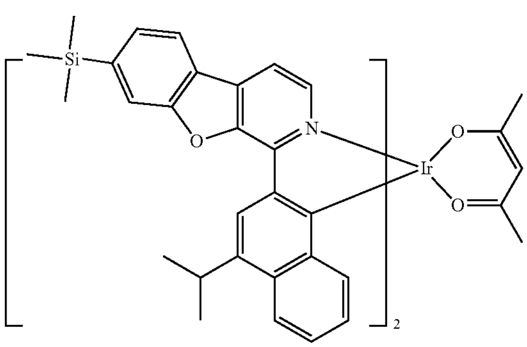
139
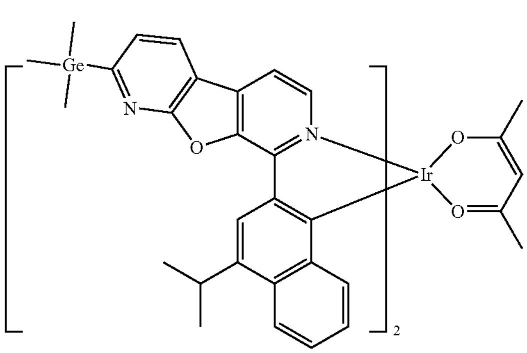
-continued
140
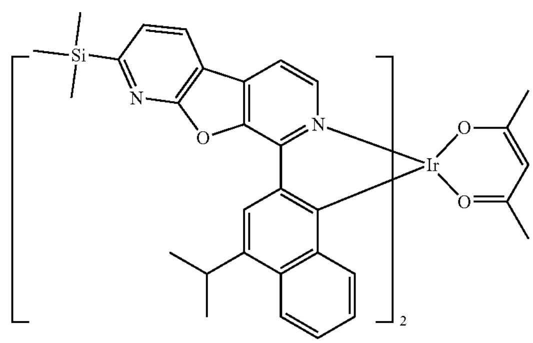
141
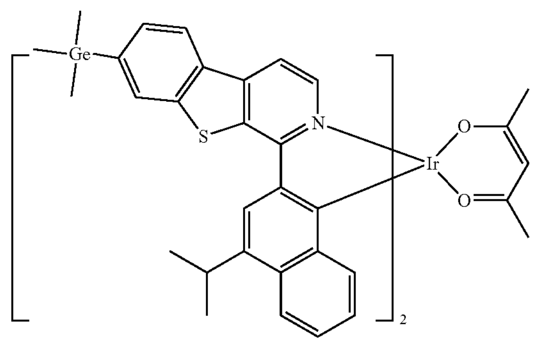
142
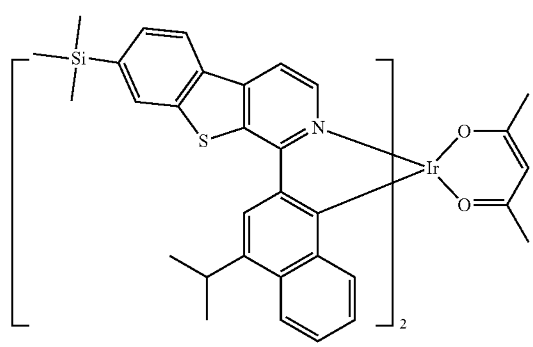
143
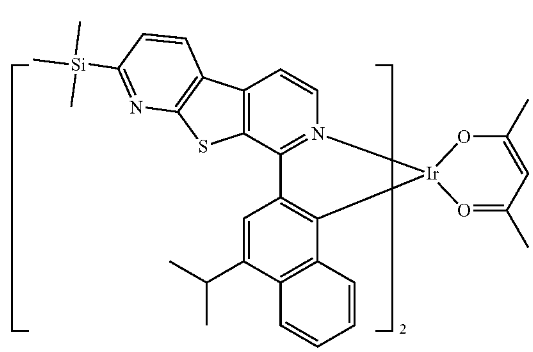

144
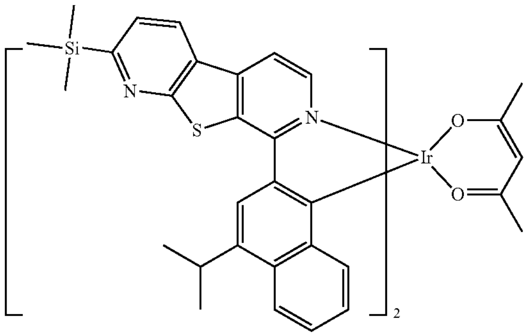
145
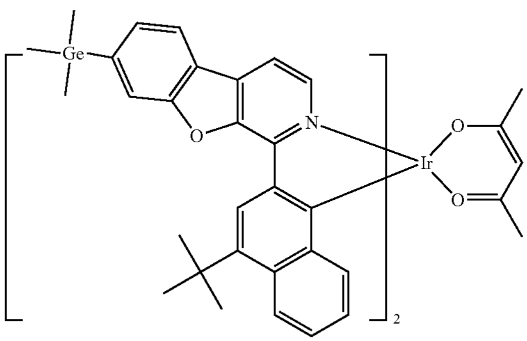
146
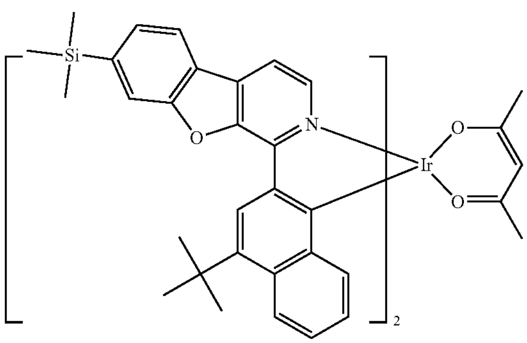
147
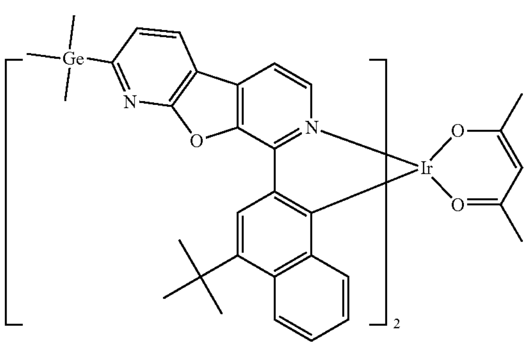
148
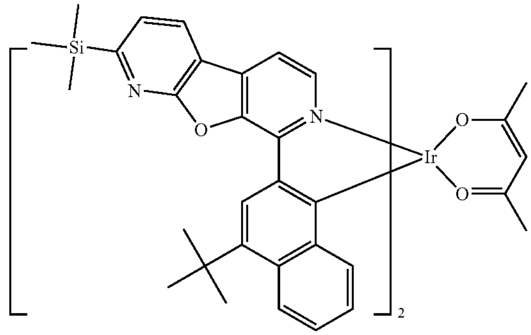
149
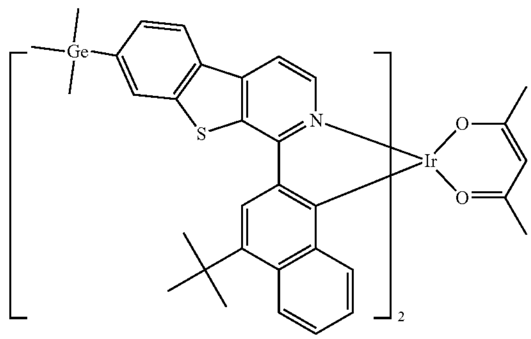
150
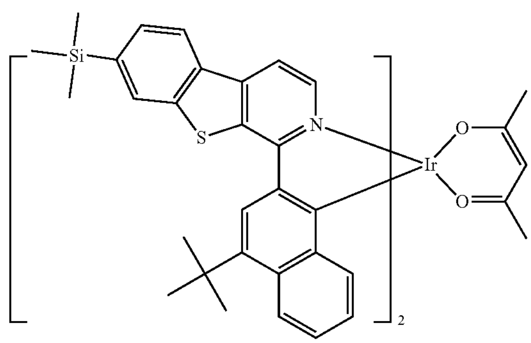
151
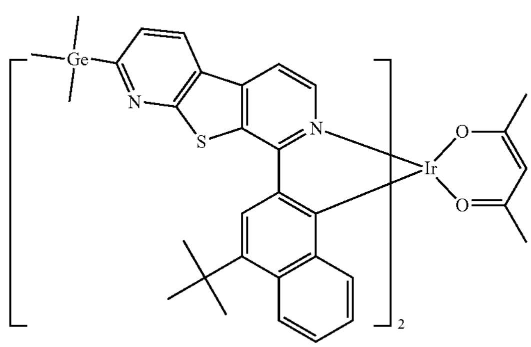

152
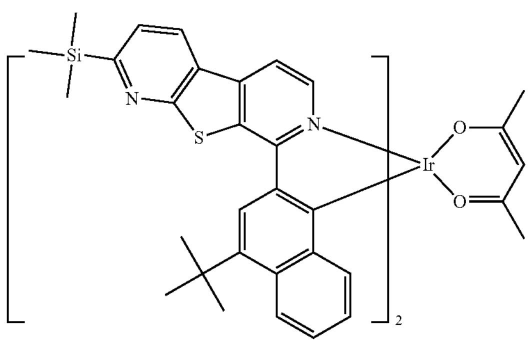
153
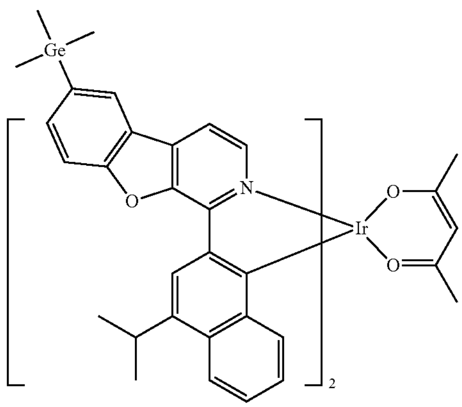
154
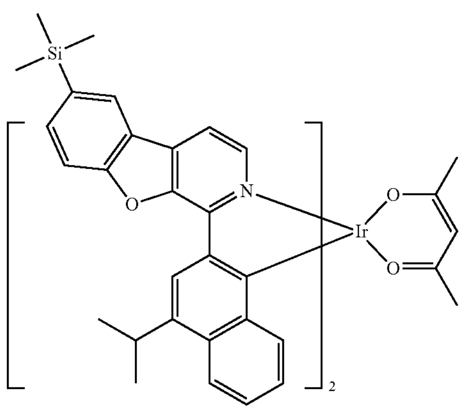
155
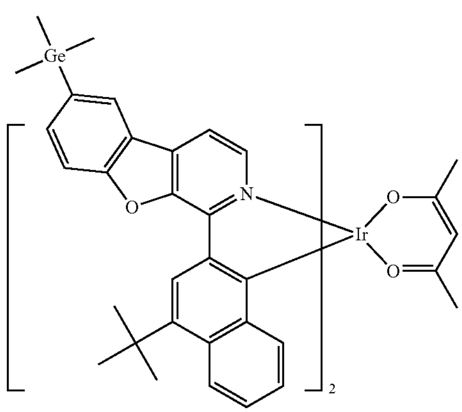
156
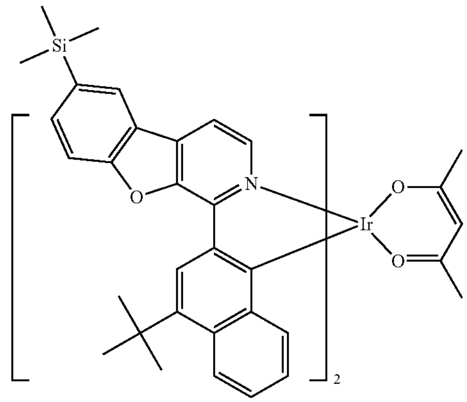
157
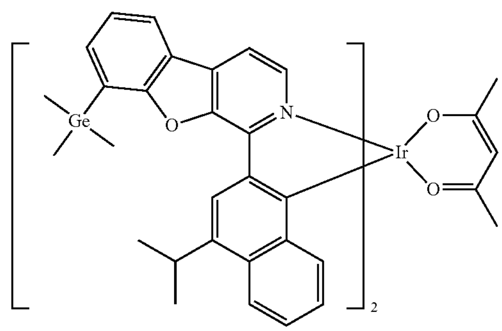
158
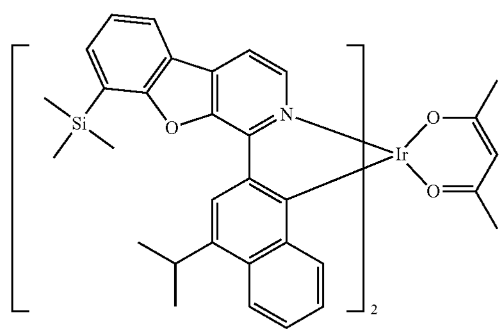
159
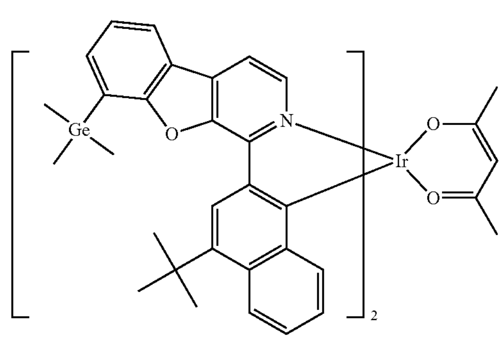

-continued
160
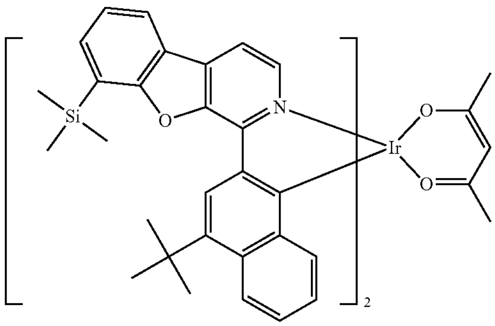
161
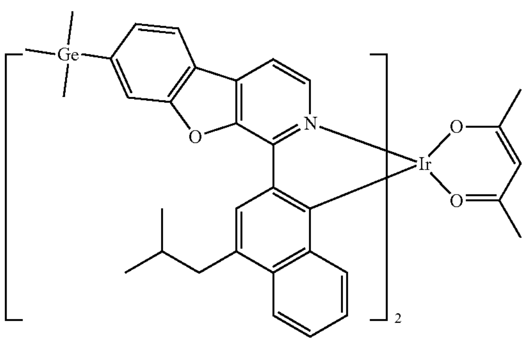
162
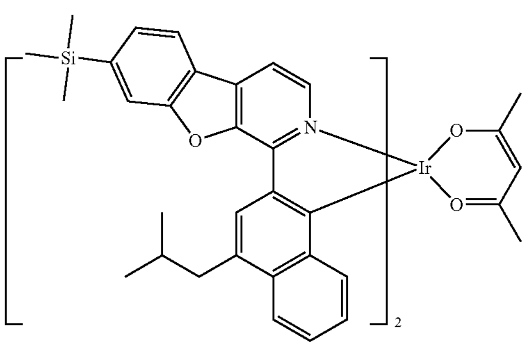
163
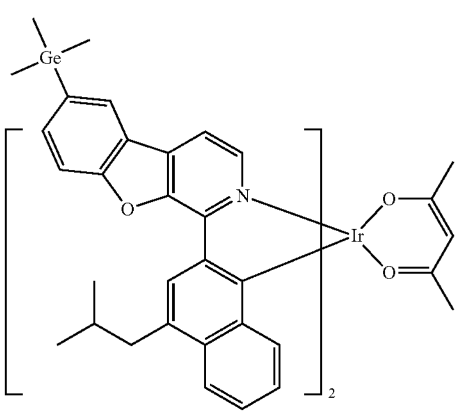
-continued
164
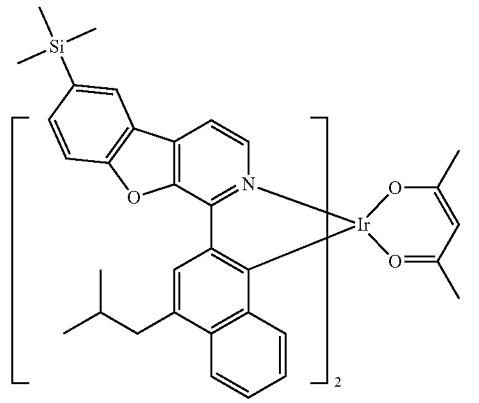
165
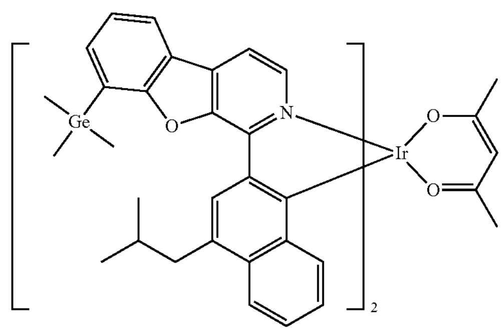
166
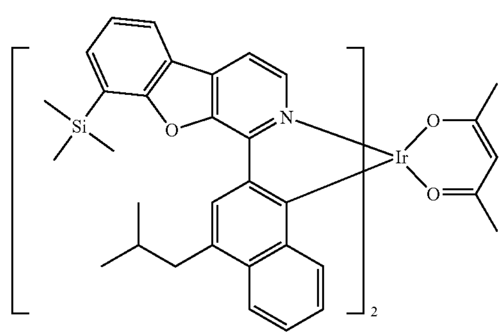
167
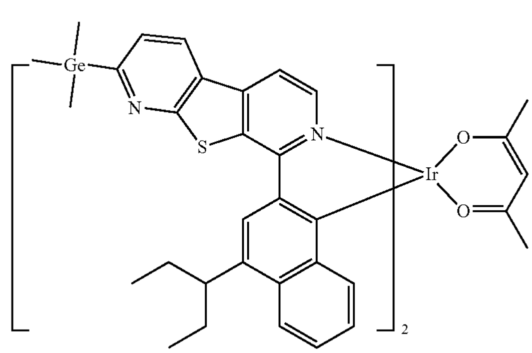

-continued
168
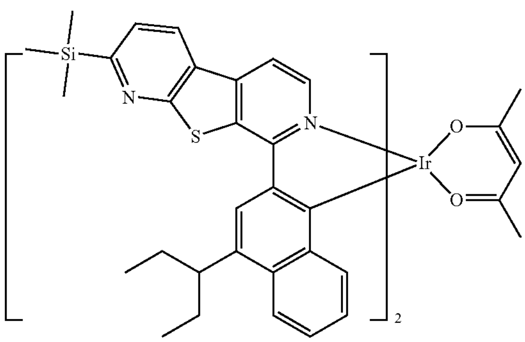
169
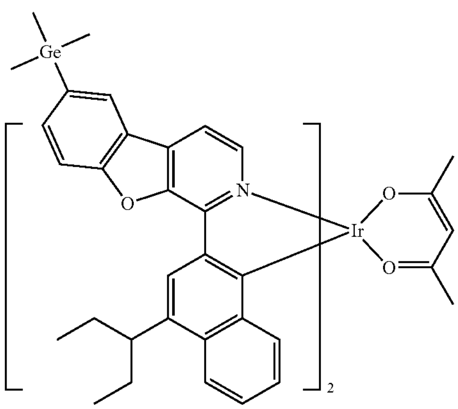
170
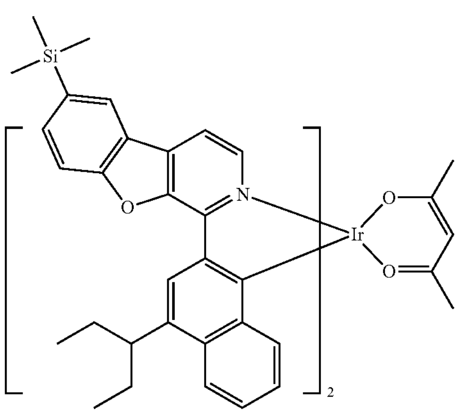
171
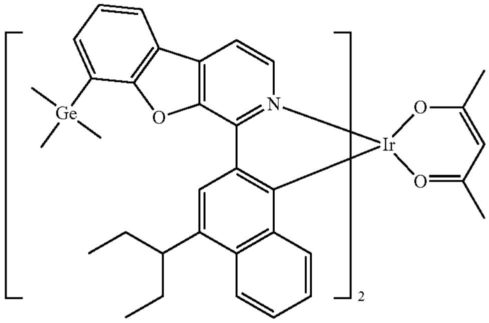
-continued
172
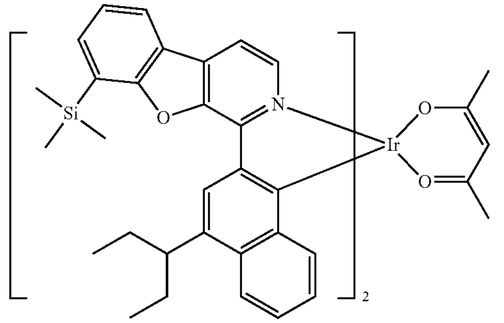
173
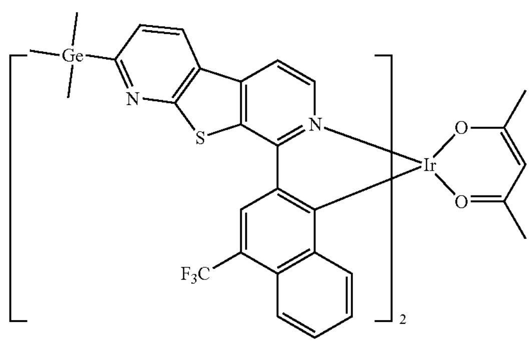
174
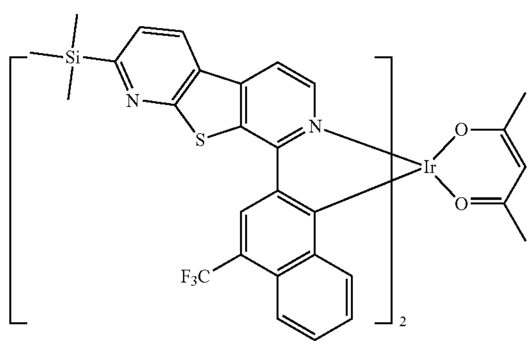
175
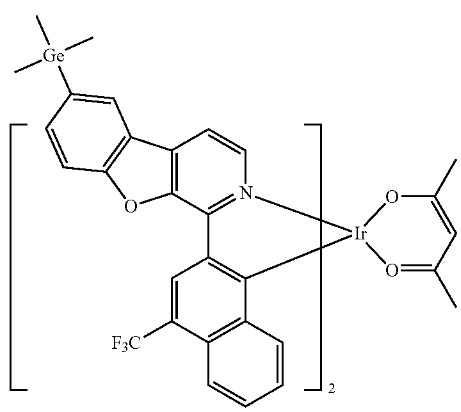

176
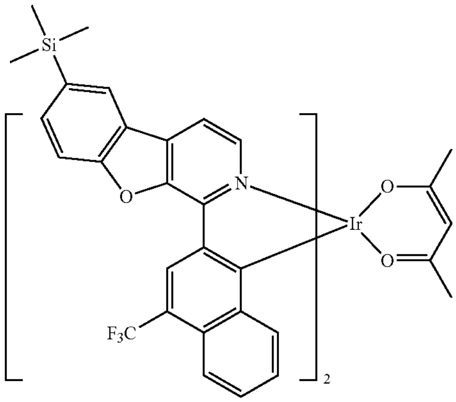
177
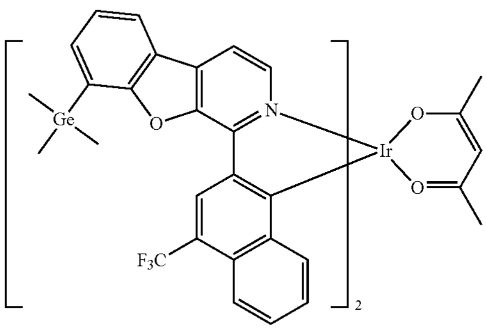
178
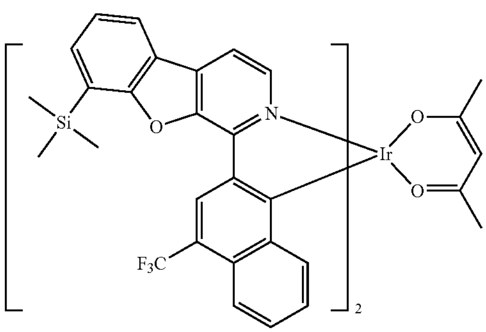
179
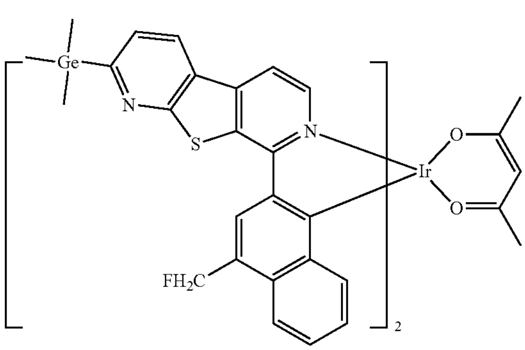
180
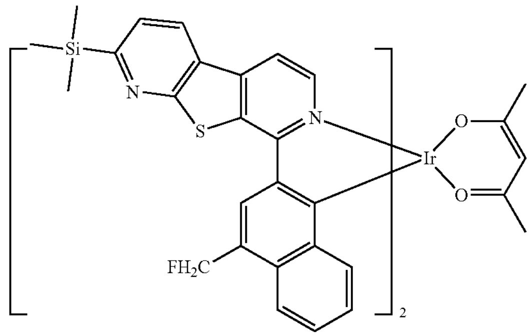
181
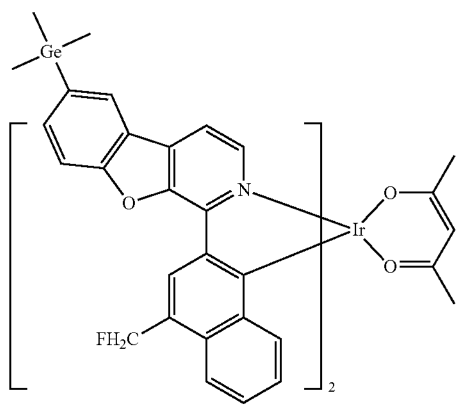
182
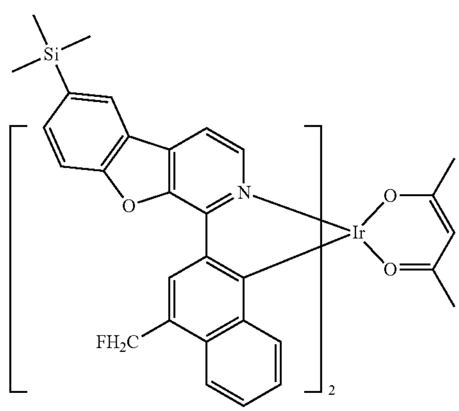
183
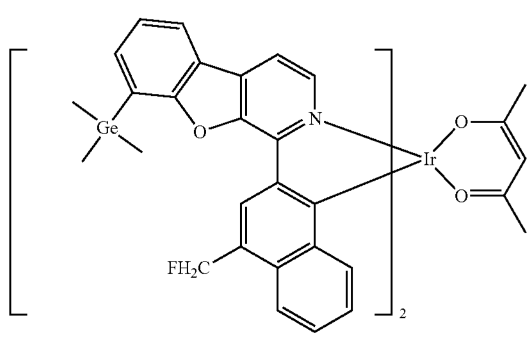

-continued
184
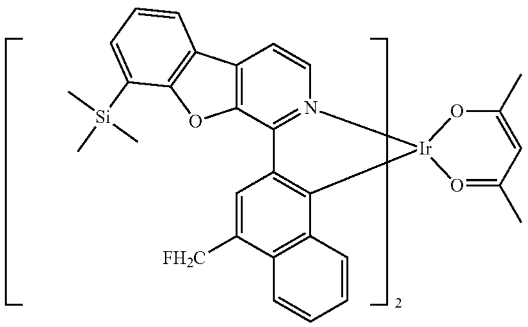
185
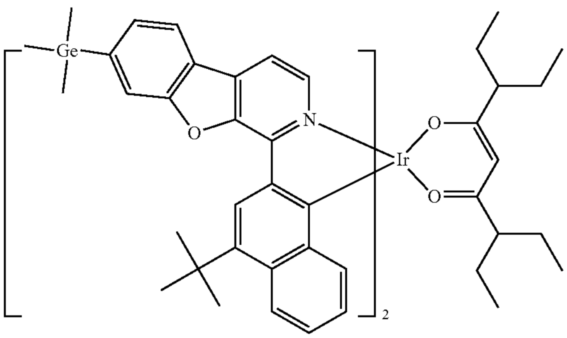
186
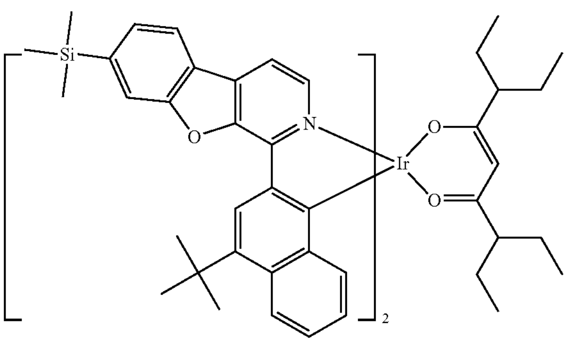
187
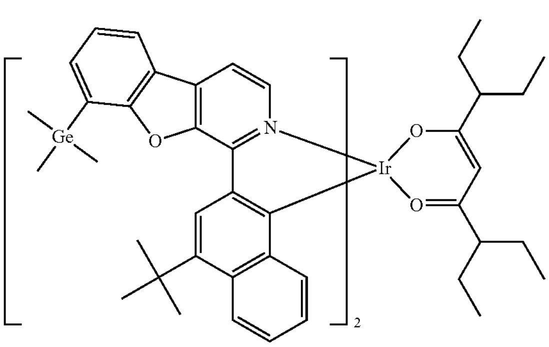
-continued
188
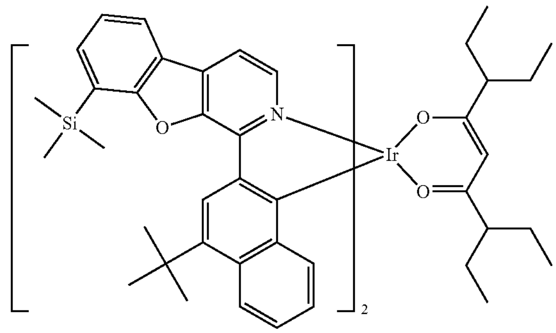
189
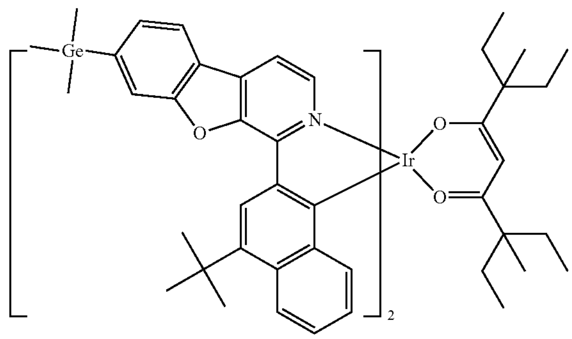
190
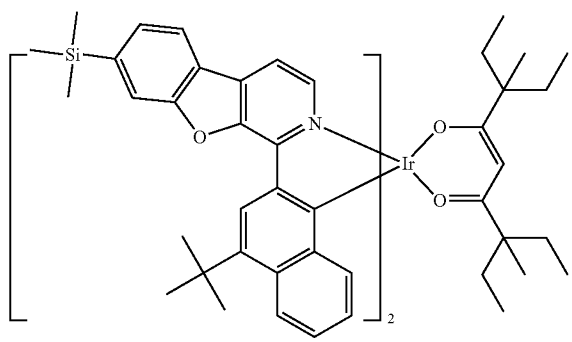
191
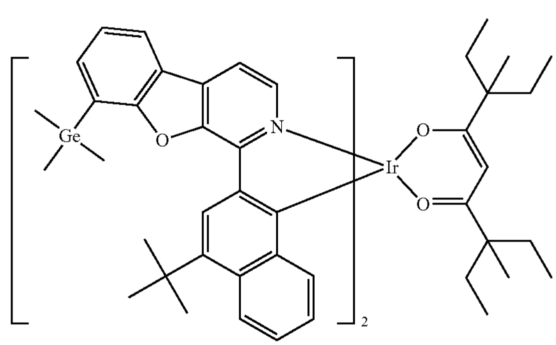

-continued

192

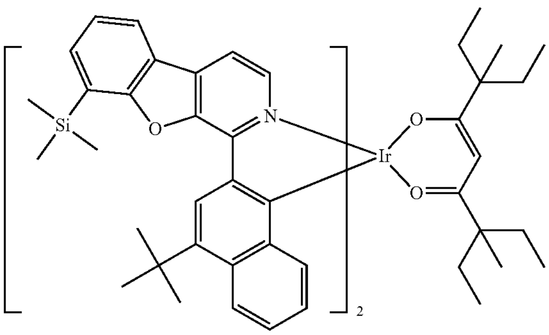

193

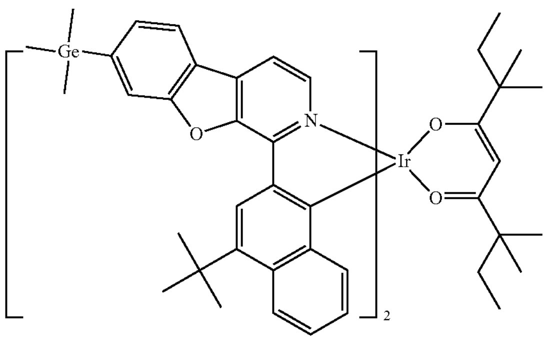

194

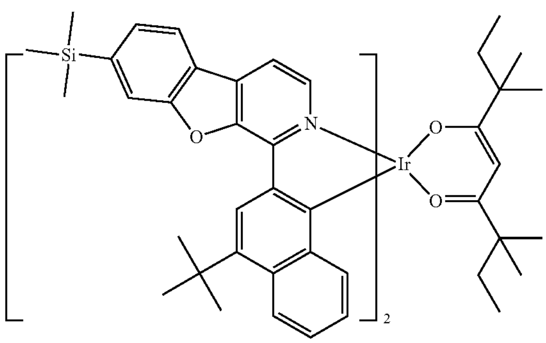

195

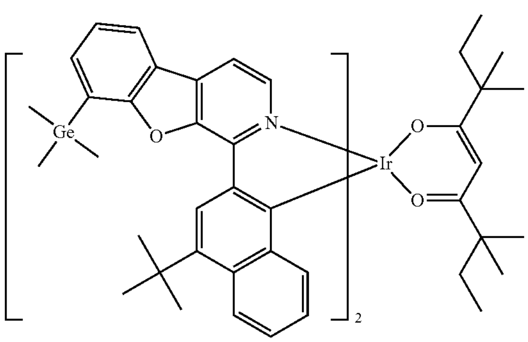

-continued

196

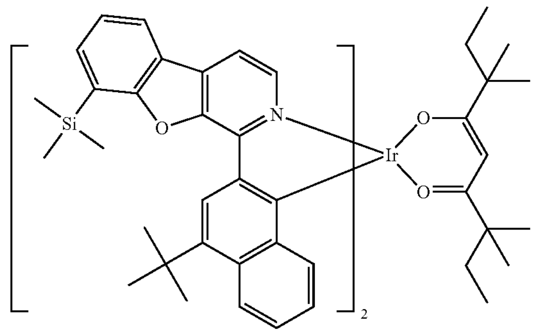

.

15. An organic light-emitting device, comprising:

a first electrode;

a second electrode; and an organic layer located between the first electrode and the second electrode, wherein the organic layer comprises an emission layer, and wherein the organic layer further comprises at least one of the organometallic compound of claim 1.

16. The organic light-emitting device of claim 15, wherein the emission layer comprises the at least one of the organometallic compound.

17. The organic light-emitting device of claim 16, wherein the emission layer further comprises a host, and an amount of the host in the emission layer is greater than an amount of the at least one of the organometallic compound in the emission layer.

18. The organic light-emitting device of claim 15, wherein the first electrode is an anode, the second electrode is a cathode, the organic layer further comprises a hole transport region located between the first electrode and the emission layer, and an electron transport region located between the emission layer and the second electrode, wherein the hole transport region comprises a hole injection layer, a hole transport layer, an electron blocking layer, a buffer layer, or a combination thereof, and the electron transport region comprises a hole blocking layer, an electron transport layer, an electron injection layer, or a combination thereof.

19. An electronic apparatus, comprising the organic light-emitting device of claim 15.

* * * * *